US012089487B2

(12) United States Patent
Hwang et al.

(10) Patent No.: US 12,089,487 B2
(45) Date of Patent: Sep. 10, 2024

(54) ORGANOMETALLIC COMPOUND AND ORGANIC LIGHT-EMITTING DEVICE INCLUDING THE SAME

(71) Applicant: Samsung Electronics Co., Ltd., Suwon-si (KR)

(72) Inventors: Kyuyoung Hwang, Anyang-si (KR); Ohyun Kwon, Yongin-si (KR); Yoonhyun Kwak, Seoul (KR); Hyun Koo, Seoul (KR); Kumhee Lee, Suwon-si (KR); Hyeonho Choi, Seoul (KR); Whail Choi, Seoul (KR); Seokhwan Hong, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 718 days.

(21) Appl. No.: 17/185,128

(22) Filed: Feb. 25, 2021

(65) Prior Publication Data

US 2021/0193940 A1 Jun. 24, 2021

Related U.S. Application Data

(63) Continuation of application No. 14/951,764, filed on Nov. 25, 2015, now abandoned.

(30) Foreign Application Priority Data

Nov. 28, 2014 (KR) ........................ 10-2014-0169183
Sep. 14, 2015 (KR) ........................ 10-2015-0129776

(51) Int. Cl.

| | |
|---|---|
| ***H10K 85/30*** | (2023.01) |
| ***H10K 85/40*** | (2023.01) |
| *C07F 15/00* | (2006.01) |
| *C09K 11/06* | (2006.01) |
| *H10K 50/11* | (2023.01) |
| *H10K 101/10* | (2023.01) |

(52) U.S. Cl.

CPC ........... *H10K 85/342* (2023.02); *H10K 85/40* (2023.02); *C07F 15/0033* (2013.01); *C09K 11/06* (2013.01); *C09K 2211/1007* (2013.01); *C09K 2211/1029* (2013.01); *C09K 2211/1088* (2013.01); *C09K 2211/185* (2013.01); *H10K 50/11* (2023.02); *H10K 85/324* (2023.02); *H10K 85/361* (2023.02); *H10K 2101/10* (2023.02)

(58) Field of Classification Search

CPC ............. H10K 2101/90; H10K 85/342; H10K 50/11; H10K 2101/10

See application file for complete search history.

(56) References Cited

U.S. PATENT DOCUMENTS

| | | | | |
|---|---|---|---|---|
| 8,709,615 | B2 | 4/2014 | Kottas et al. | |
| 8,722,205 | B2 | 5/2014 | Kia et al. | |
| 9,490,437 | B2 | 11/2016 | Hwang et al. | |
| 10,135,009 | B2 | 11/2018 | Hwang et al. | |
| 2006/0228582 | A1 | 10/2006 | Ragini et al. | |
| 2007/0128466 | A1 | 6/2007 | Nomura et al. | |
| 2007/0176542 | A1 | 8/2007 | Ragini et al. | |
| 2007/0259208 | A1 | 11/2007 | Kathirgamanathan et al. | |
| 2010/0244004 | A1 | 9/2010 | Xia et al. | |
| 2013/0026452 | A1 | 1/2013 | Kottas et al. | |
| 2013/0119354 | A1 | 5/2013 | Ma et al. | |
| 2014/0131663 | A1* | 5/2014 | Beers .................. | H10K 85/342 546/4 |
| 2014/0131676 | A1 | 5/2014 | Beers et al. | |
| 2014/0158992 | A1 | 6/2014 | Xia et al. | |
| 2015/0090974 | A1 | 4/2015 | Kim et al. | |
| 2016/0093814 | A1 | 3/2016 | Hwang et al. | |

FOREIGN PATENT DOCUMENTS

| | | | |
|---|---|---|---|
| CN | 102898477 | A | 1/2013 |
| CN | 105461754 | A | 4/2016 |
| EP | 2551933 | | 9/2014 |
| JP | 2005327526 | A | 11/2005 |
| JP | 2012001517 | A | 1/2012 |
| JP | 201274444 | A | 4/2012 |
| JP | 201355086 | | 3/2013 |
| KR | 1020130018550 | A | 2/2013 |
| KR | 1020130110934 | A | 10/2013 |
| KR | 102384222 | A | 4/2022 |
| WO | 2006016193 | A1 | 2/2006 |
| WO | 2010111175 | | 9/2010 |
| WO | 2012133042 | | 10/2012 |
| WO | 2014065498 | A1 | 5/2014 |
| WO | 2015046916 | A1 | 4/2015 |
| WO | 2015056993 | A1 | 4/2015 |

OTHER PUBLICATIONS

English Translation of Office Action dated Jun. 21, 2022, issued in corresponding KR Patent Application No. 10-2015-0129776, 9 pp.
Office Action dated Jun. 21, 2022, issued in corresponding KR Patent Application No. 10-2015-0129776, 9 pp.
Extended Search Report issued by the European Patent Office dated Apr. 21, 2016.
Ho, et al. "Carbazole-based coplanar molecule (CnInF) as a unversal host for multi-clor electrophosphorescent devices." Journal of Materials Chemistry 22.1 (2012): 215-224.
Ho, et al. "Phosphorescence Color Tuning by Ligand, and Substituent Effects of Multifunctional Iridium (III) Cyclometalates with 9-Aryicarbazole Moieties," Chemistry—An Asian Journal 4.1 (2009): 89-103.
Jaemin Lee, et al., "Improved performance of solution-processable OLEDs by silyl substitution to phosphorescent ridium complexes" Synthetic Metals 162 (2012) 1961-1967.

(Continued)

*Primary Examiner* — Sean M DeGuire
(74) *Attorney, Agent, or Firm* — CANTOR COLBURN LLP

(57) ABSTRACT

An organometallic compound represented by Formula 1:

$$M(L_1)_{n1}(L_2)_{n2} \quad \text{Formula 1}$$

wherein in Formula 1, M, $L_1$, $L_2$, n1, and n2 are the same as described in the specification.

11 Claims, 1 Drawing Sheet

(56) References Cited

OTHER PUBLICATIONS

Jung, et al. "A green emitting iridium (III) complex with narrow emission band and its application to phosphorescence organic light-emitting diodes (OLEDs)," Organic Electronics 10.6 (2009): 1066-1073.

Kim, et al. "Synthesis and characterization of new blue light emitting iridium complexes containing a trimethylsilyl group." Journal of Materials Chemistry 22-42 (2012): 22721-22726.

Lee et al. "Improved performance of solution-processable OLEDs by silyl substitution to phosphorescent iridium complexes," Synthetic Metals 162-21 (2012): 1961-1967.

Office Action issued by the Chinese Patent Office on May 3, 2018 in the examination of the Chinese Patent Application No. 201510836500.3.

Tavasli, et al., A Tris-Cyclometalated Iridium (III) Complex of 2-(5, 5-Dioxido-dibenzothiophen-3-yl) pyridine: Synthesis, Structural, Redox and Photophysical Properties. European Jpurnal of Inorganic Chemistry 2007.30 (2007); 4808-4814.

Thangaraju, et al. "4, 4, $," -Tris (N-carbazolyl)-triphenylamine interlayer in highly efficient phosphorescent organic light emitting diodes based on tris [4-methyl-2-2 (4'trmethylsilylphenyl) pyridine] iridium complex." Thin Solid Films 519-18 (2011): 6073-6076.

Yang, et al., Tuning the energy level and photophysical and electrolumnescent properties of heavy metal complexes by controlling the ligation of the metal with the carbon of the carbazole unit. Advanced Functional Materials 17.4 (2007) 651-661.

* cited by examiner

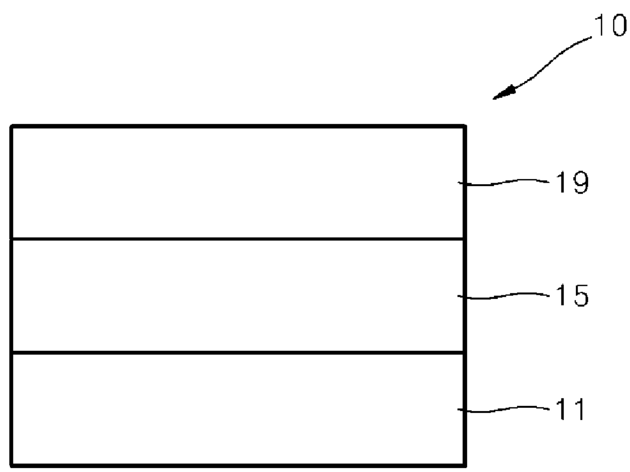
10
19
15
11

ORGANOMETALLIC COMPOUND AND ORGANIC LIGHT-EMITTING DEVICE INCLUDING THE SAME

CROSS-REFERENCE TO RELATED APPLICATION

This is a continuation application which claims priority to U.S. application Ser. No. 14/951,764, filed on Nov. 25, 2015, which claims priority to and the benefit of Korean Patent Applications Nos. 10-2014-0169183, filed on Nov. 28, 2014, and 10-2015-0129776, filed on Sep. 14, 2015, in the Korean Intellectual Property Office, the disclosure of which are incorporated herein in their entirety by reference.

BACKGROUND

1. Field

One or more embodiments relate to an organometallic compound and an organic light-emitting device including the same.

2. Description of the Related Art

Organic light emitting devices (OLEDs) are self-emission devices that have wide viewing angles, high contrast ratios, and short response times. In addition, OLEDs exhibit excellent brightness, driving voltage, and response speed characteristics, and produce full-color images.

In an example, an organic light-emitting device includes an anode, a cathode, and an organic layer that is disposed between the anode and the cathode and includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons are recombined in the emission layer to produce excitons. These excitons change from an excited state to a ground state, thereby generating light.

Various types of organic light emitting devices are known. However, there still remains a need in OLEDs having low driving voltage, high efficiency, high brightness, and long lifespan.

SUMMARY

One or more embodiments relate to a novel organometallic compound and an organic light-emitting device including the same.

Additional aspects will be set forth in part in the description which follows and, in part, will be apparent from the description, or may be learned by practice of the presented embodiments.

An aspect provides an organometallic compound represented by Formula 1:

Formula 1

$$M(L_1)_{n1}(L_2)_{n2}$$

Formula 2A

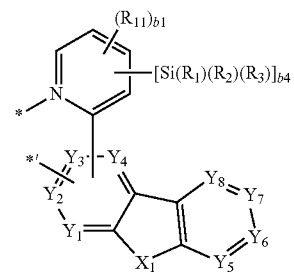

wherein M in Formula 1 is selected from Ir, Pt, Os, Ti, Zr, Hf, Eu, Tb, Tm, and Rh, in Formula 1, $L_1$ is a ligand represented by Formula 2A, n1 is 1, 2, or 3, and when n1 is 2 or more, 2 or more $L_1$ may be identical or different, in Formula 1, $L_2$ is selected from a monovalent organic ligand, a divalent organic ligand, a trivalent organic ligand, and a tetravalent organic ligand, n2 is 0, 1, 2, 3, or 4, when n2 is 2 or more, 2 or more $L_2$ may be identical or different, $L_1$ and $L_2$ in Formula 1 may be different from each other, $R_1$ to $R_3$ in Formula 2A may be each independently selected from a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and —$Si(Q_{51})(Q_{52})(Q_{53})$, $X_1$ in Formula 2A may be selected from O, S, $S({=}O)_2$, $N(R_{21})$, and $Si(R_{22})(R_{23})$, in Formula 2A, $Y_1$ may be N, $C(R_{41})$ or a carbon atom connected to a pyridine ring, $Y_2$ may be N, $C(R_{42})$ or a carbon atom connected to a pyridine ring, $Y_3$ may be N, $C(R_{43})$ or a carbon atom connected to a pyridine ring, $Y_4$ may be N, $C(R_{44})$ or a carbon atom connected to a pyridine ring, $Y_5$ may be N or $C(R_{45})$, $Y_6$ may be N or $C(R_{46})$, $Y_7$ may be N or $C(R_{47})$, $Y_8$ may be N or $C(R_{48})$, and one of $Y_1$ to $Y_4$ may be a carbon atom connected, $R_{11}$, $R_{21}$ to $R_{23}$ and $R_{41}$ to $R_{48}$ in Formula 2A may be each independently selected from a hydrogen, a deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(═O)($Q_8$)($Q_9$), and 2 or more $R_{11}$ may optionally be linked to each other to form a saturated or unsaturated $C_4$-$C_{60}$ ring, and two or more of $R_{41}$ to $R_{44}$ may be optionally linked to each other to form a saturated or unsaturated $C_4$-$C_{60}$ ring, and two or more of $R_{45}$ to $R_{48}$ may be optionally linked to each other to form a saturated or unsaturated $C_4$-$C_{60}$ ring, in Formula 2A, b1 is an integer selected from 0 to 3, and b4 is an integer selected from 1 to 4,

* and *' in Formula 2A are binding sites to M in Formula 1, at least one of substituents of the substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from a deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), and —P(═O)($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), and —P(═O)($Q_{28}$)($Q_{29}$); and —N($Q_{31}$)($Q_{32}$), —Si($Q_{33}$)($Q_{34}$)($Q_{35}$), —B($Q_{36}$)($Q_{37}$), and —P(═O)($Q_{38}$)($Q_{39}$);

wherein $Q_1$ to $Q_9$, $Q_{11}$ to $Q_{19}$, $Q_{21}$ to $Q_{29}$, $Q_{31}$ to $Q_{39}$ and $Q_{51}$ to $Q_{53}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

Another aspect provides an organic light-emitting device including:

a first electrode;

a second electrode; and an organic layer disposed between the first electrode and the second electrode, wherein the organic layer includes an emission layer and at least one organometallic compound represented by Formula 1.

The emission layer may include the organometallic compound.

The organometallic compound included in the emission layer may act as a dopant, and the emission layer may further include a host.

BRIEF DESCRIPTION OF THE DRAWINGS

These and/or other aspects will become apparent and more readily appreciated from the following description of the embodiments, taken in conjunction with the FIGURE which is a schematic view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the FIGURES, to explain aspects of the present inventive concept. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the FIGURES. It will be understood that the spatially relative terms are intended to encompass different orientations of the device in use or operation in addition to the orientation depicted in the FIGURES. For example, if the device in the FIGURES is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art an d the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrate d herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

An organometallic compound according to an embodiment is represented by Formula 1 below:

$$M(L_1)_{n1}(L_2)_{n2} \quad \text{Formula 1}$$

M in Formula 1 may be selected from iridium (Ir), platinum (Pt), osmium (Os), titanium (Ti), zirconium (Zr), hafnium (Hf), europium (Eu), terbium (Tb), thulium (Tm), and rhodium (Rh).

For example, M in Formula 1 may be selected from iridium (Ir), platinum (Pt), osmium (Os), and rhodium (Rh).

In some embodiments, M in Formula 1 may be selected from iridium (Ir) and platinum (Pt), but is not limited thereto.

In Formula 1, $L_1$ is a ligand represented by Formula 2A, n1 is 1, 2, or 3, and when n1 is 2 or more, 2 or more $L_1$ may be identical or different.

Formula 2A

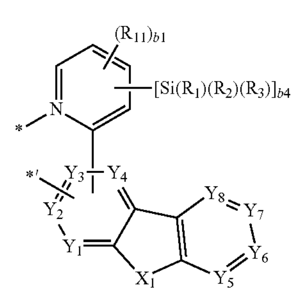

wherein in Formula 1, $L_2$ is selected from a monovalent organic ligand, a divalent organic ligand, a trivalent organic ligand, and a tetravalent organic ligand, n2 is 0, 1, 2, 3, or 4, when n2 is 2 or more, 2 or more $L_2$ may be identical or different.

$L_1$ and $L_2$ in Formula 1 may be different from each other. For example, n1 in Formula 1 may be 1.

In some embodiments, the organometallic compound represented by Formula 1 may not include an ionic group. For example, the organometallic compound may not be a salt consisting of an ionic pair.

In some embodiments, in Formula 1, M is Ir and the sum of n1 and n2 is 3; or M is Pt and the sum of n1 and n2 is 2, and the organometallic compound represented by Formula 1 may not include an ionic group.

$R_1$ to $R_3$ in Formula 2A may be each independently selected from a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and —Si($Q_{51}$)($Q_{52}$)($Q_{53}$).

For example, $R_1$ to $R_3$ in Formula 2A may be each independently selected from a $C_1$-$C_{20}$ alkyl group, a $C_1$-$C_{20}$ alkoxy group, and —Si($Q_{51}$)($Q_{52}$)($Q_{53}$);

a $C_1$-$C_{20}$ alkyl group and a $C_1$-$C_{20}$ alkoxy group, each substituted with at least one selected from a deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and a cyclopentyl group, a cyclohexyl group, a cycloheptyl group, a cyclooctyl group, an adamantanyl group, norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from a deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and $Q_{51}$ to $Q_{53}$ may be each independently selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from a deuterium, a $C_1$-$C_{10}$ alkyl group, and a phenyl group, but embodiments are not limited thereto.

In other examples, $R_1$ to $R_3$ in Formula 2A may be each independently selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, and —$Si(Q_{51})(Q_{52})(Q_{53})$; and an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from a deuterium, a $C_1$-$C_{10}$ alkyl group, and a phenyl group;

$Q_{51}$ to $Q_{53}$ may be each independently selected from

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from a deuterium, a $C_1$-$C_{10}$ alkyl group, and a phenyl group.

In some embodiments, $Q_{51}$ to $Q_{53}$ may be each independently a methyl group or an ethyl group.

In some embodiments, in Formula 2A, $R_1$ to $R_3$ may all be identical;

$R_1$ and $R_3$ may be identical and $R_2$ and $R_1$ may be different; or $R_1$ to $R_3$ may all be different from each other.

$X_1$ in Formula 2A may be selected from O, S, S(=O)$_2$, N($R_{21}$), and Si($R_{22}$)($R_{23}$).

For example, $X_1$ in Formula 2A may be selected from O, S, and N($R_{21}$).

According to an embodiment, $X_1$ in Formula 2A may be O, but is not limited thereto.

$R_{11}$, $R_{21}$ to $R_{23}$ and $R_{41}$ to $R_{48}$ in Formula 2A may be each independently selected from a hydrogen, a deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{10}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$).

For example, $R_{11}$, $R_{21}$ to $R_{23}$ and $R_{41}$ to $R_{48}$ in Formula 2A may be each independently selected from a hydrogen, a deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{14}$ aryl group, a $C_1$-$C_{14}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{14}$ aryl group, a $C_1$-$C_{14}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{14}$ aryl group, a $C_1$-$C_{14}$ heteroaryl group, a monovalent non-aromatic condensed polycyclic group, and a monovalent non-aromatic condensed heteropolycyclic group, each substituted with at least one selected from a deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{14}$ aryl group, a $C_1$-$C_{14}$ heteroaryl group, a monovalent non-aromatic condensed polycyclic group, and a monovalent non-aromatic condensed heteropolycyclic group; and —N($Q_1$)($Q_2$), —Si($Q_3$)($Q_4$)($Q_5$), —B($Q_6$)($Q_7$), and —P(=O)($Q_8$)($Q_9$);

$Q_1$ to $Q_9$ may be each independently selected from a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{14}$ aryl group, a substituted or unsubstituted $C_1$-$C_{14}$ heteroaryl group, a substituted or unsubstituted monovalent non-aromatic condensed polycyclic group, and a substituted or unsubstituted monovalent non-aromatic condensed heteropolycyclic group.

In some embodiments, $R_{11}$, $R_{21}$ to $R_{23}$ and $R_{41}$ to $R_{48}$ in Formula 2A may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from a deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —B($Q_6$)($Q_7$) and —P(=O)($Q_8$)($Q_9$), $Q_6$ to $Q_9$ may be each independently selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from a deuterium, a $C_1$-$C_{10}$ alkyl group, and a phenyl group, but embodiments are not limited thereto.

In some embodiments, $R_{11}$, $R_{21}$ to $R_{23}$ and $R_{41}$ to $R_{48}$ in Formula 2A may be each independently selected from a hydrogen, a deuterium, —F, a cyano group, a nitro group, $—SF_5$, a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl, norbornanyl group, a norbornenyl, a cyclopentenyl group, a cyclohexenyl group, a cycloheptenyl group, a phenyl group, a naphthyl group, a pyridinyl group, and a pyrimidinyl group;

a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, norbornanyl group, a norbornenyl group, a cyclopentenyl group, a cyclohexenyl group, a cycloheptenyl group, a phenyl group, a naphthyl group, a pyridinyl group, and a pyrimidinyl group, each substituted with at least one selected from a deuterium, —F, $—CD_3$, $—CD_2H$, $—CDH_2$, $—CF_3$, $—CF_2H$, $—CFH_2$, a cyano group, a nitro group, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, norbornanyl group, a norbornenyl group, a cyclopentenyl group, a cyclohexenyl group, a cycloheptenyl group, a phenyl group, a naphthyl group, a pyridinyl group, and a pyrimidinyl group; and $—B(Q_6)(Q_7)$ and $—P(=O)(Q_8)(Q_9)$, $Q_6$ to $Q_9$ may be each independently selected from $—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, and $—CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from a deuterium, a $C_1$-$C_{10}$ alkyl group, and a phenyl group.

In some embodiments, $R_{11}$, $R_{21}$ to $R_{23}$ and $R_{41}$ to $R_{48}$ in Formula 2A may be each independently selected from a hydrogen, a deuterium, —F, a cyano group, a nitro group, $—SF_5$, $—CH_3$, $—CD_3$, $—CD_2H$, $—CDH_2$, $—CF_3$, $—CF_2H$, $—CFH_2$, groups represented by Formulae 9-1 to 9-17, and groups represented by Formulae 10-1 to 10-30, but they are not limited thereto:

Formula 9-1

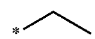

Formula 9-2

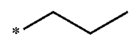

Formula 9-3

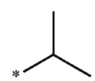

Formula 9-4

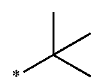

Formula 9-5

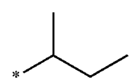

Formula 9-6

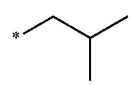

Formula 9-7

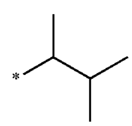

Formula 9-8

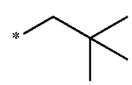

Formula 9-9

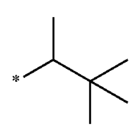

Formula 9-10

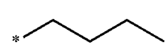

Formula 9-11

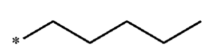

Formula 9-12

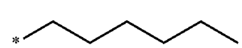

Formula 9-13

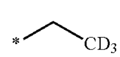

Formula 9-14

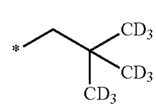

-continued
Formula 9-15
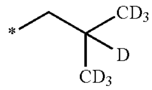
Formula 9-16
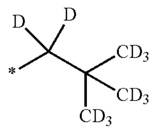
Formula 9-17
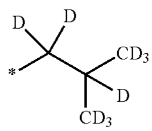
Formula 10-1
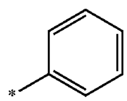
Formula 10-2
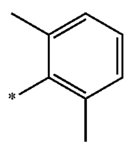
Formula 10-3
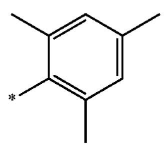
Formula 10-4
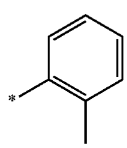
Formula 10-5
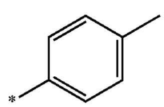
Formula 10-6
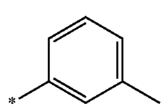
Formula 10-7
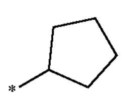
Formula 10-8
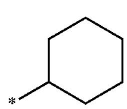
Formula 10-9
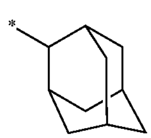
Formula 10-10
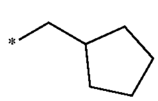
-continued
Formula 10-11
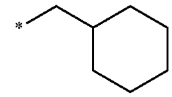
Formula 10-12
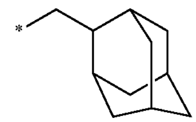
Formula 10-13
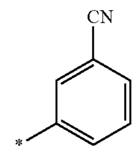
Formula 10-14
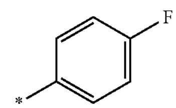
Formula 10-15
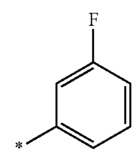
Formula 10-16
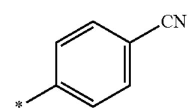
Formula 10-17
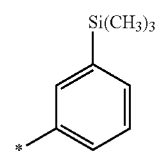
Formula 10-18
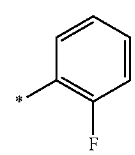
Formula 10-19
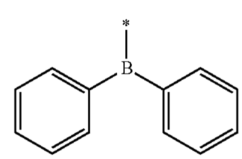
Formula 10-20
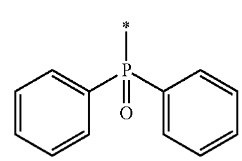
Formula 10-21
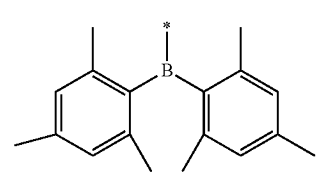

-continued

Formula 10-22

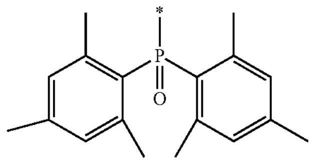

Formula 10-23

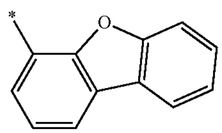

Formula 10-24

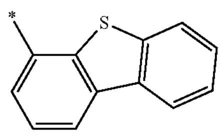

Formula 10-25

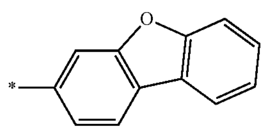

Formula 10-26

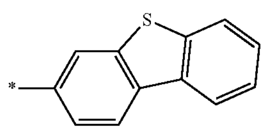

Formula 10-27

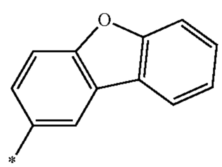

Formula 10-28

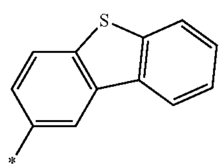

Formula 10-29

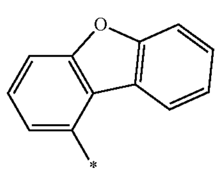

Formula 10-30

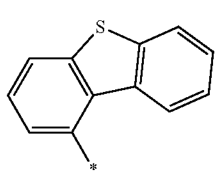

In Formulae 9-1 to 9-17 and 10-1 to 10-30, * is a binding site to a neighboring atom.

In Formula 2A, b1 is an integer selected from 0 to 3, and b4 is an integer selected from 1 to 4.

In some embodiments, $R_{21}$ to $R_{23}$ in $X_1$ of Formula 2A are each independently selected from a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyridinyl group, a pyrimidinyl group, and a triazinyl group;

a $C_1$-$C_{20}$ alkyl group and a $C_1$-$C_{20}$ alkoxy group, each substituted with at least one selected from a deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a cyclopentyl group, a cyclohexyl group, a cycloheptyl group, a cyclooctyl group, an adamantanyl group, norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyridinyl group, a pyrimidinyl group, and a triazinyl group, each substituted with at least one selected from a deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, and a naphthyl group.

In Formula 2A, b1 indicates the number of $R_{11}$, when b1 is 2 or more, 2 or more $R_{11}$ are identical or different, and b4 indicates the number of $—Si(R_1)(R_2)(R_3)$, when b4 is 2 or more, 2 or more $—Si(R_1)(R_2)(R_3)$ are identical or different.

In some embodiments, in Formula 2A, b1 may be 0, 1 or 2, and b4 may be 1 or 2, but they are not limited thereto.

In some embodiments, in Formula 2A, b1 may be 0 or 1, and b4 may be 1, but they are not limited thereto.

Regarding Formula 2A, two or more $R_{11}$s may be optionally linked to each other to form a saturated or unsaturated $C_4$-$C_{60}$ ring (for example, a cyclopentane, a cyclohexane, an adamantane, a norbornane, a benzene, a pyridine, a pyrimidine, a naphthalene, a pyrene, or a chrysene), two or more of $R_{41}$ to $R_{44}$ may be optionally linked to each other to form a saturated or unsaturated $C_4$-$C_{60}$ ring (for example, a cyclopentane, a cyclohexane, an adamantane, a norbornane, a benzene, a pyridine, a pyrimidine, a naphthalene, a pyrene, or a chrysene), and two or more of $R_{45}$ to $R_{48}$ may be optionally linked to each other to form a saturated or unsaturated $C_4$-$C_{60}$ ring (for example, a cyclopentane, a cyclohexane, an adamantane, a norbornane, a benzene, a pyridine, a pyrimidine, a naphthalene, a pyrene, or a chrysene).

For example, two $R_{11}$s in Formula 2A may bind to each other to form a substituted or unsubstituted a cyclohexane or a substituted or unsubstituted a benzene, but embodiments are not limited thereto.

In some embodiments, none of $Y_1$ to $Y_8$ in Formula 2A may be N.

In some embodiments, $Y_1$ or $Y_3$ in Formula 2A may be N.

In some embodiments, $Y_5$ or $Y_6$ in Formula 2A may be N.

In some embodiments, one or two of $Y_1$, $Y_3$, $Y_5$, and $Y_6$ in Formula 2A may be N
In some embodiments, $L_1$ in Formula 1 may be selected from ligands represented by Formula 2A-1 to 2A-16 below:
Formula 2A-1
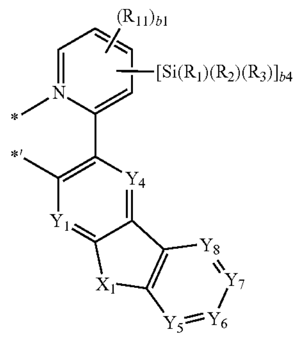
Formula 2A-2
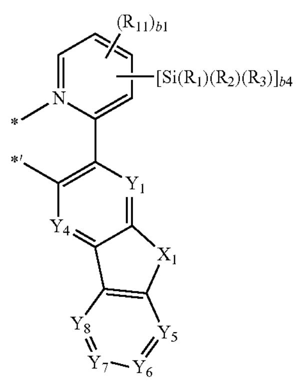
Formula 2A-3
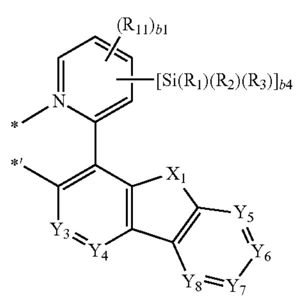
Formula 2A-4
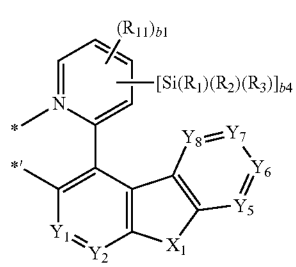
-continued
Formula 2A-5
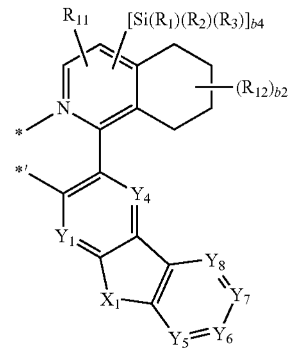
Formula 2A-6
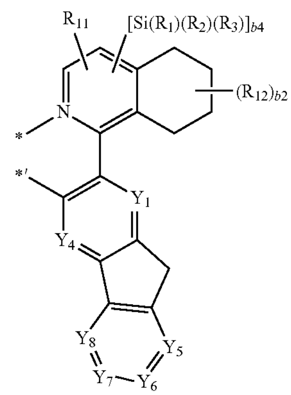
Formula 2A-7
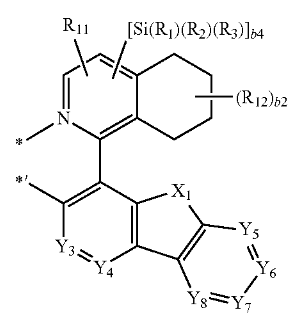
Formula 2A-8
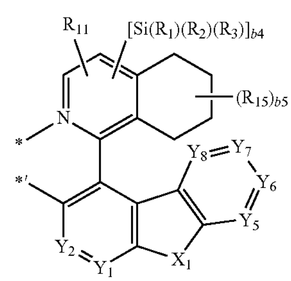

-continued
Formula 2A-9
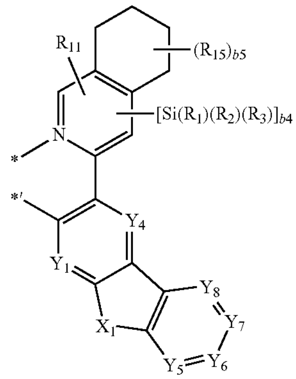
Formula 2A-10
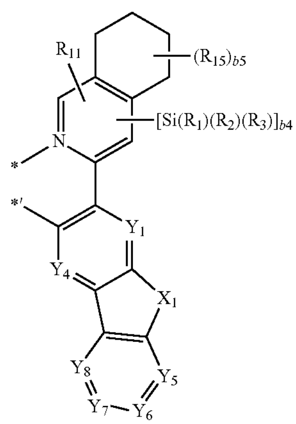
Formula 2A-11
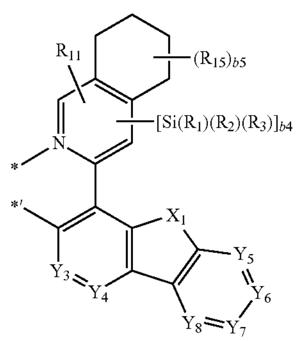
Formula 2A-12
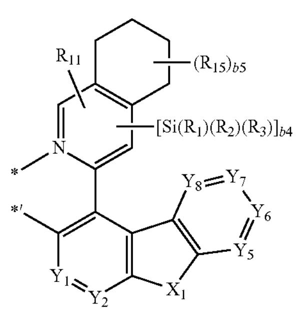
-continued
Formula 2A-13
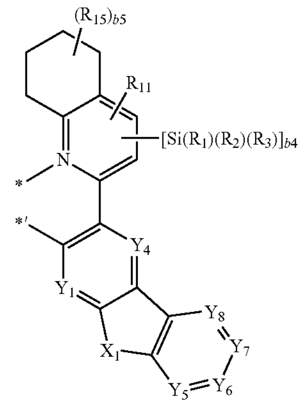
Formula 2A-14
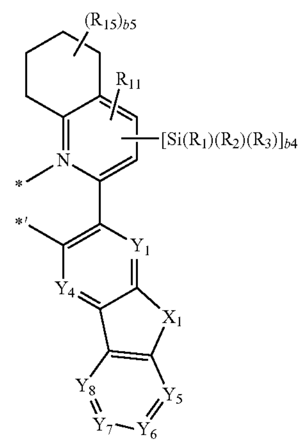
Formula 2A-15
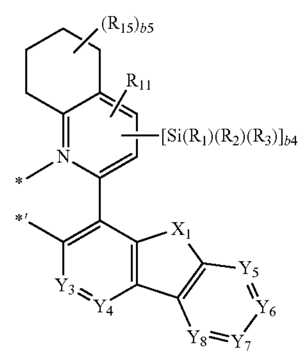
Formula 2A-16
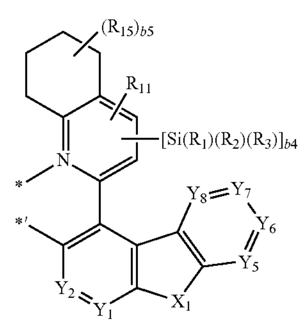
Regarding Formulae 2A-1 to 2A-16, descriptions of $R_1$ to $R_3$, $X_1$, $Y_1$ to $Y_8$, $R_{11}$, b1 and b4 are the same as described above, descriptions of $R_{15}$ are the same as described in connection with $R_{11}$, b5 is an integer selected from 0 to 8, and * and *' are binding sites to M in Formula 1.

In some embodiments, in Formulae 2A-1 to 2A-16, $Y_1$ may be $C(R_{41})$, $Y_2$ may be $C(R_{42})$, $Y_3$ may be $C(R_{43})$, $Y_4$ may be $C(R_{44})$, $Y_5$ may be $C(R_{45})$, $Y_6$ may be $C(R_{46})$, $Y_7$ may be $C(R_{47})$, and $Y_8$ may be $C(R_{48})$;

in Formulae 2A-1, 2A-2, 2A-4, 2A-5, 2A-6, 2A-8, 2A-9, 2A-10, 2A-12, 2A-13, 2A-14, and 2A-16, $Y_1$ may be N, $Y_4$ may be $C(R_{44})$, $Y_5$ may be $C(R_{45})$, $Y_6$ may be $C(R_{46})$, $Y_7$ may be $C(R_{47})$, and $Y_8$ may be $C(R_{48})$;

in Formulae 2A-1, 2A-2, 2A-4, 2A-5, 2A-6, 2A-8, 2A-9, 2A-10, 2A-12, 2A-13, 2A-14, and 2A-16, $Y_1$ may be $C(R_{41})$, $Y_4$ may be $C(R_{44})$, $Y_5$ may be N, $Y_6$ may be $C(R_{46})$, $Y_7$ may be $C(R_{47})$, and $Y_8$ may be $C(R_{48})$;

in Formulae 2A-1, 2A-2, 2A-4, 2A-5, 2A-6, 2A-8, 2A-9, 2A-10, 2A-12, 2A-13, 2A-14, and 2A-16, $Y_1$ may be $C(R_{41})$, $Y_4$ may be $C(R_{44})$, $Y_5$ may be $C(R_{45})$, $Y_6$ may be N, $Y_7$ may be $C(R_{47})$, and $Y_8$ may be $C(R_{48})$;

in Formulae 2A-1, 2A-2, 2A-4, 2A-5, 2A-6, 2A-8, 2A-9, 2A-10, 2A-12, 2A-13, 2A-14, and 2A-16, $Y_1$ may be N, $Y_4$ may be $C(R_{44})$, $Y_5$ may be N, $Y_6$ may be $C(R_{46})$, $Y_7$ may be $C(R_{47})$, and $Y_8$ may be $C(R_{48})$;

in Formulae 2A-1, 2A-2, 2A-4, 2A-5, 2A-6, 2A-8, 2A-9, 2A-10, 2A-12, 2A-13, 2A-14, and 2A-16, $Y_1$ may be N, $Y_4$ may be $C(R_{44})$, $Y_5$ may be $C(R_{45})$, $Y_6$ may be N, $Y_7$ may be $C(R_{47})$, and $Y_8$ may be $C(R_{48})$;

in Formulae 2A-3, 2A-7, 2A-11, and 2A-15, $Y_3$ may be N, $Y_4$ may be $C(R_{44})$, $Y_5$ may be $C(R_{45})$, $Y_6$ may be $C(R_{46})$, $Y_7$ may be $C(R_{47})$, and $Y_8$ may be $C(R_{48})$;

in Formulae 2A-3, 2A-7, 2A-11, and 2A-15, $Y_3$ may be $C(R_{43})$, $Y_4$ may be $C(R_{44})$, $Y_5$ may be N, $Y_6$ may be $C(R_{46})$, $Y_7$ may be $C(R_{47})$, and $Y_8$ may be $C(R_{48})$;

in Formulae 2A-3, 2A-7, 2A-11, and 2A-15, $Y_3$ may be $C(R_{43})$, $Y_4$ may be $C(R_{44})$, $Y_5$ may be $C(R_{45})$, $Y_6$ may be N, $Y_7$ may be $C(R_{47})$, and $Y_8$ may be $C(R_{48})$;

in Formulae 2A-3, 2A-7, 2A-11, and 2A-15, $Y_3$ may be N, $Y_4$ may be $C(R_{44})$, $Y_5$ may be N, $Y_6$ may be $C(R_{46})$, $Y_7$ may be $C(R_{47})$, and $Y_8$ may be $C(R_{48})$;

in Formulae 2A-3, 2A-7, 2A-11, and 2A-15, $Y_3$ may be N, $Y_4$ may be $C(R_{44})$, $Y_5$ may be $C(R_{45})$, $Y_6$ may be N, $Y_7$ may be $C(R_{47})$, and $Y_8$ may be $C(R_{48})$, but they are not limited thereto.

In this regard, a maximum luminance wavelength decreases in this following order: i) an organometallic compound using the ligand represented by Formula 2A-4, 2A-8, 2A-12 or 2A-16 ii) an organometallic compound using the ligand represented by Formula 2A-2, 2A-6, 2A-10 or 2A-14 iii) an organometallic compound using the ligand represented by Formula 2A-3, 2A-7, 2A-11 or 2A-15 and iv) an organometallic compound using the ligand represented by Formula 2A-1, 2A-5, 2A-9 or 2A-13. That is, a maximum luminance wavelength of the organometallic compound using the ligand represented by Formula 2A-1, 2A-5, 2A-9 or 2A-13 among Formulae 2A-1 to 2A-16 is the smallest.

In some embodiments, $L_1$ in Formula 1 may be selected from ligands represented by Formulae 2AA-1, 2AA-2, 2AA-3, 2AA-4 and 2AB below. When $L_1$ in Formula 1 is selected from ligands represented by Formulae 2AA-1 and 2AB, an organic light-emitting device using the organometallic compound represented by Formula 1 may have high efficiency and a long life span.

Formula 2AA-1

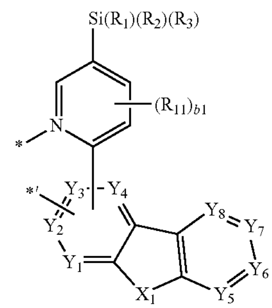

Formula 2AA-2

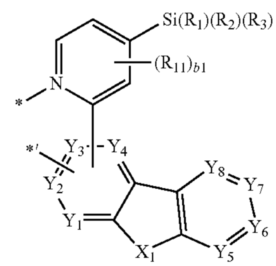

Formula 2AA-3

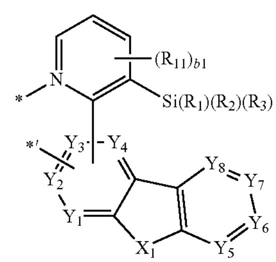

Formula 2AA-4

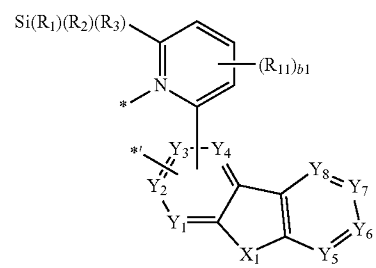

Formula 2AB

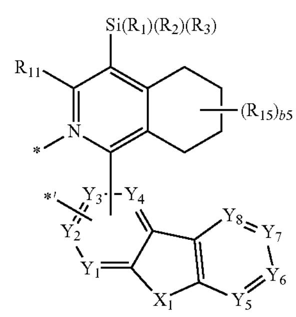

Regarding Formulae 2AA-1, 2AA-2, 2AA-3, 2AA-4, and 2AB, $R_1$ to $R_3$, $X_1$, $Y_1$ to $Y_8$, $R_{11}$, and b1 are already described above, $R_{15}$ may be understood by referring to the description of $R_{11}$, b5 is an integer selected from 0 to 8, and each of * and *' indicates a binding site to M in Formula 1.

For example, in Formulae 2A-1 to 2A-16, 2AA-1, 2AA-2, 2AA-3, 2AA-4, and 2AB, $R_1$ to $R_3$ may be each independently selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, and —$Si(Q_{51})(Q_{52})(Q_{53})$; and an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from a deuterium, a $C_1$-$C_{10}$ alkyl group, and a phenyl group;

$Q_{51}$ to $Q_{53}$ may be each independently selected from

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from a deuterium, a $C_1$-$C_{10}$ alkyl group, and a phenyl group, $X_1$ may be selected from O, S, S(=O)$_2$, N($R_{21}$), and Si($R_{22}$)($R_{23}$), $Y_1$ to $Y_8$ are already described above, $R_{11}$, $R_{15}$, $R_{21}$ to $R_{23}$ and $R_{41}$ to $R_{48}$ may be each independently selected from a hydrogen, a deuterium, —F, a cyano group, a nitro group, —$SF_5$, a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl, norbornanyl group, a norbornenyl, a cyclopentenyl group, a cyclohexenyl group, a cycloheptenyl group, a phenyl group, a naphthyl group, a pyridinyl group, and a pyrimidinyl group;

a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, norbornanyl group, a norbornenyl group, a cyclopentenyl group, a cyclohexenyl group, a cycloheptenyl group, a phenyl group, a naphthyl group, a pyridinyl group, and a pyrimidinyl group, each substituted with at least one selected from a deuterium, —F, —$CD_3$, —$CD_2H$, —$CDH_2$, —$CF_3$, —$CF_2H$, —$CFH_2$, a cyano group, a nitro group, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, norbornanyl group, a norbornenyl group, a cyclopentenyl group, a cyclohexenyl group, a cycloheptenyl group, a phenyl group, a naphthyl group, a pyridinyl group, and a pyrimidinyl group; and —$B(Q_6)(Q_7)$ and —$P(=O)(Q_8)(Q_9)$, $Q_6$ to $Q_9$ may be each independently selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an isopropyl group, an n-butyl group, an isobutyl group, a sec-butyl group, a tert-butyl group, an n-pentyl group, an isopentyl group, a sec-pentyl group, a tert-pentyl group, and a phenyl group, and a naphthyl group, each substituted with at least one selected from a deuterium and a $C_1$-$C_{10}$ alkyl group, b1 may be an integer selected from 0 to 3, b4 may be 1 or 2, b5 may be an integer selected from 0 to 8, but they are not limited thereto.

In some embodiments, $L_1$ in Formula 1 may be selected from ligands represented by Formulae 2A(1) to 2A(40) below:

Formula 2A(1)

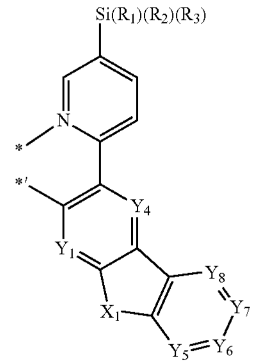

-continued
Formula 2A(2)
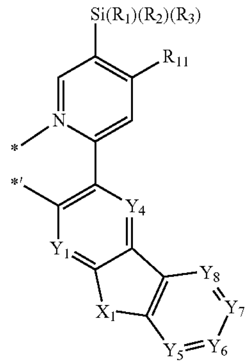
Formula 2A(3)
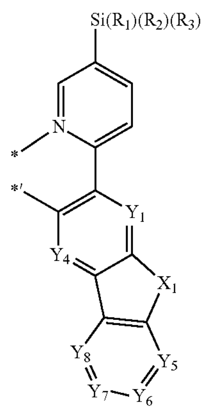
Formula 2A(4)
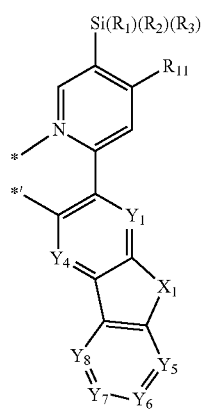
Formula 2A(5)
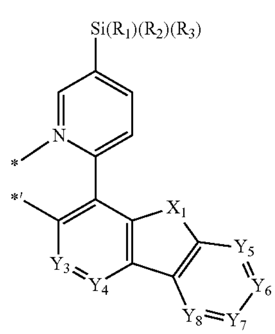
-continued
Formula 2A(6)
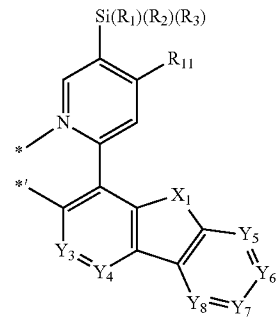
Formula 2A(7)
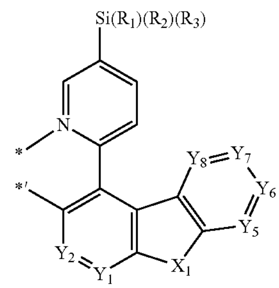
Formula 2A(8)
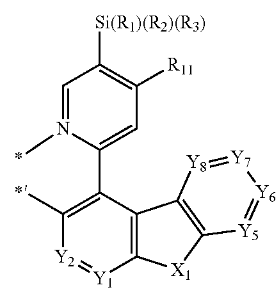
Formula 2A(9)
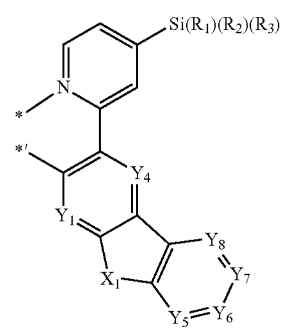
Formula 2A(10)
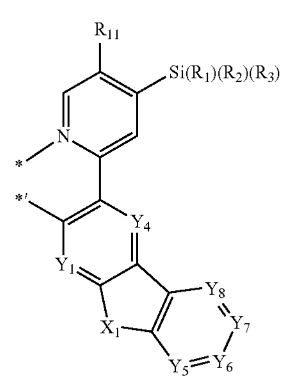

-continued
Formula 2A(11)
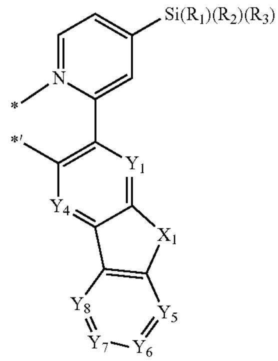
Formula 2A(12)
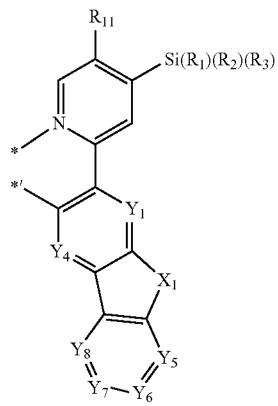
Formula 2A(13)
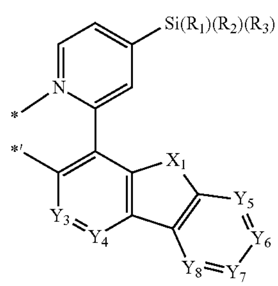
Formula 2A(14)
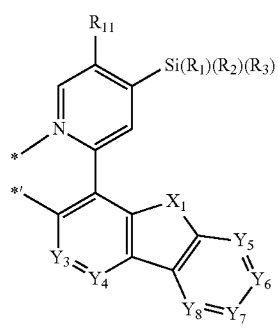
Formula 2A(15)
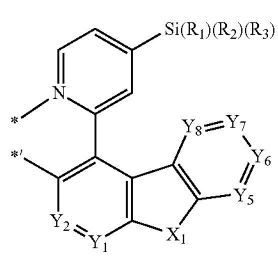
-continued
Formula 2A(16)
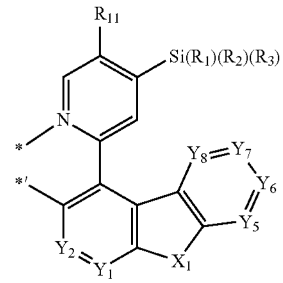
Formula 2A(17)
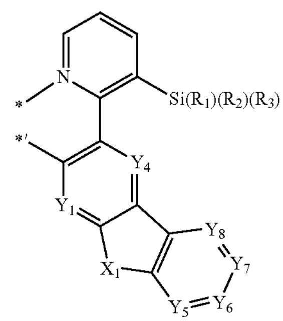
Formula 2A(18)
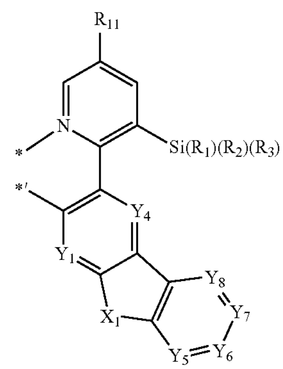
Formula 2A(19)
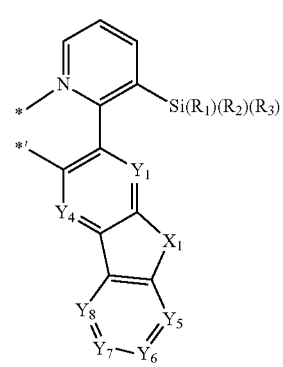

Formula 2A(20)
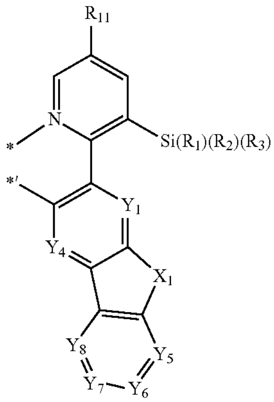
Formula 2A(21)
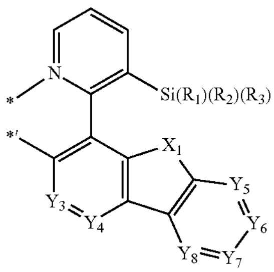
Formula 2A(22)
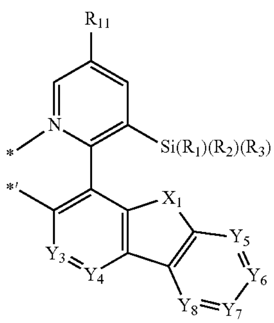
Formula 2A(23)
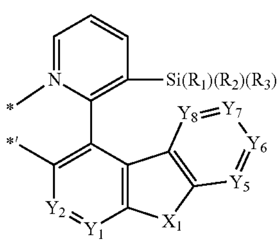
Formula 2A(24)
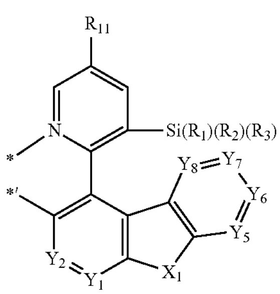
Formula 2A(25)
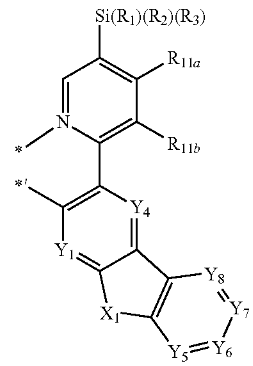
Formula 2A(26)
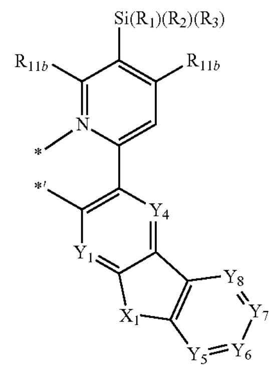
Formula 2A(27)
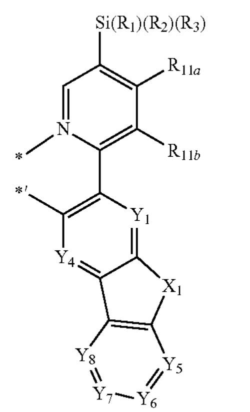
Formula 2A(28)
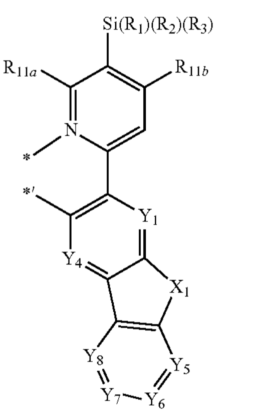

-continued
Formula 2A(29)
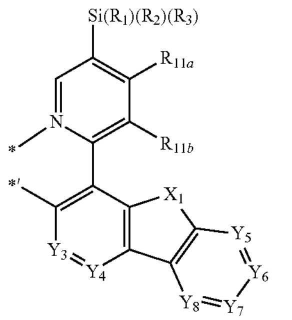
Formula 2A(30)
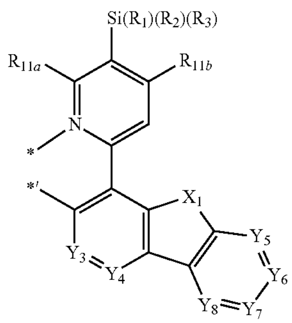
Formula 2A(31)
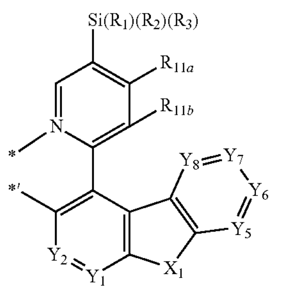
Formula 2A(32)
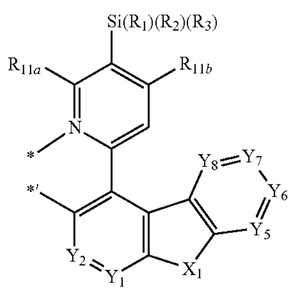
Formula 2A(33)
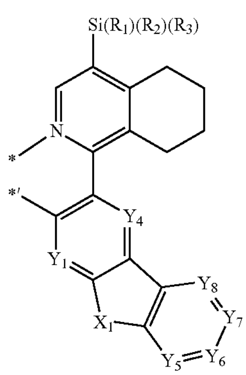
-continued
Formula 2A(34)
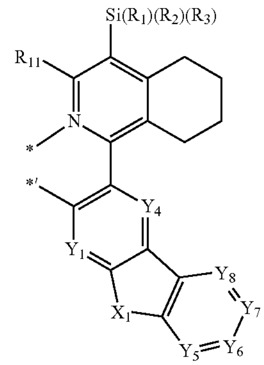
Formula 2A(35)
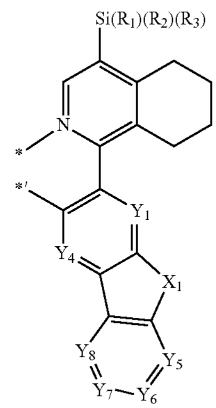
Formula 2A(36)
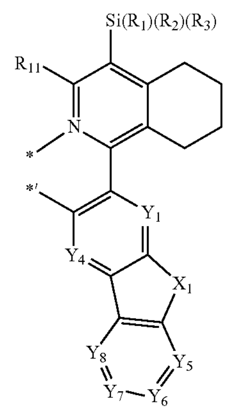
Formula 2A(37)
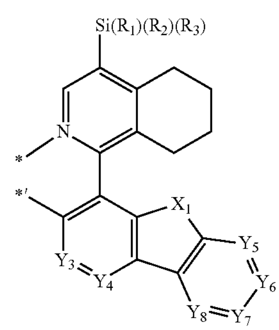

-continued

Formula 2A(38)

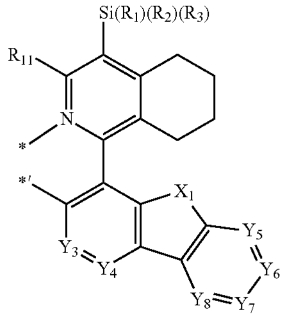

Formula 2A(39)

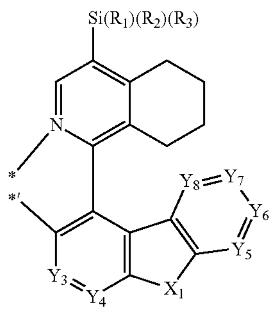

Formula 2A(40)

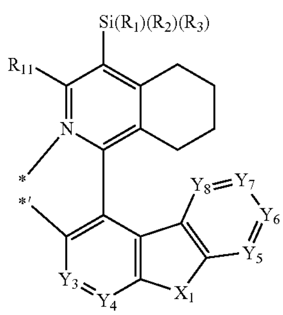

Regarding Formulae 2A(1) to 2A(40), $R_1$ to $R_3$, $Y_1$ to $Y_8$, and $R_{11}$ are already described above, $R_{11a}$ and $R_{11b}$ may be understood by referring to the description of $R_{11}$, and each of * and *' indicates a binding site to M in Formula 1, provided that $R_{11}$, $R_{11a}$, and $R_{11b}$ are not hydrogen.

In some embodiments, in Formulae 2A(1) to 2A(40), $Y_1$ may be $C(R_{41})$, $Y_2$ may be $C(R_{42})$, $Y_3$ may be $C(R_{43})$, $Y_4$ may be $C(R_{44})$, $Y_5$ may be $C(R_{45})$, $Y_6$ may be $C(R_{46})$, $Y_7$ may be $C(R_{47})$, and $Y_8$ may be $C(R_{48})$;

in Formulae 2A(1) to 2(4), 2A(7) to 2A(12), 2A(15) to 2A(20), 2A(23) to 2A(28), and 2A(31) to 2A(36), $Y_1$ may be N, $Y_4$ may be $C(R_{44})$, $Y_5$ may be $C(R_{45})$, $Y_6$ may be $C(R_{46})$, $Y_7$ may be $C(R_{47})$, and $Y_8$ may be $C(R_{48})$;

in Formulae 2A(1) to 2(4), 2A(7) to 2A(12), 2A(15) to 2A(20), 2A(23) to 2A(28), and 2A(31) to 2A(36), $Y_1$ may be $C(R_{41})$, $Y_4$ may be $C(R_{44})$, $Y_5$ may be N, $Y_6$ may be $C(R_{46})$, $Y_7$ may be $C(R_{47})$, and $Y_8$ may be $C(R_{48})$;

in Formulae 2A(1) to 2(4), 2A(7) to 2A(12), 2A(15) to 2A(20), 2A(23) to 2A(28), and 2A(31) to 2A(36), $Y_1$ may be $C(R_{41})$, $Y_4$ may be $C(R_{44})$, $Y_5$ may be $C(R_{45})$, $Y_6$ may be N, $Y_7$ may be $C(R_{47})$, and $Y_8$ may be $C(R_{48})$;

in Formulae 2A(1) to 2(4), 2A(7) to 2A(12), 2A(15) to 2A(20), 2A(23) to 2A(28), and 2A(31) to 2A(36), $Y_1$ may be N, $Y_4$ may be $C(R_{44})$, $Y_5$ may be N, $Y_6$ may be $C(R_{46})$, $Y_7$ may be $C(R_{47})$, and $Y_8$ may be $C(R_{48})$;

in Formulae 2A(1) to 2(4), 2A(7) to 2A(12), 2A(15) to 2A(20), 2A(23) to 2A(28), and 2A(31) to 2A(36), $Y_1$ may be N, $Y_4$ may be $C(R_{44})$, $Y_5$ may be $C(R_{45})$, $Y_6$ may be N, $Y_7$ may be $C(R_{47})$, and $Y_8$ may be $C(R_{48})$;

in Formulae 2A(5), 2A(6), 2A(13), 2A(14), 2A(21), 2A(22), 2A(29), 2A(30), 2A(37), and 2A(38), $Y_3$ may be N, $Y_4$ may be $C(R_{44})$, $Y_5$ may be $C(R_{45})$, $Y_6$ may be $C(R_{46})$, $Y_7$ may be $C(R_{47})$, and $Y_8$ may be $C(R_{48})$;

in Formula 2A(5), 2A(6), 2A(13), 2A(14), 2A(21), 2A(22), 2A(29), 2A(30), 2A(37), and 2A(38), $Y_3$ may be $C(R_{43})$, $Y_4$ may be $C(R_{44})$, $Y_5$ may be N, $Y_6$ may be $C(R_{46})$, $Y_7$ may be $C(R_{47})$, and $Y_8$ may be $C(R_{48})$;

in Formulae 2A(5), 2A(6), 2A(13), 2A(14), 2A(21), 2A(22), 2A(29), 2A(30), 2A(37), 2A(38), $Y_3$ may be $C(R_{43})$, $Y_4$ may be $C(R_{44})$, $Y_5$ may be $C(R_{45})$, $Y_6$ may be N, $Y_7$ may be $C(R_{47})$, and $Y_8$ may be $C(R_{48})$;

in Formulae 2A(5), 2A(6), 2A(13), 2A(14), 2A(21), 2A(22), 2A(29), 2A(30), 2A(37), and 2A(38), $Y_3$ may be N, $Y_4$ may be $C(R_{44})$, $Y_5$ may be N, $Y_6$ may be $C(R_{46})$, $Y_7$ may be $C(R_{47})$, and $Y_8$ may be $C(R_{48})$; or in Formulae 2A(5), 2A(6), 2A(13), 2A(14), 2A(21), 2A(22), 2A(29), 2A(30), 2A(37), and 2A(38), $Y_3$ may be N, $Y_4$ may be $C(R_{44})$, $Y_5$ may be $C(R_{45})$, $Y_6$ may be N, $Y_7$ may be $C(R_{47})$, and $Y_8$ may be $C(R_{48})$, but they are not limited thereto.

For example, in Formulae 2A(1) to 2A(40), $R_1$ to $R_3$ may be each independently selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, and —$Si(Q_{51})(Q_{52})(Q_{53})$; and an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from a deuterium, a $C_1$-$C_{10}$ alkyl group, and a phenyl group;

$Q_{51}$ to $Q_{53}$ may be each independently selected from

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from a deuterium, a $C_1$-$C_{10}$ alkyl group, and a phenyl group, $X_1$ may be selected from O, S, $S(=O)_2$, $N(R_{21})$, and $Si(R_{22})(R_{23})$, $Y_1$ to $Y_8$ are already described above, $R_{11}$, $R_{11a}$, $R_{11b}$, $R_{21}$ to $R_{23}$ and $R_{41}$ to $R_{48}$ are each independently selected from a hydrogen, a deuterium, —F, a cyano group, a nitro group, —$SF_5$, a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl, norbornanyl group, a norbornenyl, a cyclopentenyl group, a cyclohexenyl group, a cycloheptenyl group, a phenyl group, a naphthyl group, a pyridinyl group, and a pyrimidinyl group;

a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, norbornanyl group, a norbornenyl group, a cyclopentenyl group, a cyclohexenyl group, a cycloheptenyl group, a phenyl group, a naphthyl group, a pyridinyl group, and a pyrimidinyl group, each substituted with at least one selected from a deuterium, —F, —$CD_3$, —$CD_2H$, —$CDH_2$, —$CF_3$, —$CF_2H$, —$CFH_2$, a cyano group, a nitro group, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, norbornanyl group, a norbornenyl group, a cyclopentenyl group, a cyclohexenyl group, a cycloheptenyl group, a phenyl group, a naphthyl group, a pyridinyl group, and a pyrimidinyl group; and —$B(Q_6)(Q_7)$, and —$P(=O)(Q_8)(Q_9)$ (provided that, $R_{11}$, $R_{11a}$, and $R_{11b}$ in Formulae 2A(1) to 2A(40) is not a hydrogen), $Q_6$ to $Q_9$ may be each independently selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from a deuterium and a $C_1$-$C_{10}$ alkyl group, but embodiments are not limited thereto.

In some embodiments, regarding Formulae 2A(1) to 2A(40), $R_1$ to $R_3$ may be each independently selected from —CHs, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, and —$Si(Q_{51})(Q_{52})(Q_{53})$; and an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from a deuterium, a $C_1$-$C_{10}$ alkyl group, and a phenyl group;

$Q_{51}$ to $Q_{53}$ may be each independently selected from

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from a deuterium, a $C_1$-$C_{10}$ alkyl group, and a phenyl group, $X_1$ may be selected from O, S, $S(=O)_2$, $N(R_{21})$, and $Si(R_{22})(R_{23})$, $Y_1$ to $Y_8$ are already described above, $R_{11}$, $R_{11a}$, $R_{11b}$ and $R_{41}$ to $R_{48}$ may be selected from a deuterium, —F, a cyano group, a nitro group, —$SF_5$, —$CH_3$, —$CD_3$, —$CD_2H$, —$CDH_2$, —$CF_3$, —$CF_2H$, —$CFH_2$, groups represented by Formulae 9-1 to 9-17, and groups represented by Formulae 10-1 to 10-30, $R_{21}$ to $R_{23}$ are each independently selected from a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyridinyl group, a pyrimidinyl group, and a triazinyl group;

a $C_1$-$C_{20}$ alkyl group and a $C_1$-$C_{20}$ alkoxy group, each substituted with at least one selected from a deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof; and a cyclopentyl group, a cyclohexyl group, a cycloheptyl group, a cyclooctyl group, an adamantanyl group, norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyridinyl group, a pyrimidinyl group, and a triazinyl group, each substituted with at least one selected from a deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, and a naphthyl group, but are not limited thereto.

$L_2$ in Formula 1 may be selected from ligands represented by Formulae 3A to 3G:

Formula 3A

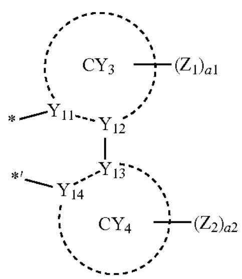

Formula 3B

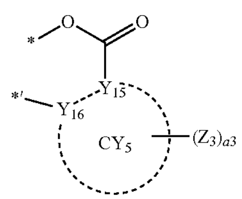

Formula 3C

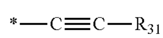

Formula 3D

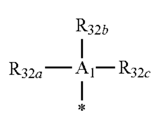

Formula 3E

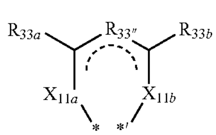

Formula 3F

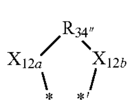

Formula 3G

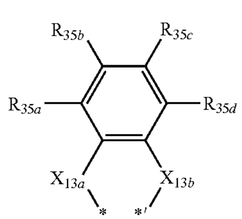

wherein in Formulae 3A to 3G, $Y_{11}$ to $Y_{16}$ are each independently carbon (C) or nitrogen (N), $Y_{11}$ and $Y_{12}$ are linked to each other by a single bond or a double bond, $Y_{13}$ and $Y_{14}$ are linked to each other by a single bond or a double bond, and $Y_{15}$ and $Y_{16}$ are linked to each other by a single bond or a double bond, $CY_3$ to $CY_5$ are each independently selected from a $C_5$-$C_{60}$ carbocyclic group and a $C_2$-$C_{60}$ heterocyclic group ("a monocyclic group" or "polycyclic group", respectively).

a1 to a3 are each independently an integer selected from 1 to 5 and $CY_3$ and $CY_4$ may be optionally additionally linked to each other via an organic linking group, $A_1$ is P or As;

$X_{11a}$, $X_{11b}$, $X_{12a}$, $X_{12b}$, $X_{13a}$, and $X_{13b}$ may be each independently selected from N, O, $N(R_{34})$, $P(R_{35})(R_{36})$, and $As(R_{37})(R_{38})$ (provided that none of $X_{12a}$, $X_{12b}$, $X_{13a}$, and $X_{13b}$ are N or O);

$R_{33''}$ and $R_{34''}$ are each independently selected from a single bond, a double bond, a substituted or unsubstituted $C_1$-$C_5$ alkylene group, a substituted or unsubstituted $C_2$-$C_5$ alkenylene group, and a substituted or unsubstituted $C_6$-$C_{10}$ arylene group;

$Z_1$ to $Z_3$, $R_{31}$, $R_{32a}$, $R_{32b}$, $R_{32c}$, $R_{33a}$, $R_{33b}$, $R_{34}$ to $R_{38}$, $R_{35a}$, $R_{35b}$, $R_{35c}$, and $R_{35d}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—N(Q_1)(Q_2)$, $—Si(Q_3)(Q_4)(Q_5)$, $—B(Q_6)(Q_7)$, and $—P(=O)(Q_8)(Q_9)$,

* and *' each indicate binding sites to M in Formula 1;

at least one of substituents of the substituted $C_1$-$C_5$ alkylene group, substituted $C_2$-$C_5$ alkenylene group, substituted $C_6$-$C_{10}$ arylene group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group and substituted monovalent non-aromatic condensed heteropolycyclic group is selected from a deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{60}$ heterocycloalkyl group, a $C_3$-$C_{10}$ cycloalkenyl group, a $C_1$-$C_{60}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), and —P(═O)($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), and —P(═O)($Q_{28}$)($Q_{29}$); and —N($Q_{31}$)($Q_{32}$), —Si($Q_{33}$)($Q_{34}$)($Q_{35}$), —B($Q_{36}$)($Q_{37}$), and —P(═O)($Q_{38}$)($Q_{39}$);

wherein to $Q_1$ to $Q_9$, $Q_{11}$ to $Q_{19}$, $Q_{21}$ to $Q_{29}$, and $Q_{31}$ to $Q_{39}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

According to an embodiment, $CY_3$ to $CY_5$ in Formulae 3A and 3B may be each independently selected from a benzene, a naphthalene, a fluorene, a spiro-fluorene, an indene, a pyrrole, a thiophene, a furan, an imidazole, a pyrazole, a thiazole, an isothiazole, an oxazole, an isoxazole, a pyridine, a pyrazine, a pyrimidine, a pyridazine, a quinoline, an isoquinoline, a benzoquinoline, a quinoxaline, a quinazoline, a carbazole, a benzoimidazole, a benzofuran, a benzothiophene, an isobenzothiophene, a benzoxazole, an isobenzoxazole, a triazole, a tetrazole, an oxadiazole, a triazine, a dibenzofuran, a dibenzothiophene, and 5,6,7,8-tetrahydroisoquinoline, but they are not limited thereto.

In some embodiments, $L_2$ in Formula 1 may be selected from ligands represented by Formulae 3-1 to 3-111, but are not limited thereto:

Formula 3-1

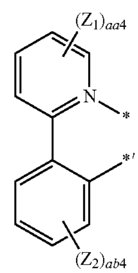

Formula 3-2

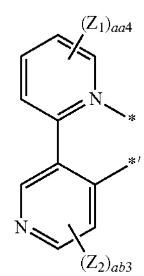

Formula 3-3

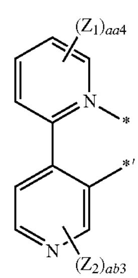

-continued
Formula 3-4
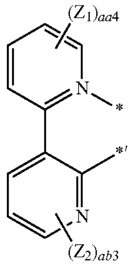
Formula 3-5
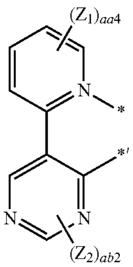
Formula 3-6
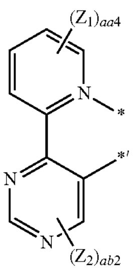
Formula 3-7
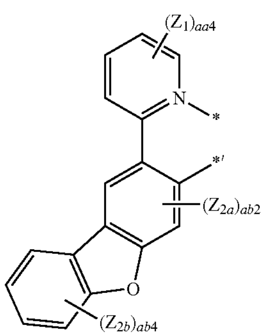
Formula 3-8
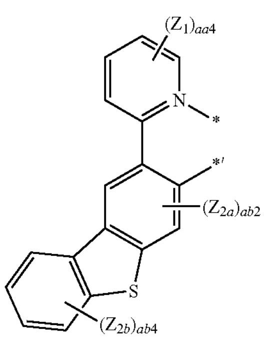
-continued
Formula 3-9
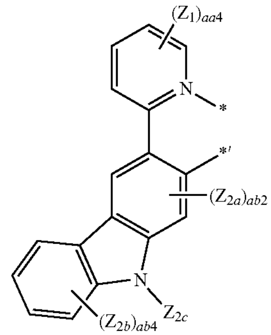
Formula 3-10
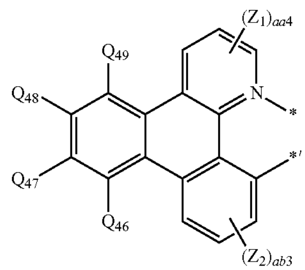
Formula 3-11
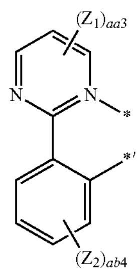
Formula 3-12
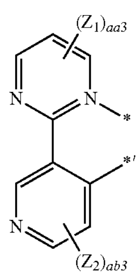
Formula 3-13
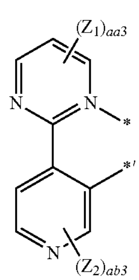

-continued
Formula 3-14
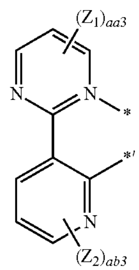
Formula 3-15
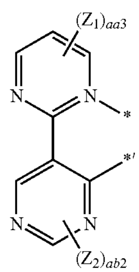
Formula 3-16
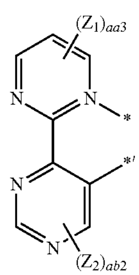
Formula 3-17
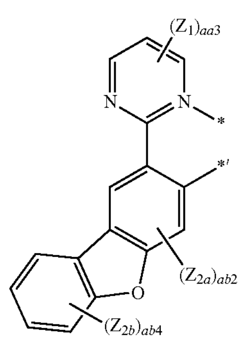
Formula 3-18
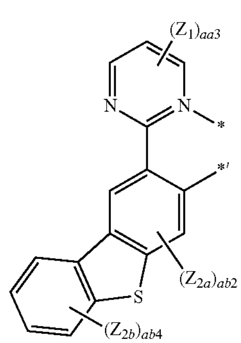
-continued
Formula 3-19
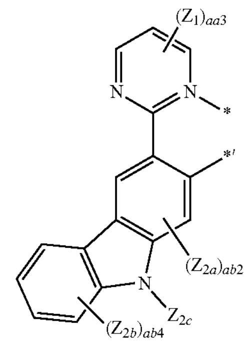
Formula 3-20
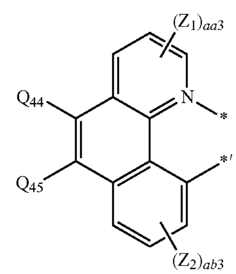
Formula 3-21
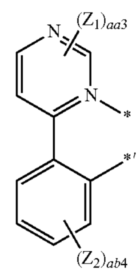
Formula 3-22
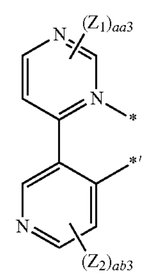
Formula 3-23
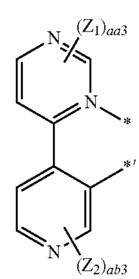

-continued
Formula 3-24
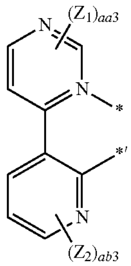
Formula 3-25
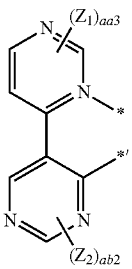
Formula 3-26
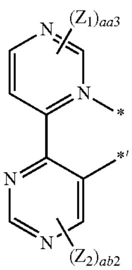
Formula 3-27
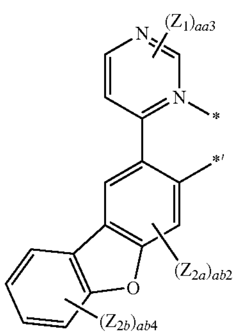
Formula 3-28
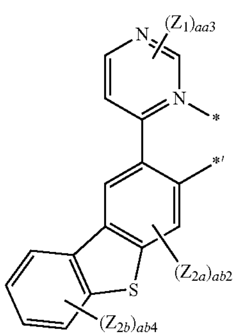
-continued
Formula 3-29
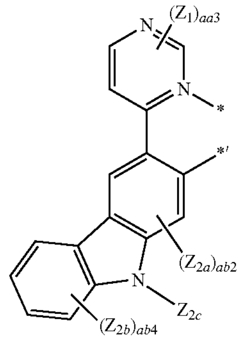
Formula 3-30
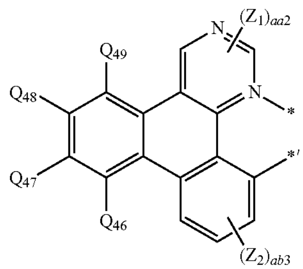
Formula 3-31
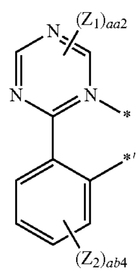
Formula 3-32
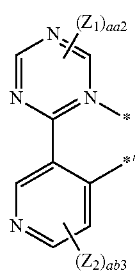
Formula 3-33
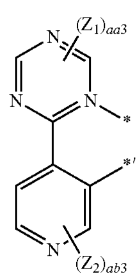

-continued
Formula 3-34
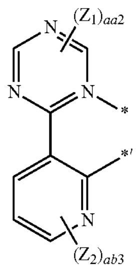
Formula 3-35
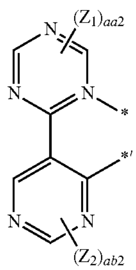
Formula 3-36
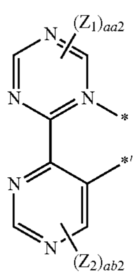
Formula 3-37
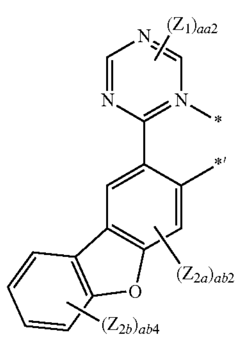
Formula 3-38
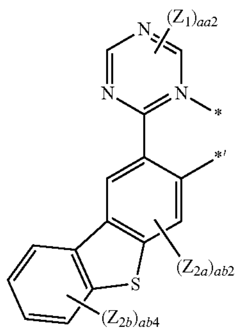
-continued
Formula 3-39
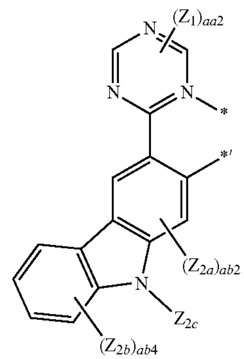
Formula 3-40
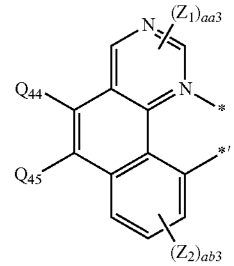
Formula 3-41
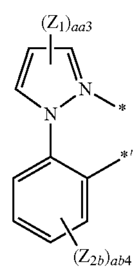
Formula 3-42
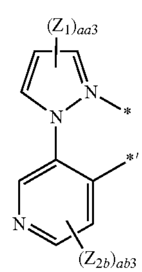
Formula 3-43
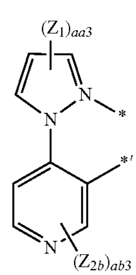

-continued
Formula 3-44
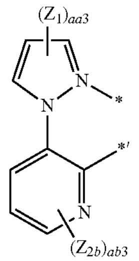
Formula 3-45
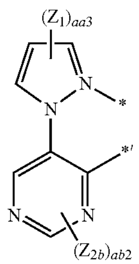
Formula 3-46
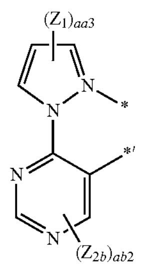
Formula 3-47
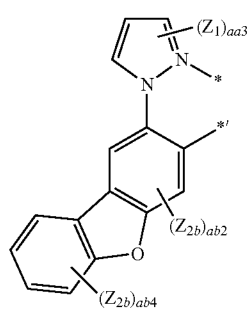
Formula 3-48
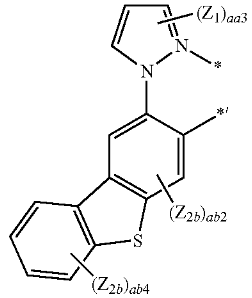
-continued
Formula 3-49
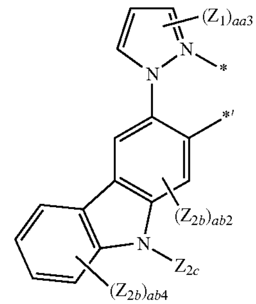
Formula 3-50
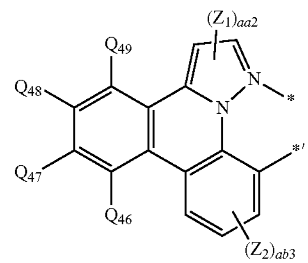
Formula 3-51
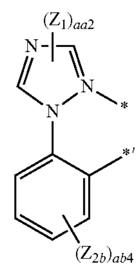
Formula 3-52
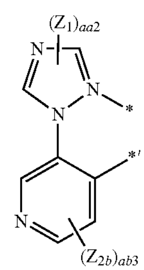
Formula 3-53
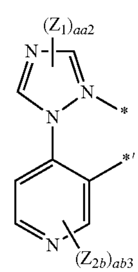
Formula 3-54
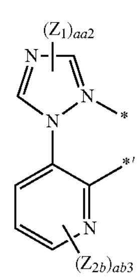

-continued
Formula 3-55
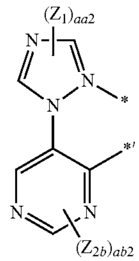
Formula 3-56
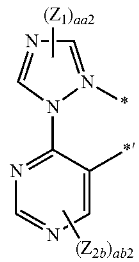
Formula 3-57
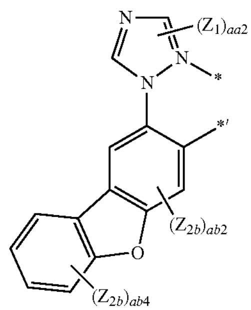
Formula 3-58
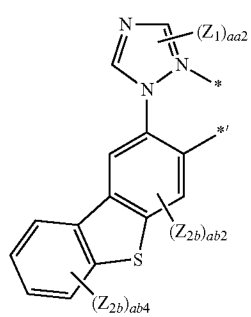
Formula 3-59
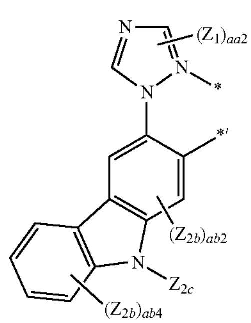
-continued
Formula 3-60
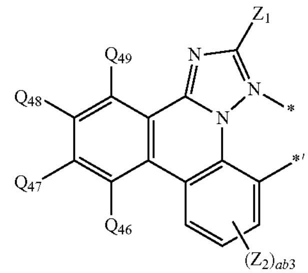
Formula 3-61
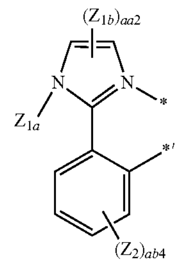
Formula 3-62
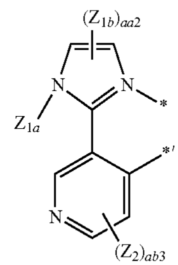
Formula 3-63
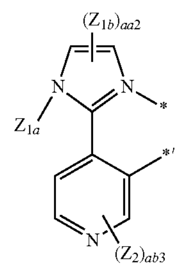
Formula 3-64
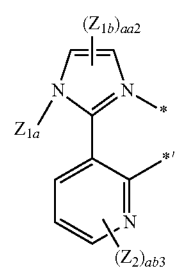
Formula 3-65
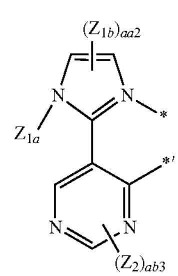

-continued
Formula 3-66
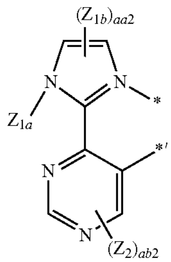
Formula 3-67
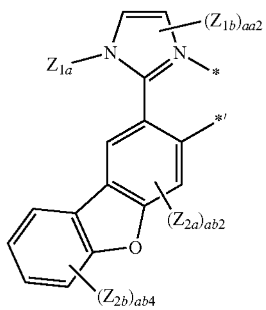
Formula 3-68
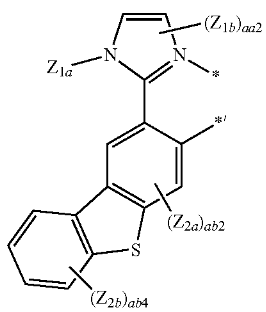
Formula 3-69
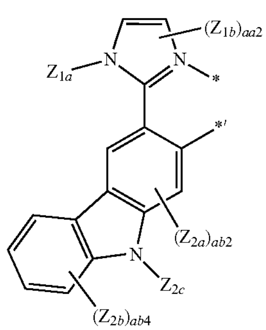
Formula 3-70
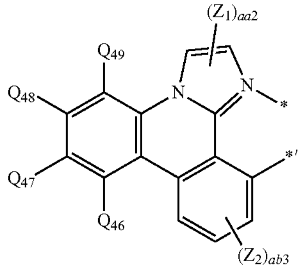
-continued
Formula 3-71
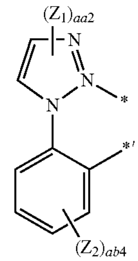
Formula 3-72
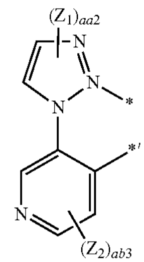
Formula 3-73
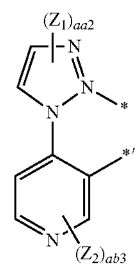
Formula 3-74
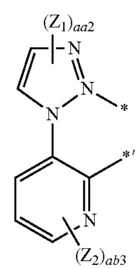
Formula 3-75
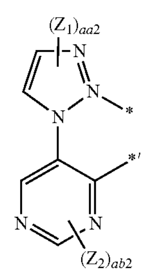
Formula 3-76
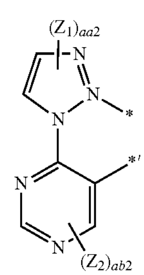

-continued
Formula 3-77
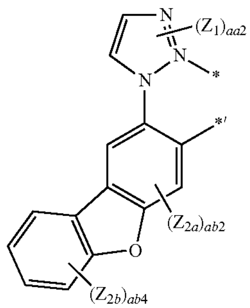
Formula 3-78
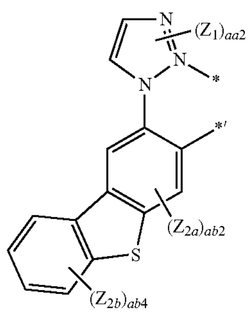
Formula 3-79
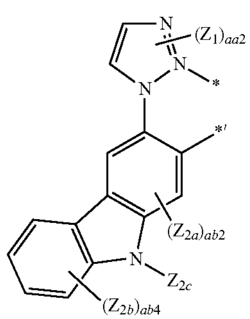
Formula 3-80
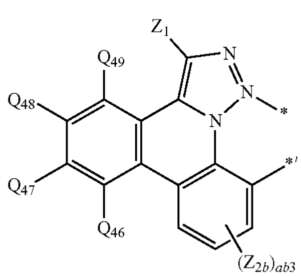
Formula 3-81
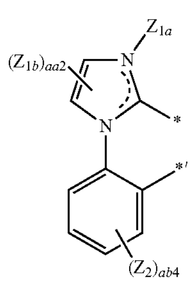
-continued
Formula 3-82
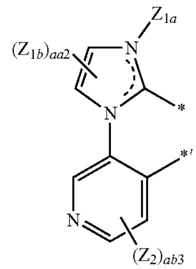
Formula 3-83
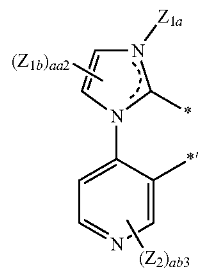
Formula 3-84
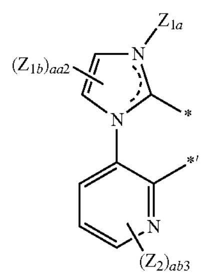
Formula 3-85
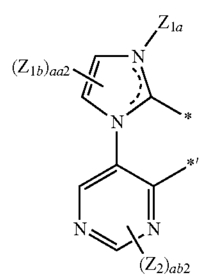
Formula 3-86
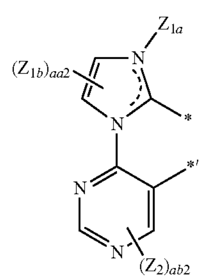

-continued
Formula 3-87
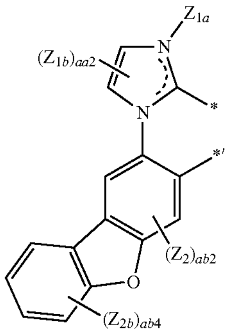
Formula 3-88
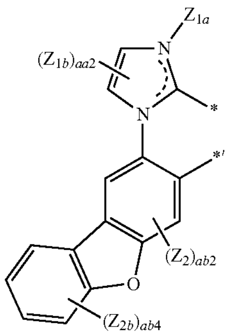
Formula 3-89
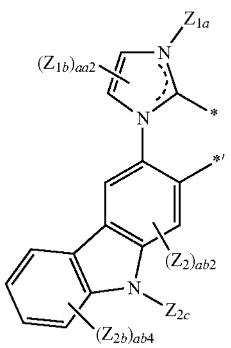
Formula 3-90
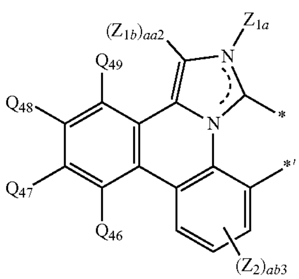
Formula 3-91
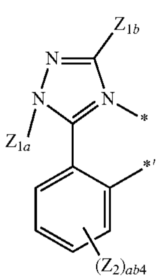
-continued
Formula 3-92
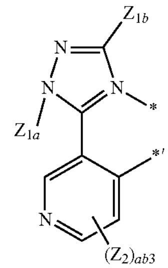
Formula 3-93
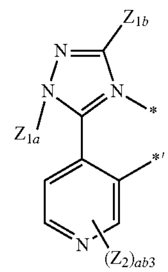
Formula 3-94
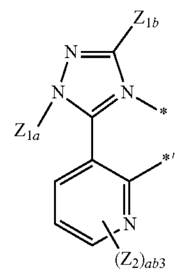
Formula 3-95
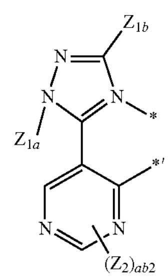
Formula 3-96
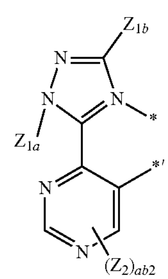

Formula 3-97
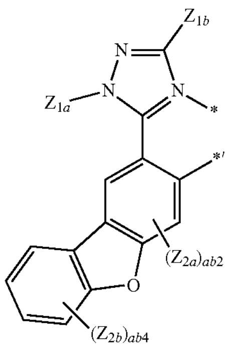
Formula 3-98
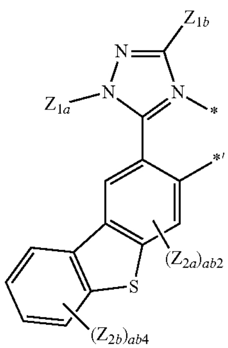
Formula 3-99
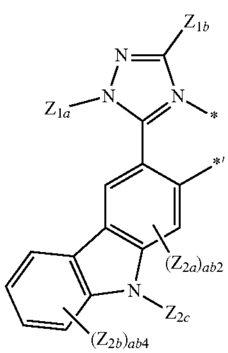
Formula 3-100
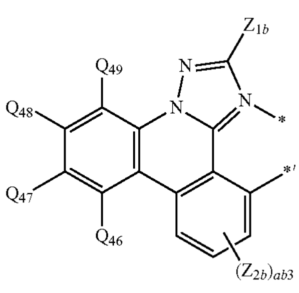
Formula 3-101
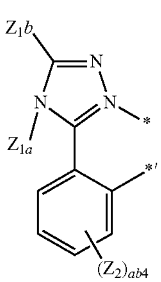
Formula 3-102
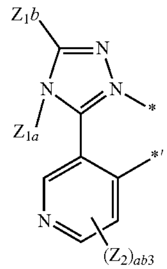
Formula 3-103
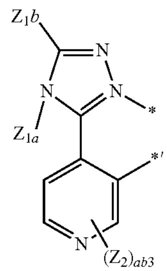
Formula 3-104
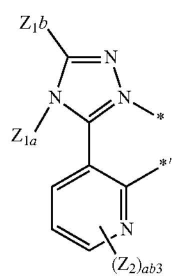
Formula 3-105
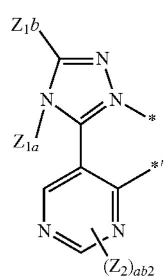
Formula 3-106
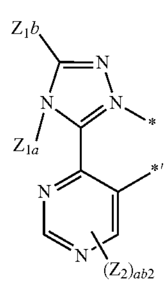

-continued

Formula 3-107

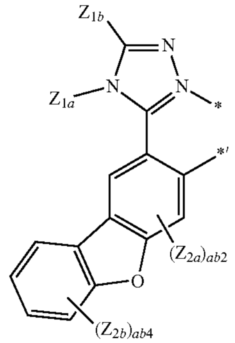

Formula 3-108

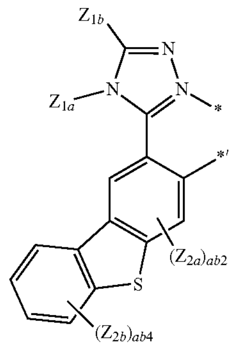

Formula 3-109

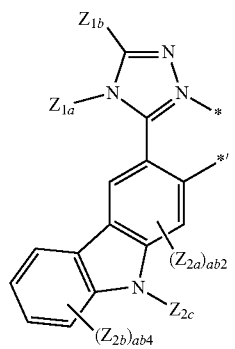

Formula 3-110

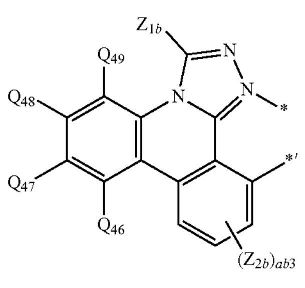

Formula 3-111

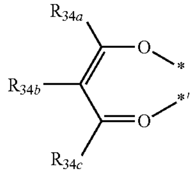

wherein in Formulae 3-1 to 3-111, $Z_1$, $Z_2$, $Z_{1a}$, $Z_{1b}$, $Z_{2a}$, $Z_{2b}$, $Z_{2c}$, $R_{34a}$, $R_{34b}$, and $R_{34c}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from a deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and $—N(Q_1)(Q_2)$, $—Si(Q_3)(Q_4)(Q_5)$, $—B(Q_6)(Q_7)$, and $—P(=O)(Q_8)(Q_9)$;

$Q_1$ to $Q_9$ and $Q_{44}$ to $Q_{49}$ may be each independently selected from $—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, and $—CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an isopropyl group, an n-butyl group, an isobutyl group, a sec-butyl group, a tert-butyl group, an n-pentyl group, an isopentyl group, a sec-pentyl group, a tert-pentyl group, and a phenyl group, and a naphthyl group, each substituted with at least one selected from a deuterium and a $C_1$-$C_{10}$ alkyl group, aa2 and ab2 are each independently 1 or 2, aa3 and ab3 are each independently selected from 1, 2, and 3, aa4 and ab4 may be each independently selected from, 1, 2, 3, and 4, and

* and *' each indicate binding sites to M in Formula 1.

$Z_1$, $Z_2$, $Z_{1a}$, $Z_{1b}$, $Z_{2a}$, $Z_{2b}$, $Z_{2c}$, $R_{34a}$, $R_{34b}$, and $R_{34c}$ in Formulae 3-1 to 3-111 may be each independently selected from a hydrogen, a deuterium, —F, a cyano group, a nitro group, $—SF_5$, a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl, norbornanyl group, a norbornenyl, a cyclopentenyl group, a cyclohexenyl group, a cycloheptenyl group, a phenyl group, a naphthyl group, a pyridinyl group, and a pyrimidinyl group;

a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, norbornanyl group, a norbornenyl group, a cyclopentenyl group, a cyclohexenyl group, a cycloheptenyl group, a phenyl group, a naphthyl group, a pyridinyl group, and a pyrimidinyl group, each substituted with at least one selected from a deuterium, —F, $—CD_3$, $—CD_2H$, $—CDH_2$, $—CF_3$, $—CF_2H$, $—CFH_2$, a cyano group, a nitro group, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, norbornanyl group, a norbornenyl group, a cyclopentenyl group, a cyclohexenyl group, a cycloheptenyl group, a phenyl group, a naphthyl group, a pyridinyl group, and a pyrimidinyl group;

$—N(Q_1)(Q_2)$, $—Si(Q_3)(Q_4)(Q_5)$, $—B(Q_6)(Q_7)$, and $—P(=O)(Q_8)(Q_9)$;

$Q_1$ to $Q_9$ may be each independently selected from $—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, and $—CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from a deuterium and a $C_1$-$C_{10}$ alkyl group, but embodiments are not limited thereto.

In some embodiments, $L_2$ in Formula 1 may be selected from ligands represented by Formulae 3-1(1) to 3-1(59) below and Formula 3-111 above:

-continued
Formula 3-1(1)
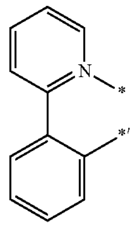
Formula 3-1(2)
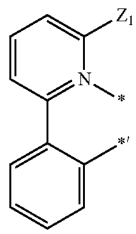
Formula 3-1(3)
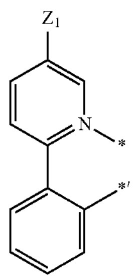
Formula 3-1(4)
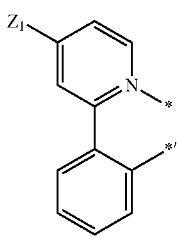
Formula 3-1(5)
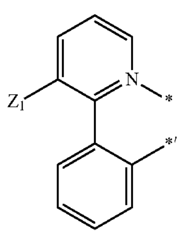
Formula 3-1(6)
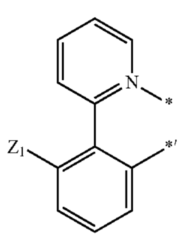
Formula 3-1(7)
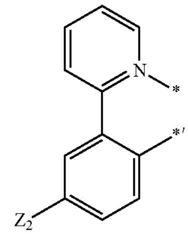
Formula 3-1(8)
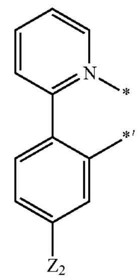
Formula 3-1(9)
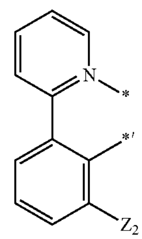
Formula 3-1(10)
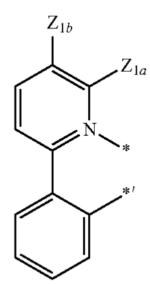
Formula 3-1(11)
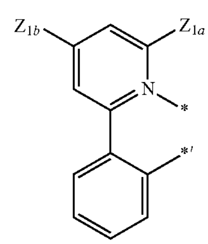
Formula 3-1(12)
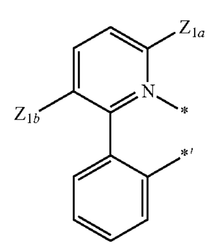

-continued
Formula 3-1(13)
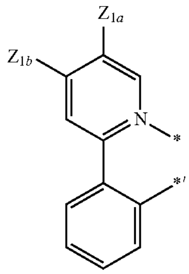
Formula 3-1(14)
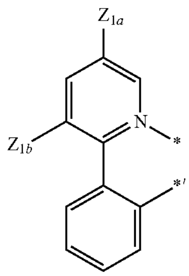
Formula 3-1(15)
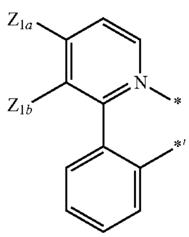
Formula 3-1(16)
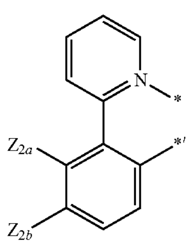
Formula 3-1(17)
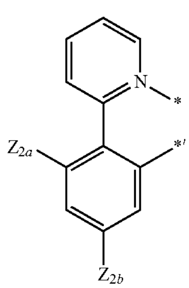
Formula 3-1(18)
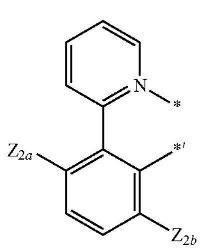
-continued
Formula 3-1(19)
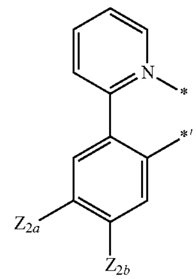
Formula 3-1(20)
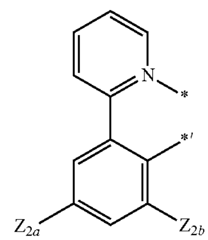
Formula 3-1(21)
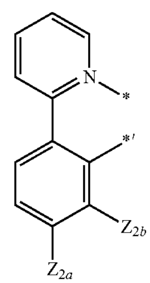
Formula 3-1(22)
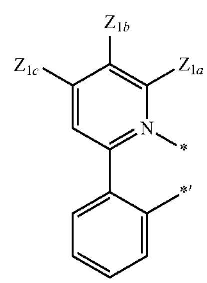
Formula 3-1(23)
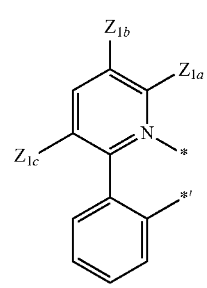
Formula 3-1(24)
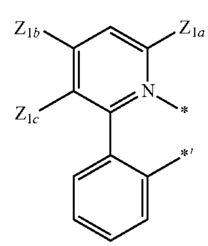

Formula 3-1(25)
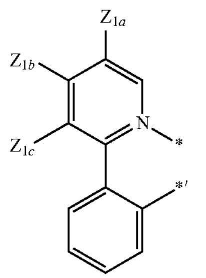
Formula 3-1(26)
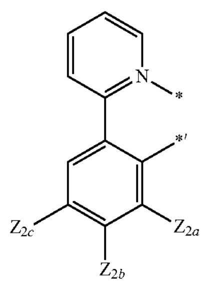
Formula 3-1(27)
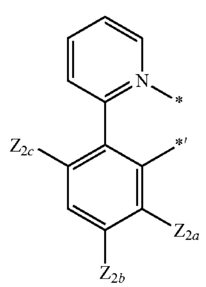
Formula 3-1(28)
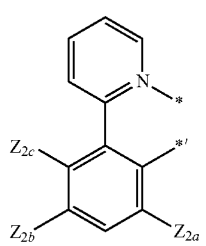
Formula 3-1(29)
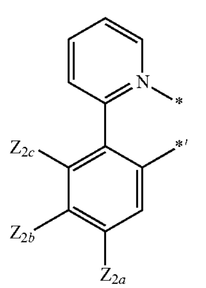
Formula 3-1(30)
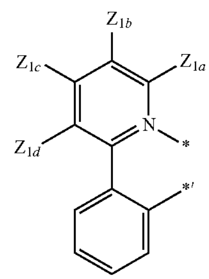
Formula 3-1(31)
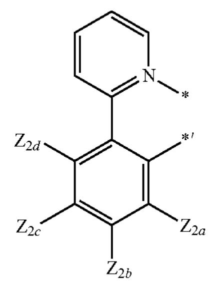
Formula 3-1(32)
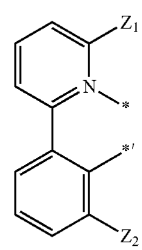
Formula 3-1(33)
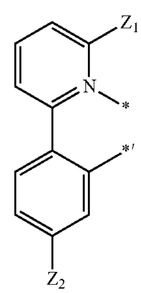
Formula 3-1(34)
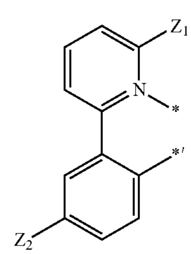
Formula 3-1(35)
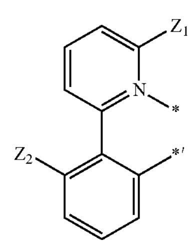

-continued
Formula 3-1(36)
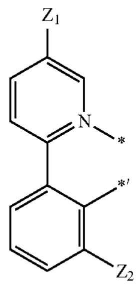
Formula 3-1(37)
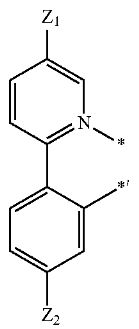
Formula 3-1(38)
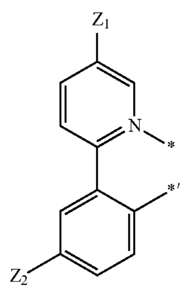
Formula 3-1(39)
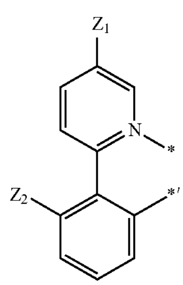
Formula 3-1(40)
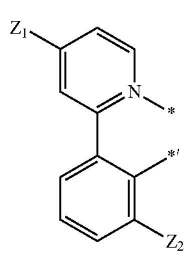
-continued
Formula 3-1(41)
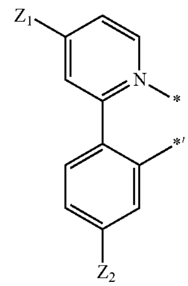
Formula 3-1(42)
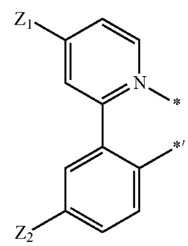
Formula 3-1(43)
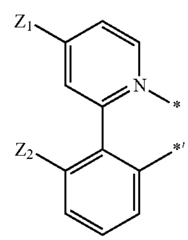
Formula 3-1(44)
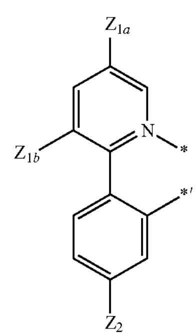
Formula 3-1(45)
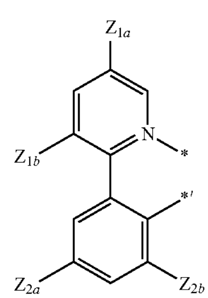

Formula 3-1(46)
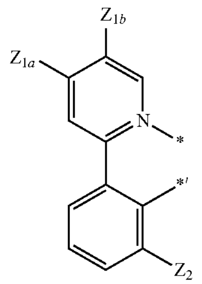
Formula 3-1(47)
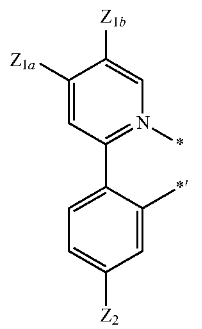
Formula 3-1(48)
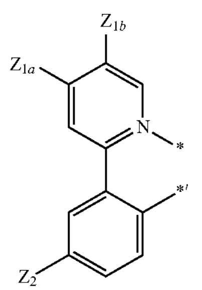
Formula 3-1(49)
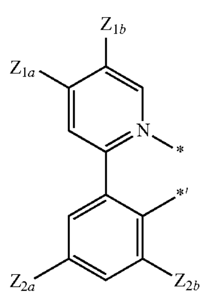
Formula 3-1(50)
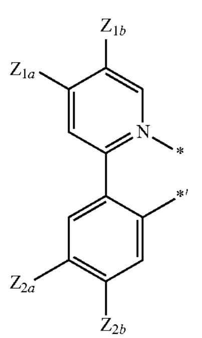
Formula 3-1(51)
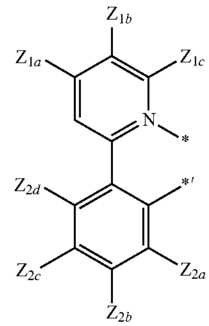
Formula 3-1(52)
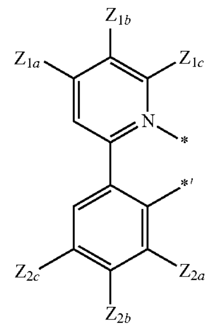
Formula 3-1(53)
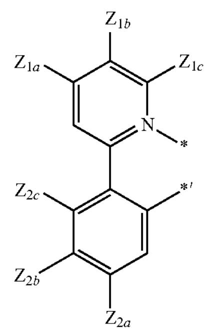
Formula 3-1(54)
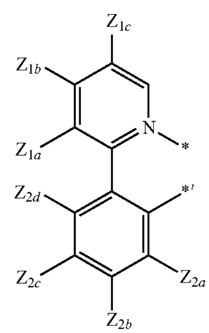
Formula 3-1(55)
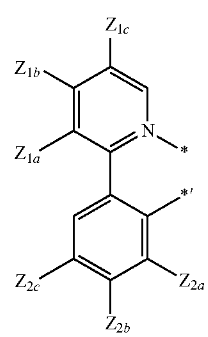

-continued

Formula 3-1(56)

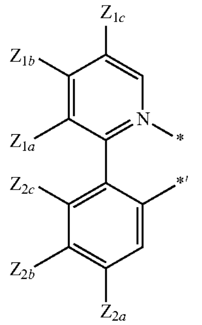

Formula 3-1(57)

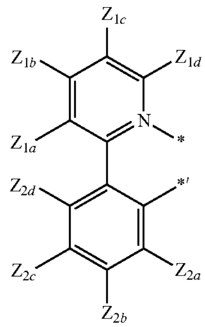

Formula 3-1(58)

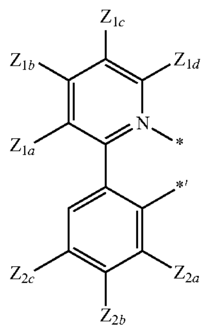

Formula 3-1(59)

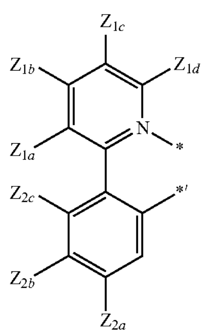

For example, in Formulae 3-1(1) to 3-1(59) and Formula 3-111:

$Z_1$, $Z_2$, $Z_{1a}$, $Z_{1b}$, $Z_{1c}$, $Z_{1d}$, $Z_{2a}$, $Z_{2b}$, $Z_{2c}$, $Z_{2d}$, $R_{34a}$, $R_{34b}$, and $R_{34c}$ are each independently selected from a deuterium, —F, a cyano group, a nitro group, —$SF_5$, —$CH_3$, —$CD_3$, —$CD_2H$, —$CDH_2$, —$CF_3$, —$CF_2H$, —$CFH_2$, —$Si(Q_3)(Q_4)(Q_5)$, groups represented by Formulae 9-1 to 9-17, and groups represented by Formulae 10-1 to 10-30, $Q_3$ to $Q_5$ may be each independently selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from a deuterium and a $C_1$-$C_{10}$ alkyl group, and

* and *' are binding sites to M in Formula 1.

In some embodiments, in Formula 1, M is Ir and the sum of n1 and n2 is 3; or M is Pt and the sum of n1 and n2 is 2, the organometallic compound represented by Formula 1 does not include an ionic group, and $L_1$ in Formula 1 may be selected from ligands represented by Formulae 2A-1 to 2A-16, 2AA-1, 2AA-2, 2AA-3, 2AA-4, and 2AB, but embodiments are not limited thereto.

In some embodiments, in Formula 1, M is Ir and the sum of n1 and n2 is 3; or M is Pt and the sum of n1 and n2 is 2, the organometallic compound represented by Formula 1 does not include an ionic group, $L_1$ in Formula 1 is selected from ligands represented by Formulae 2A-1, 2A-5, 2AA-1 and 2AB, but embodiments are not limited thereto.

In some embodiments, in Formula 1, M is Ir and the sum of n1 and n2 is 3; or M is Pt and the sum of n1 and n2 is 2, the organometallic compound represented by Formula 1 is neutral, $L_1$ in Formula 1 is selected from ligands represented by Formulae 2A-1, 2A-5, 2AA-1, and 2AB, $L_2$ in Formula 1 is selected from ligands represented by Formulae 3-1 to 3-111 (for example, ligands represented by Formulae 3-1(1) to 3-1(59) and 3-111), but embodiments are not limited thereto.

In some embodiments, in Formula 1, M is Ir and the sum of n1 and n2 is 3; or M is Pt and the sum of n1 and n2 is 2, the organometallic compound represented by Formula 1 does not include an ionic group, and $L_1$ in Formula 1 is selected from ligands represented by Formulae 2A(1) to 2A(40), but embodiments are not limited thereto.

In some embodiments, in Formula 1, M is Ir and the sum of n1 and n2 is 3; or M is Pt and the sum of n1 and n2 is 2, the organometallic compound represented by Formula 1 does not include an ionic group, $L_1$ in Formula 1 is selected from ligands represented by Formulae 2A(1) to 2A(40), and $L_2$ in Formula 1 is selected from ligands represented by Formulae 3-1 to 3-111 (for example, ligands represented by Formulae 3-1(1) to 3-1(59) and 3-111), but embodiments are not limited thereto For example, the organometallic compound represented by Formula 1 may be one of Compounds 1 to 481 below, but is not limited thereto.

-continued
1
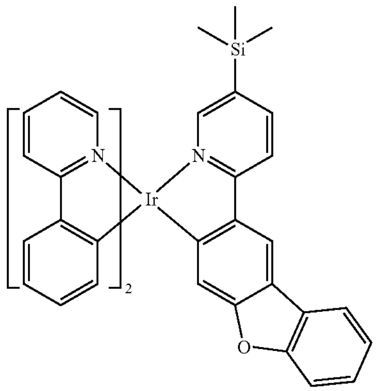
2
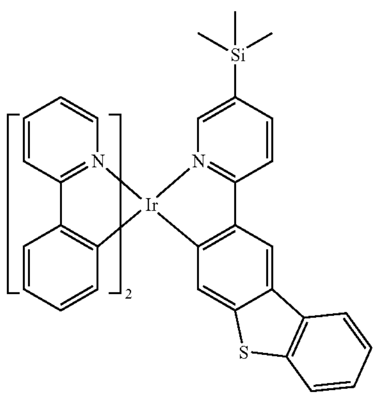
3
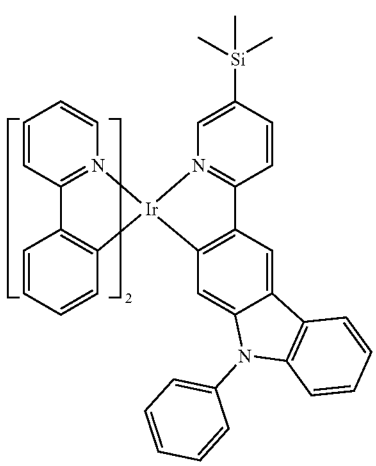
4
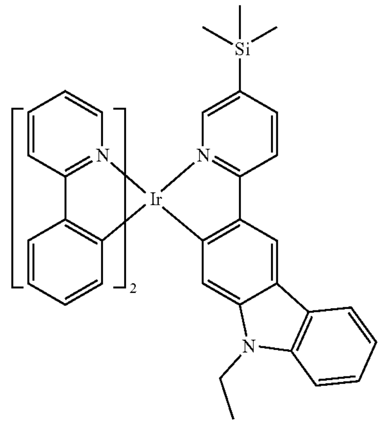
5
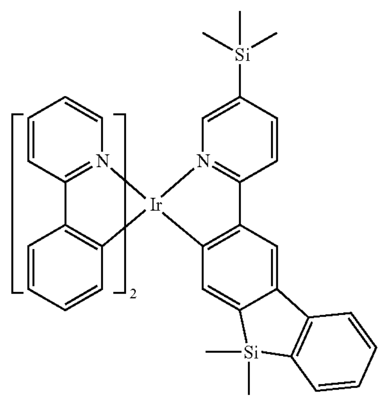
6
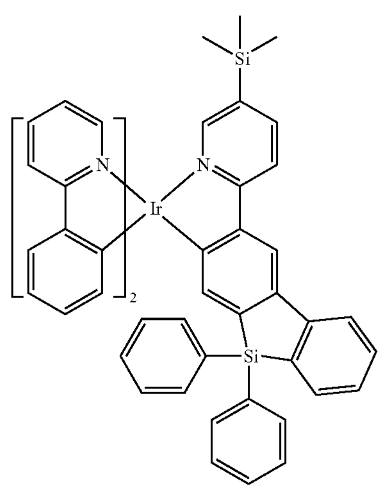

7
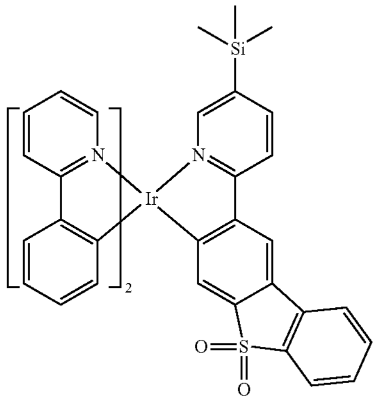
8
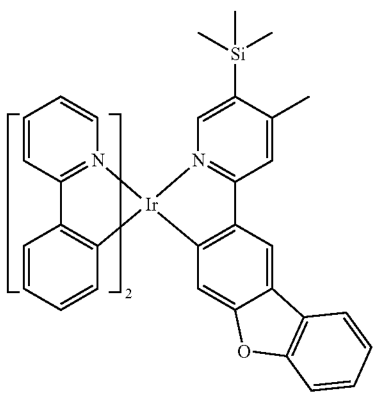
9
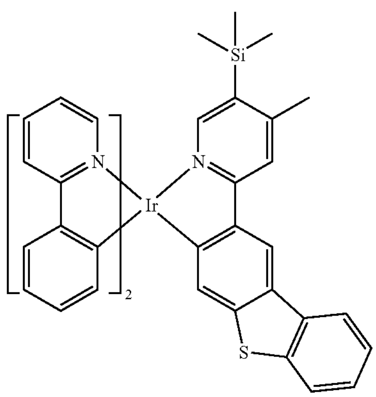
10
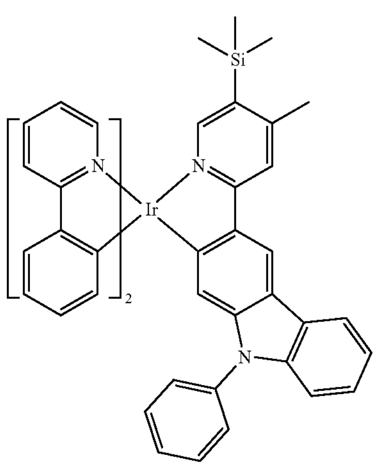
11
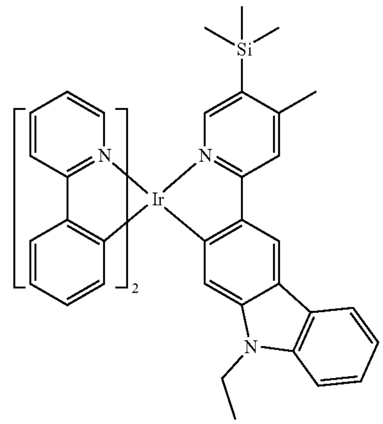
12
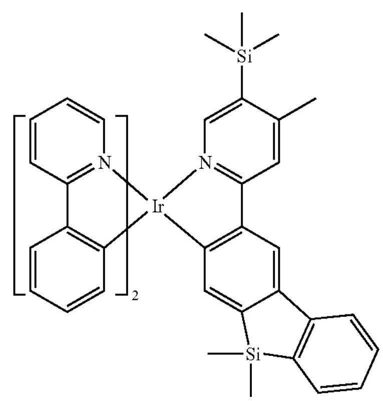
13
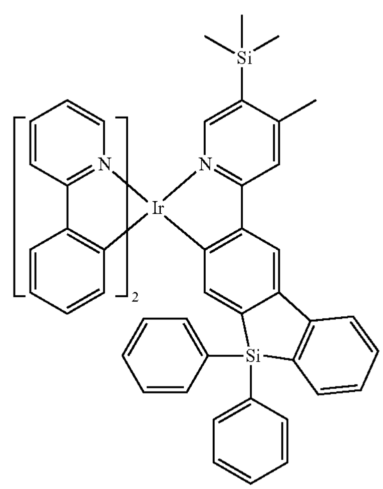

-continued
14
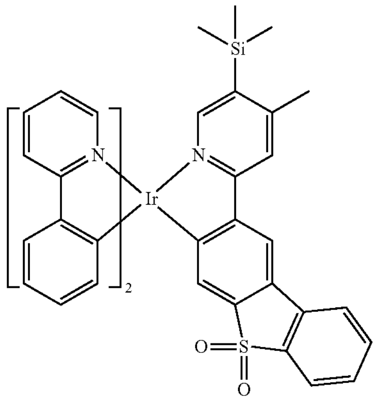
15
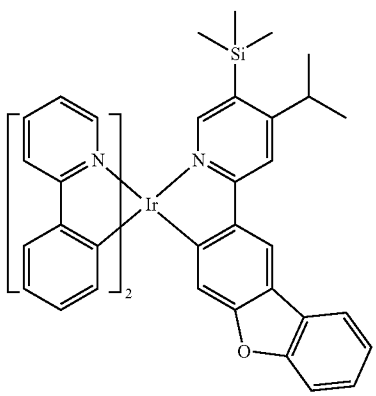
16
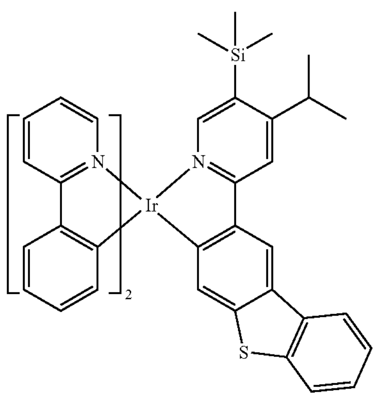
17
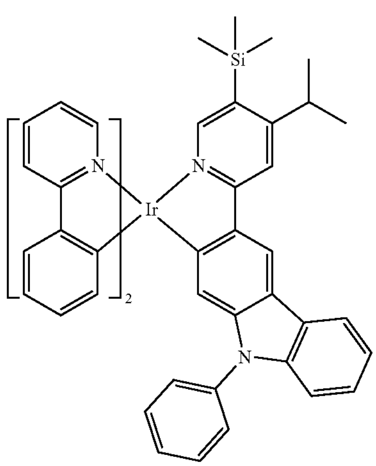
-continued
18
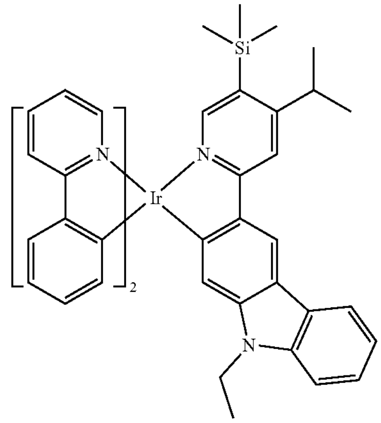
19
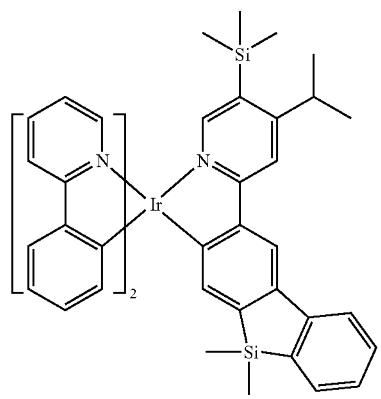
20
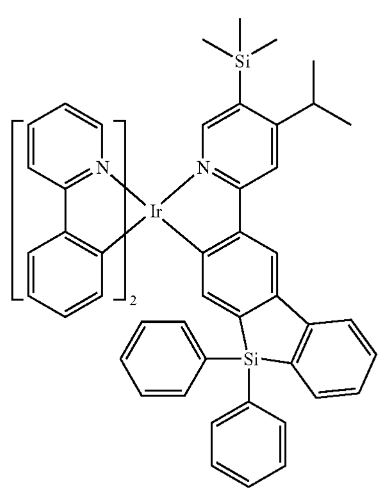

21
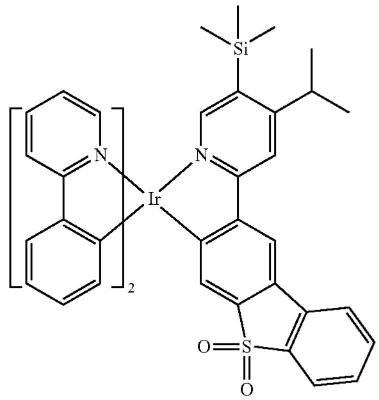
22
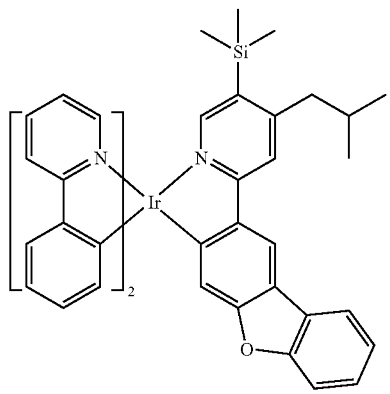
23
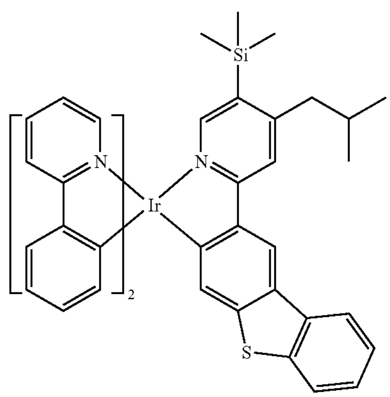
24
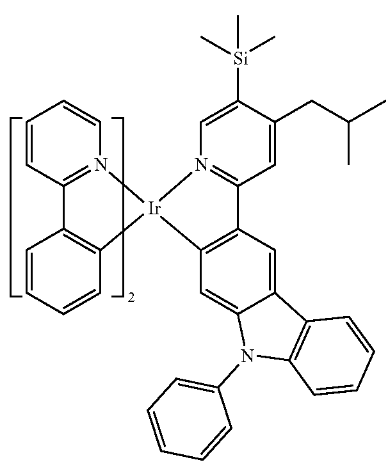
25
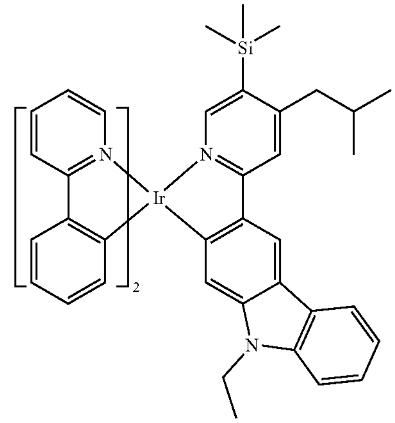
26
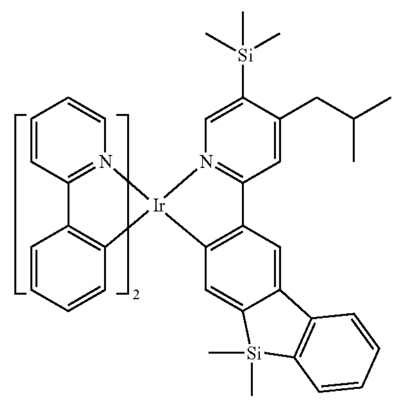
27
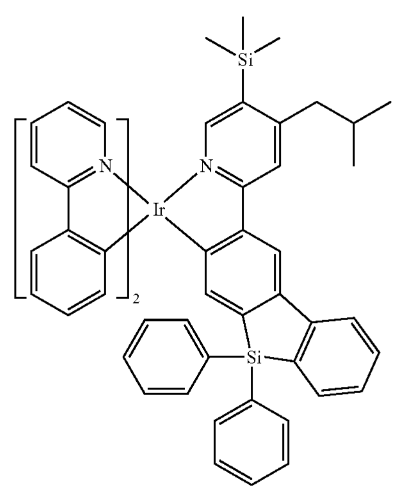

28
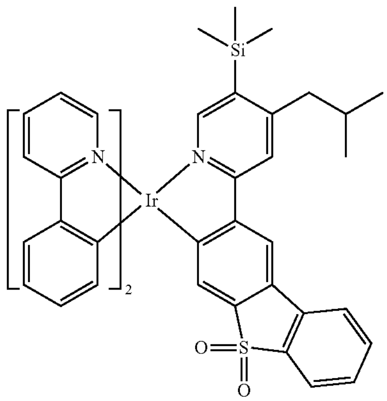
29
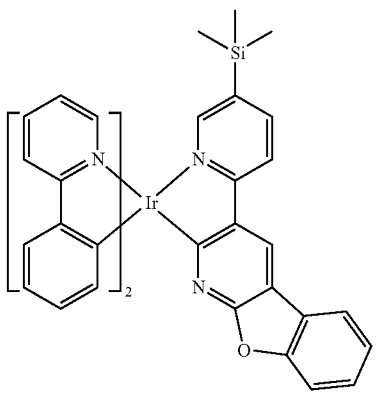
30
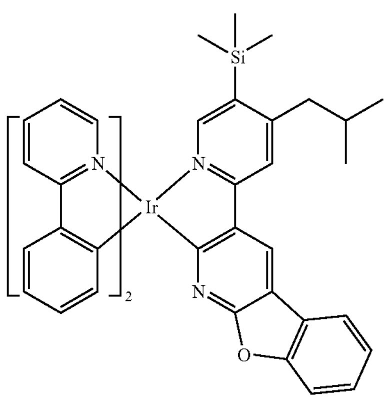
31
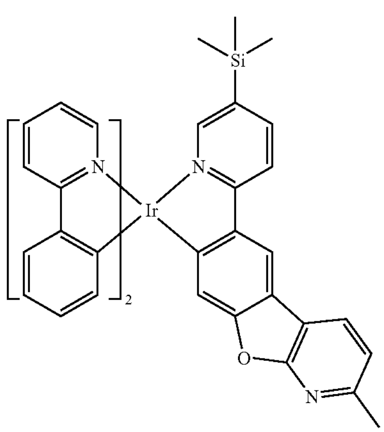
32
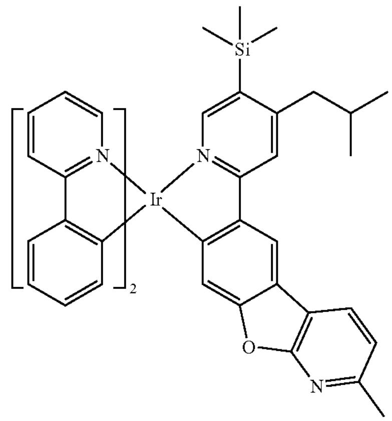
33
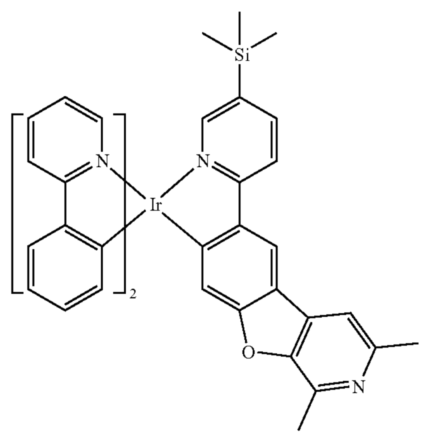
34
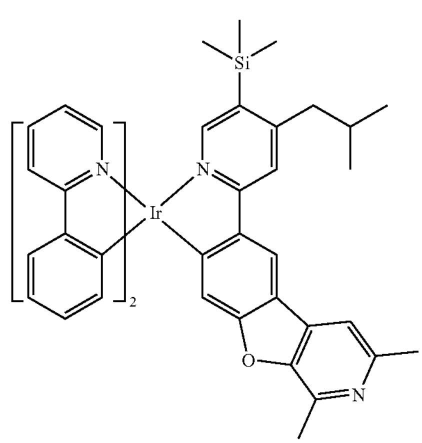

35
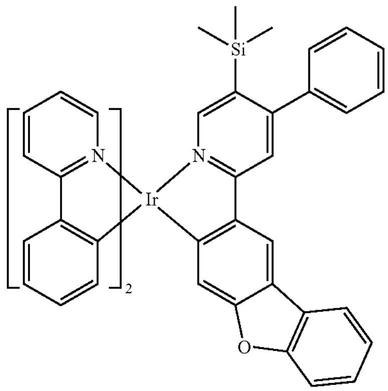
38
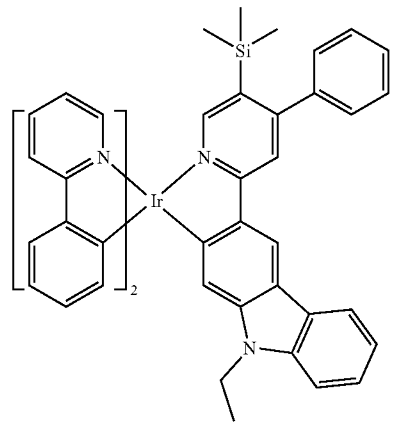
36
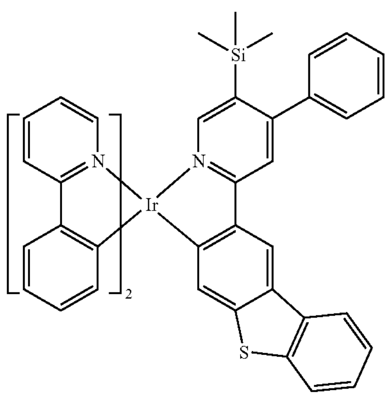
39
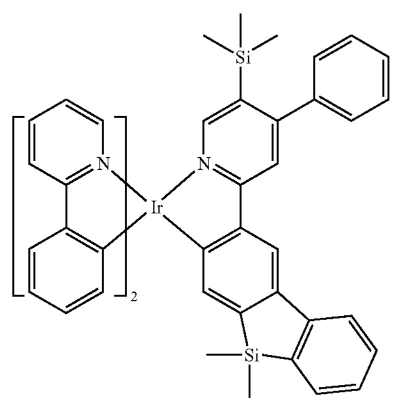
37
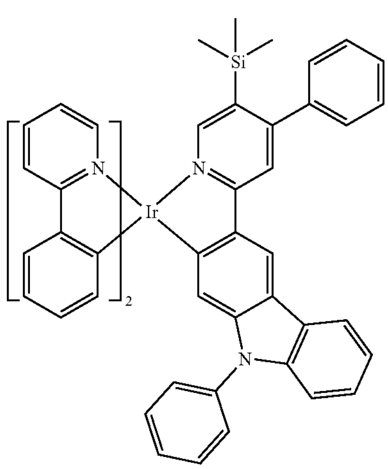
40
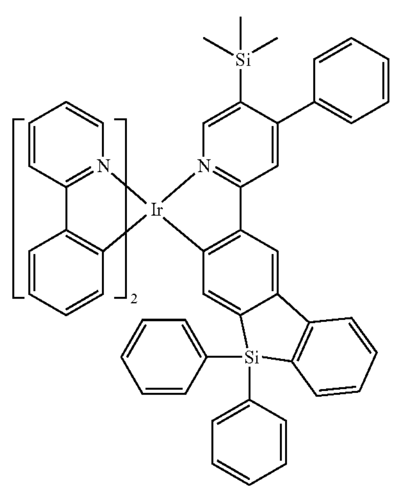

-continued
41
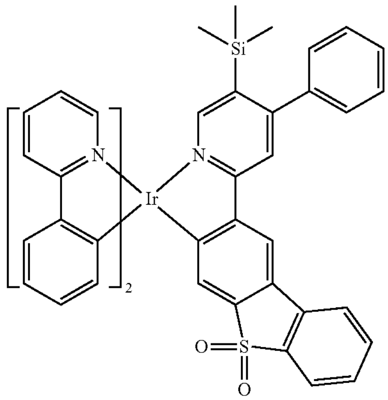
42
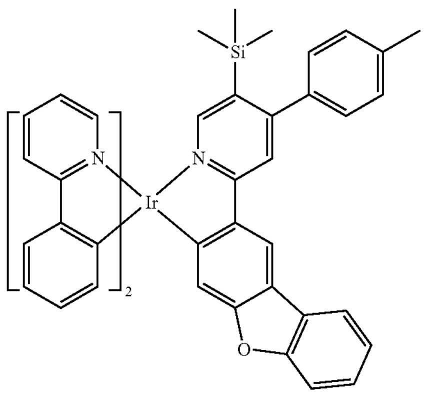
43
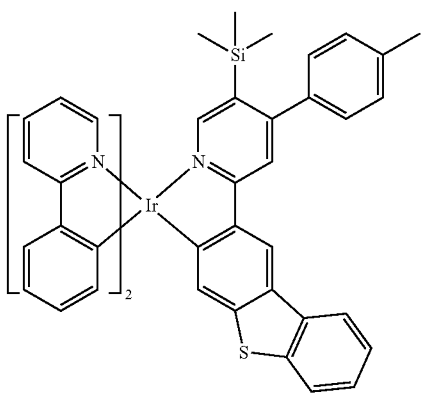
44
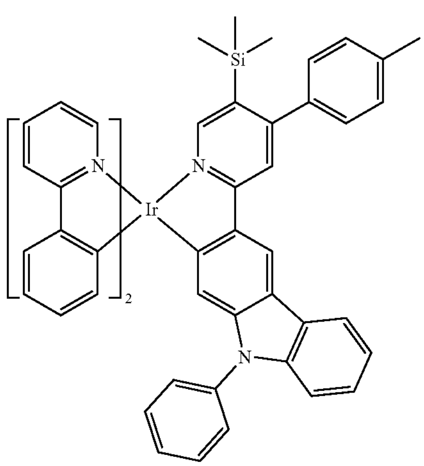
-continued
45
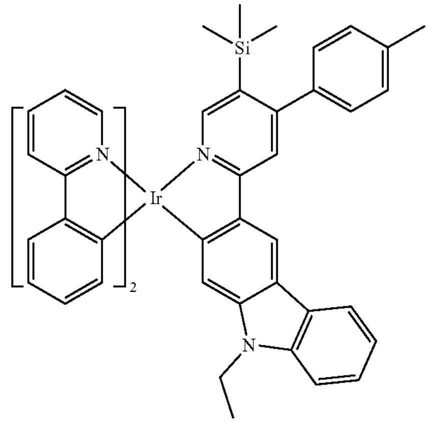
46
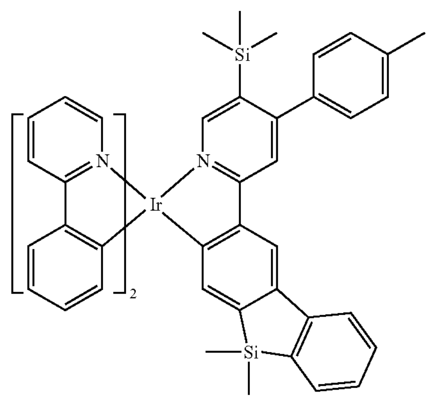
47
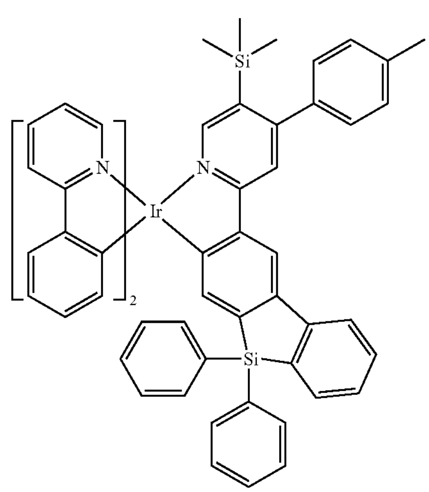

-continued
48
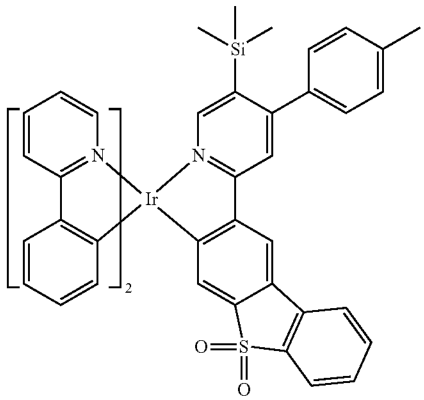
49
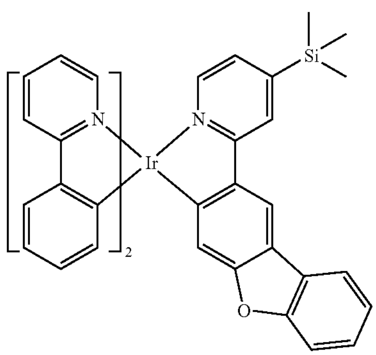
50
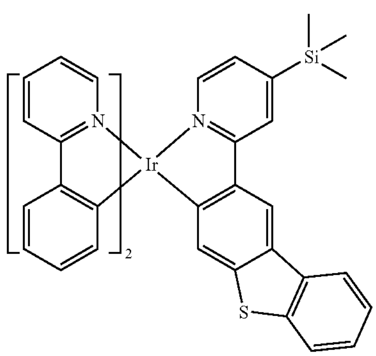
51
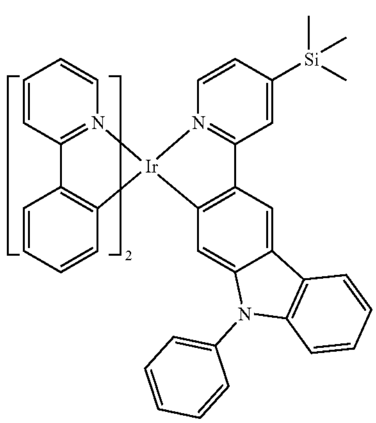
-continued
52
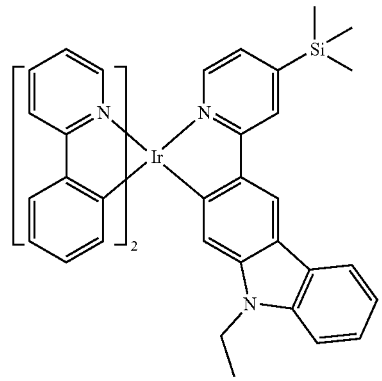
53
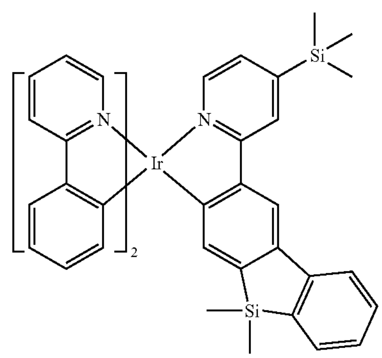
54
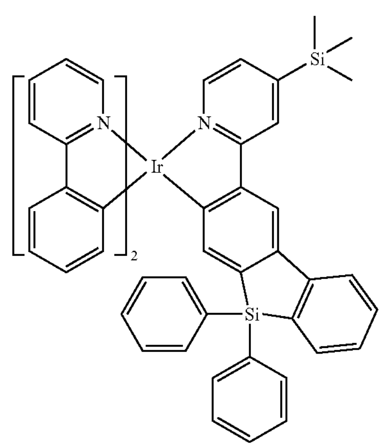
55
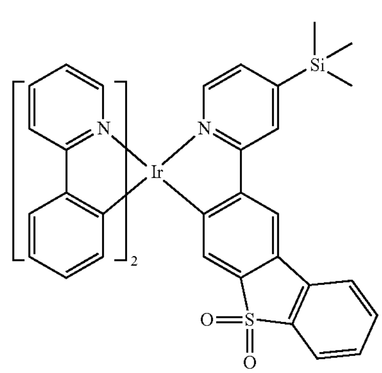

-continued
56
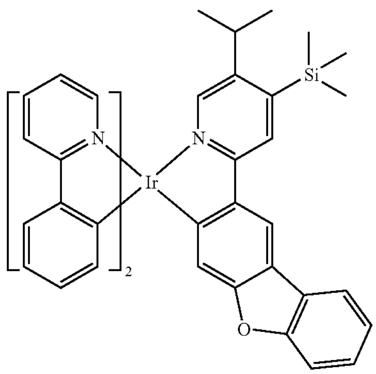
57
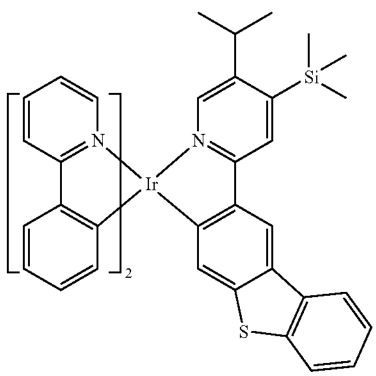
58
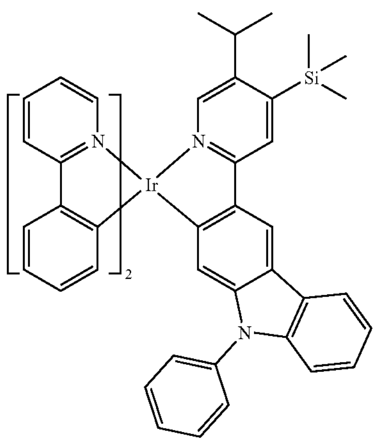
59
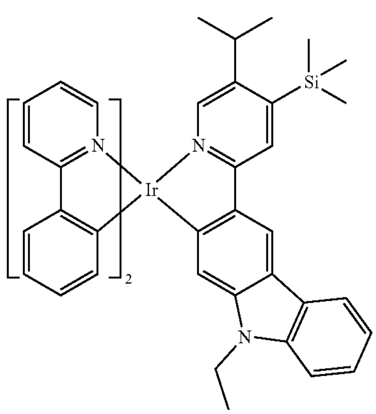
-continued
60
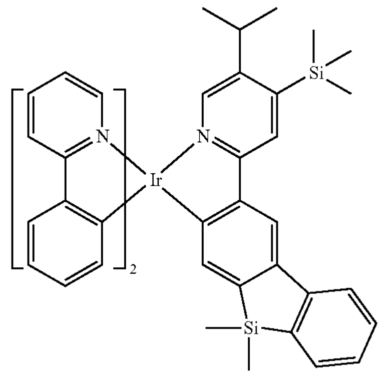
61
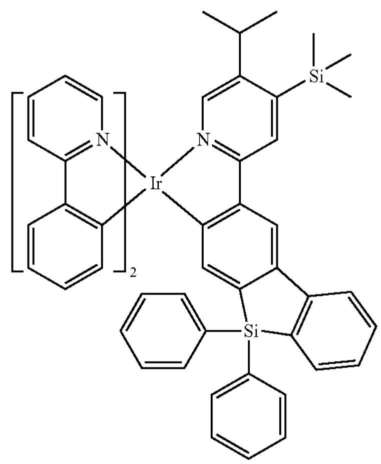
62
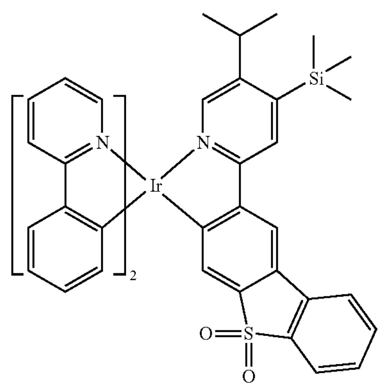
63
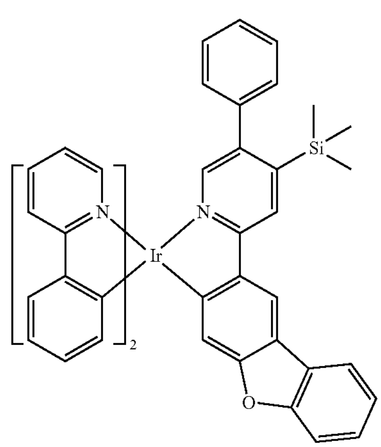

98
-continued
64
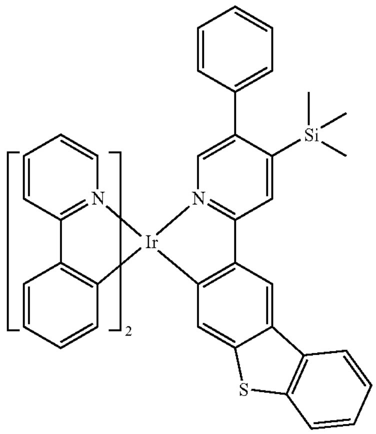
65
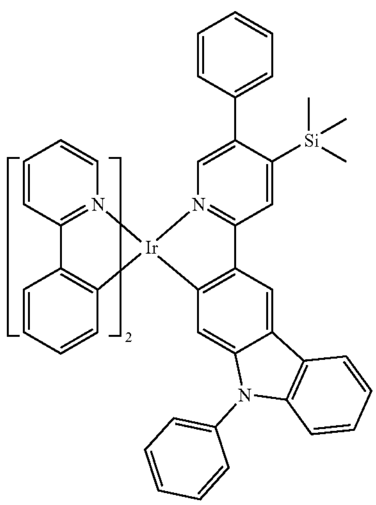
66
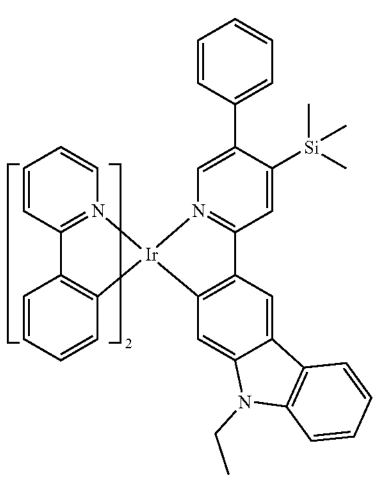
67
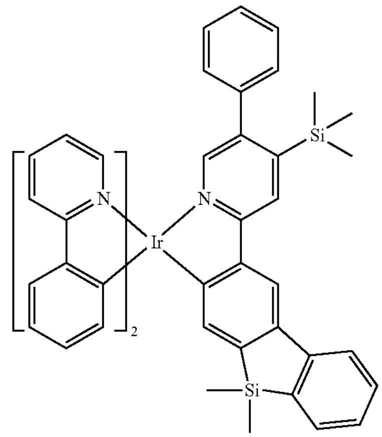
68
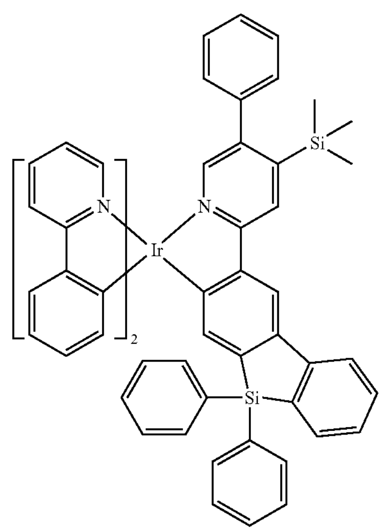
69
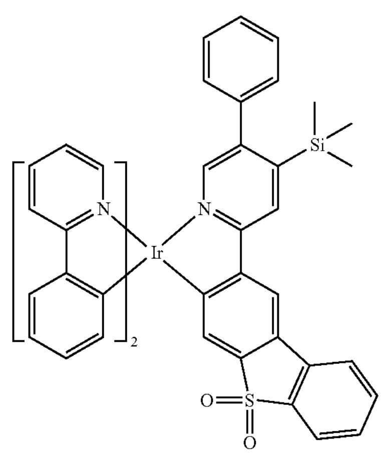

-continued
70
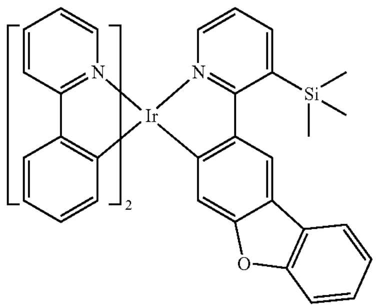
71
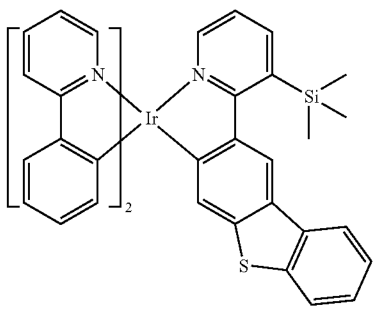
72
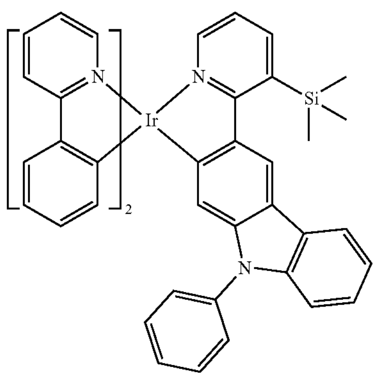
73
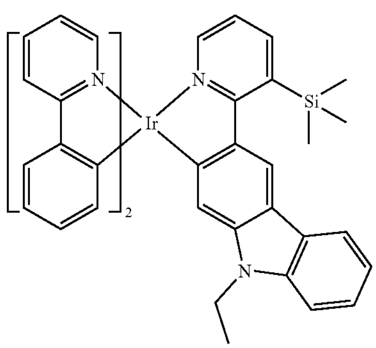
74
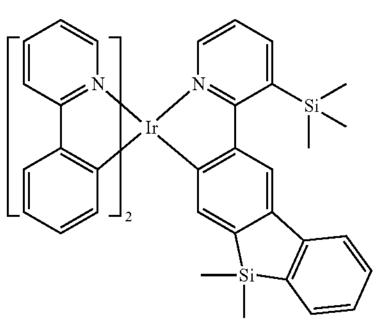
-continued
75
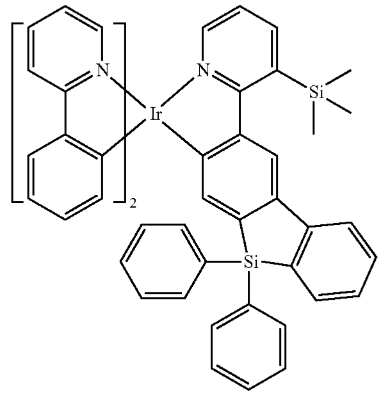
76
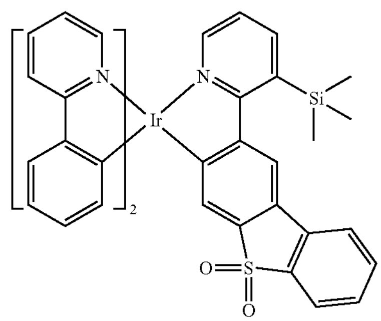
77
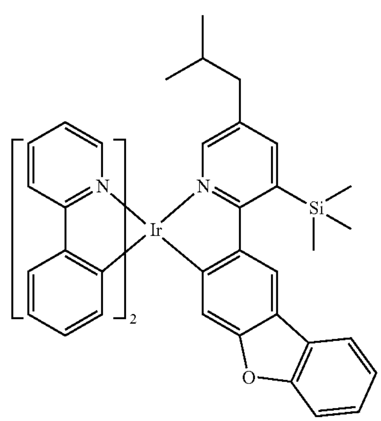
78
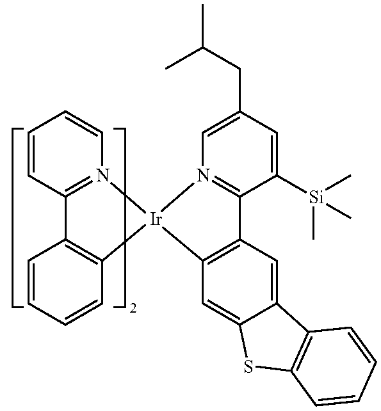

-continued
79
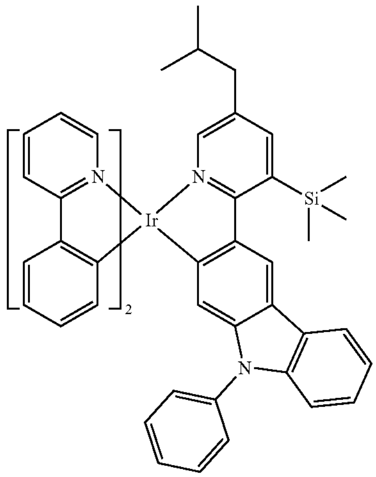
80
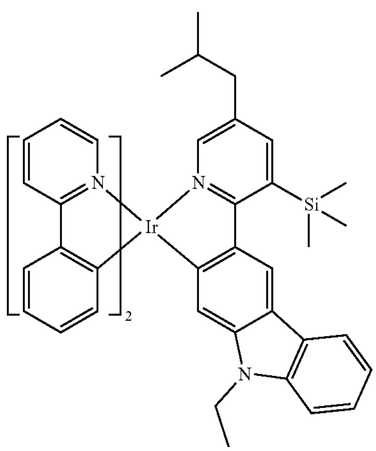
81
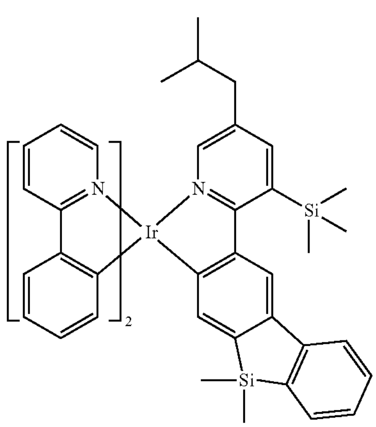
-continued
82
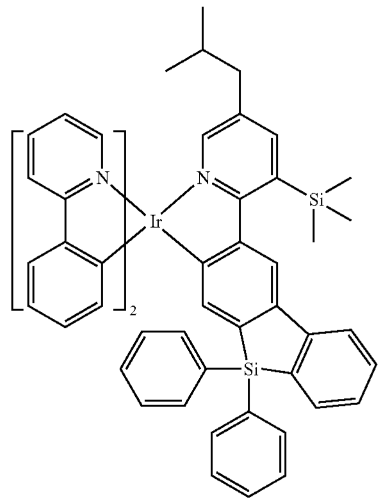
83
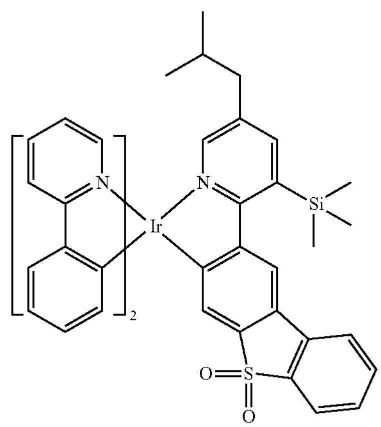
84
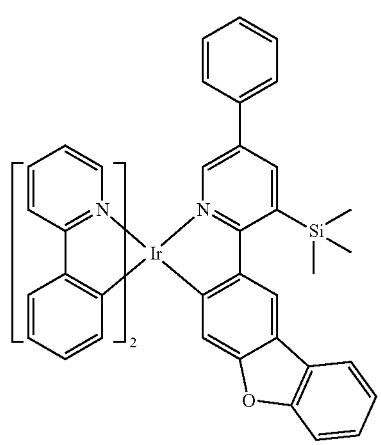

85
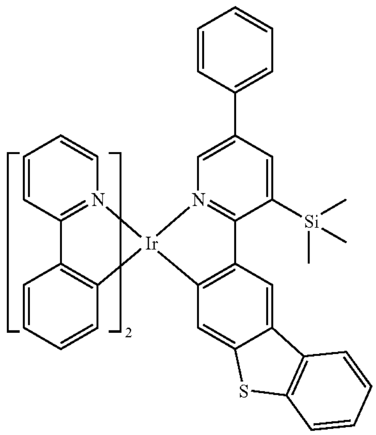
86
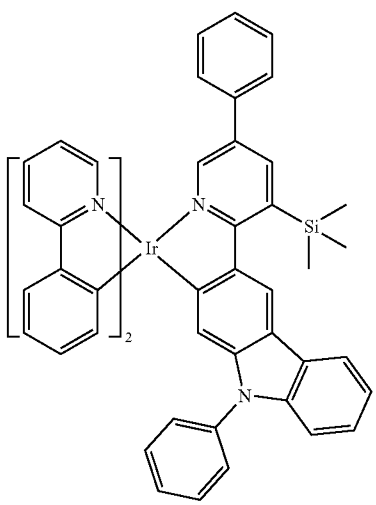
87
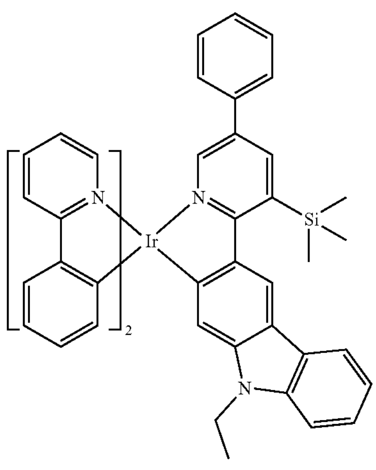
88
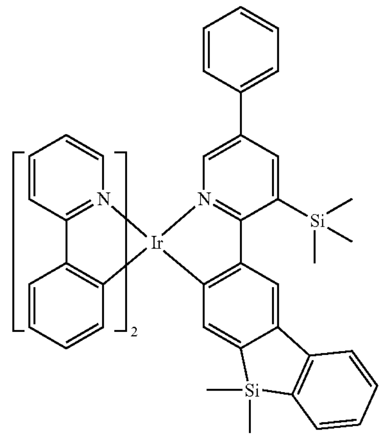
89
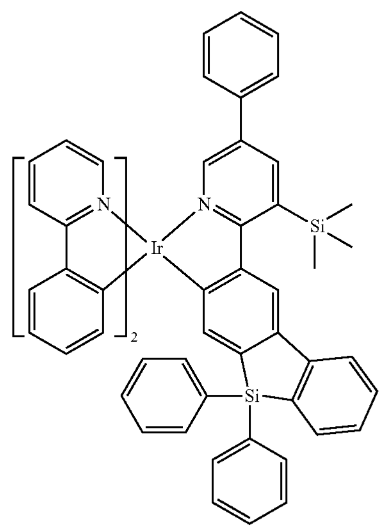
90
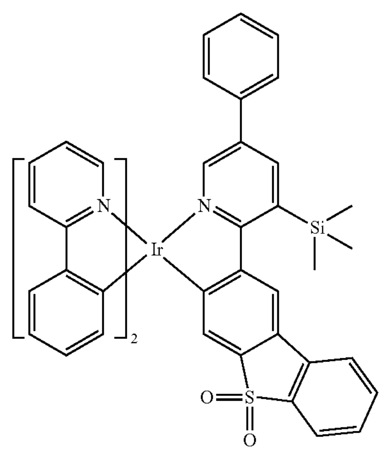

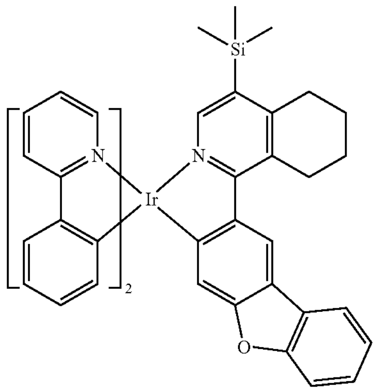
91
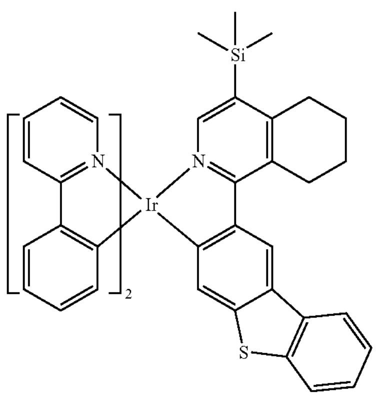
92
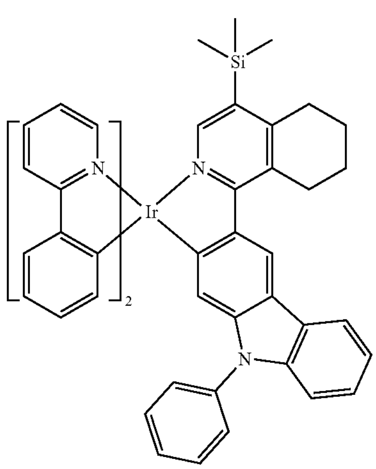
93
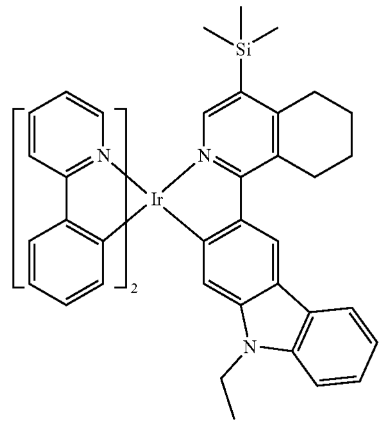
94
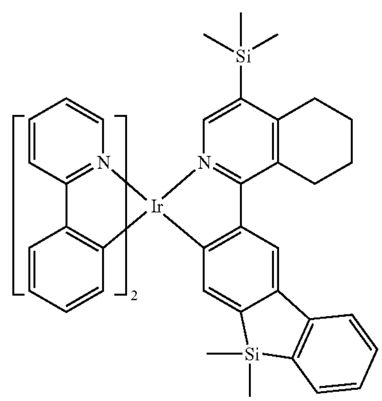
95
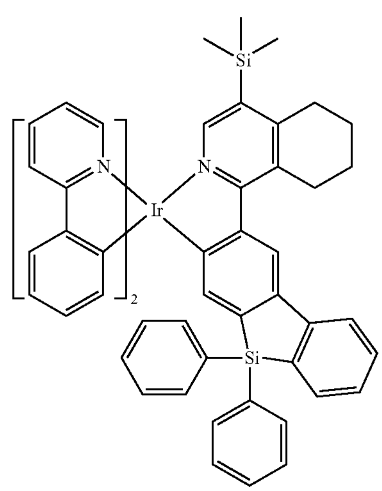
96

-continued
97
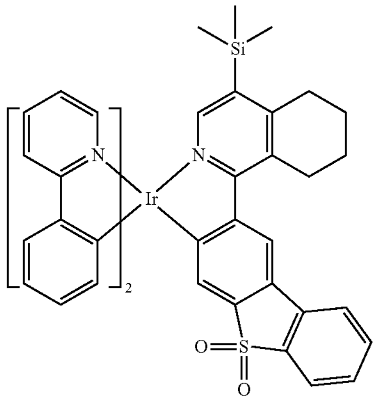
98
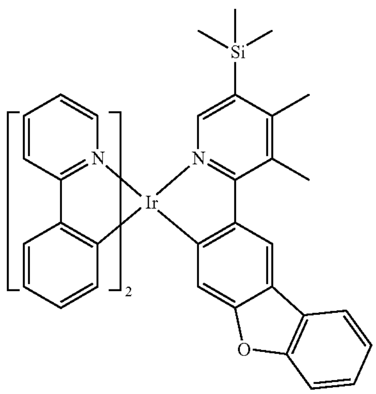
99
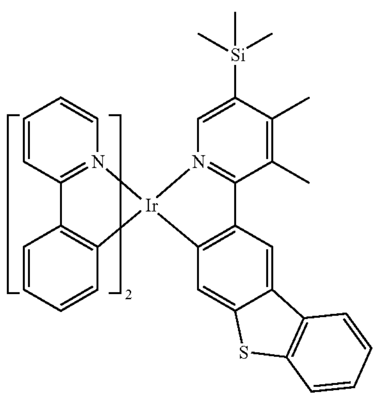
100
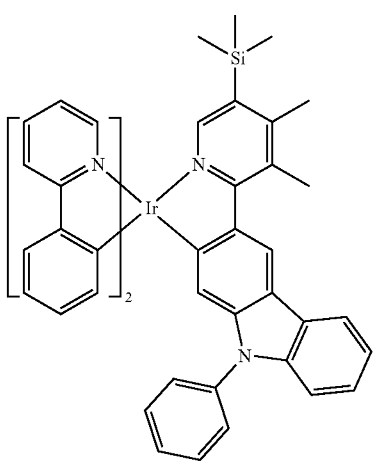
-continued
101
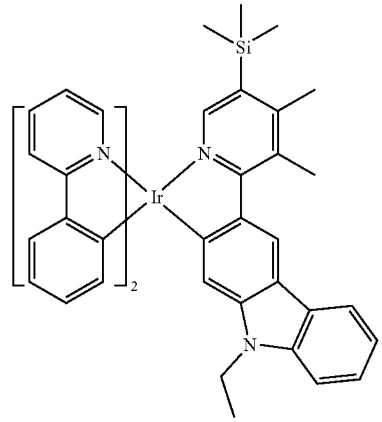
102
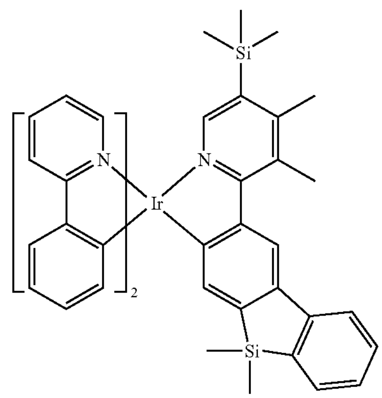
103
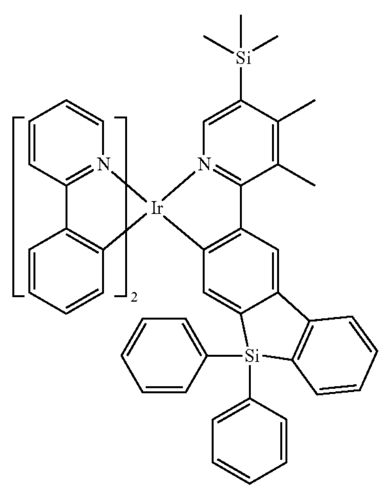

-continued
104
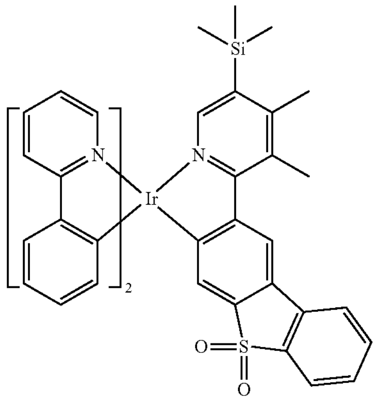
105
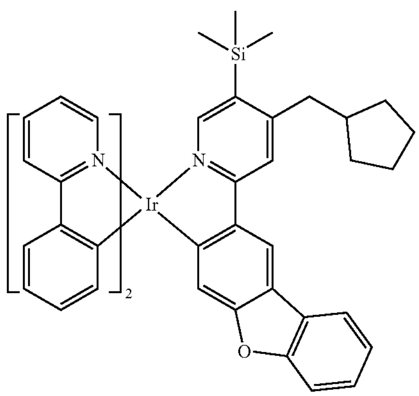
106
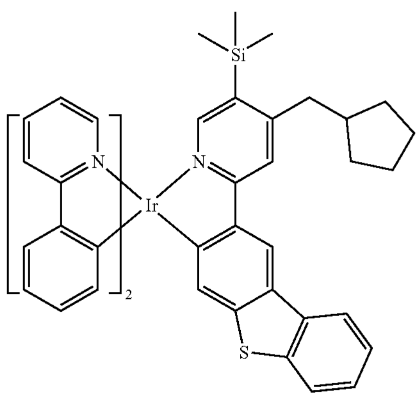
107
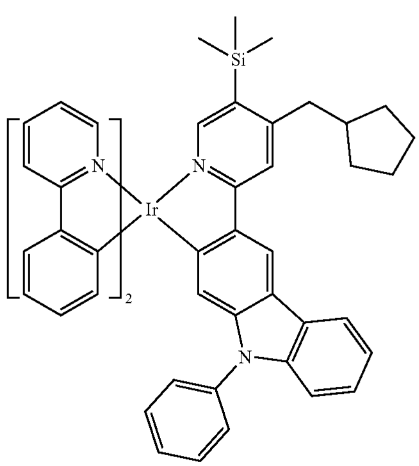
-continued
108
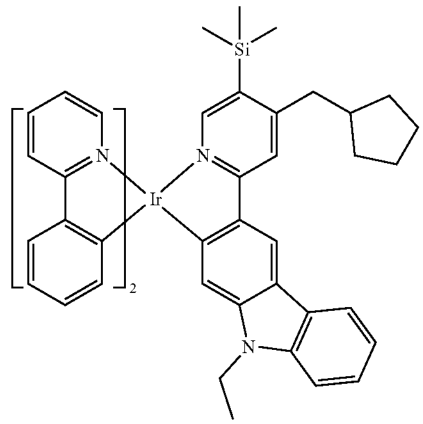
109
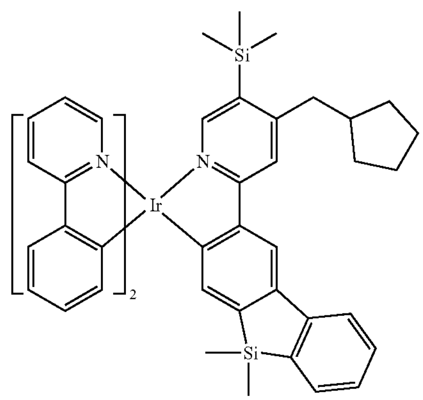
110
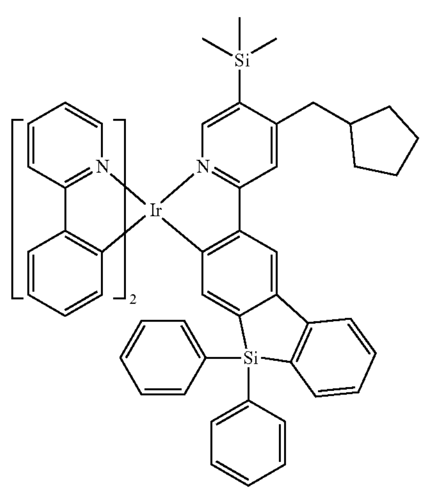

-continued
111
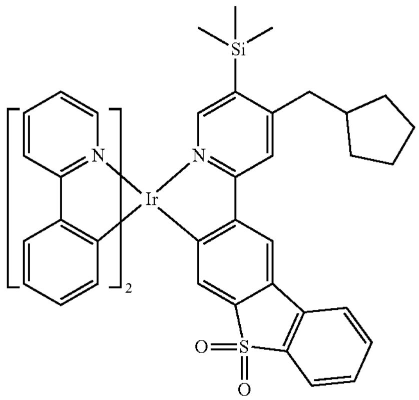
112
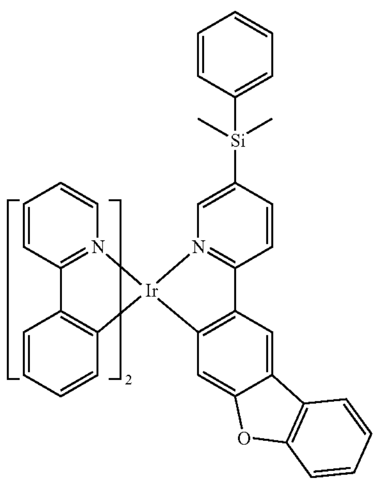
113
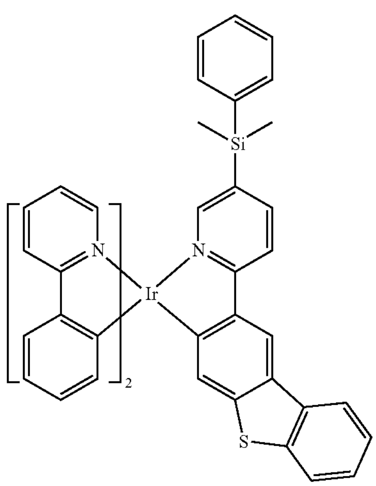
-continued
114
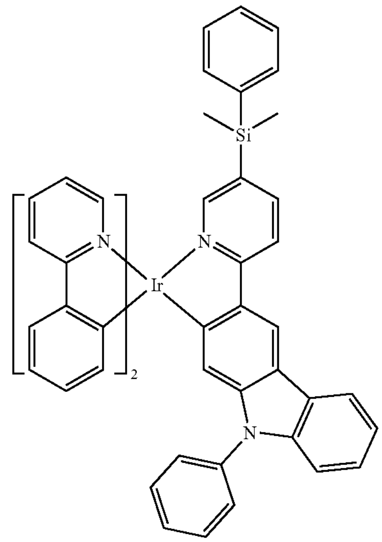
115
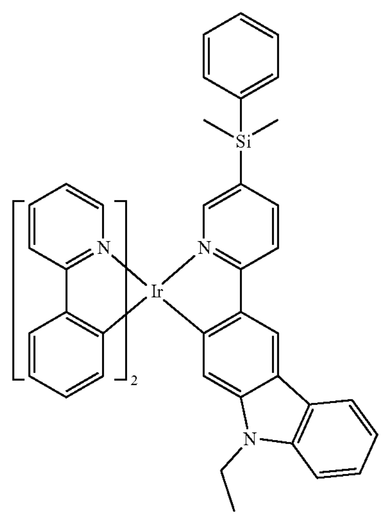
116
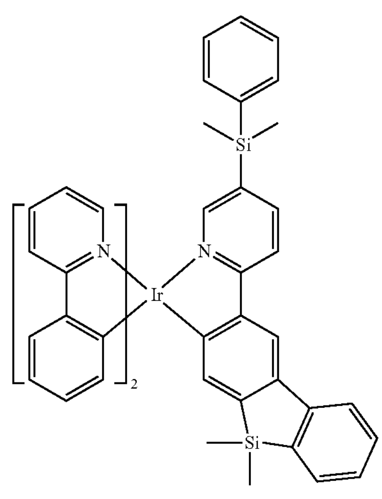

-continued
117
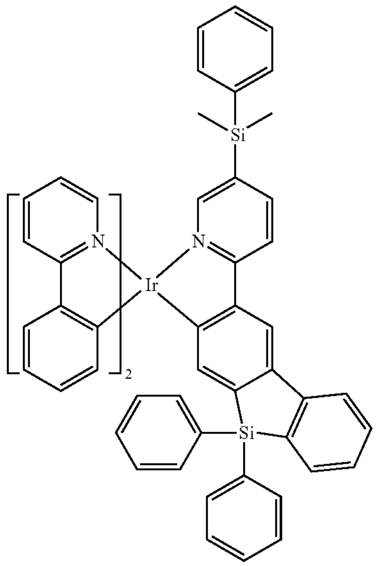
118
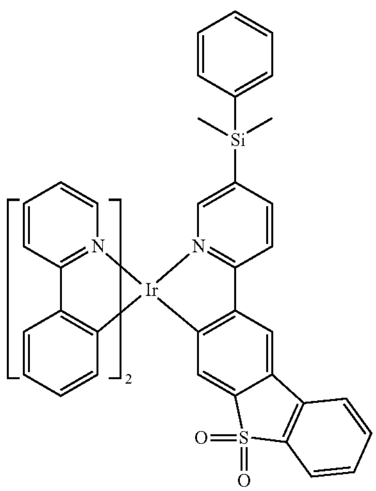
119
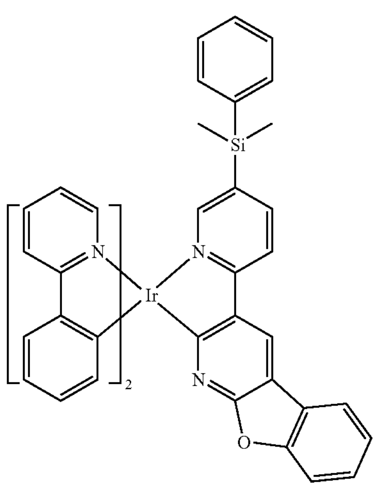
-continued
120
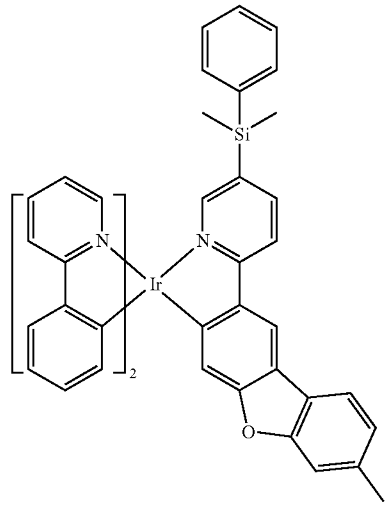
121
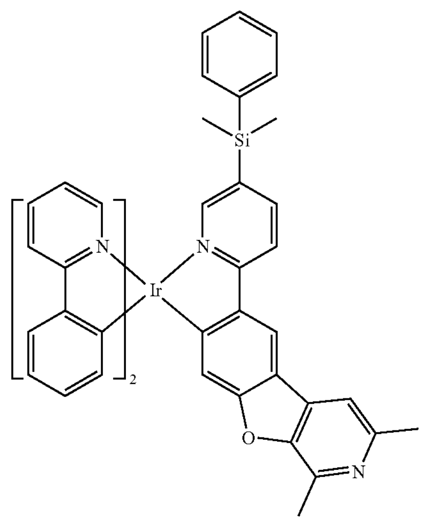
122
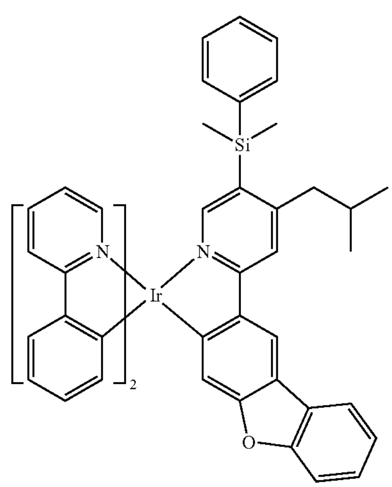

123
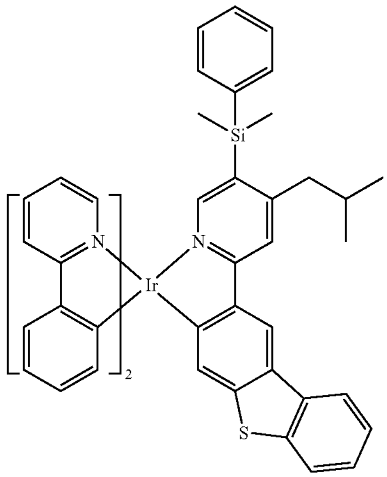
124
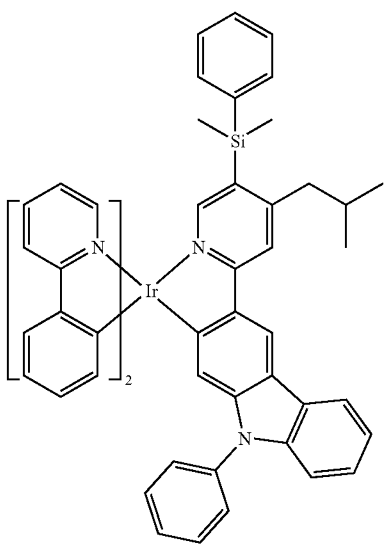
125
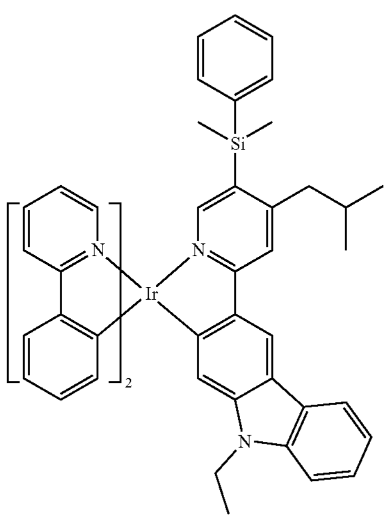
126
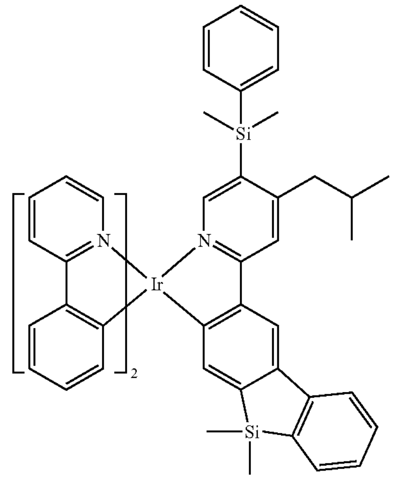
127
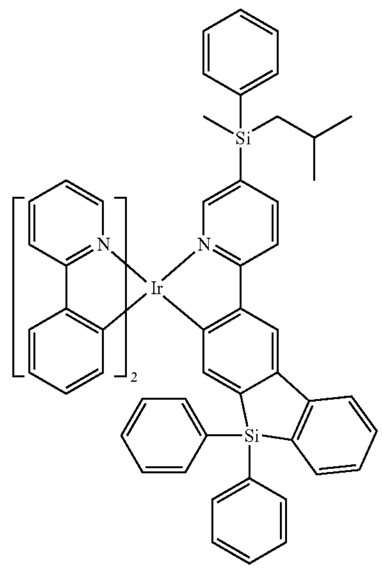
128
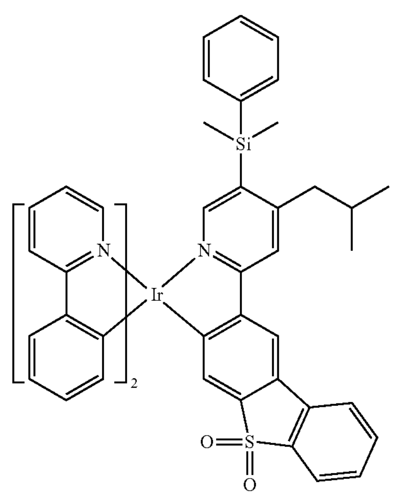

-continued
129
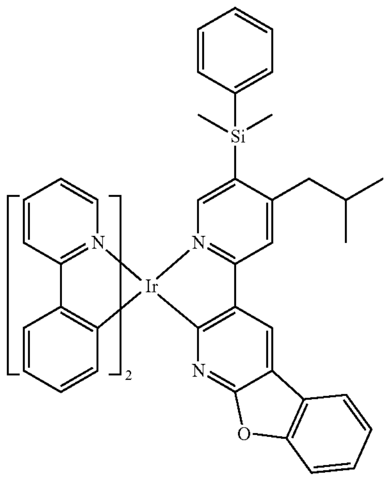
130
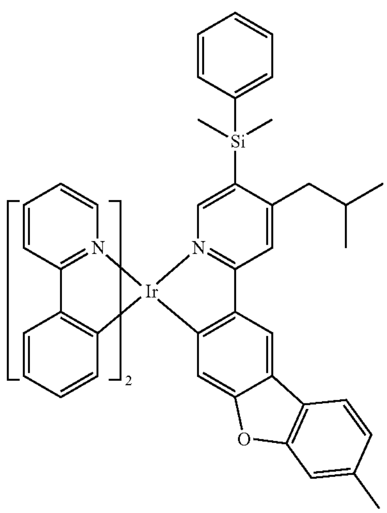
131
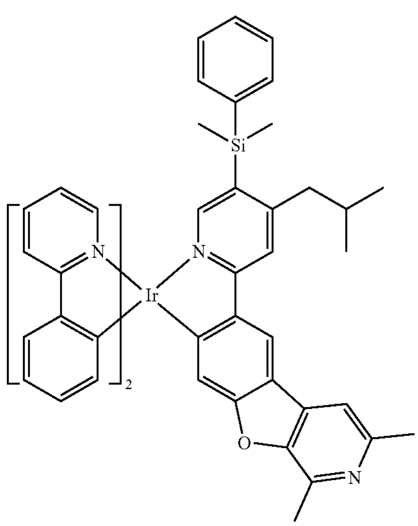
-continued
132
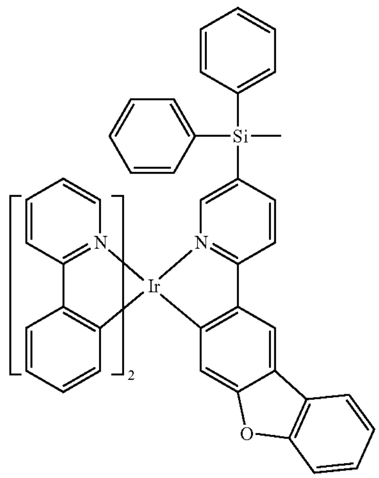
133
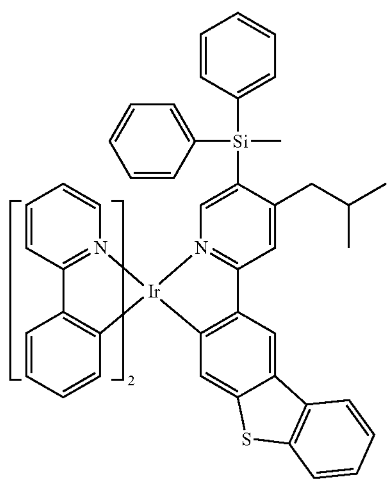
134
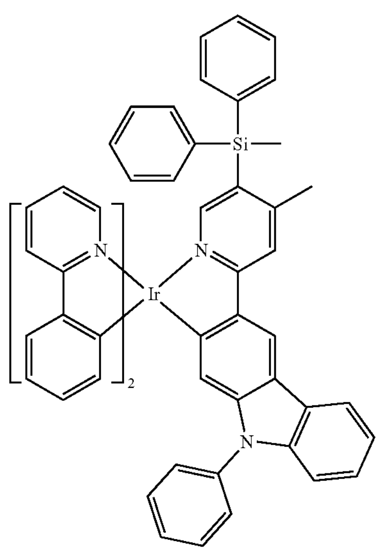

-continued
135
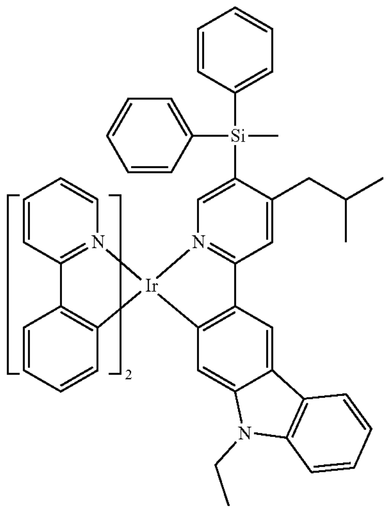
136
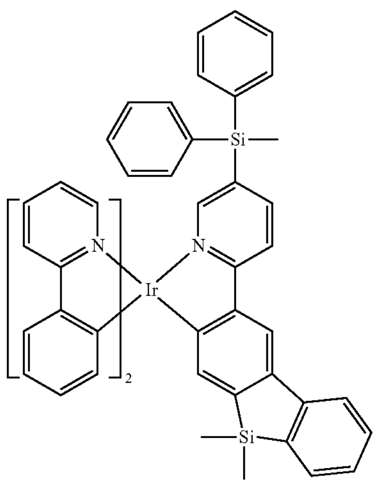
137
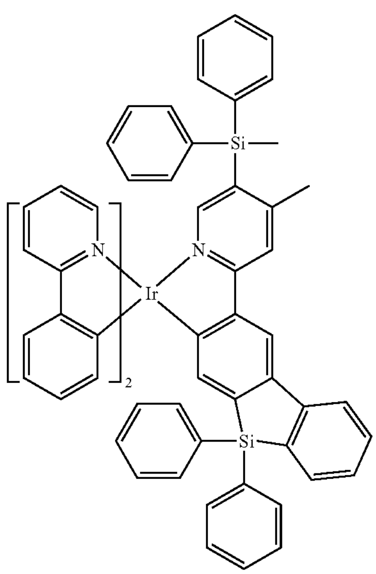
-continued
138
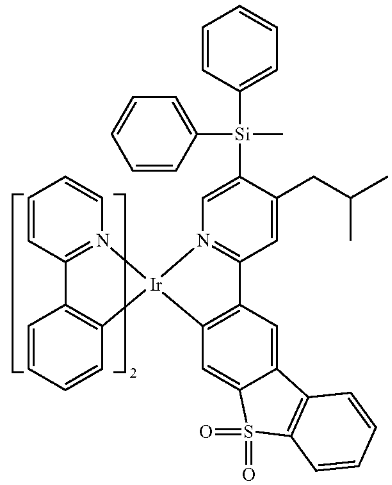
139
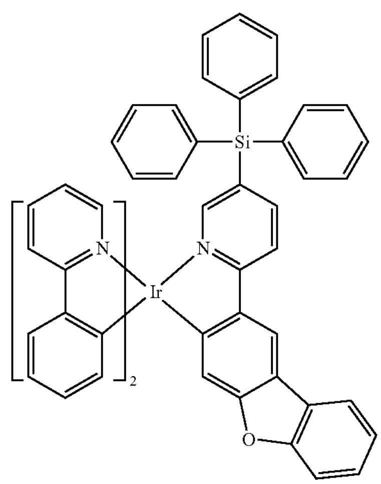
140
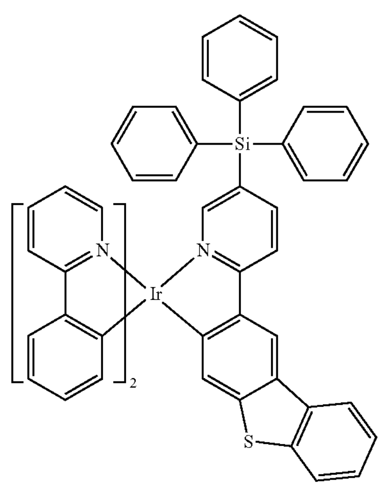

-continued
141
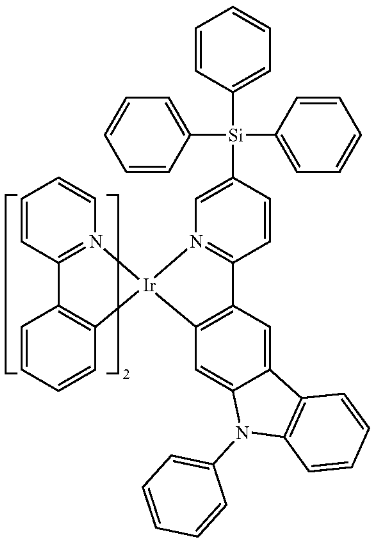
142
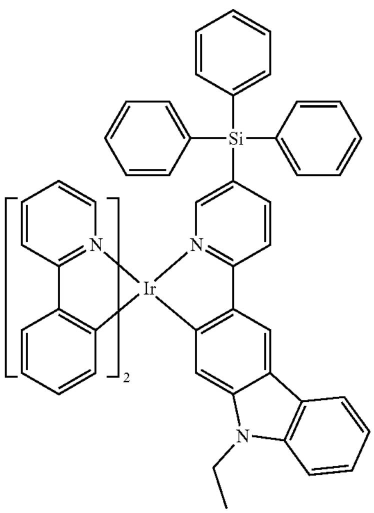
143
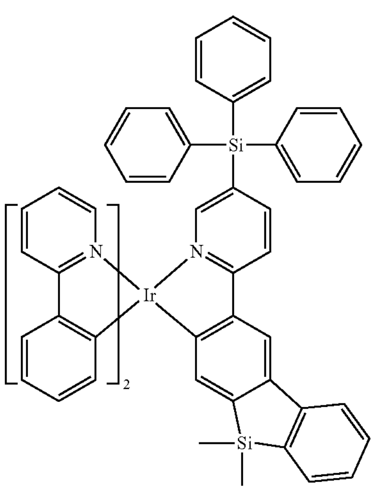
-continued
144
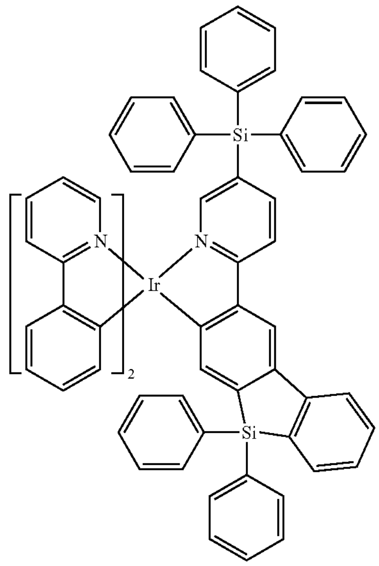
145
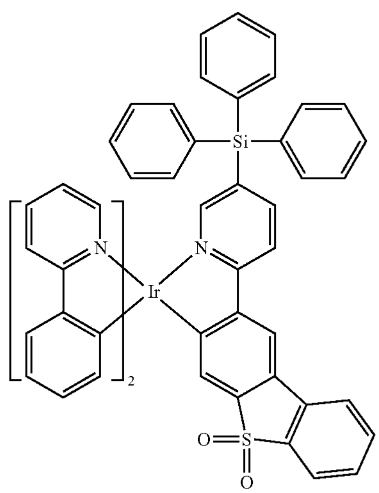
146
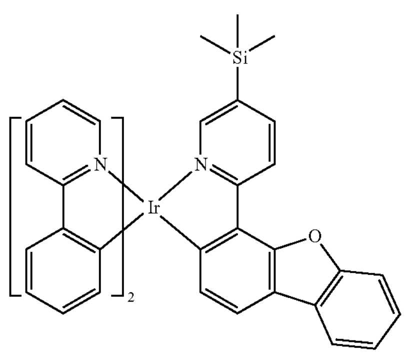

-continued
147
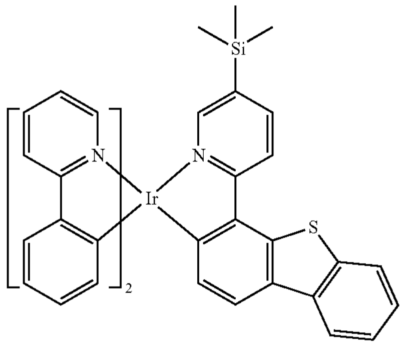
148
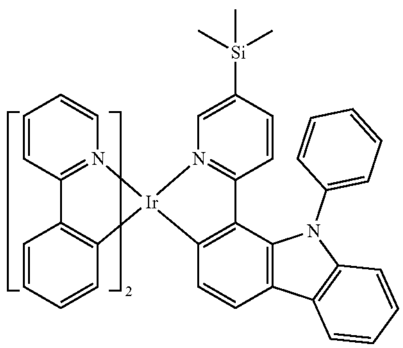
149
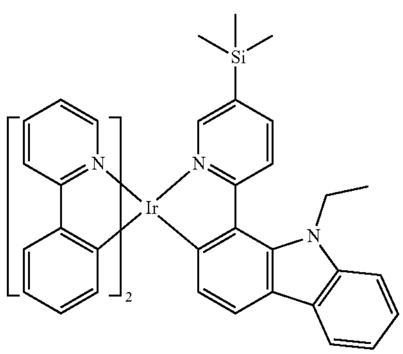
150
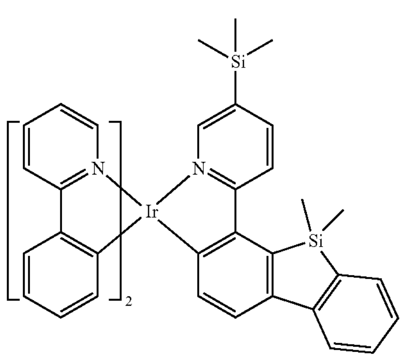
-continued
151
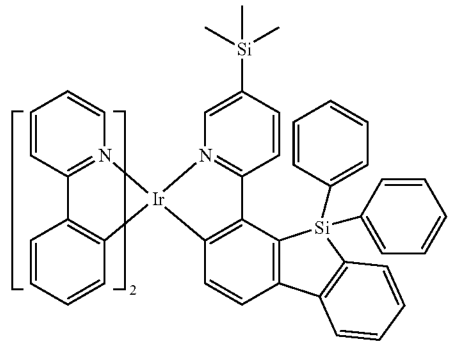
152
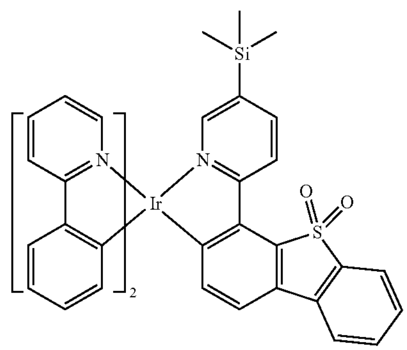
153
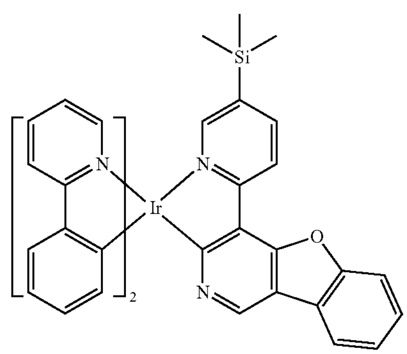
154
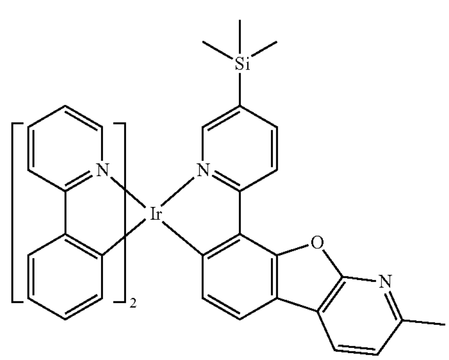

-continued
155
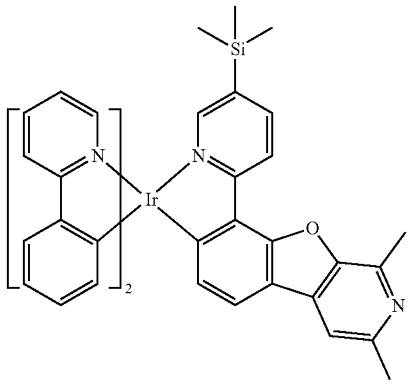
156
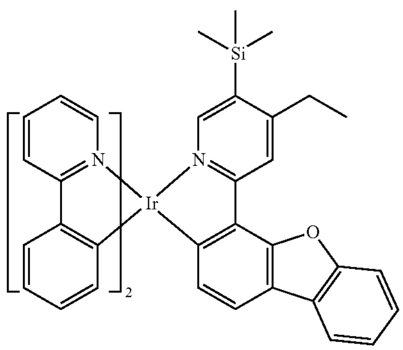
157
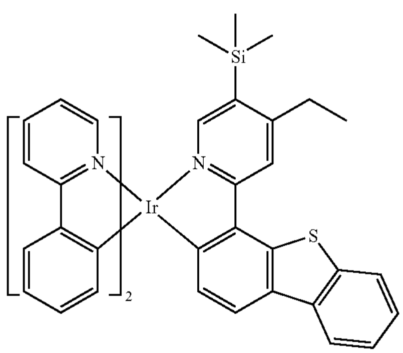
158
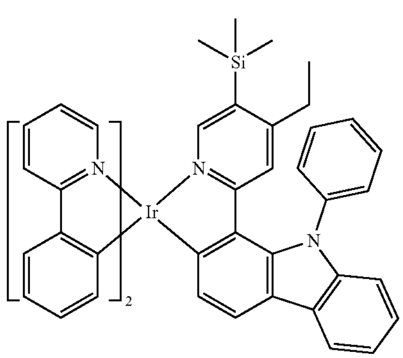
-continued
159
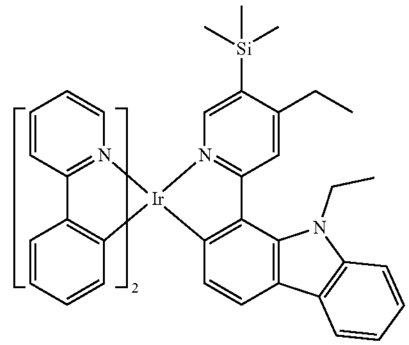
160
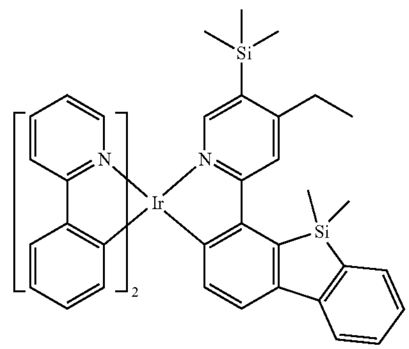
161
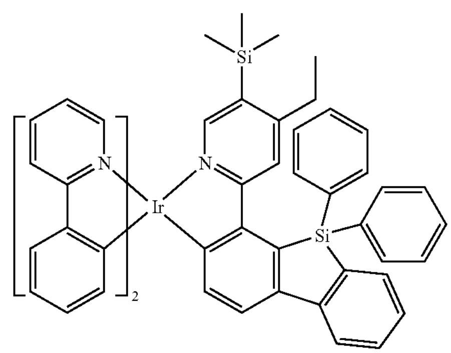
162
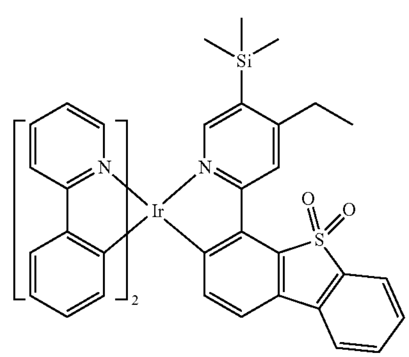

163
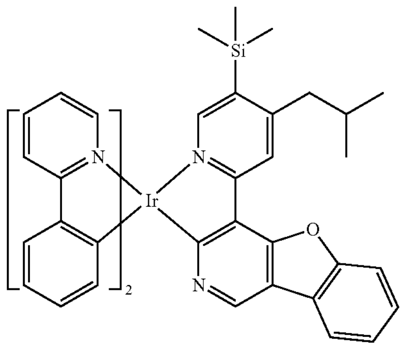
164
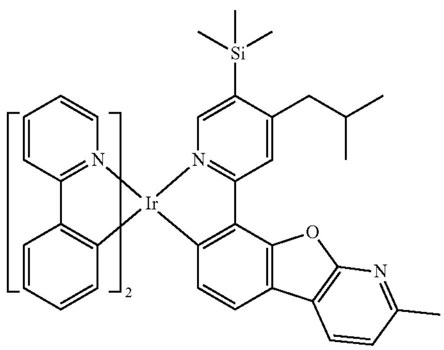
165
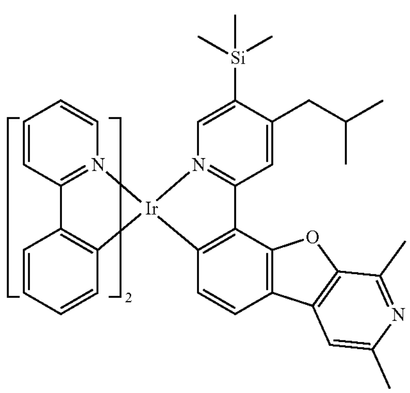
166
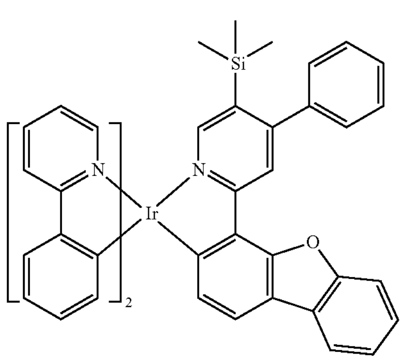
167
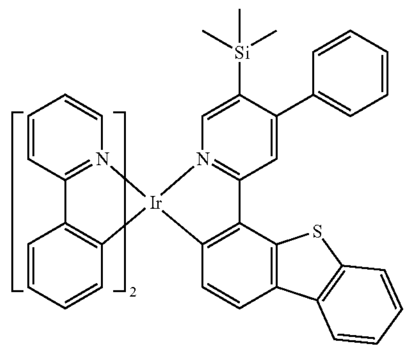
168
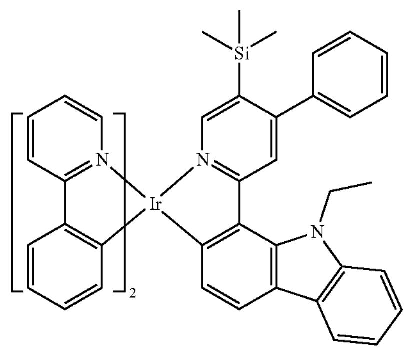
169
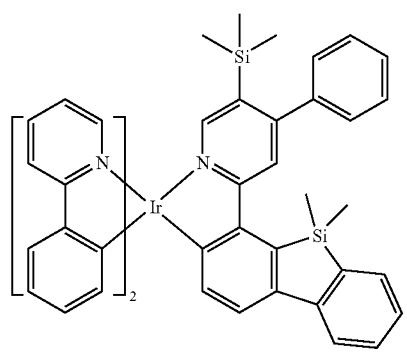
170
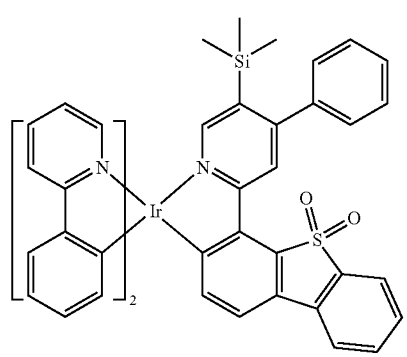

-continued
171
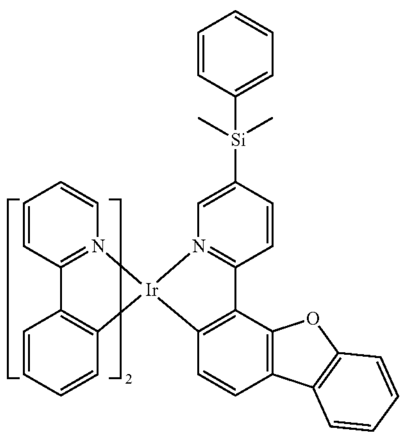
172
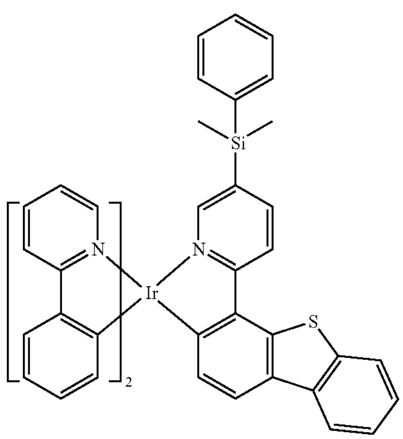
173
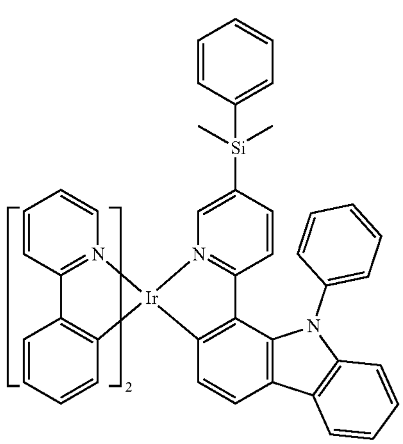
-continued
174
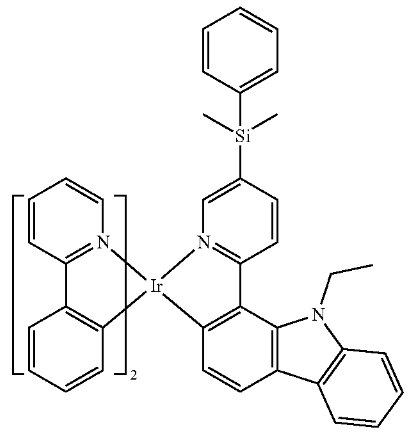
175
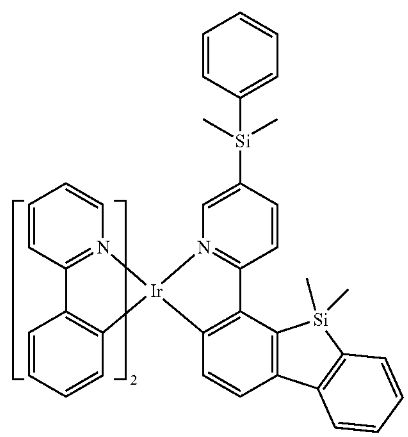
176
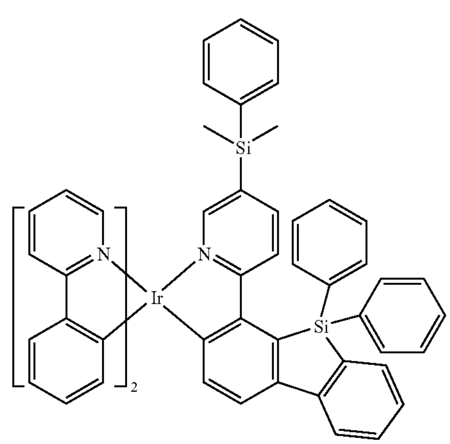

-continued
177
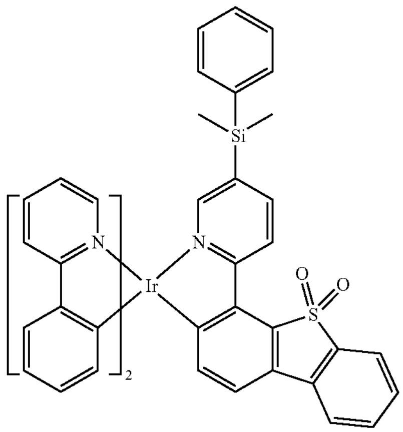
178
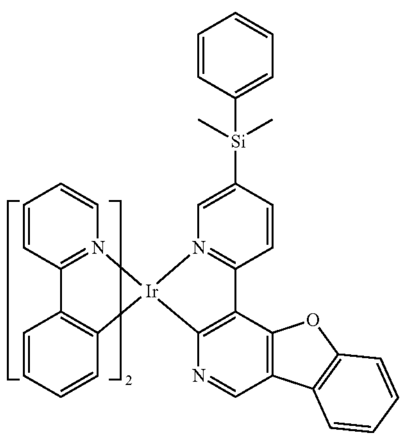
179
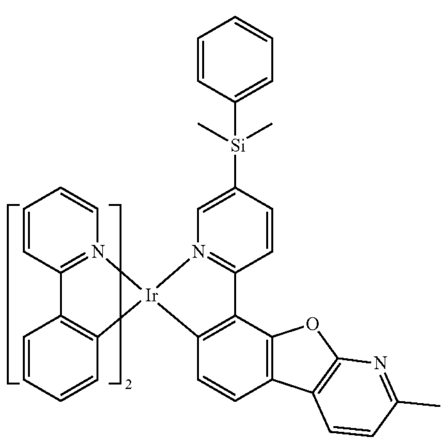
-continued
180
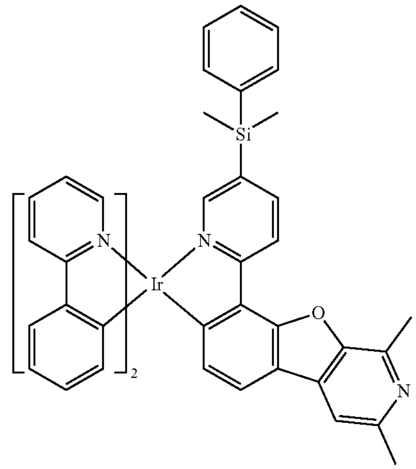
181
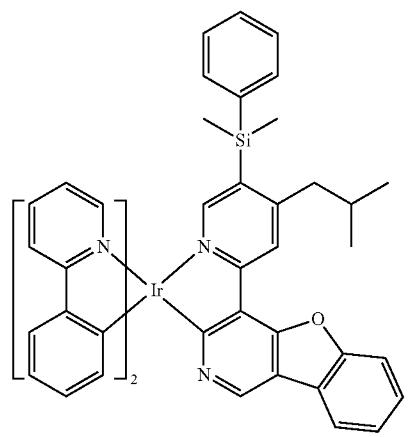
182
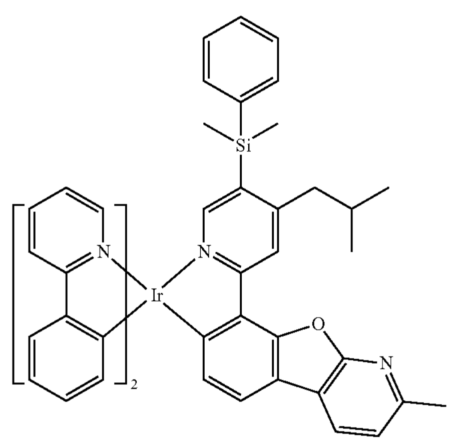

-continued
183
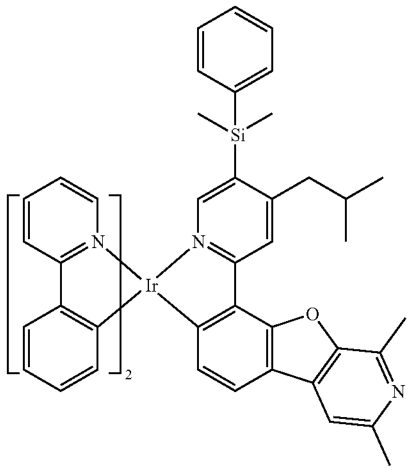
184
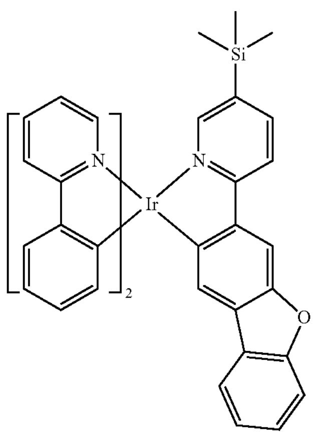
185
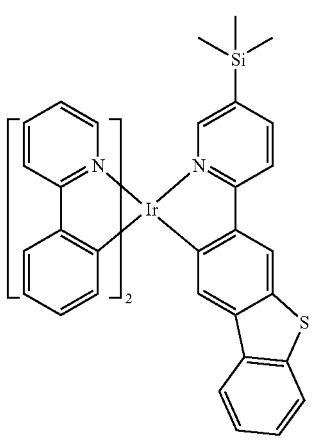
-continued
186
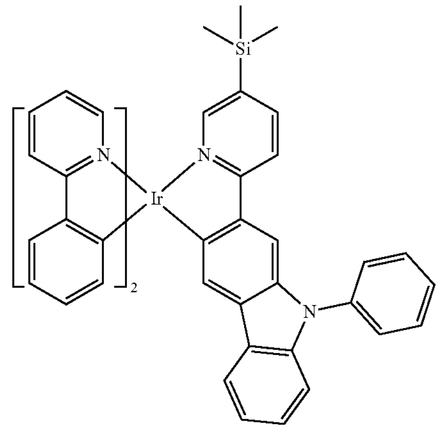
187
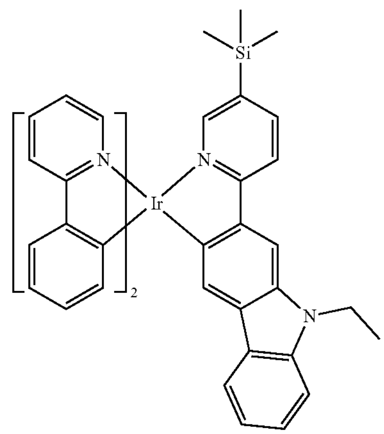
188
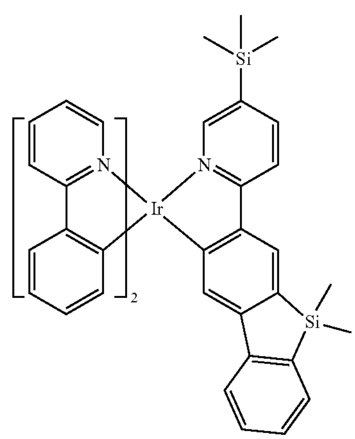

-continued
189
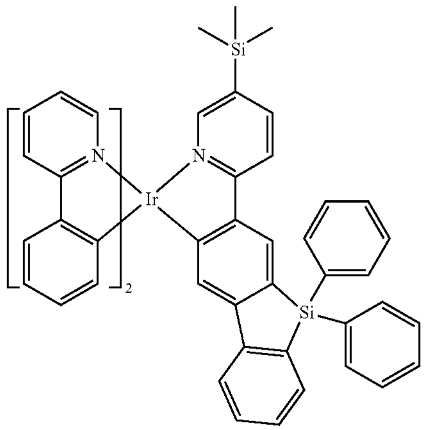
190
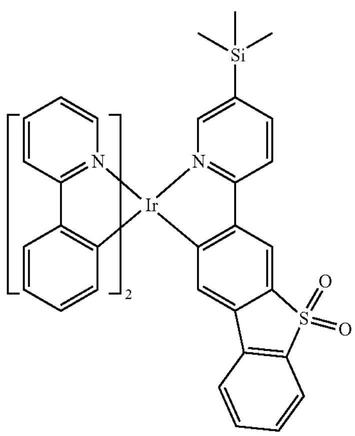
191
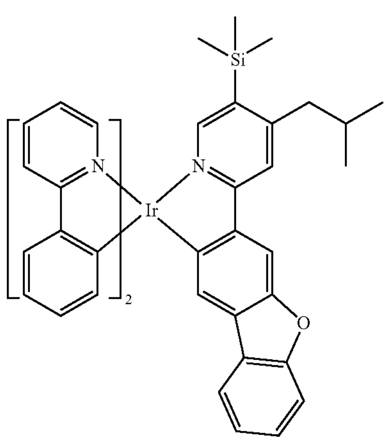
-continued
192
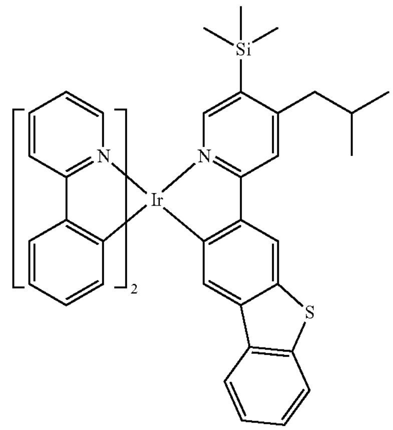
193
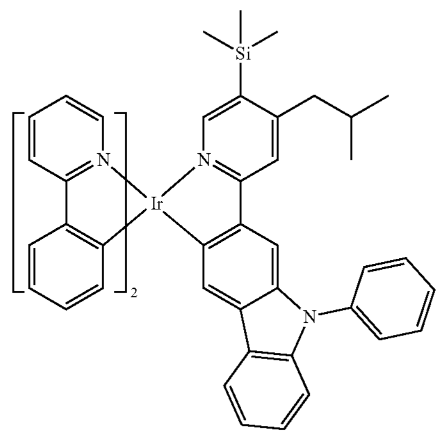
194
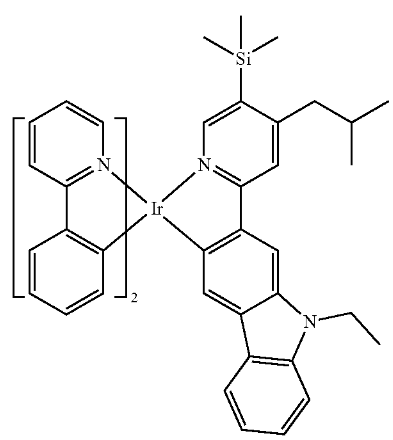

-continued
195
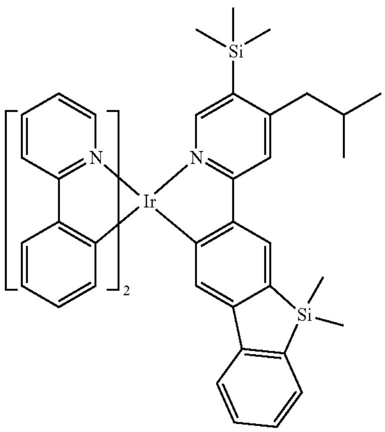
196
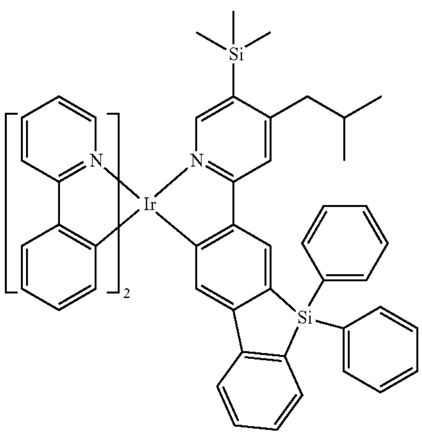
197
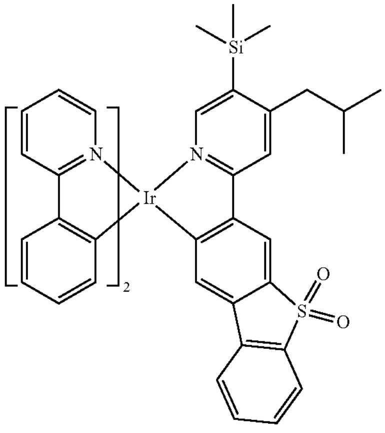
-continued
198
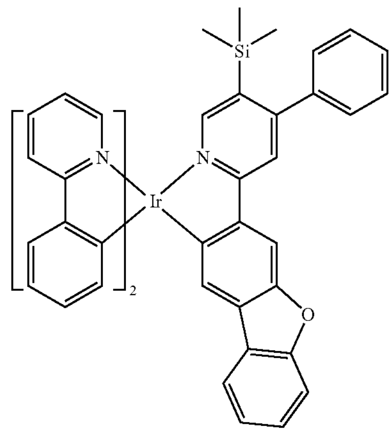
199
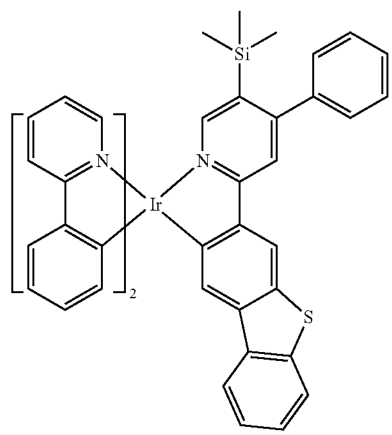
200
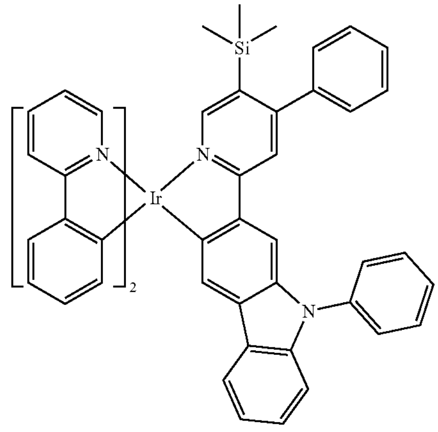

201
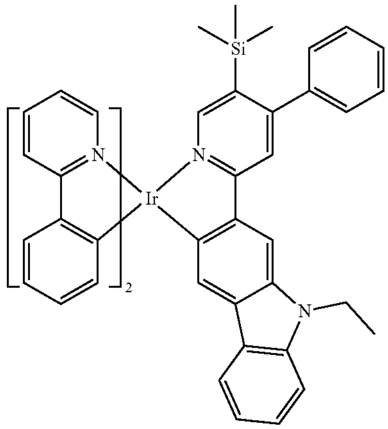
202
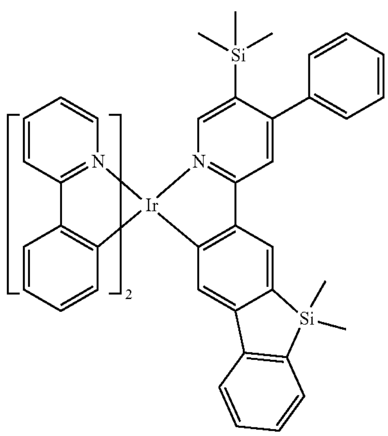
203
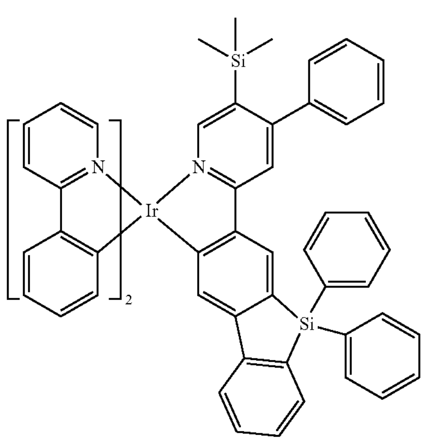
204
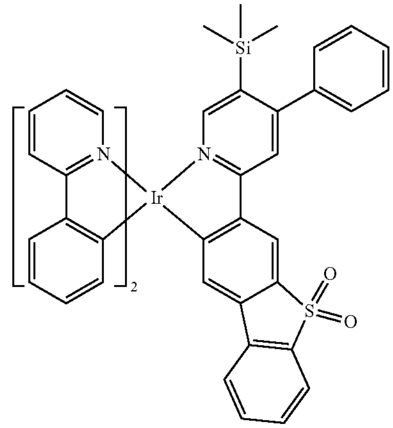
205
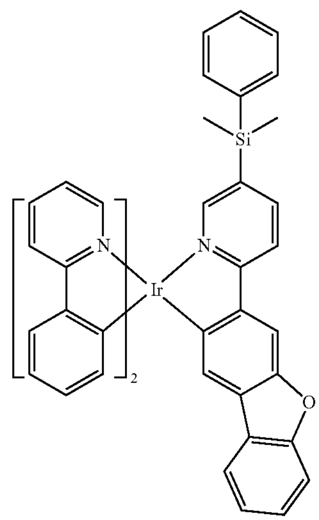
206
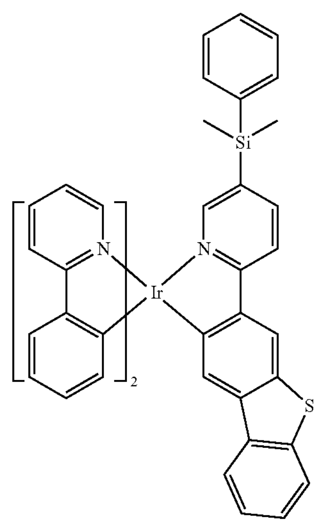

-continued
207
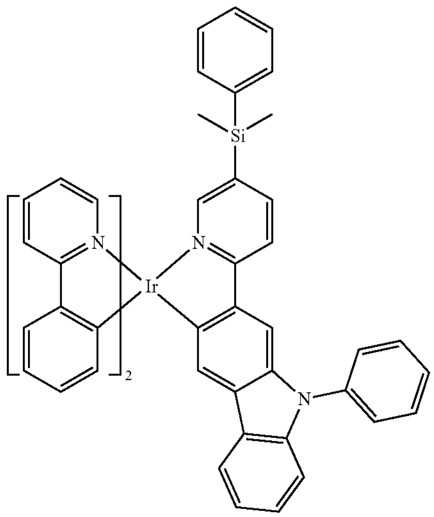
208
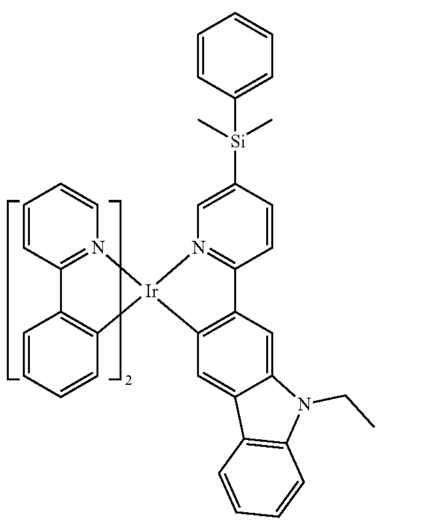
209
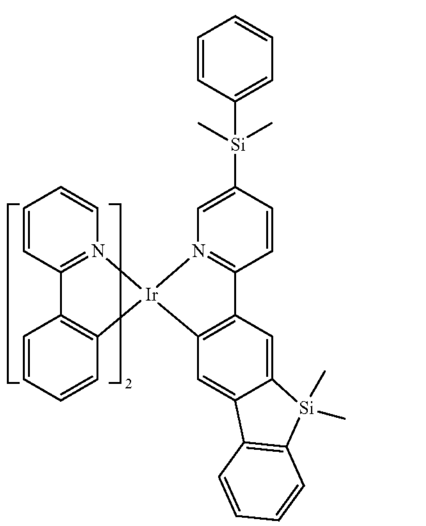
-continued
210
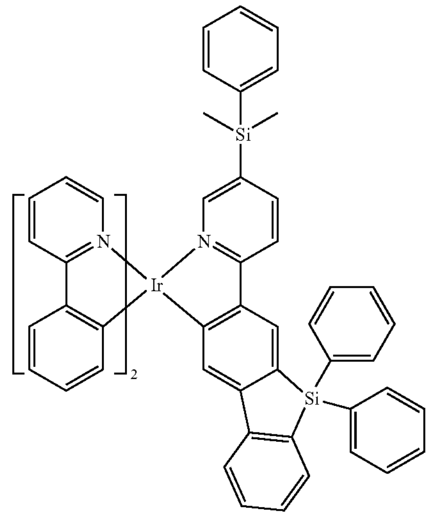
211
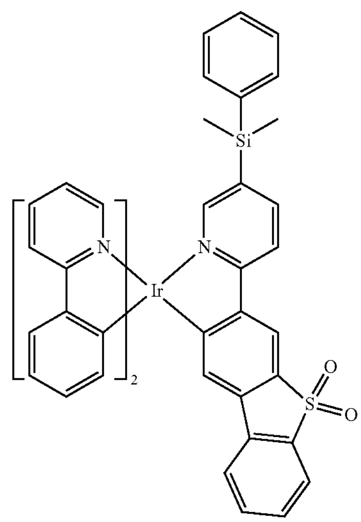
212
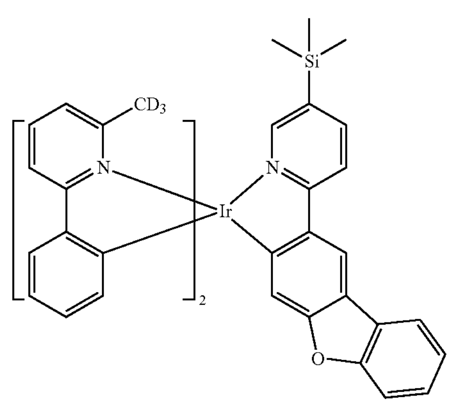

-continued
213
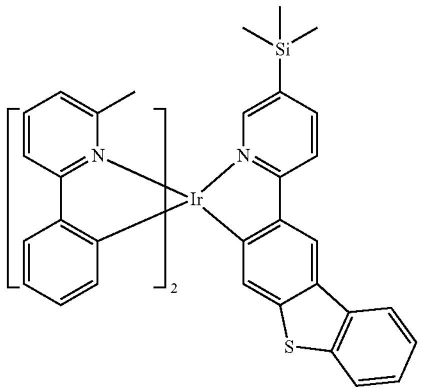
214
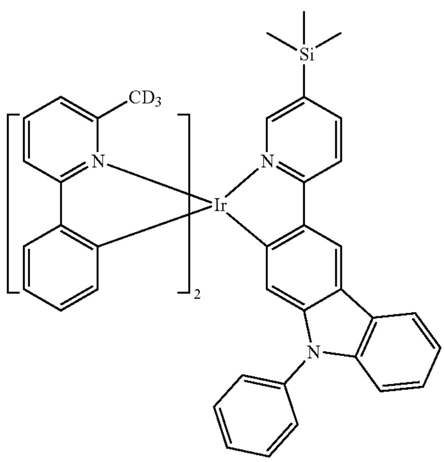
215
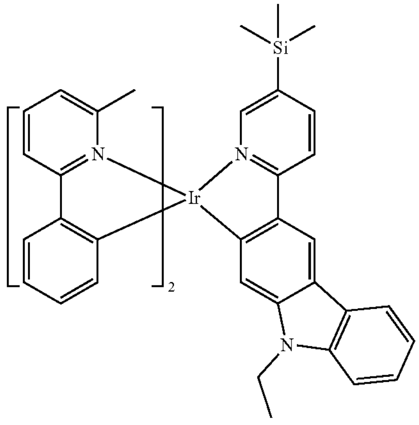
-continued
216
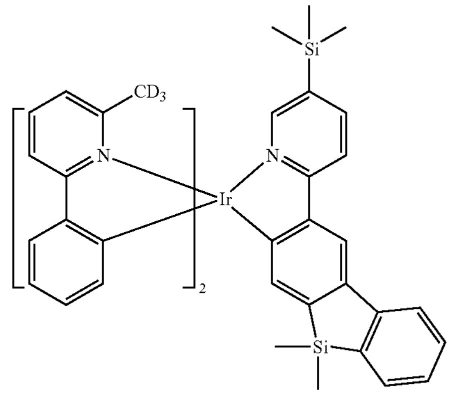
217
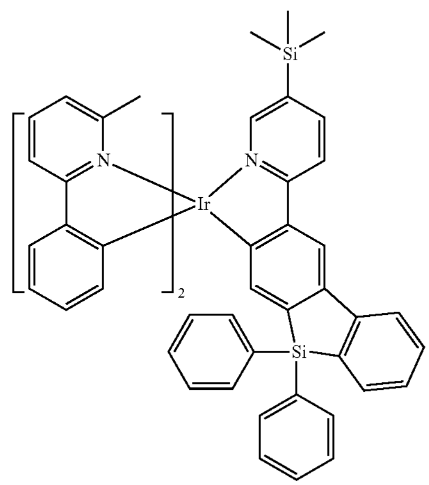
218
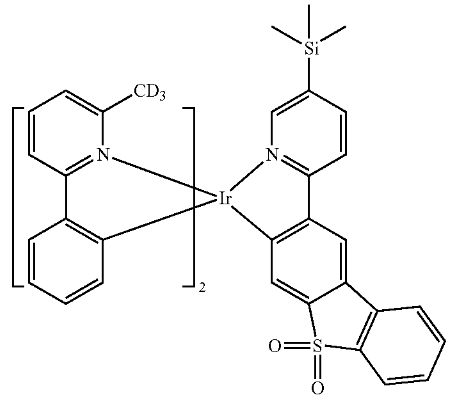

-continued
219
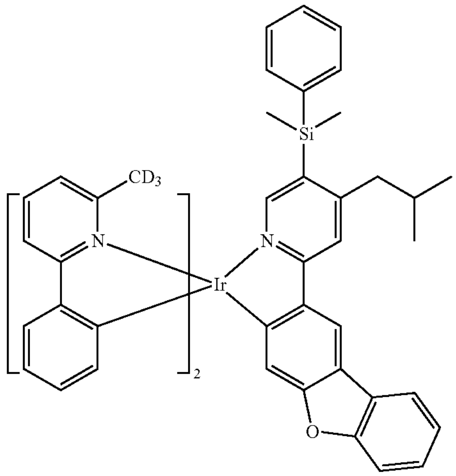
220
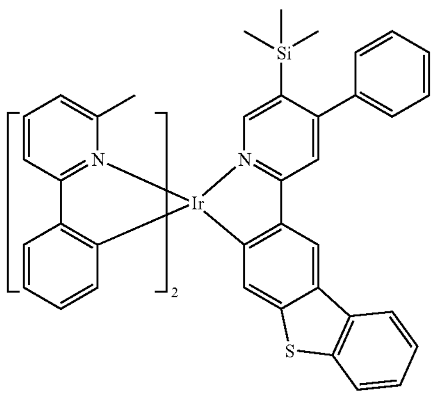
221
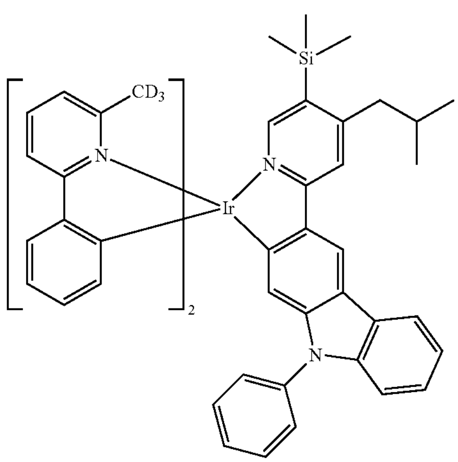
-continued
222
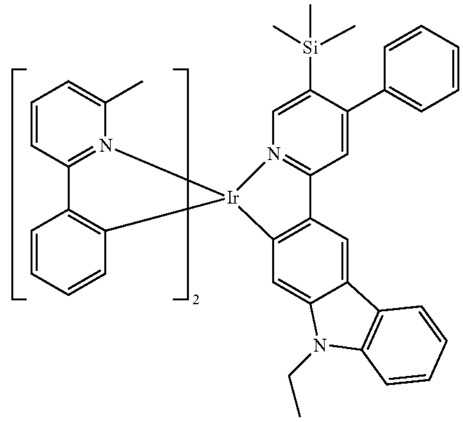
223
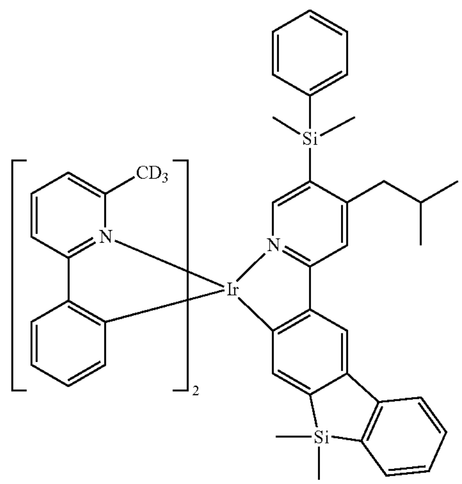
224
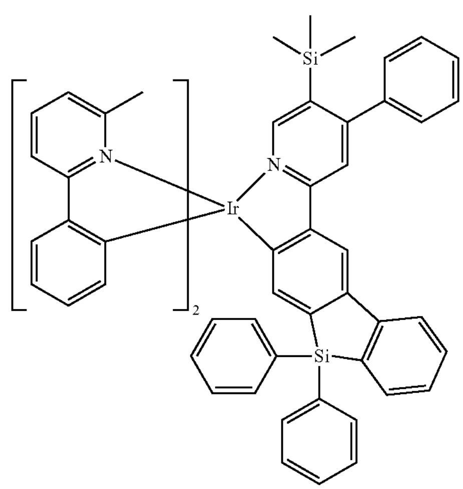

-continued
225
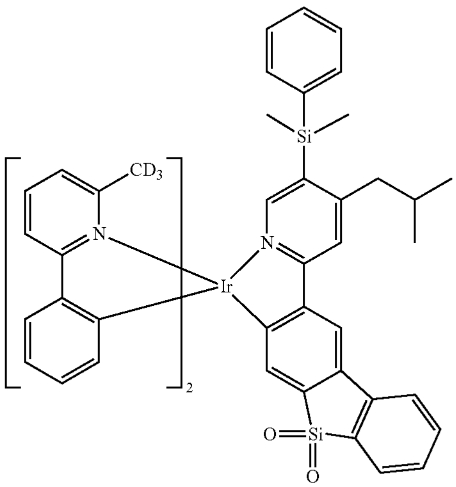
226
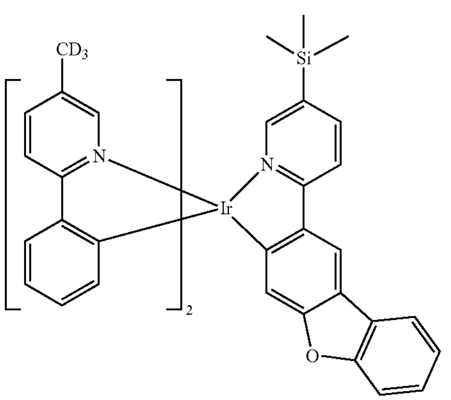
227
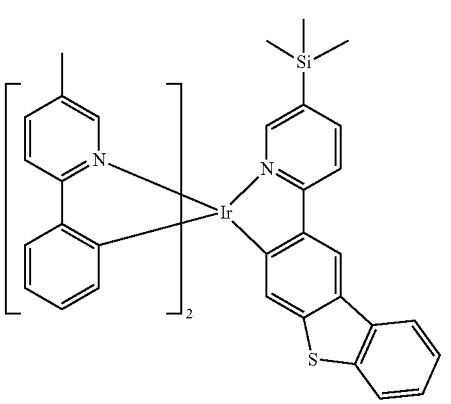
-continued
228
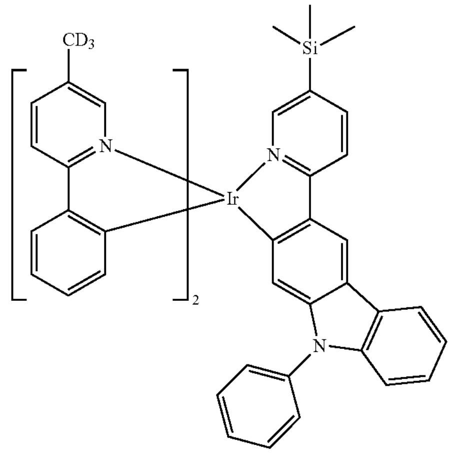
229
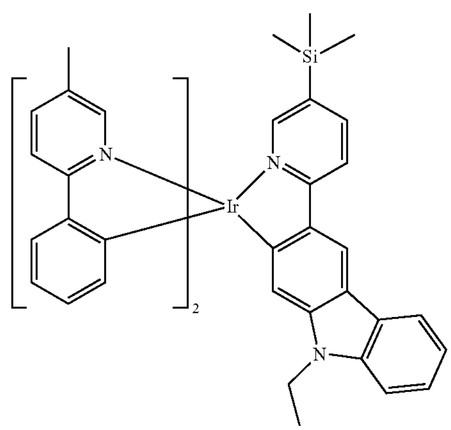
230
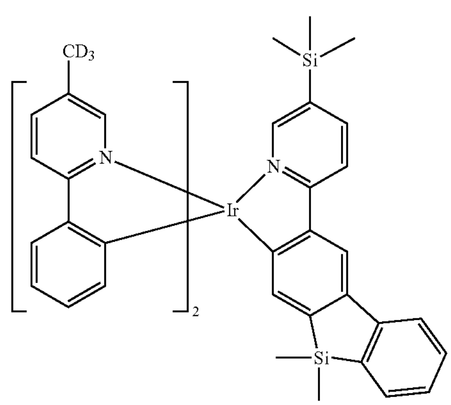

-continued
231
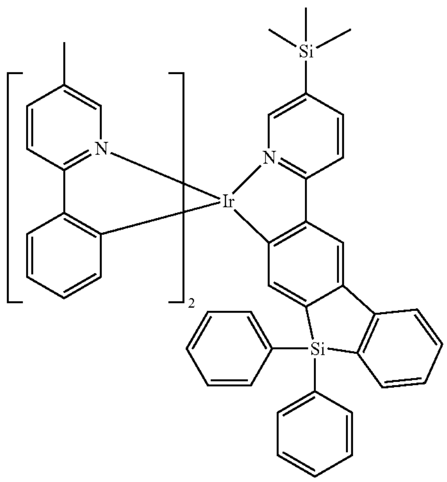
232
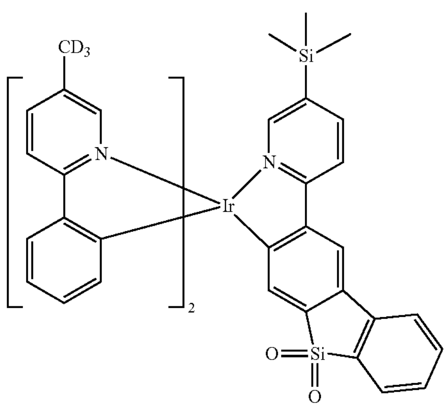
233
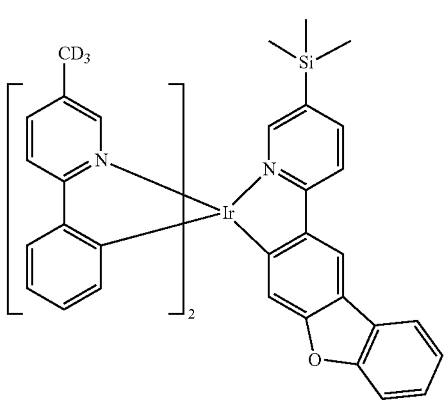
-continued
234
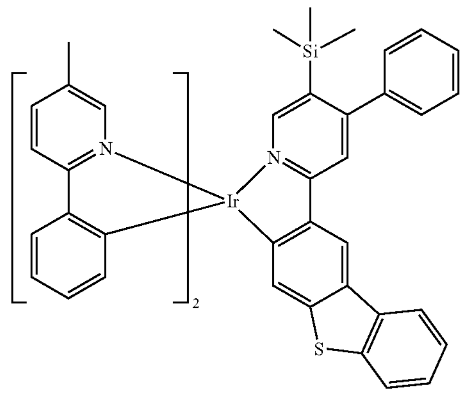
235
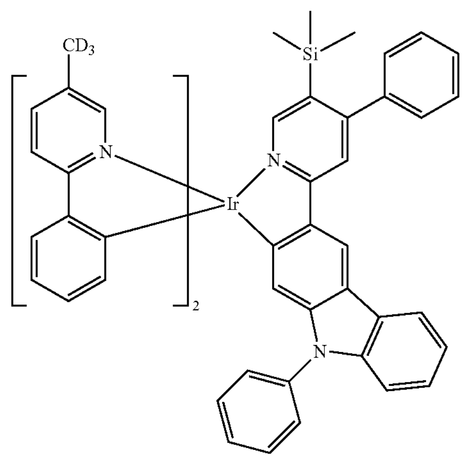
236
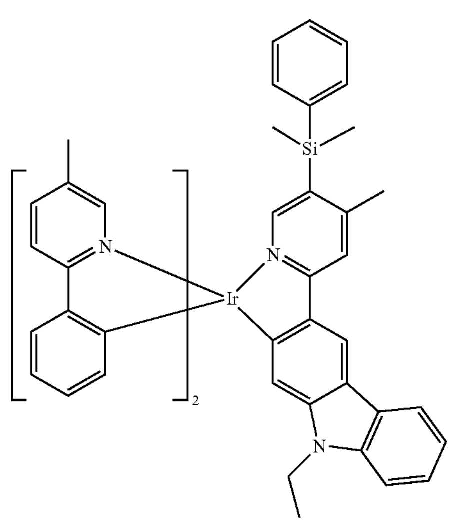

-continued
237
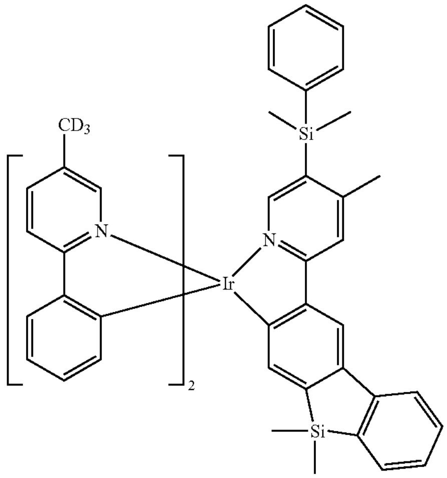
238
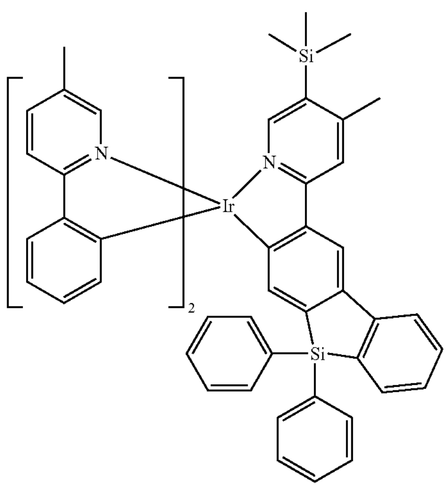
239
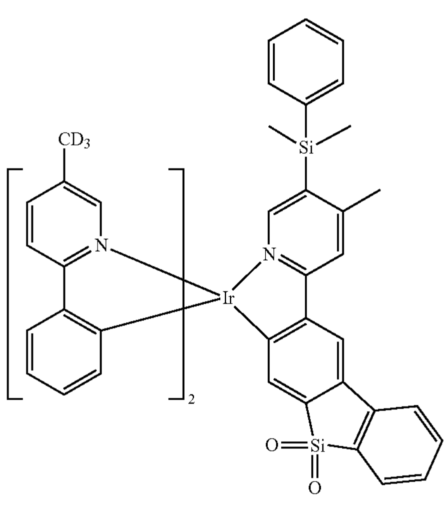
-continued
240
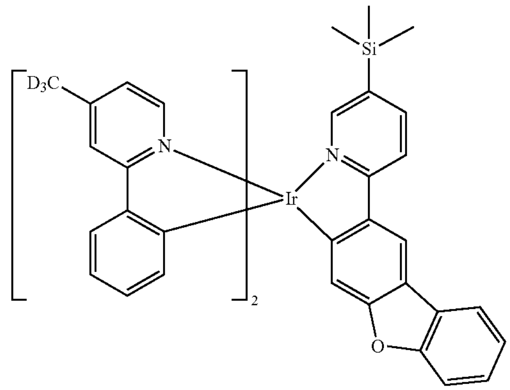
241
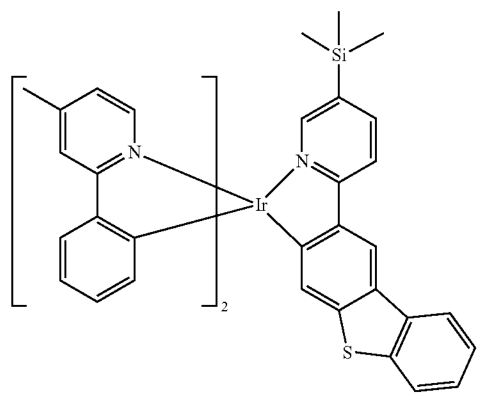
242
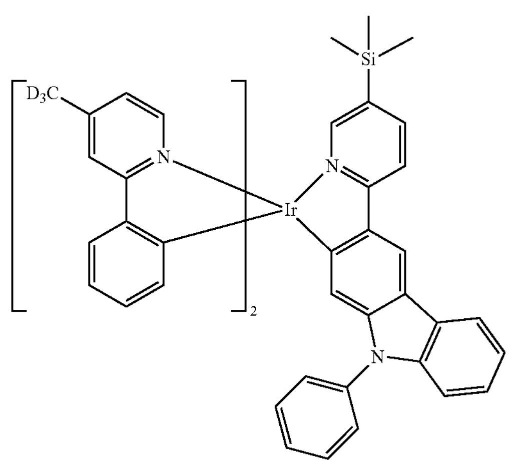

-continued
243
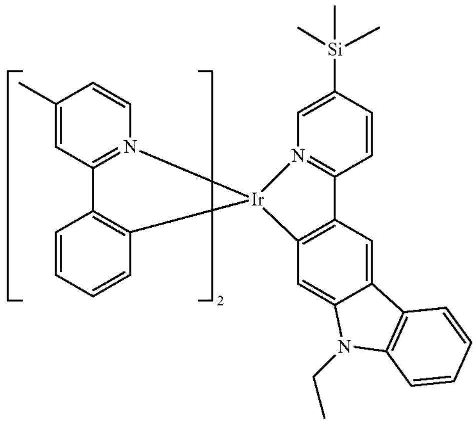
244
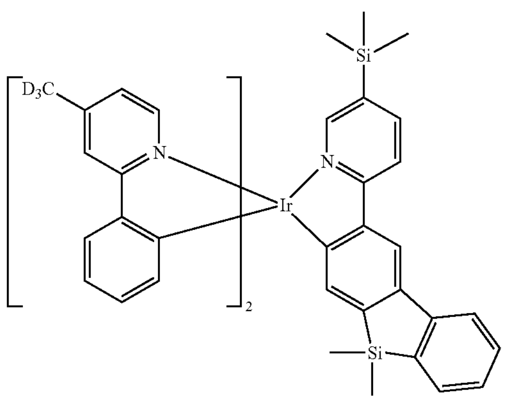
245
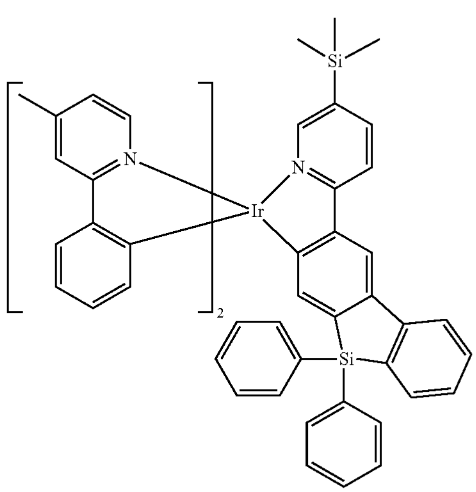
-continued
246
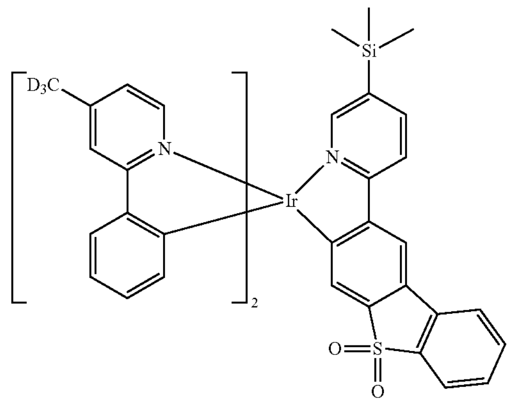
247
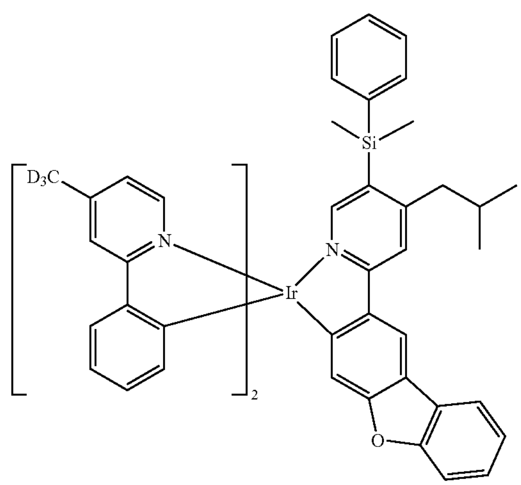
248
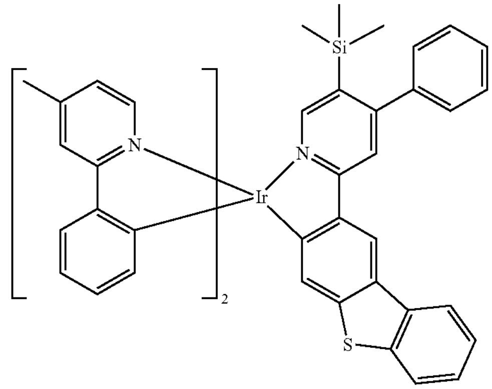

-continued
249
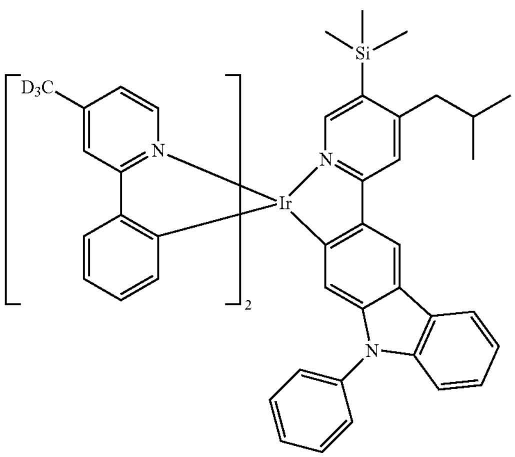
250
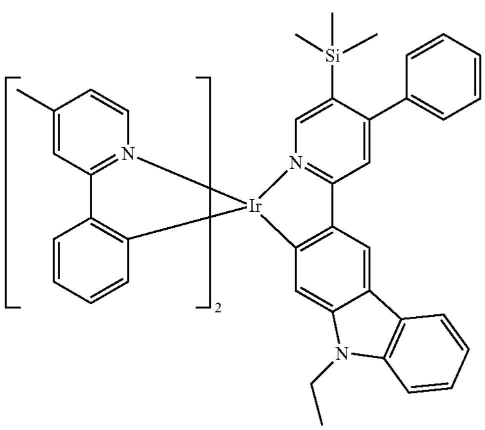
251
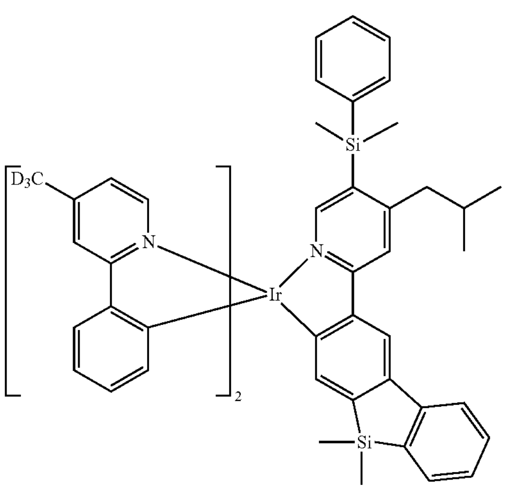
-continued
252
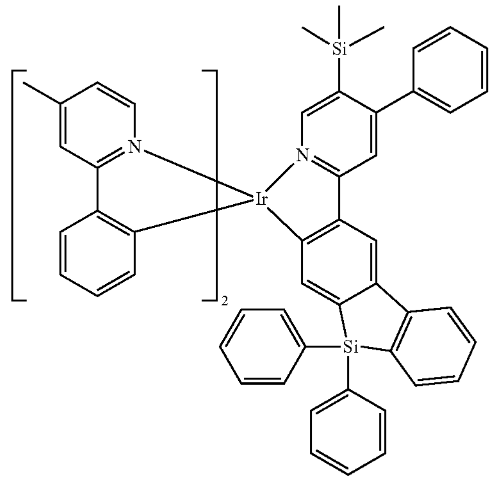
253
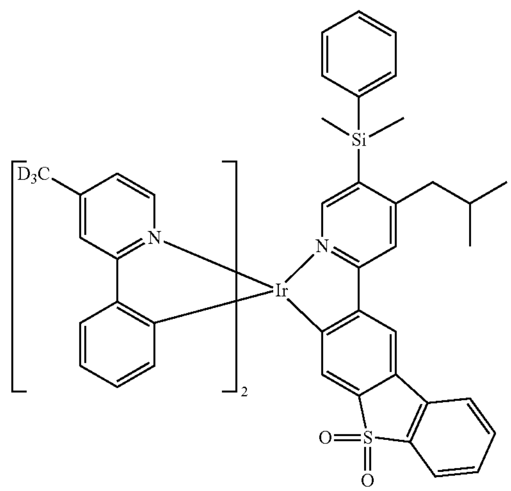
254
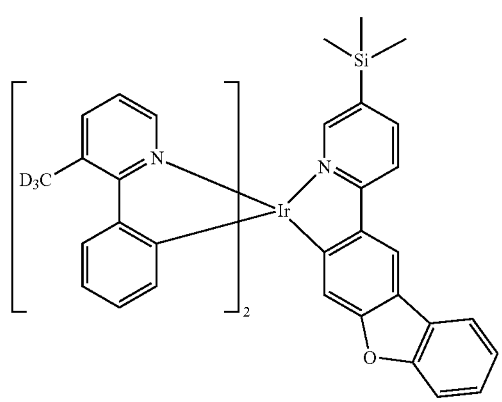

-continued
255
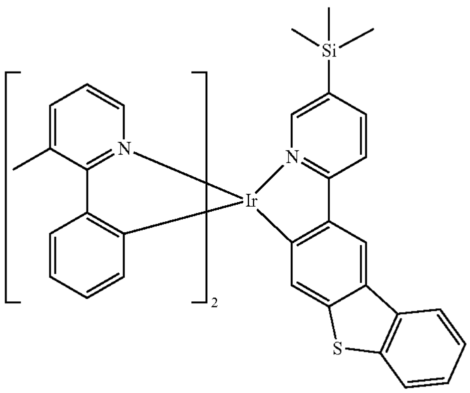
256
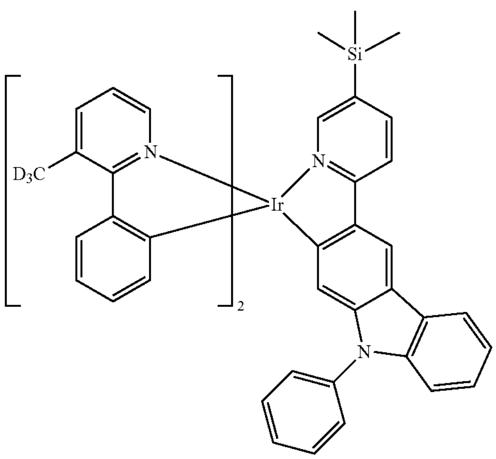
257
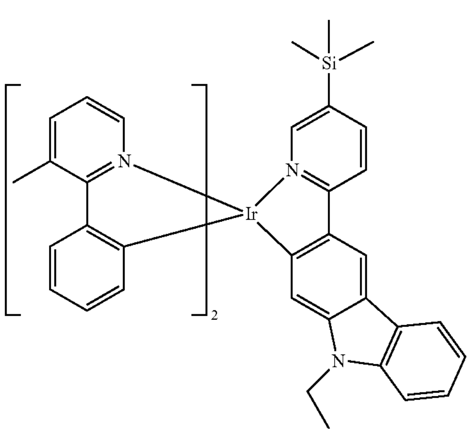
-continued
258
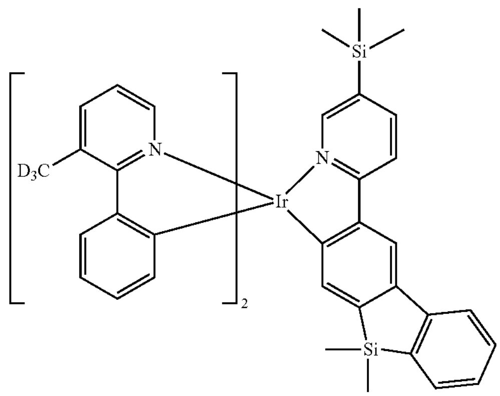
259
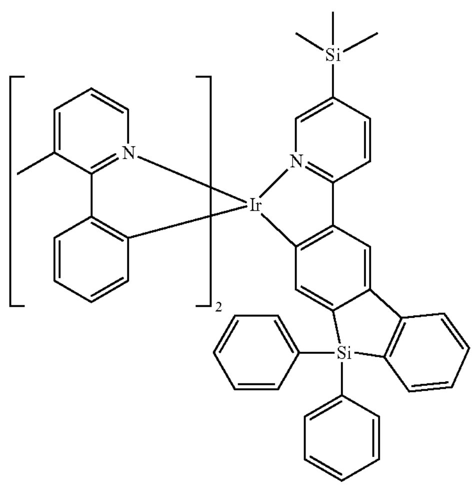
260
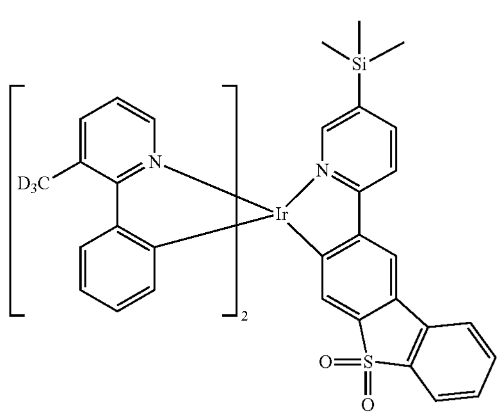

-continued
261
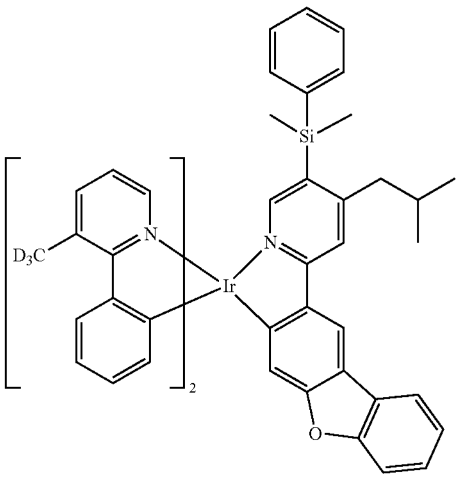
262
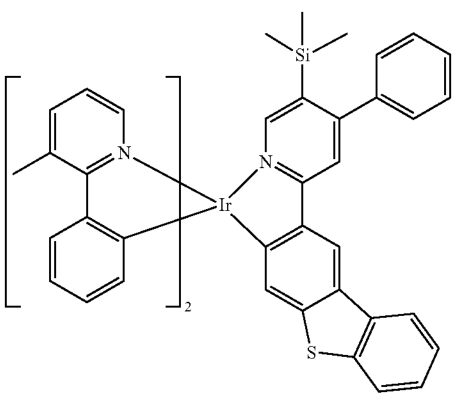
263
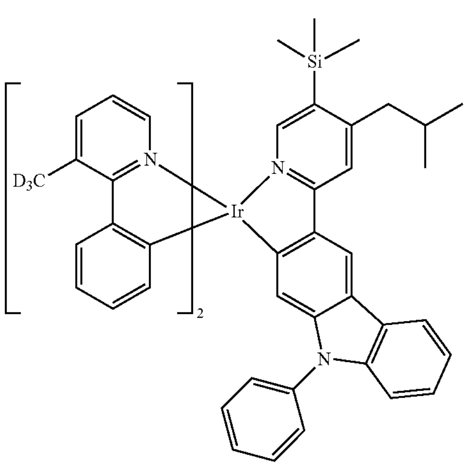
-continued
264
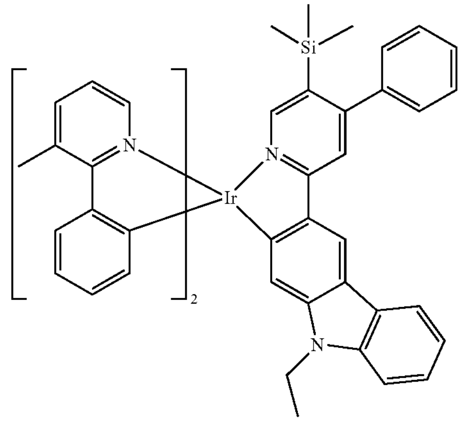
265
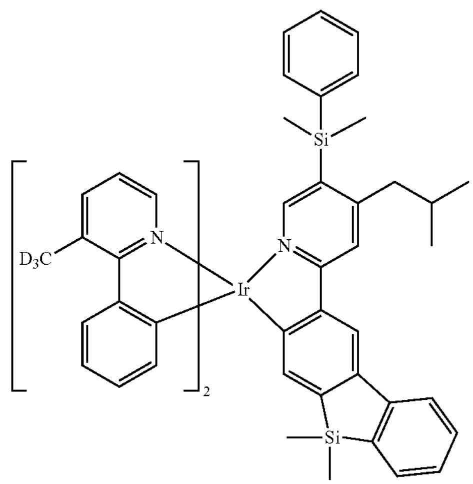
266
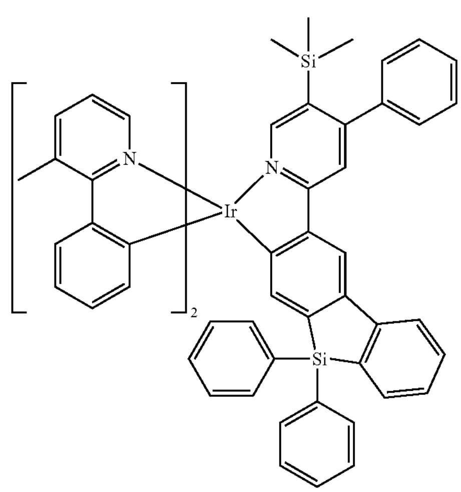

-continued
267
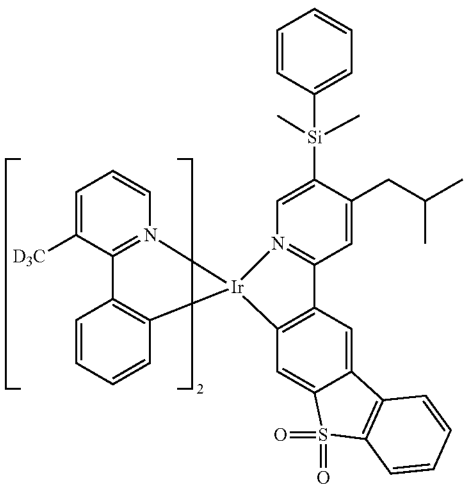
268
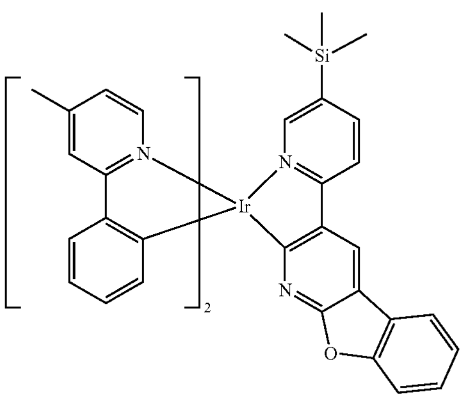
269
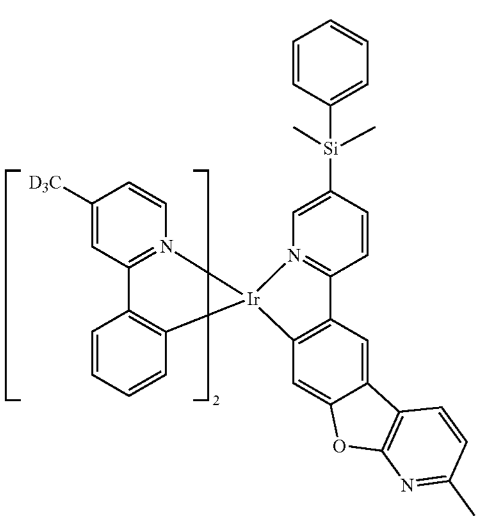
-continued
270
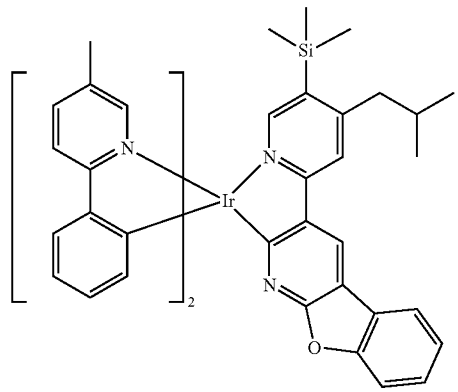
271
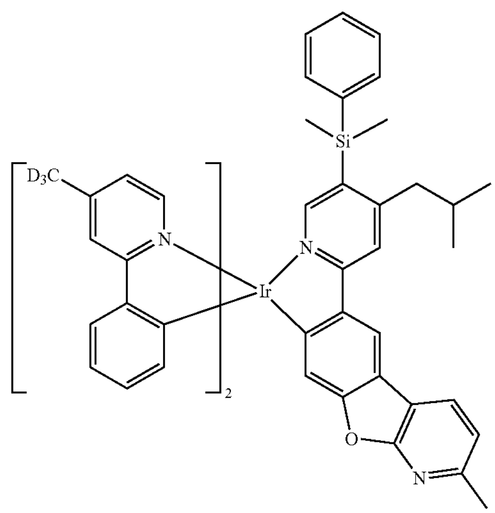
272
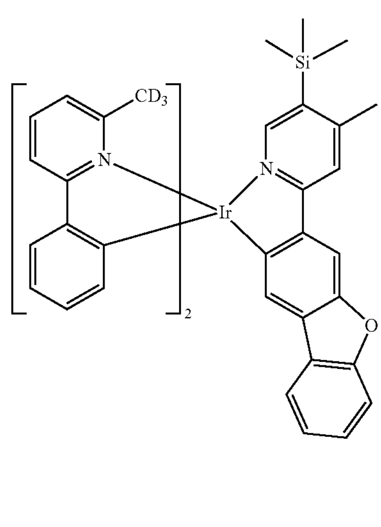

273
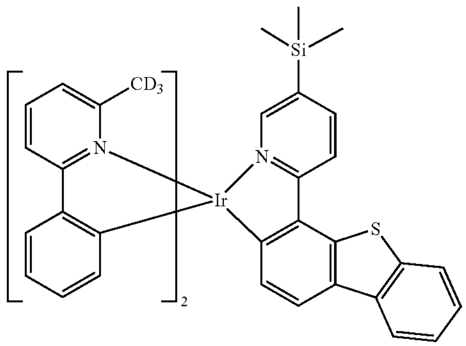
274
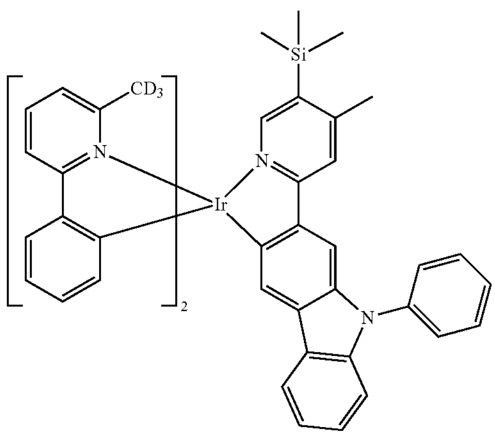
275
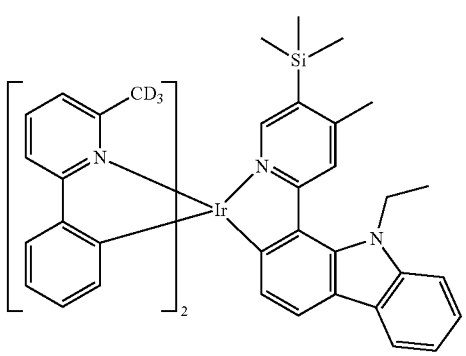
276
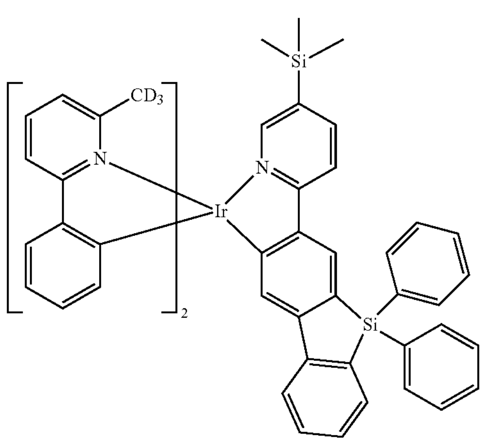
277
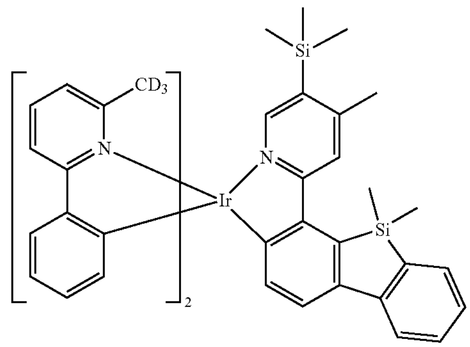
278
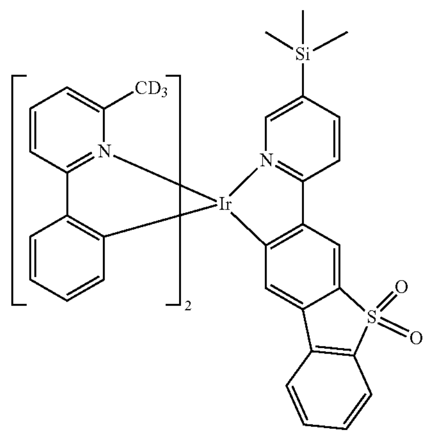
279
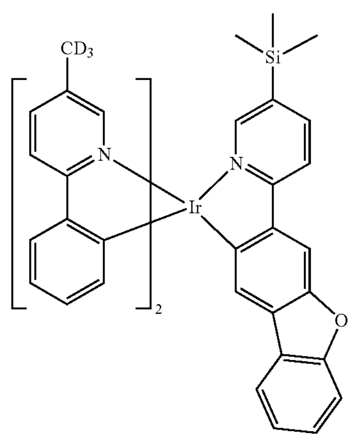
280
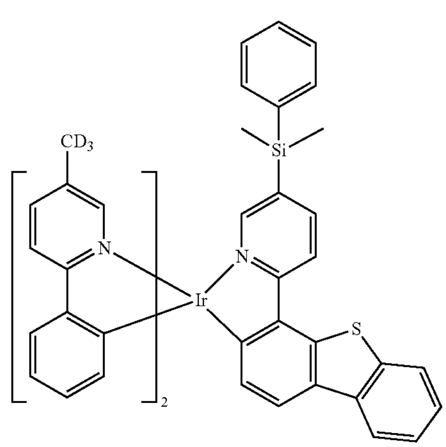

-continued
281
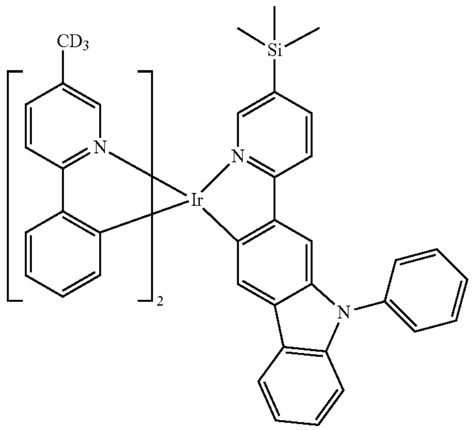
282
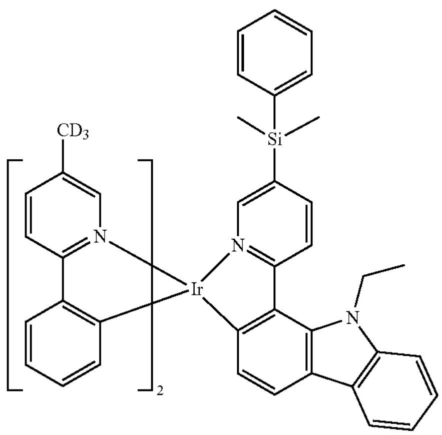
283
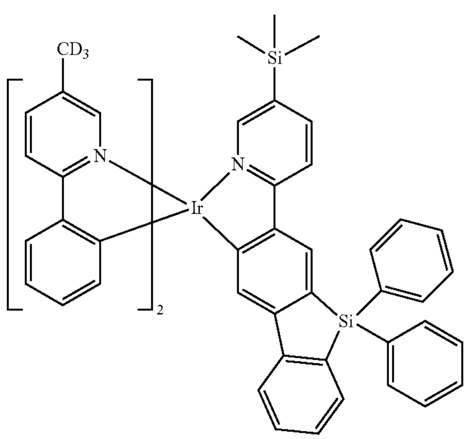
284
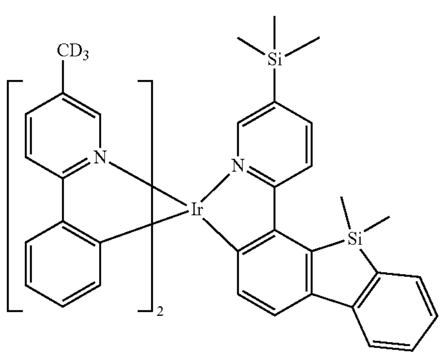
-continued
285
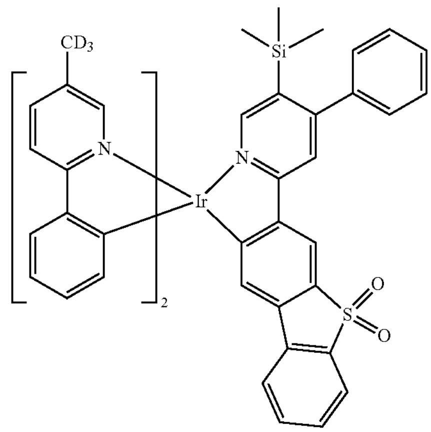
286
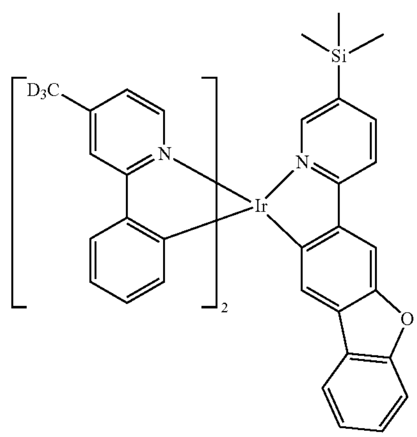
287
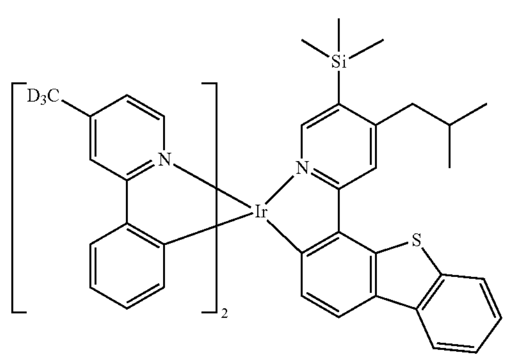

-continued
288
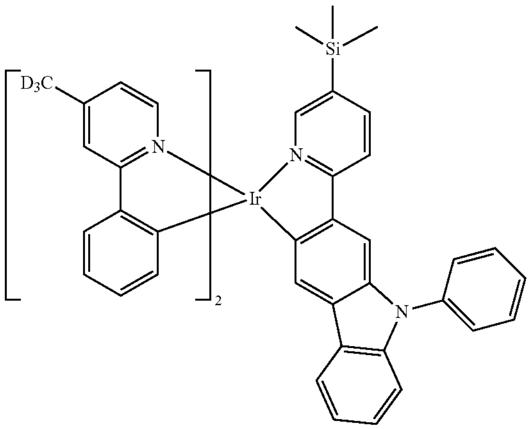
289
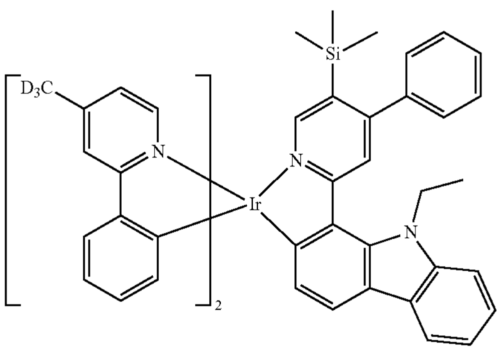
290
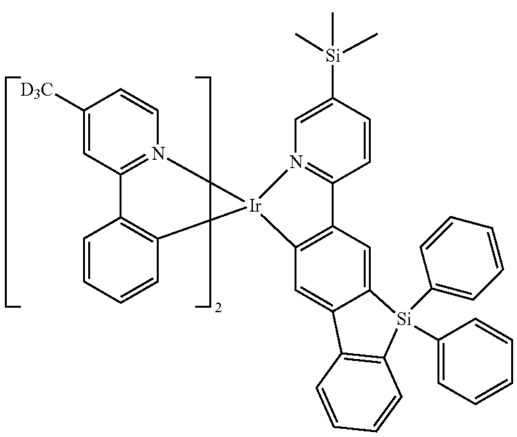
291
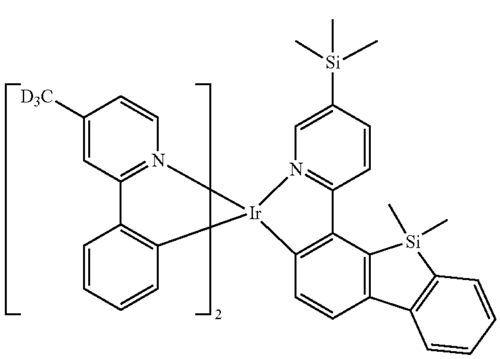
-continued
292
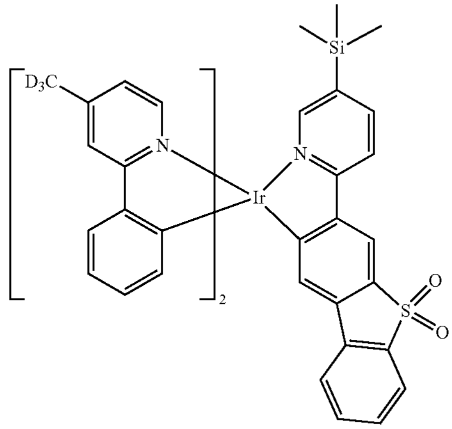
293
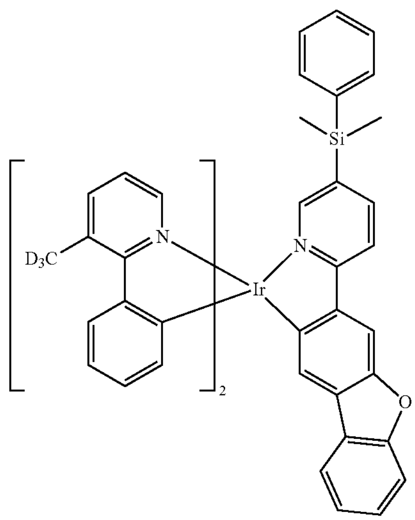
294
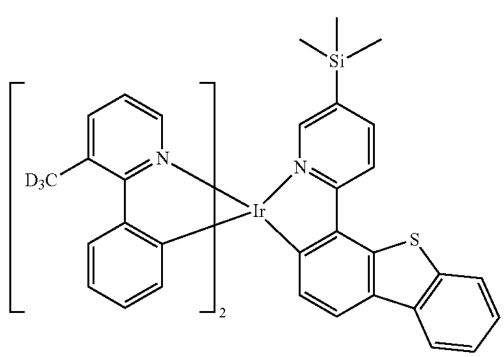

-continued
295
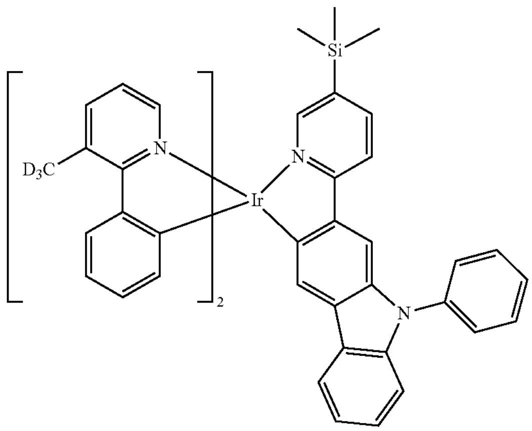
296
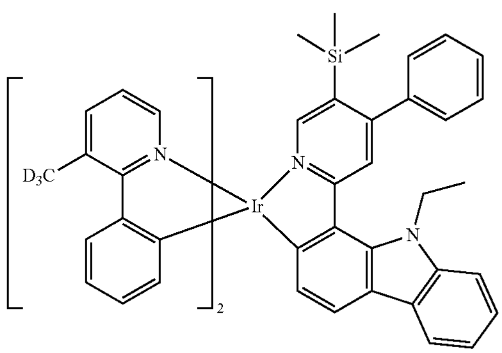
297
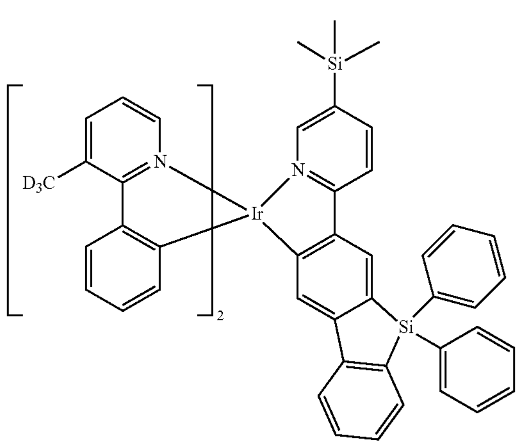
-continued
298
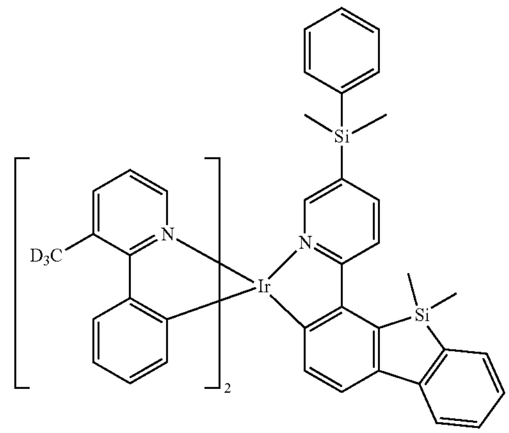
299
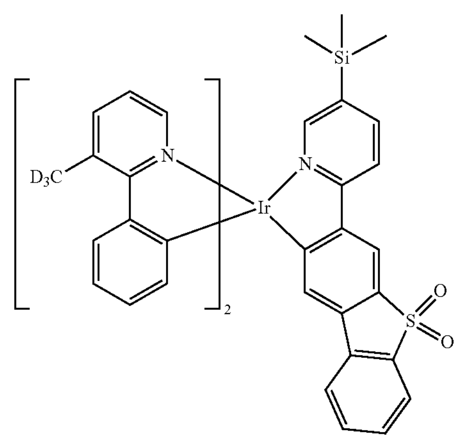
300
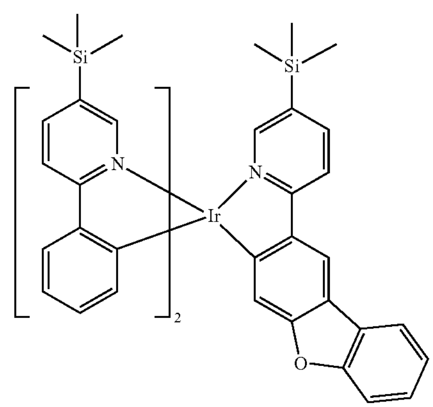

-continued
301
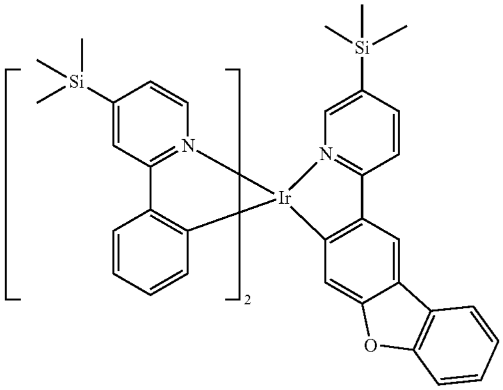
302
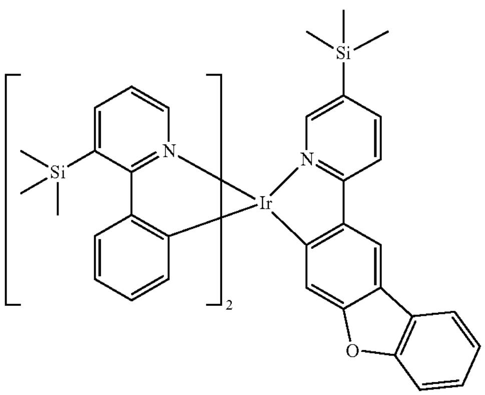
303
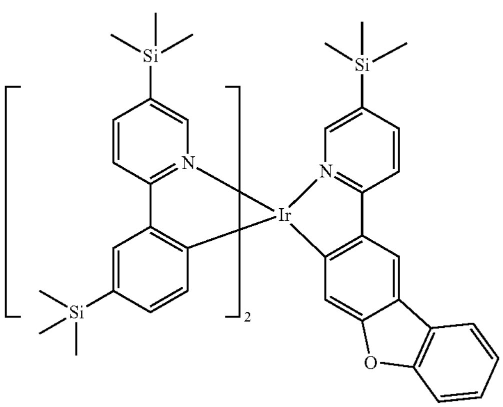
304
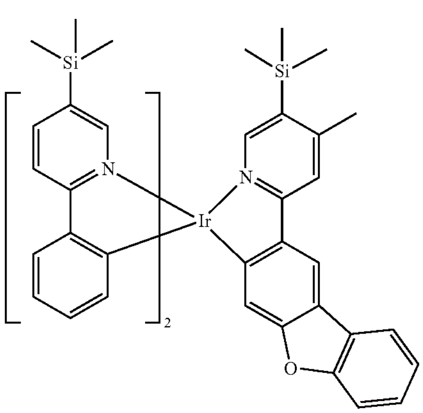
-continued
305
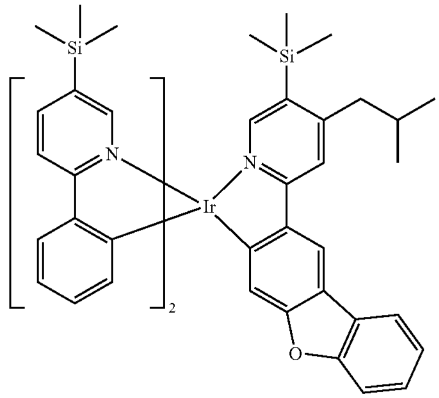
306
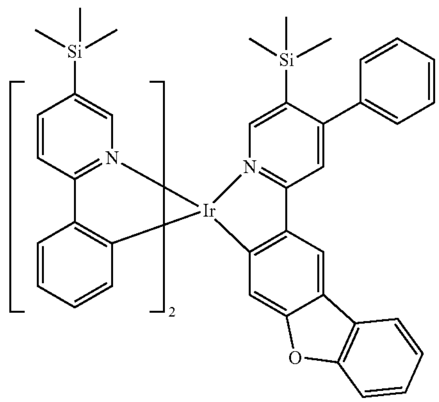
307
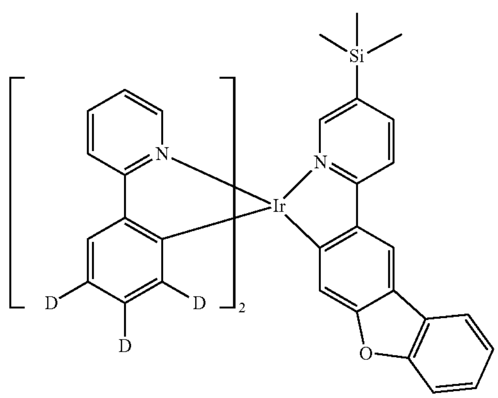
308
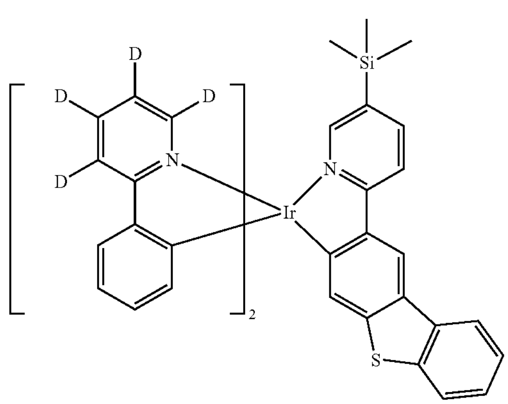

-continued
309
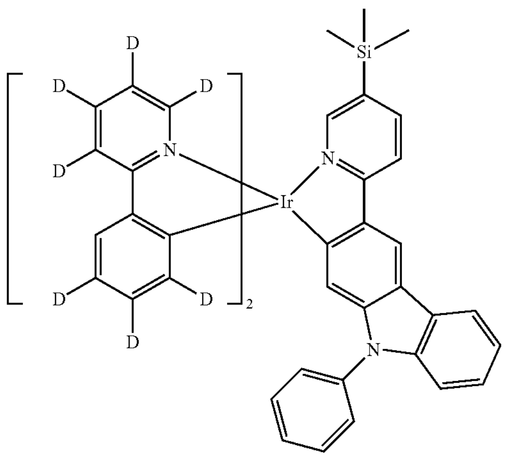
310
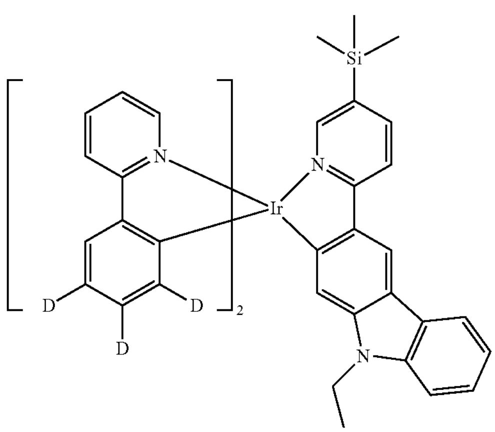
311
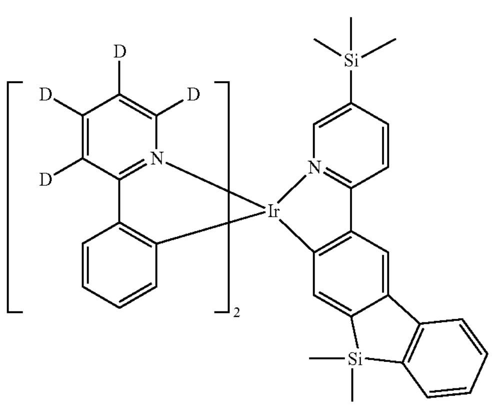
-continued
312
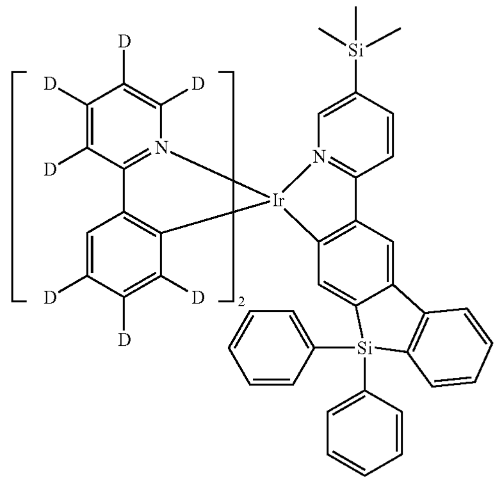
313
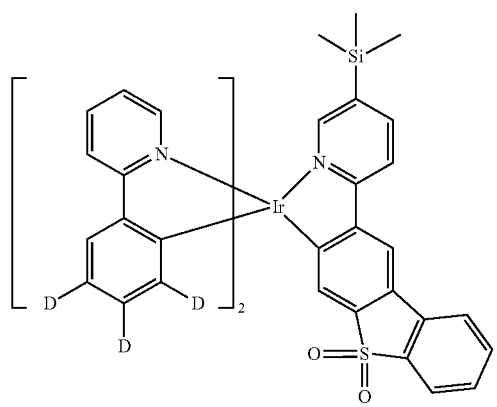
314
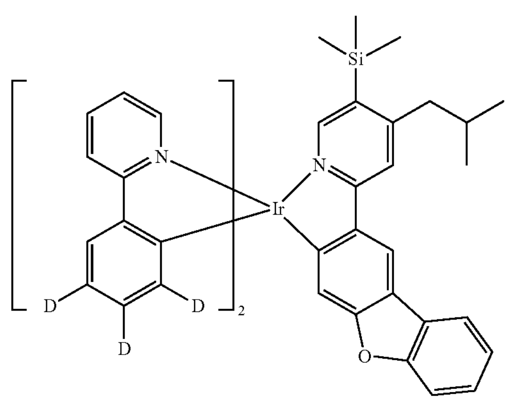

-continued
315
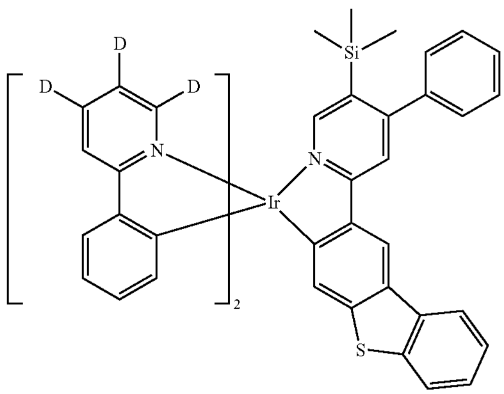
316
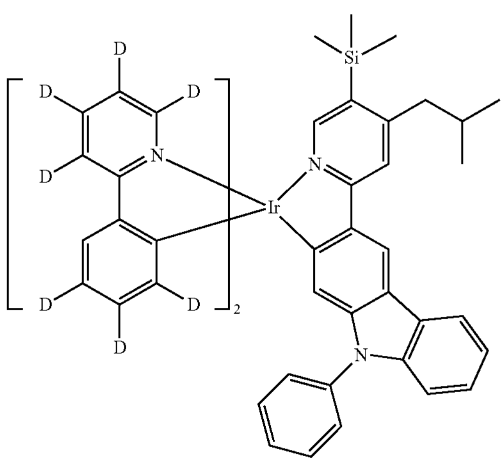
317
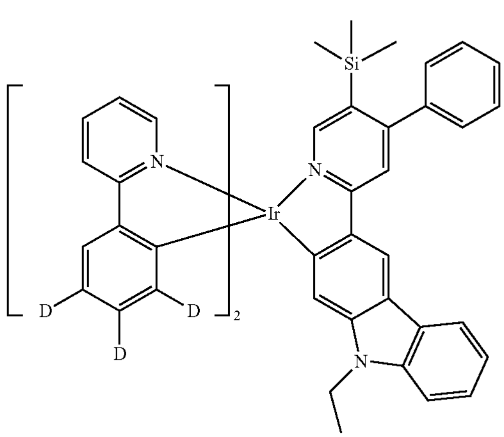
-continued
318
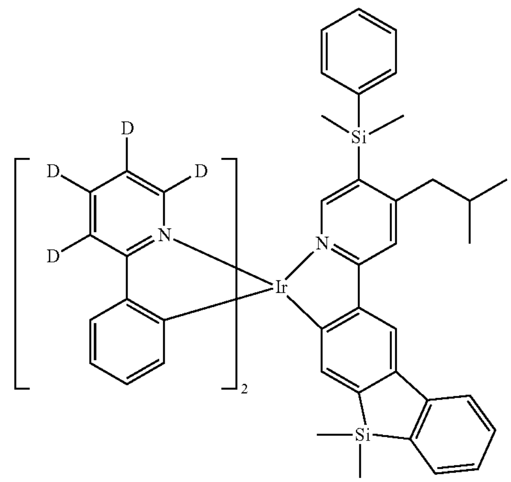
319
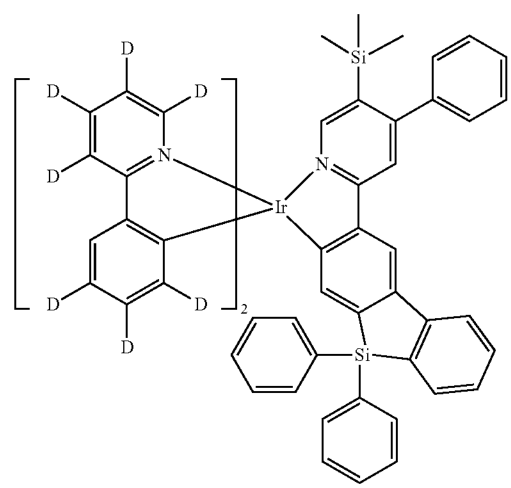
320
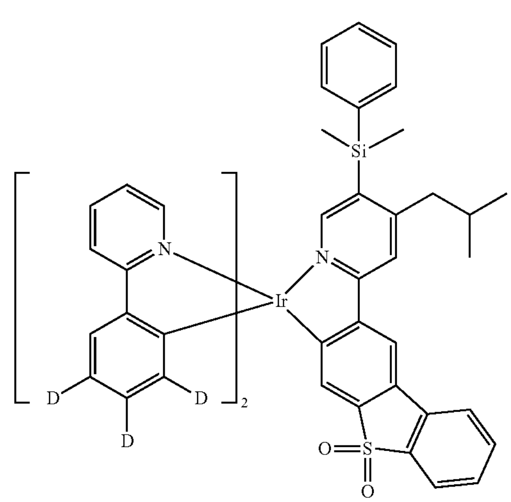

321
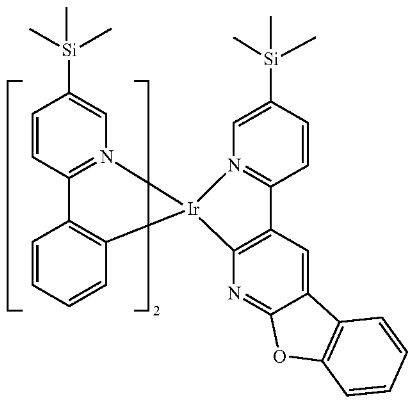
322
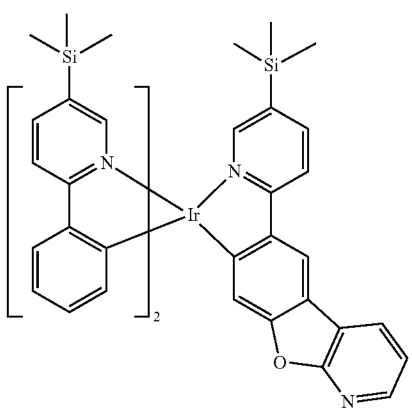
323
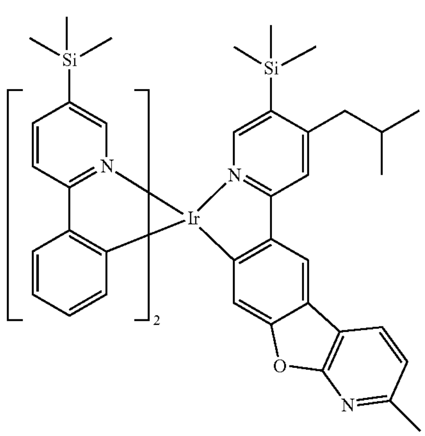
324
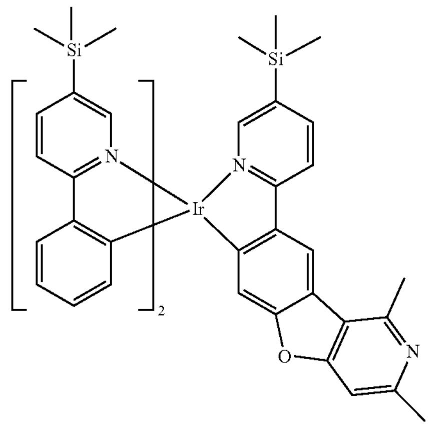
325
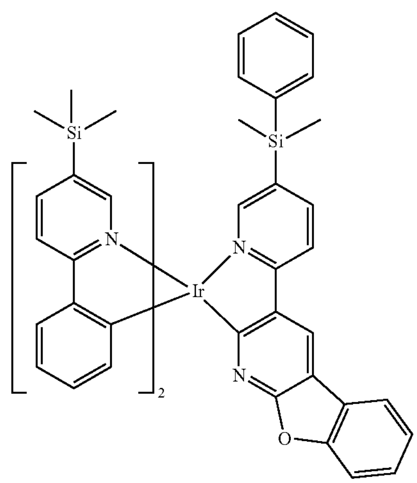
326
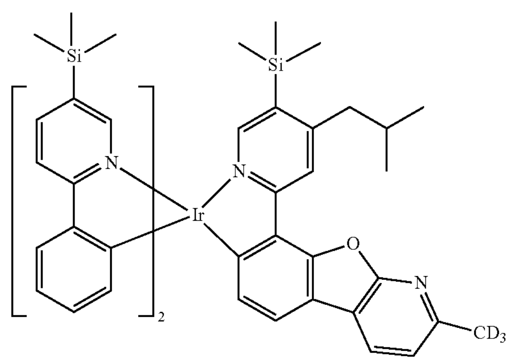

-continued
327
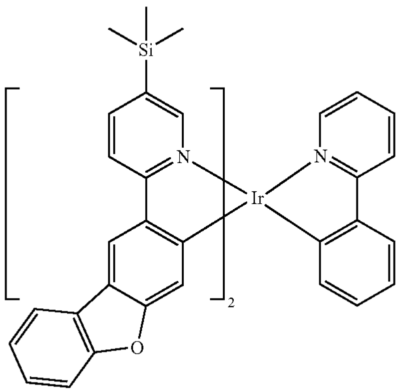
328
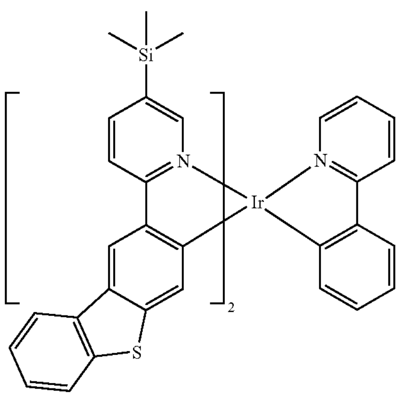
329
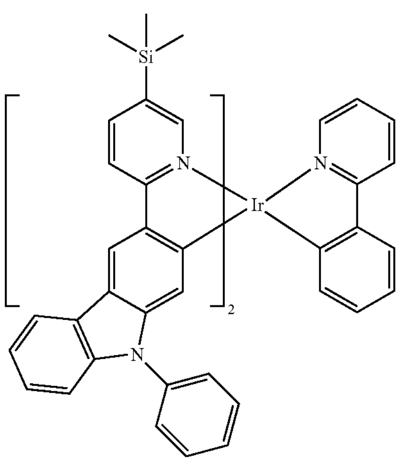
-continued
330
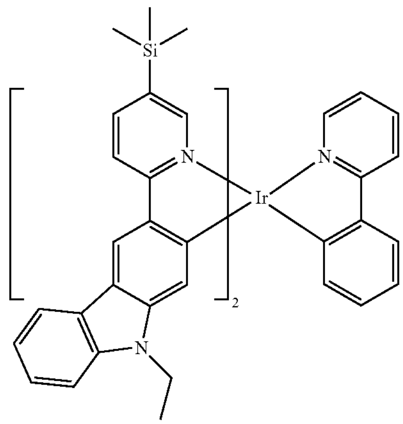
331
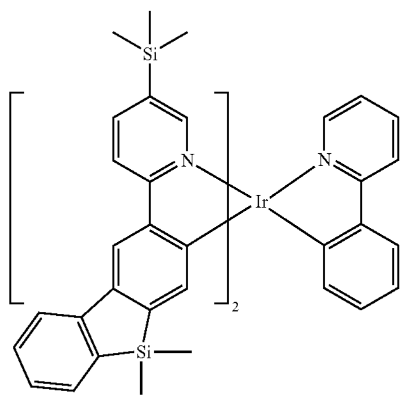
332
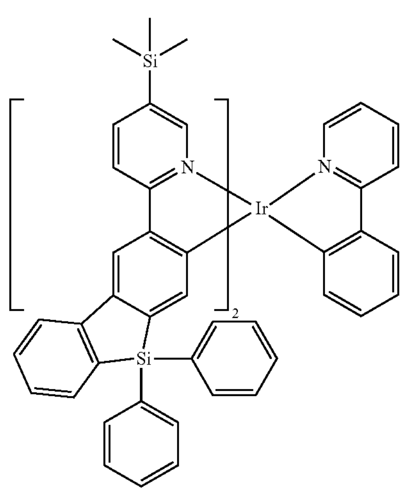

-continued
333
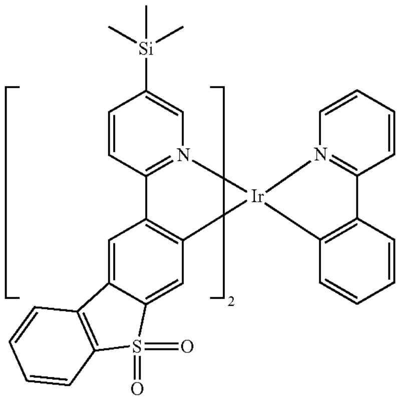
334
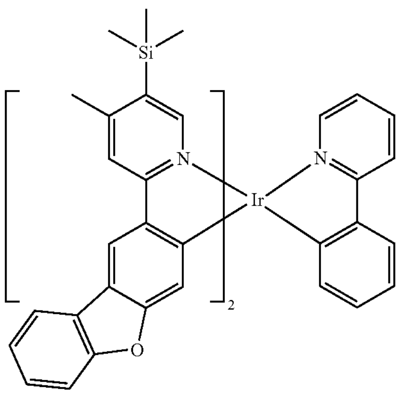
335
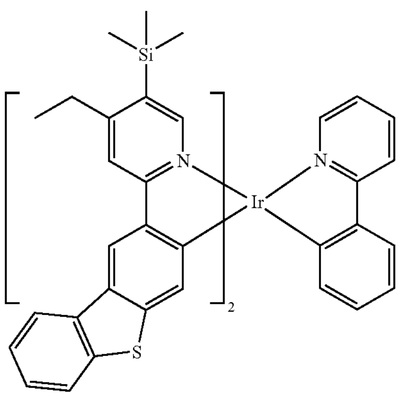
336
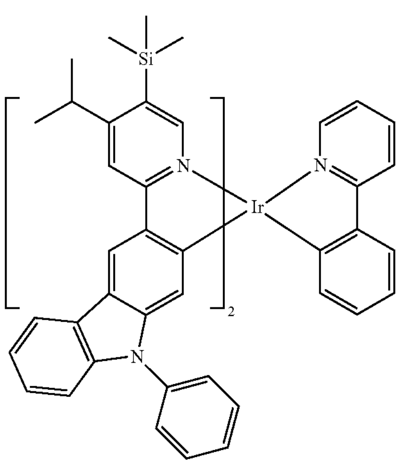
-continued
337
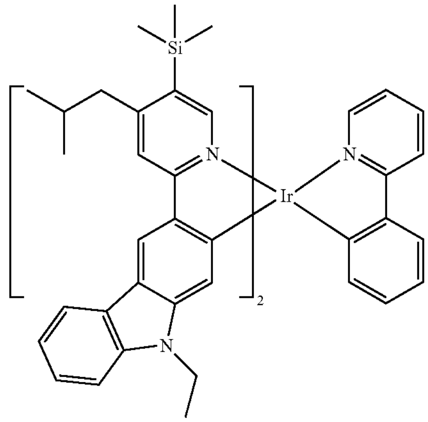
338
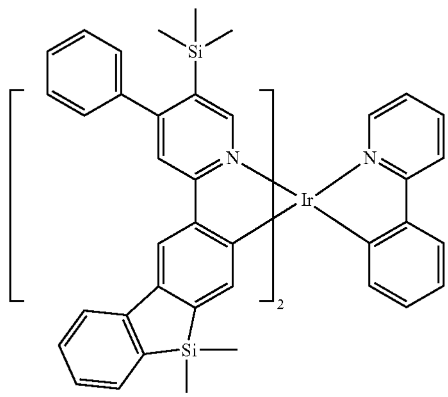
339
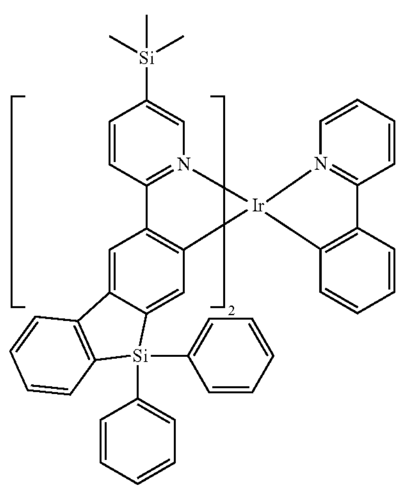

-continued
340
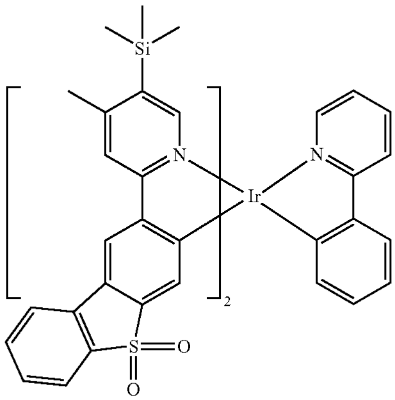
341
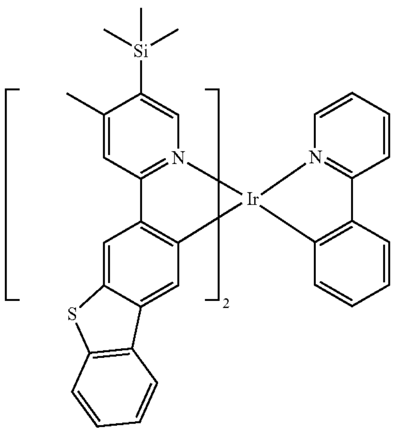
342
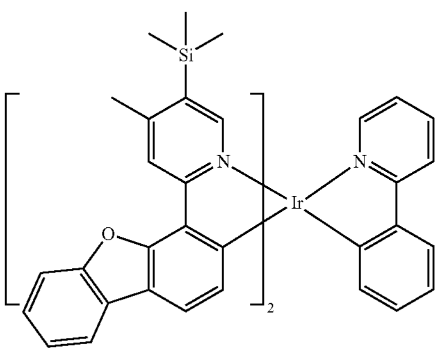
343
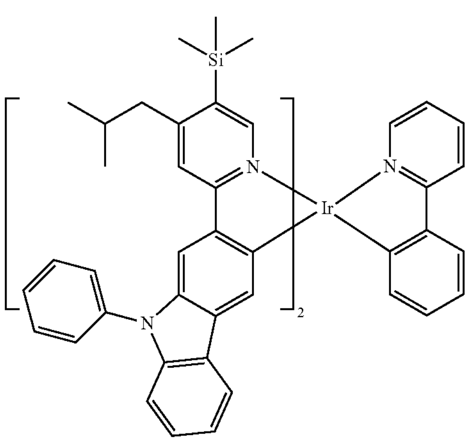
-continued
344
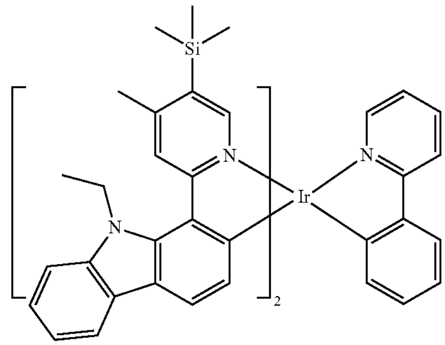
345
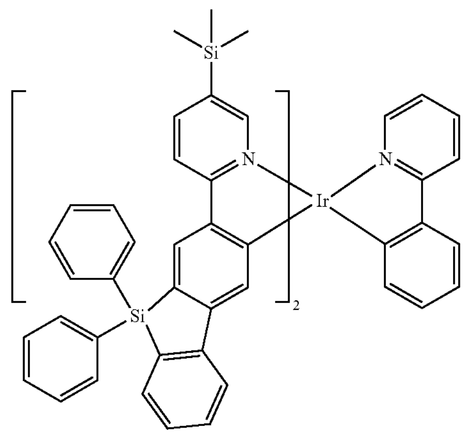
346
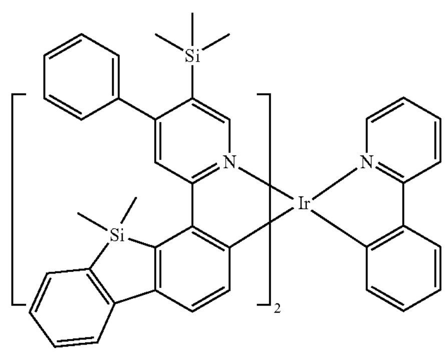
347
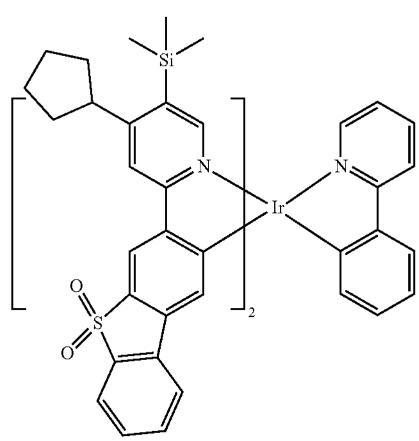

348
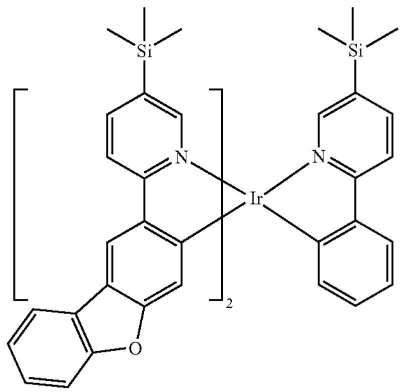
349
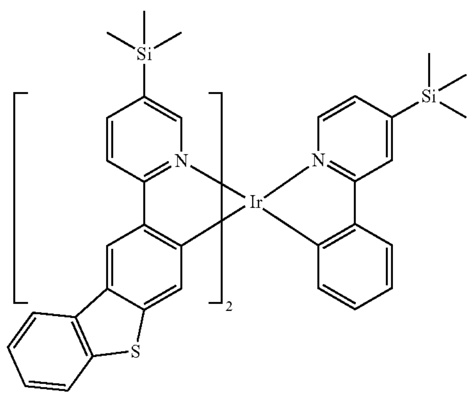
350
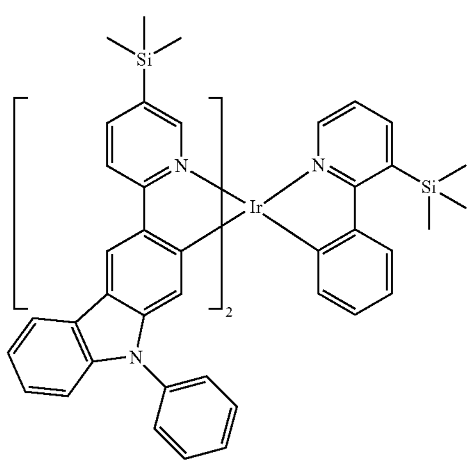
351
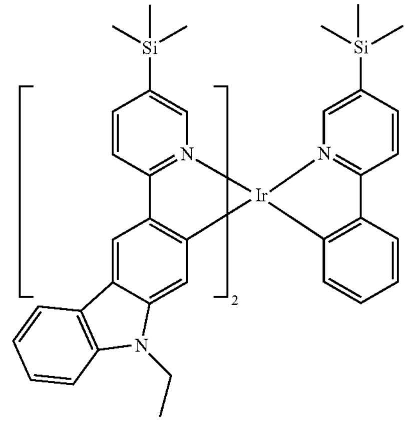
352
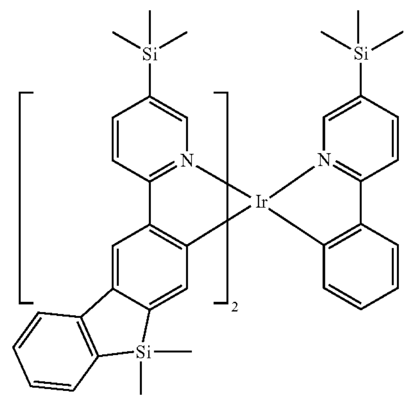
353
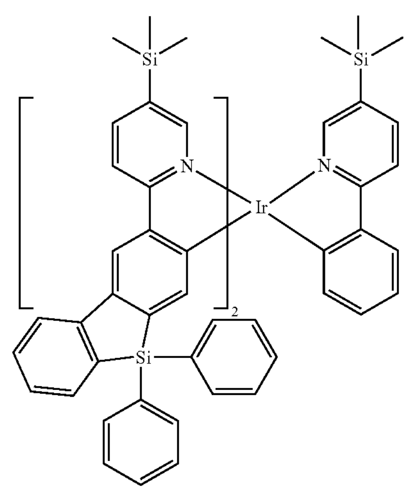

-continued
354
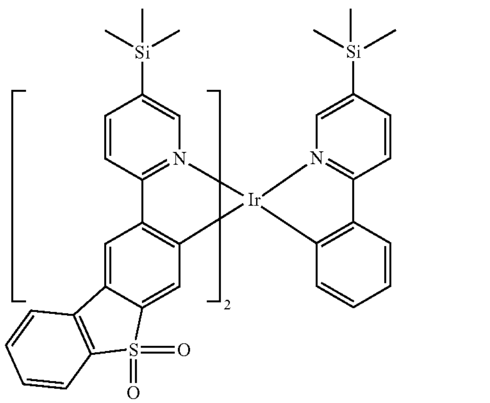
355
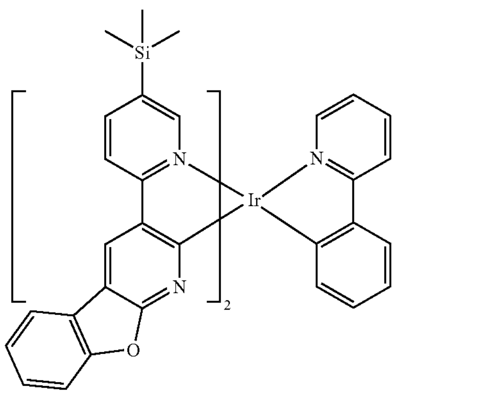
356
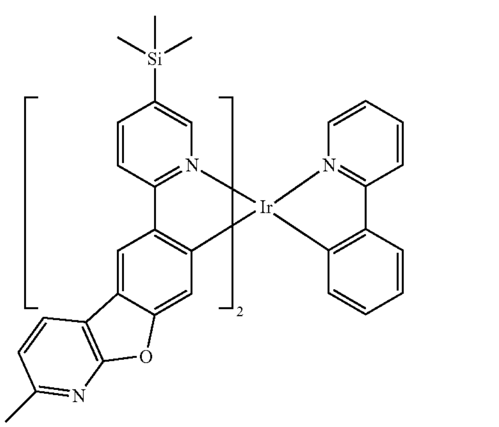
357
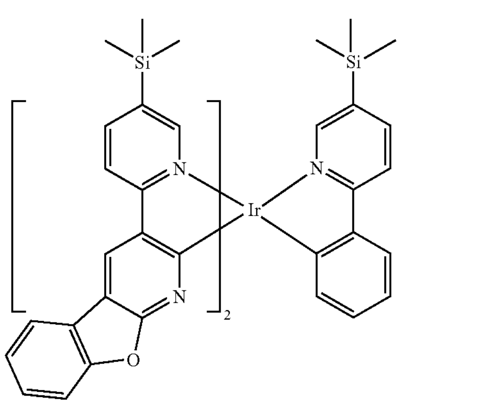
-continued
358
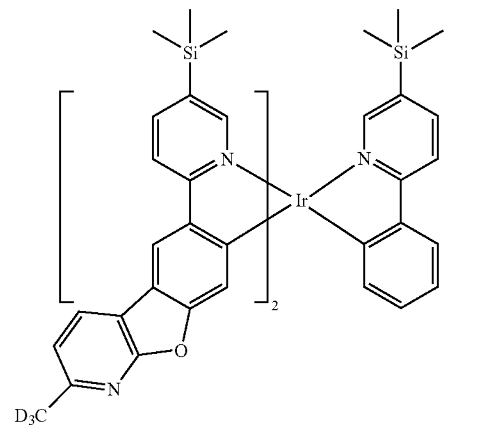
359
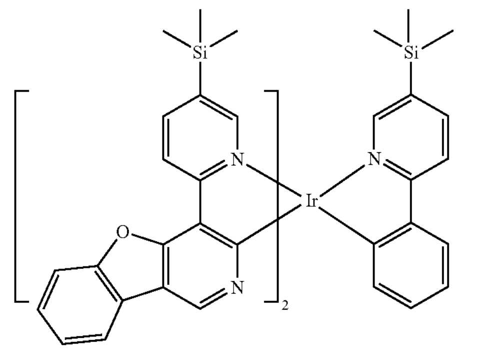
360
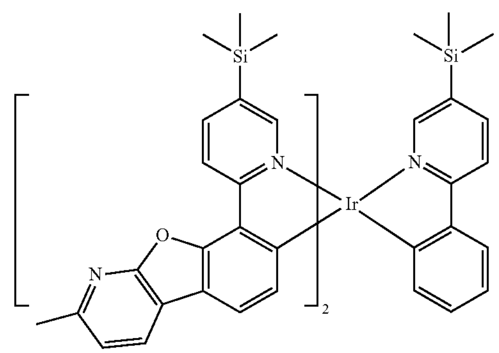
361
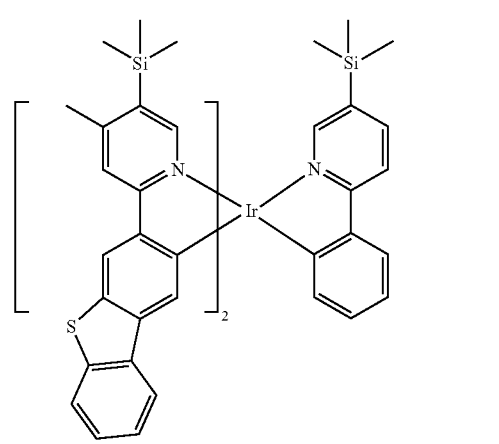

-continued
362
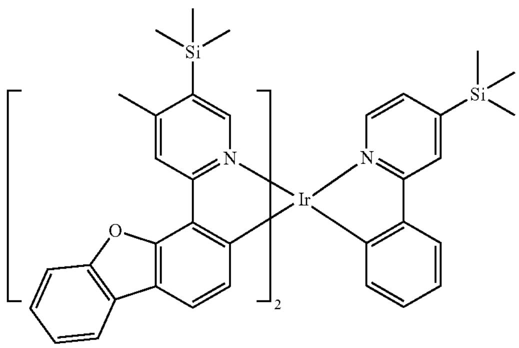
363
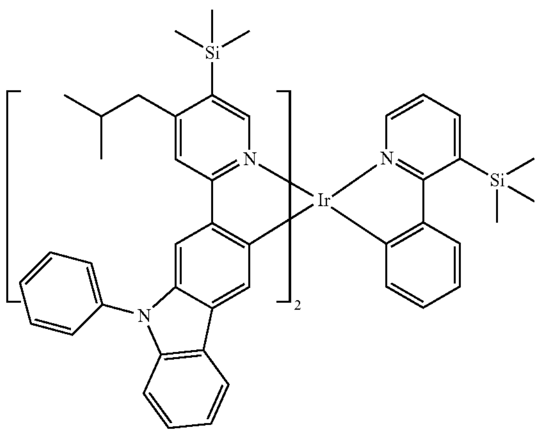
364
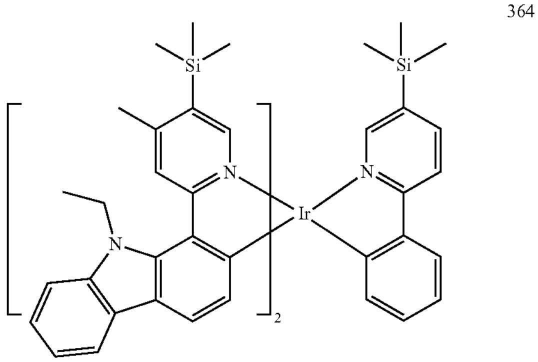
365
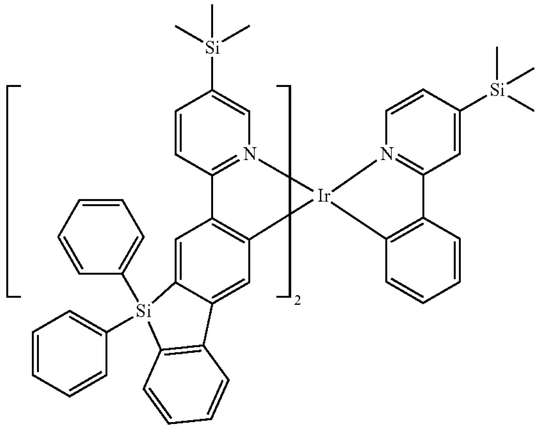
-continued
366
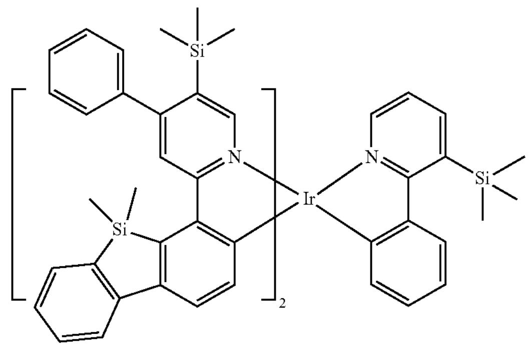
367
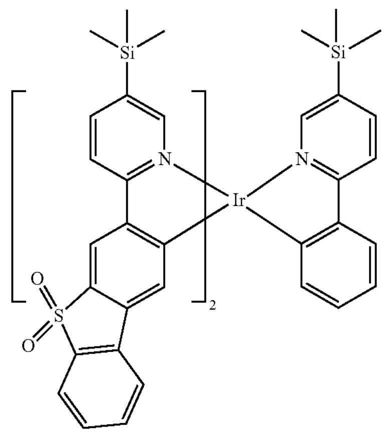
368
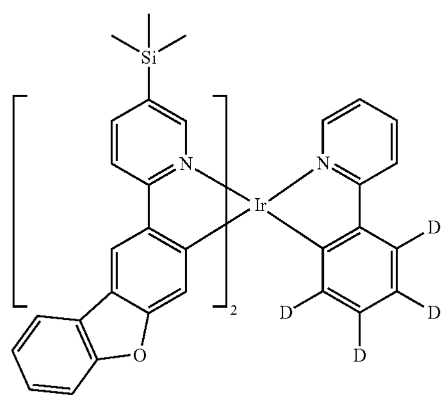
369
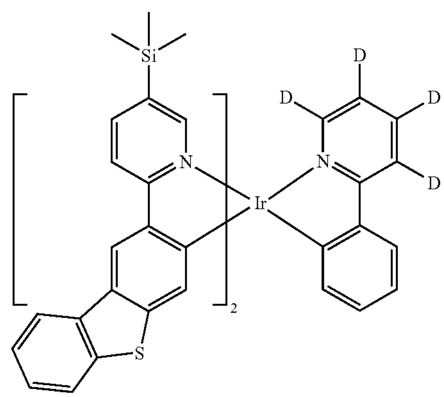

-continued
370
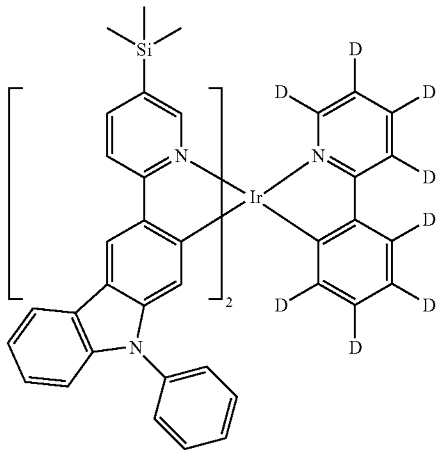
371
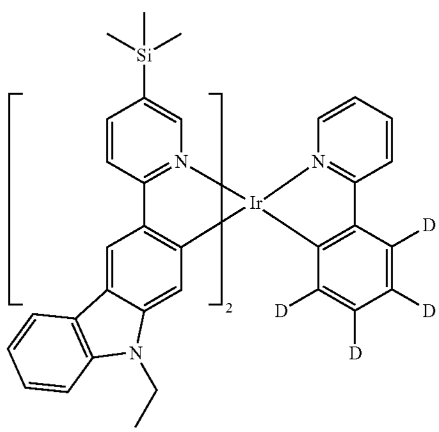
372
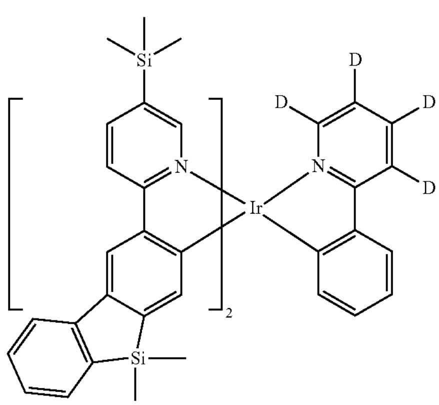
-continued
373
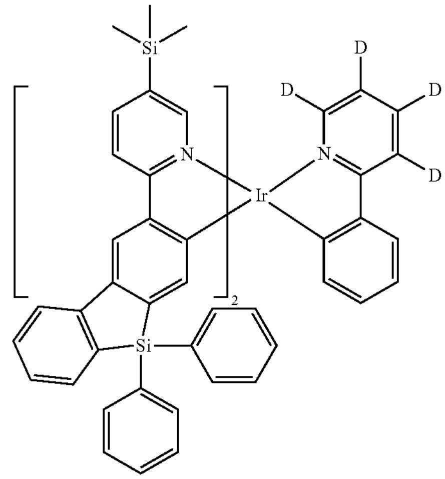
374
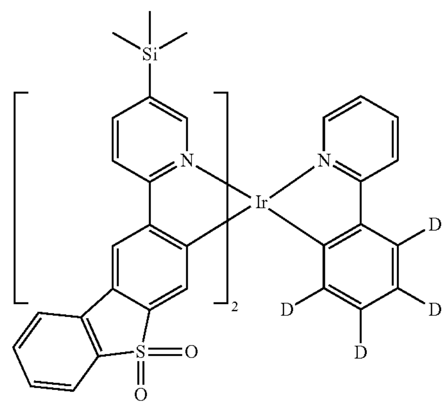
375
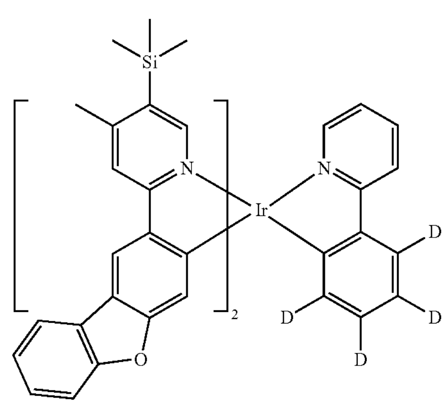

-continued
376
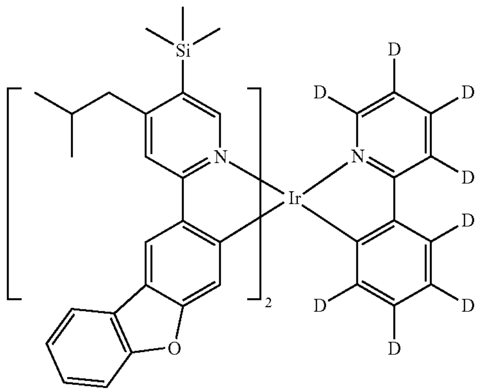
377
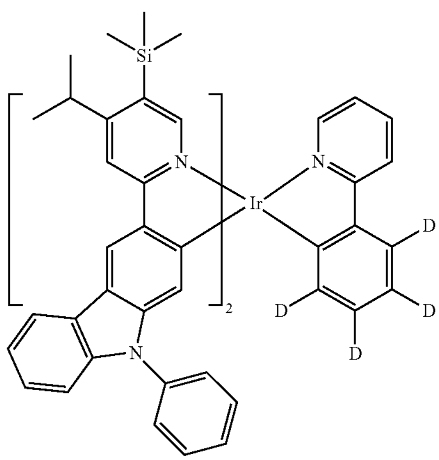
378
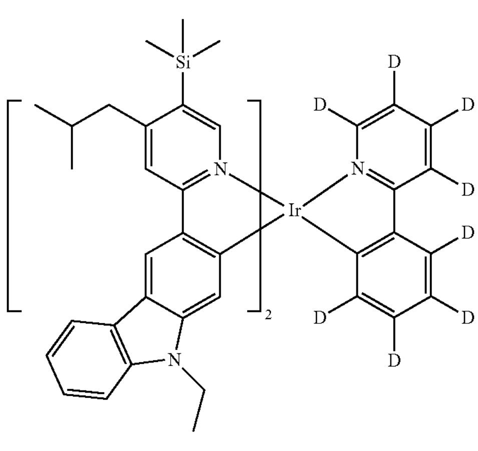
-continued
379
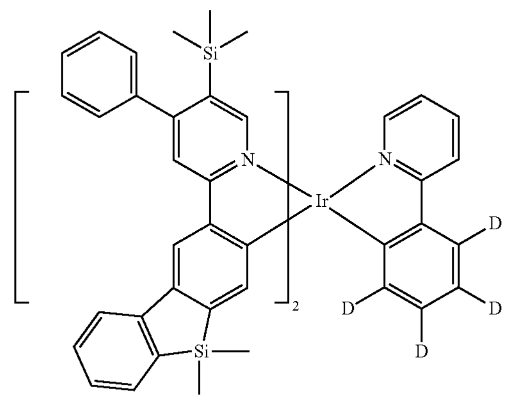
380
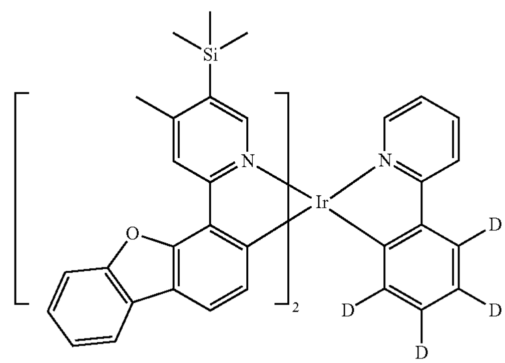
381
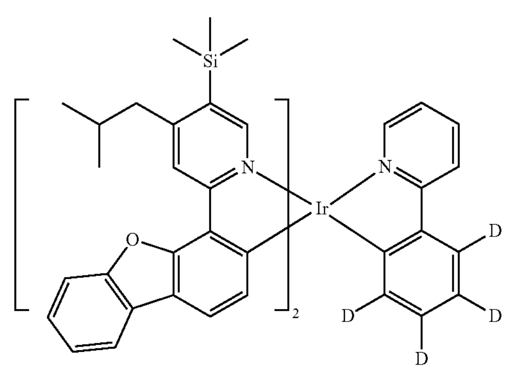
382
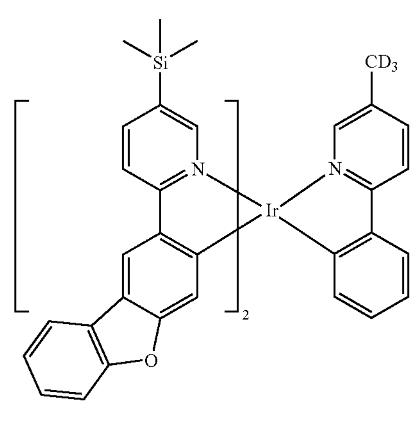

-continued
383
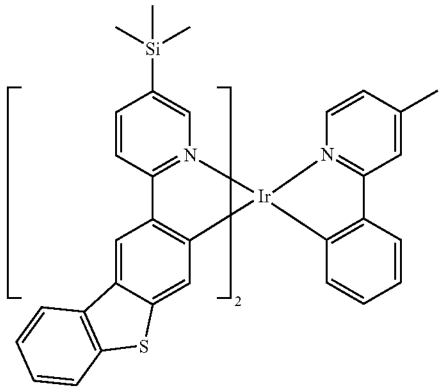
384
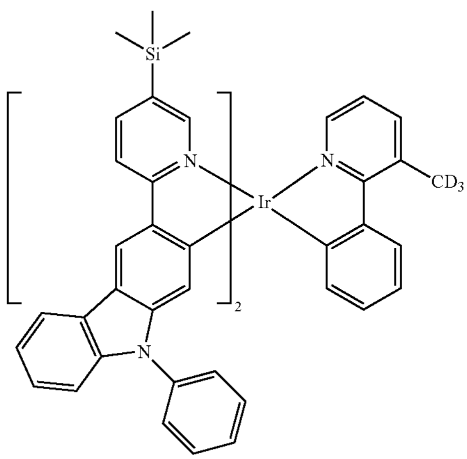
385
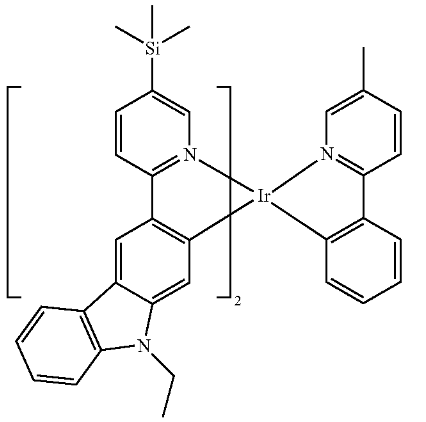
-continued
386
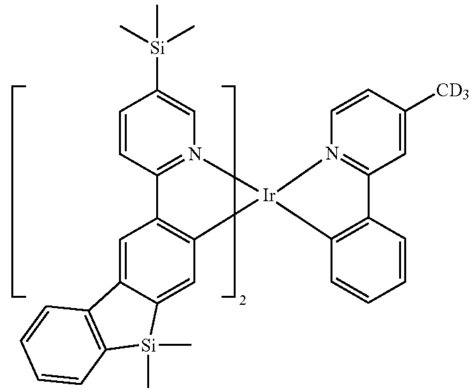
387
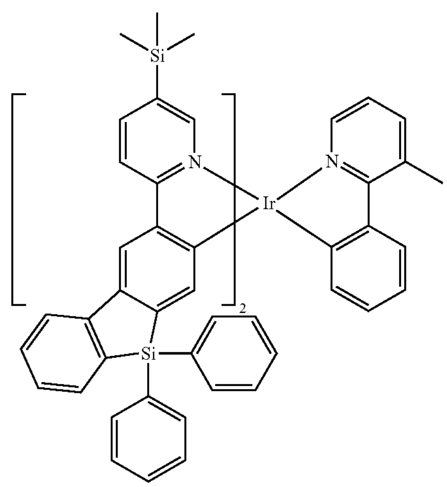
388
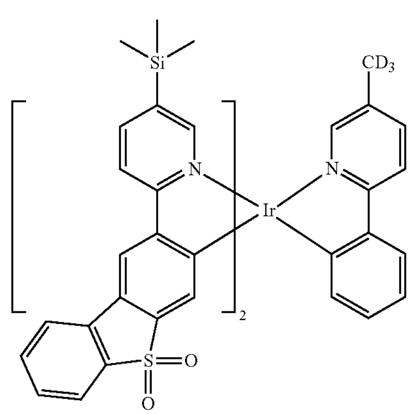

-continued
389
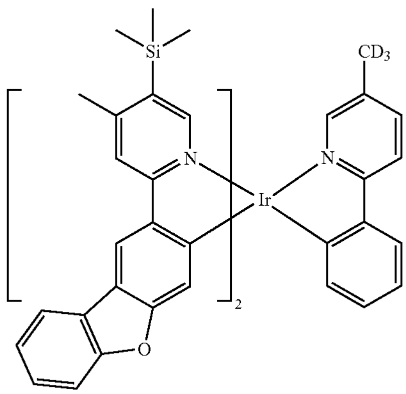
390
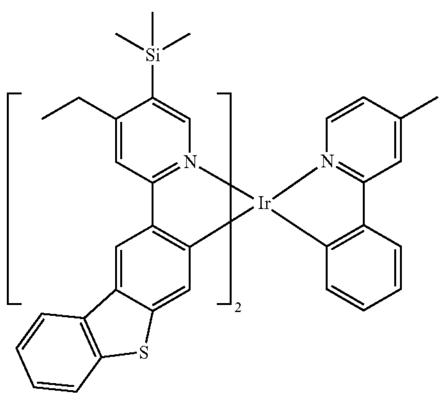
391
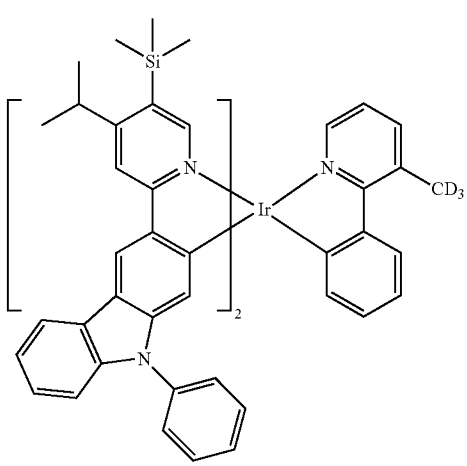
-continued
392
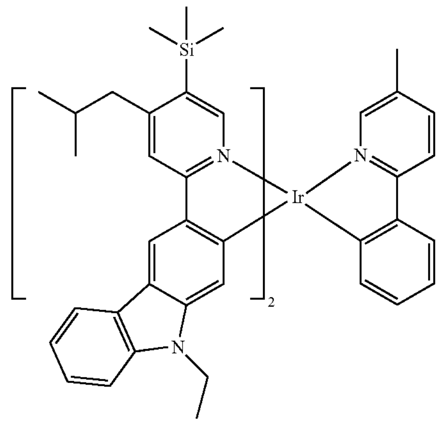
393
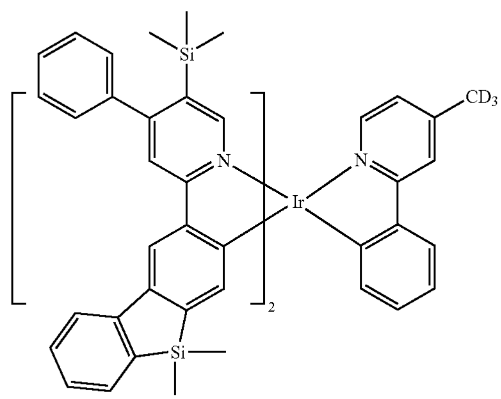
394
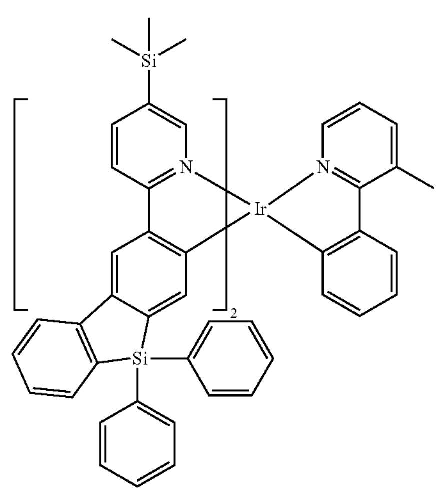

395
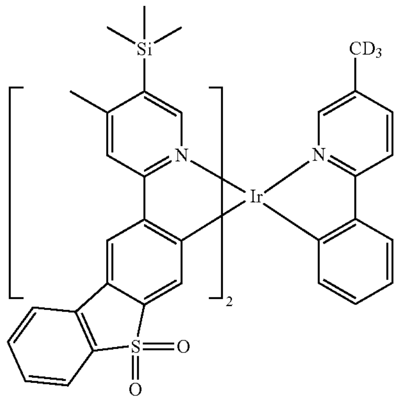
396
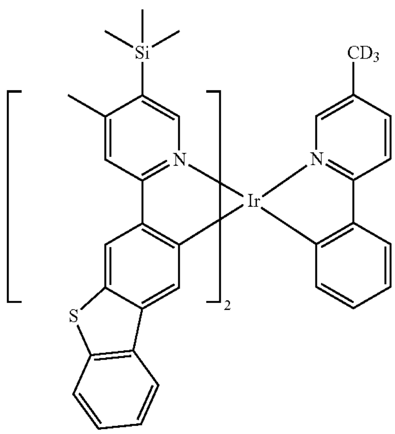
397
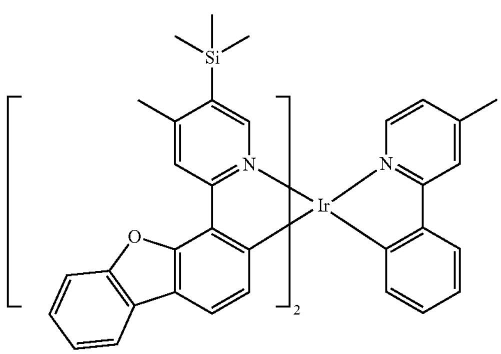
398
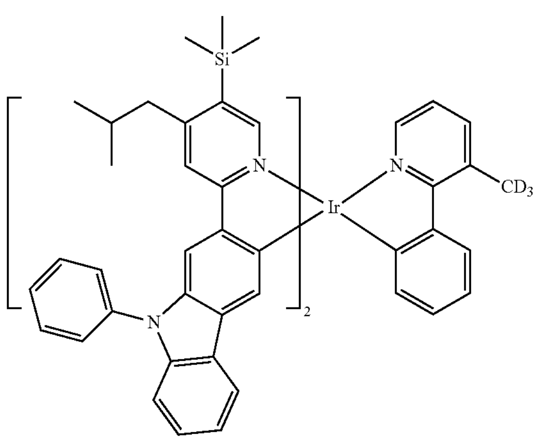
399
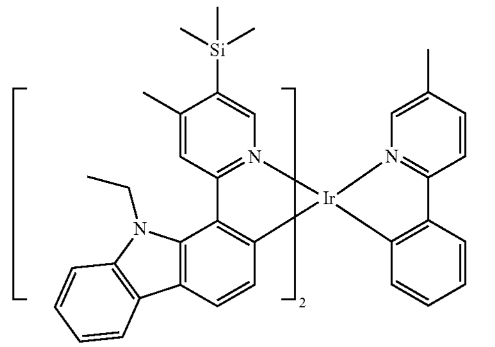
400
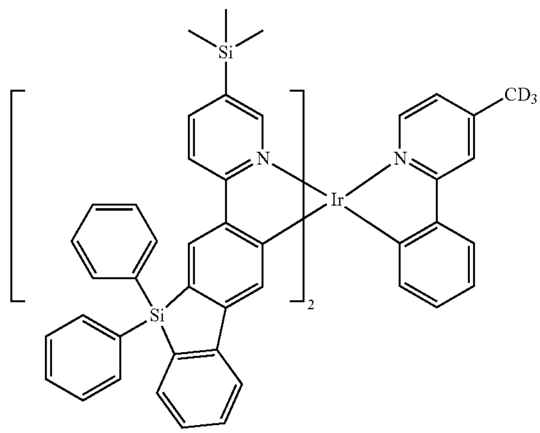
401
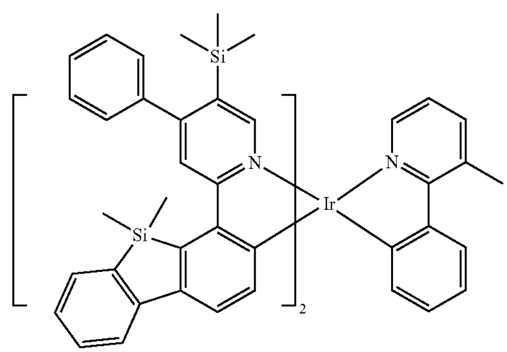
402
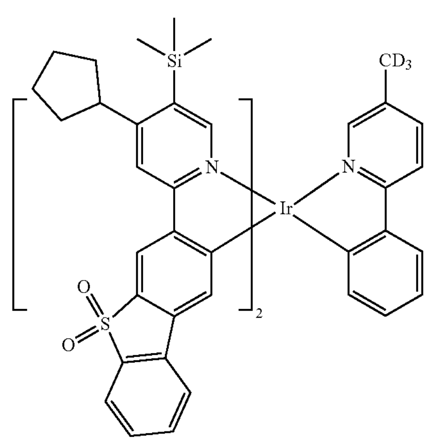

-continued
403
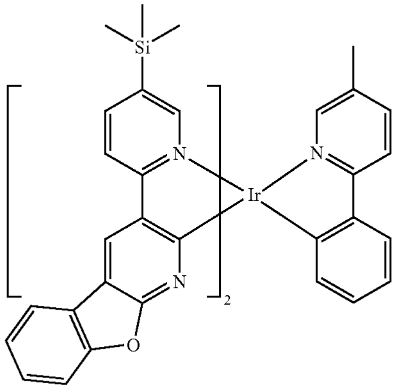
404
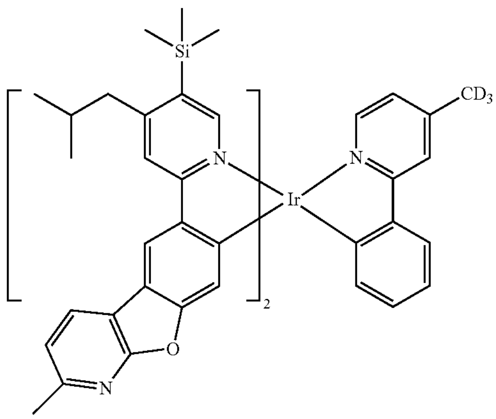
405
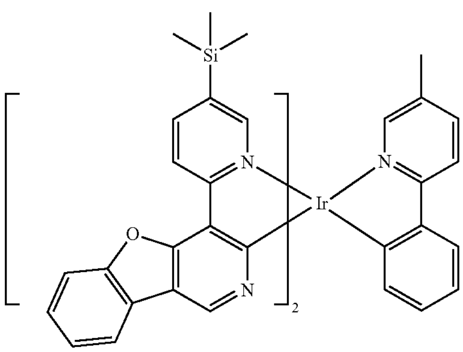
406
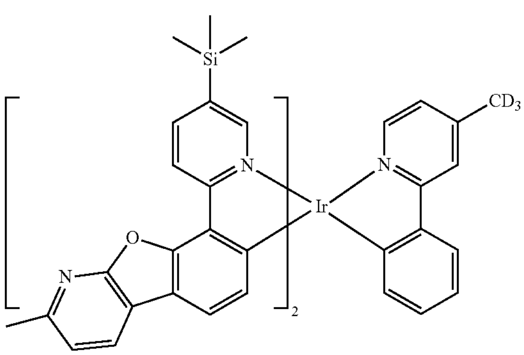
-continued
407
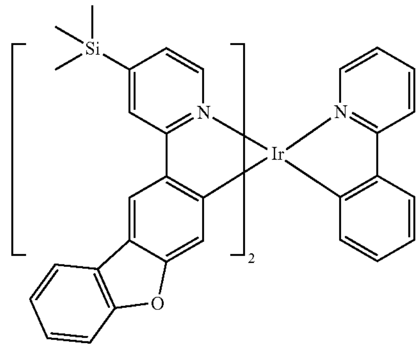
408
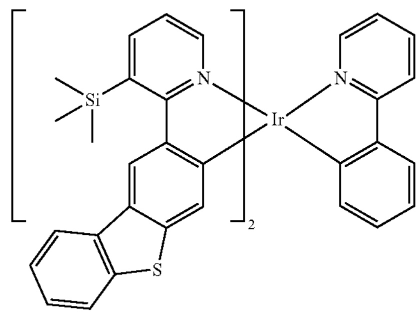
409
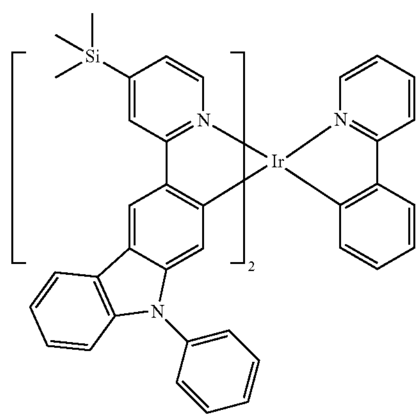
410
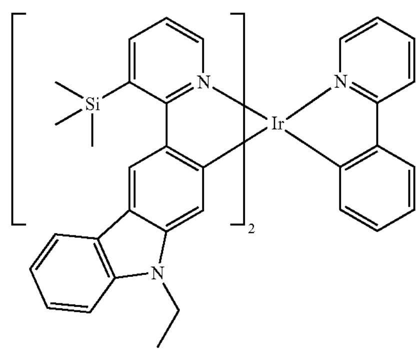

204
-continued
411
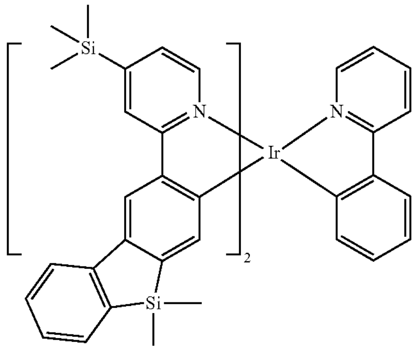
412
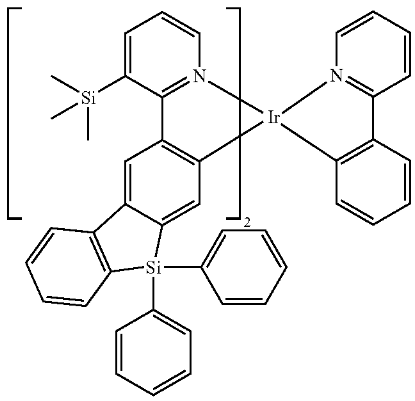
413
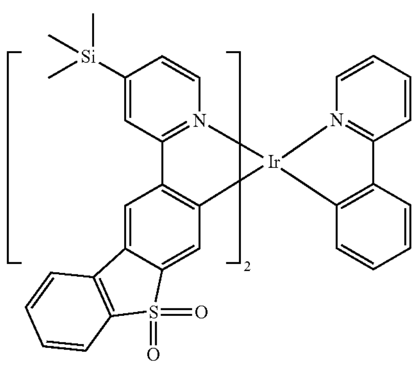
414
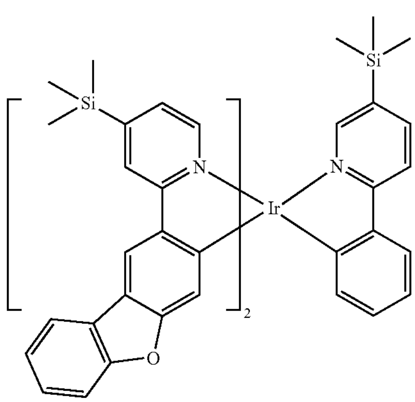
415
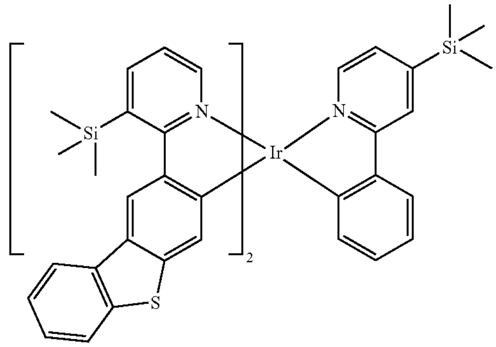
416
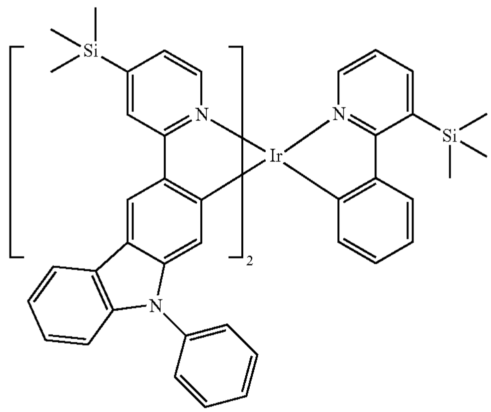
417
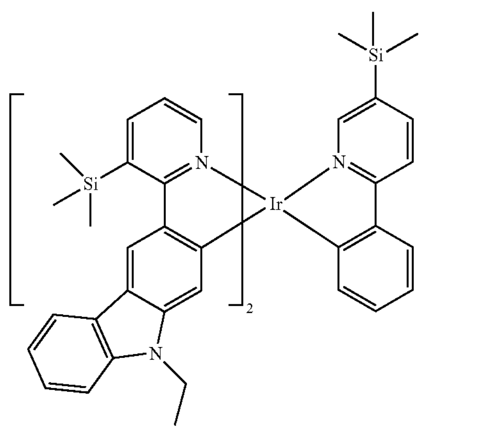
418
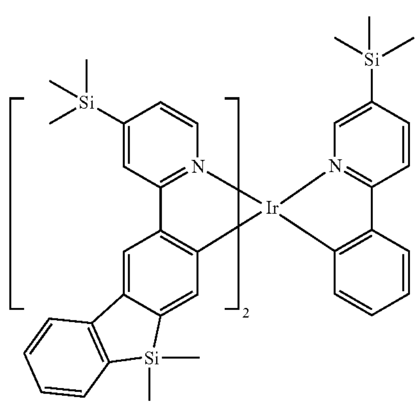

-continued
419
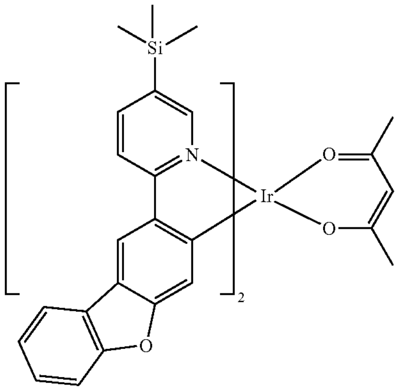
420
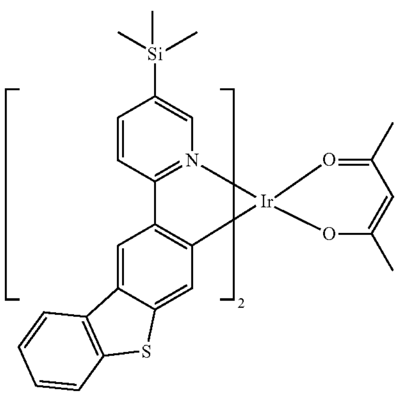
421
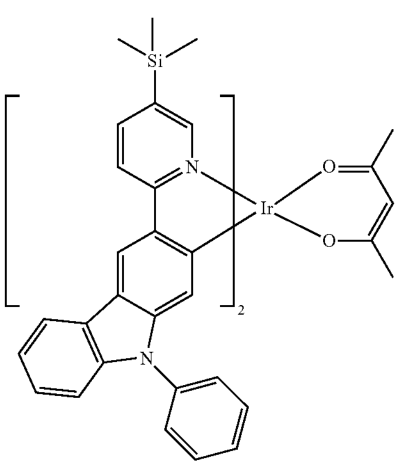
-continued
422
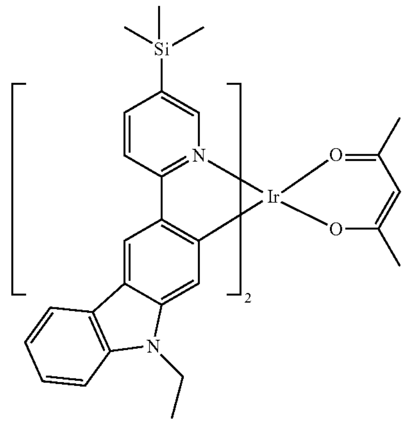
423
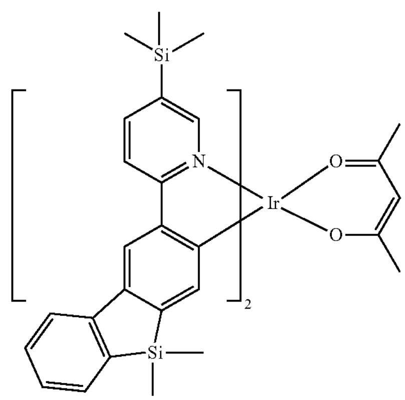
424
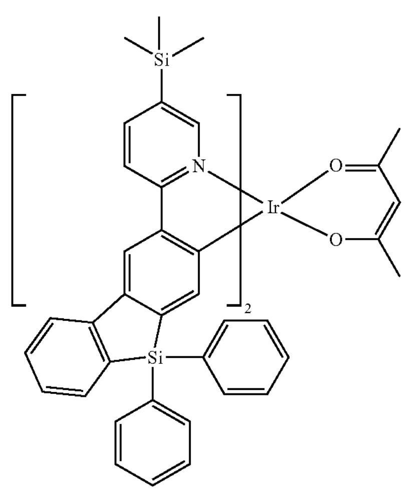

425
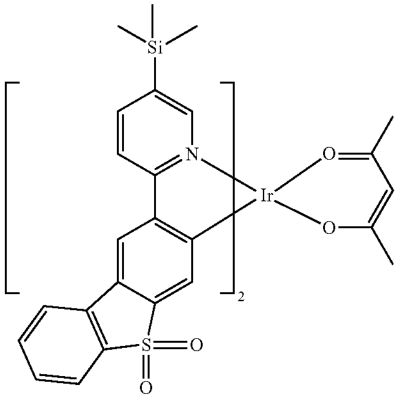
426
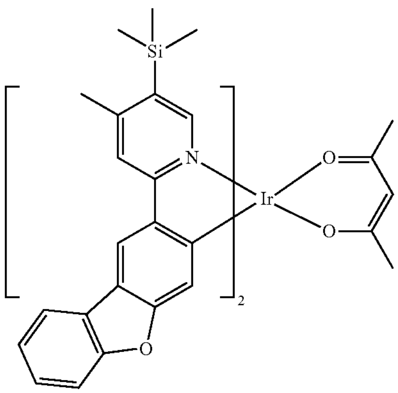
427
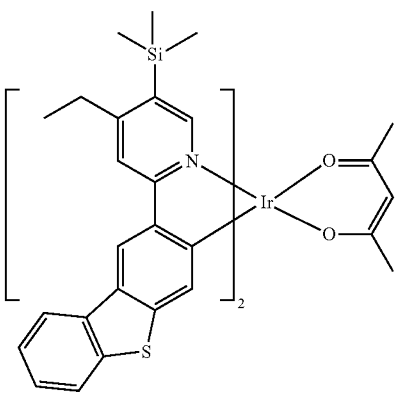
248
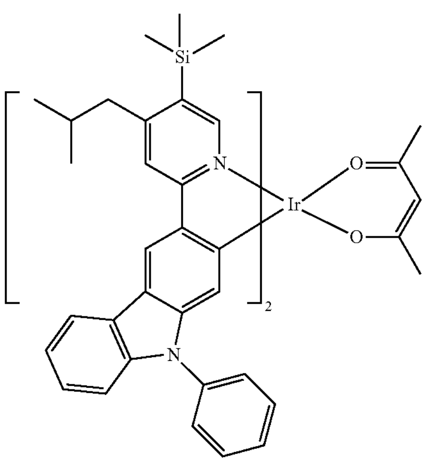
429
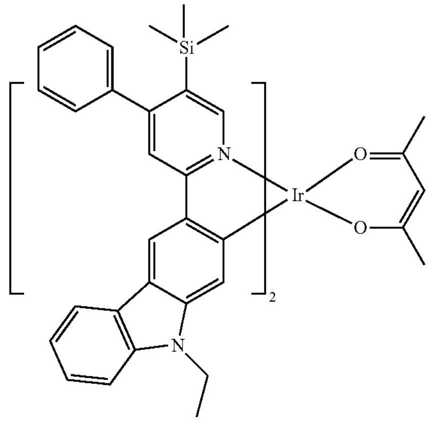
430
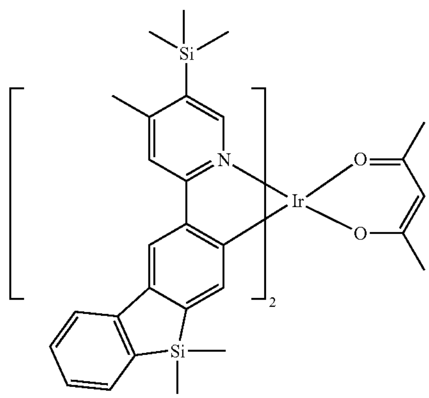
431
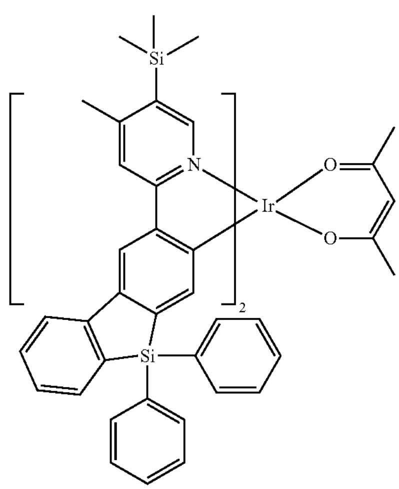

432
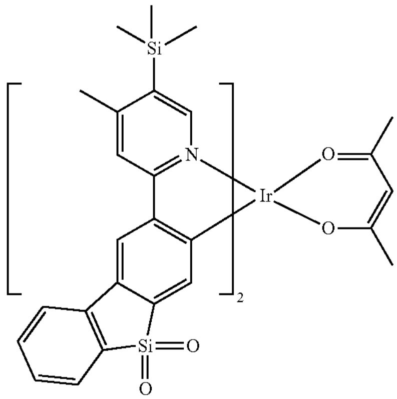
433
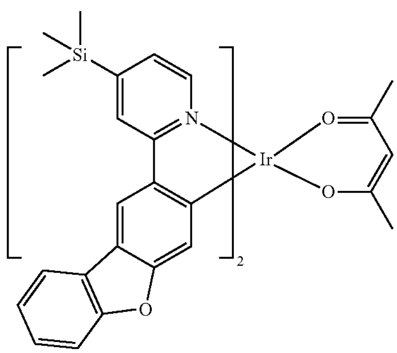
434
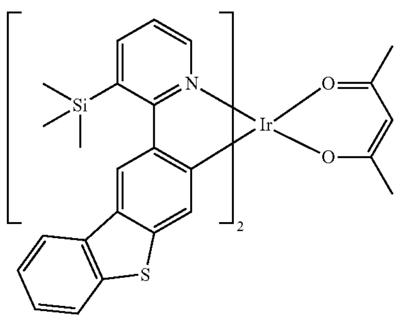
435
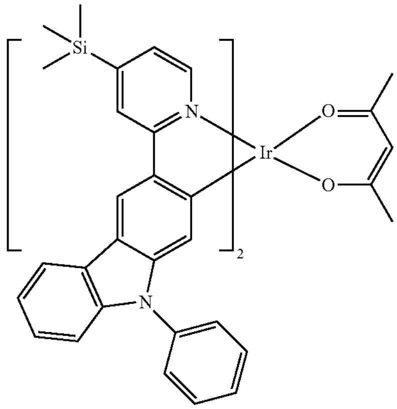
436
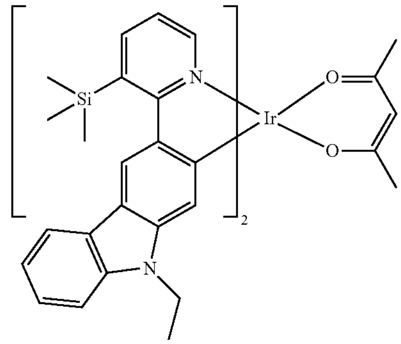
437
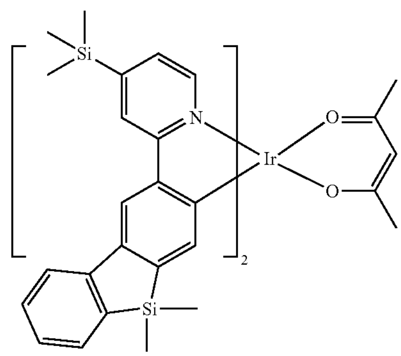
438
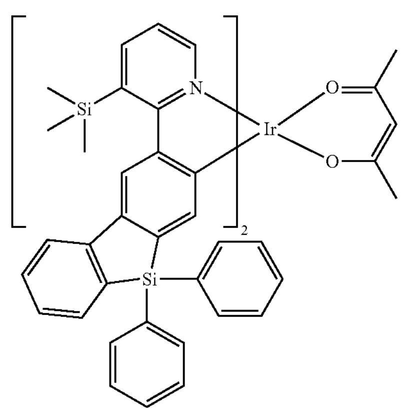
439
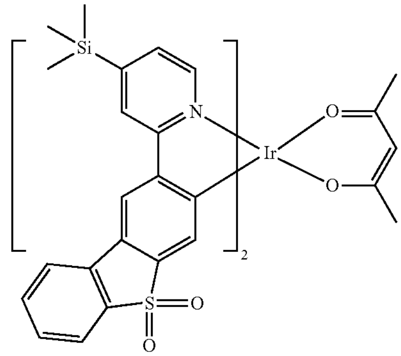

-continued
440
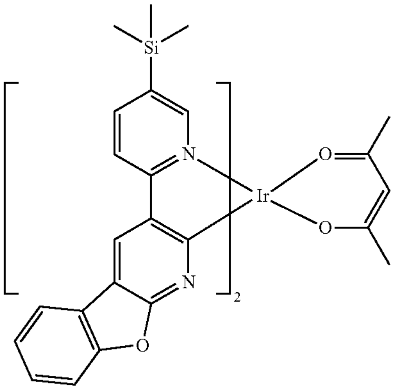
441
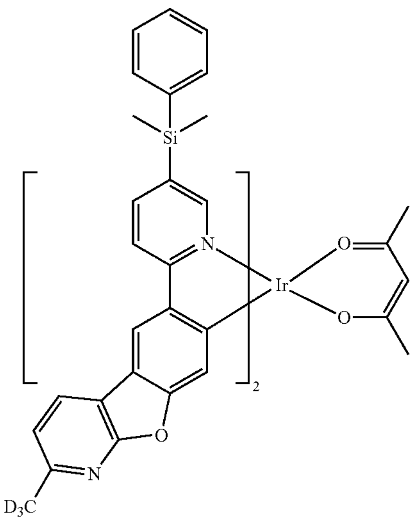
442
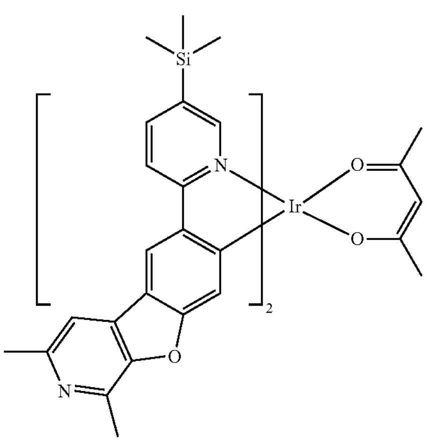
-continued
443
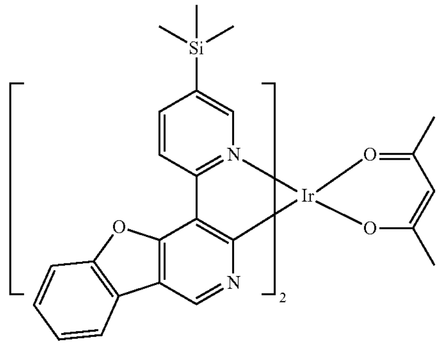
444
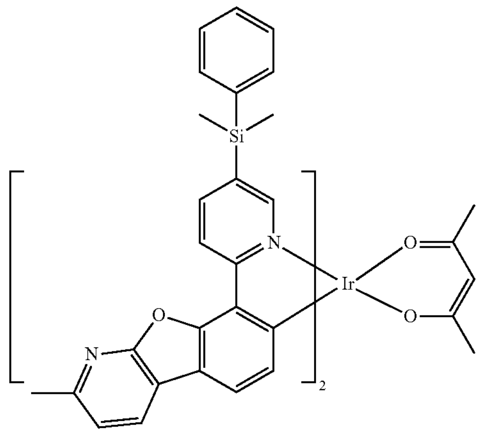
445
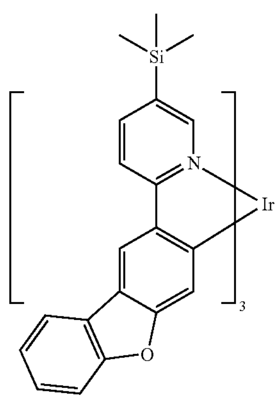
446
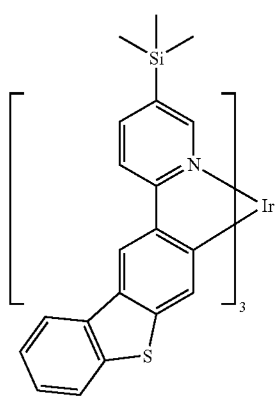

447
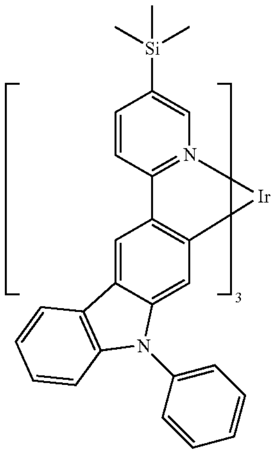
448
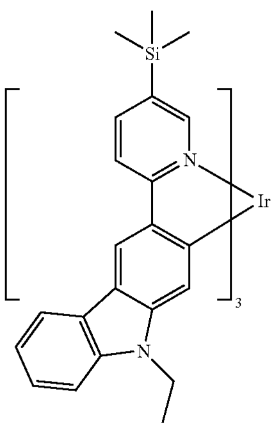
449
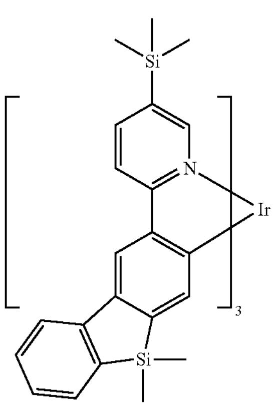
450
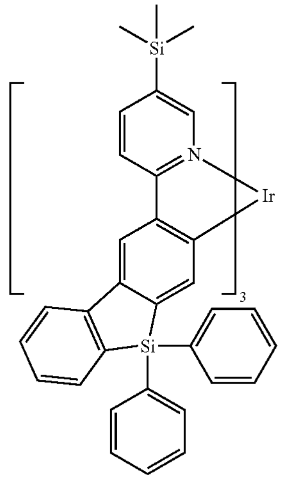
451
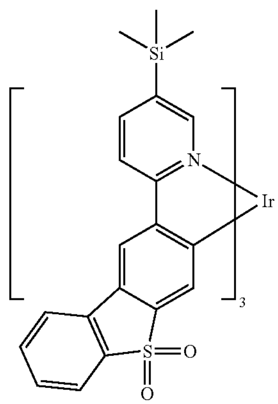
452
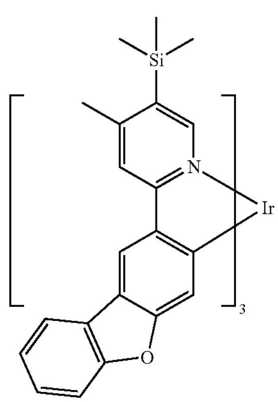

-continued
453
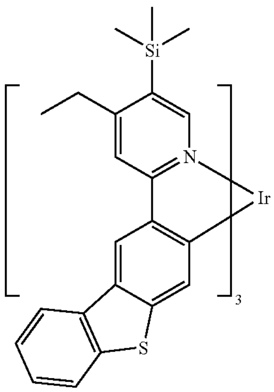
454
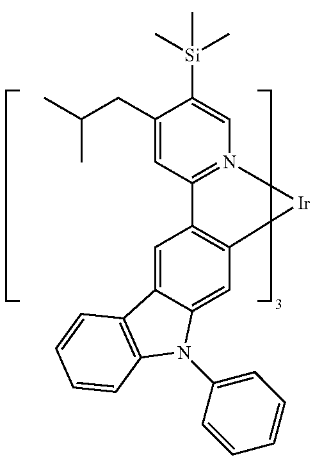
455
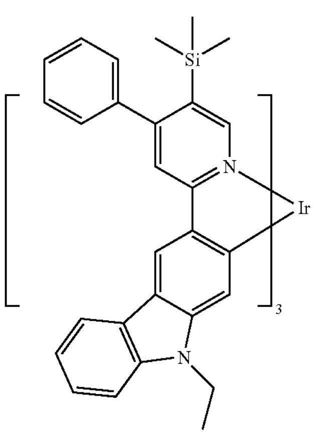
-continued
456
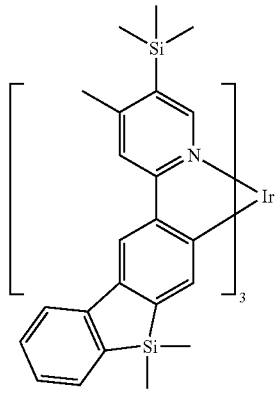
457
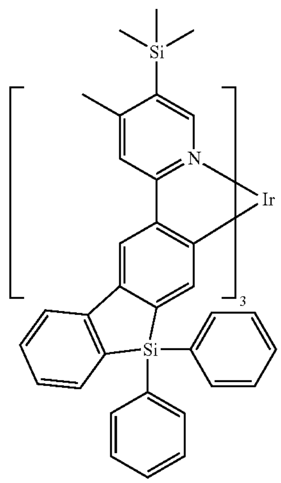
458
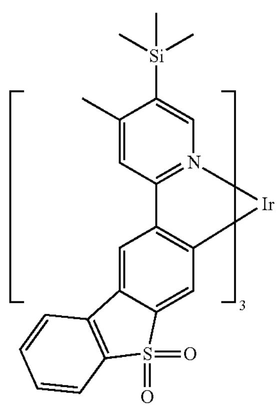
459
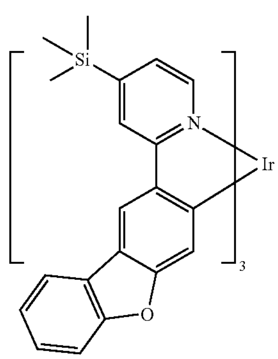

-continued
460
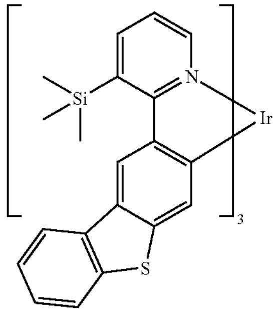
461
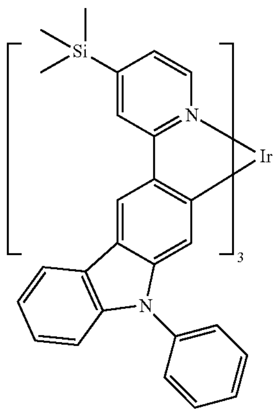
462
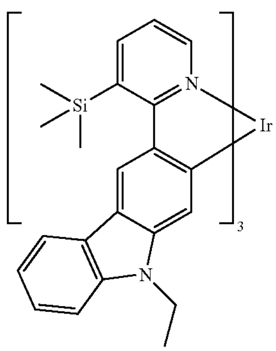
463
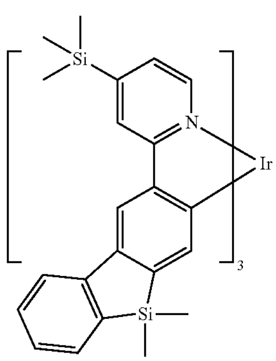
-continued
464
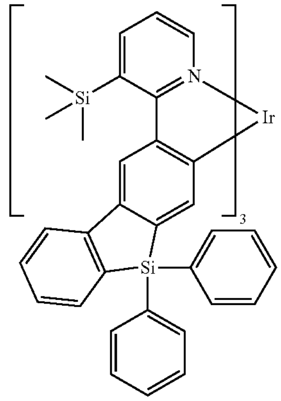
465
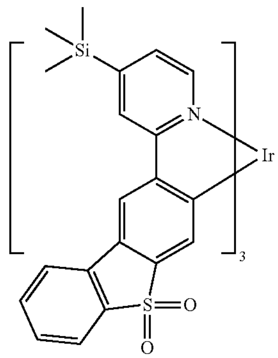
466
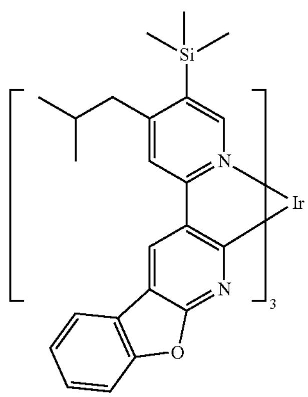
467
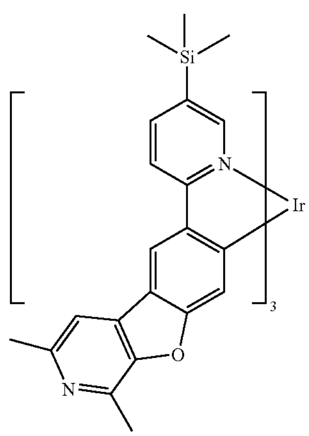

-continued
468
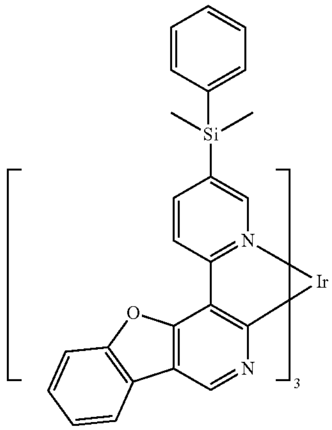
469
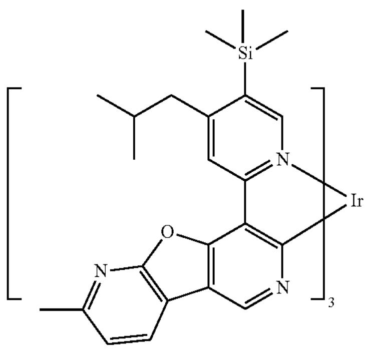
470
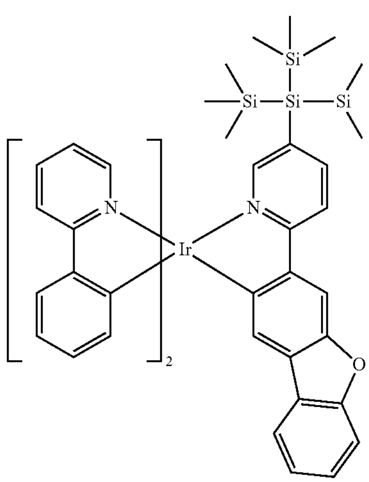
-continued
471
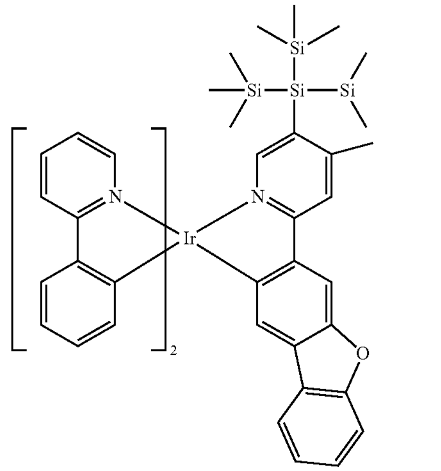
472
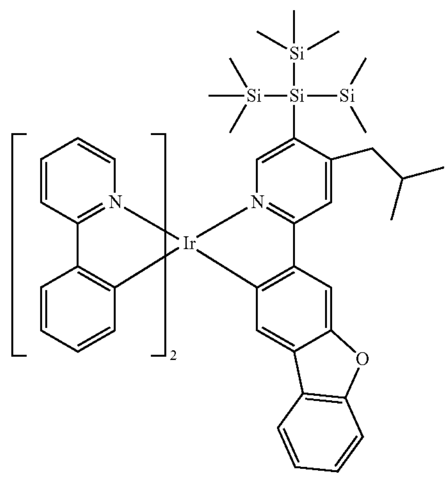
473
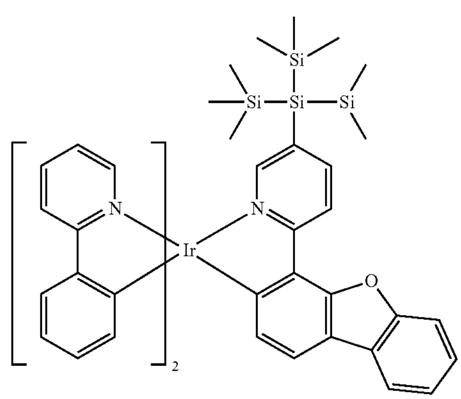

-continued
474
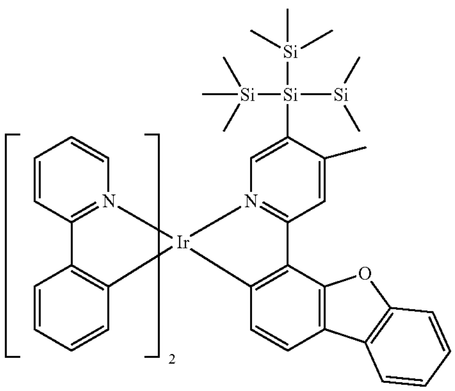
475
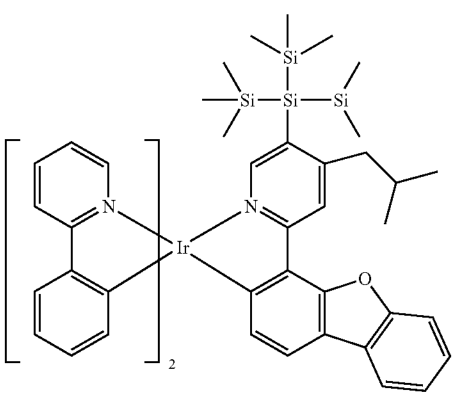
476
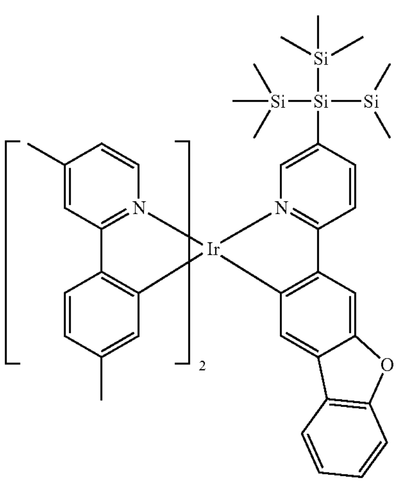
-continued
477
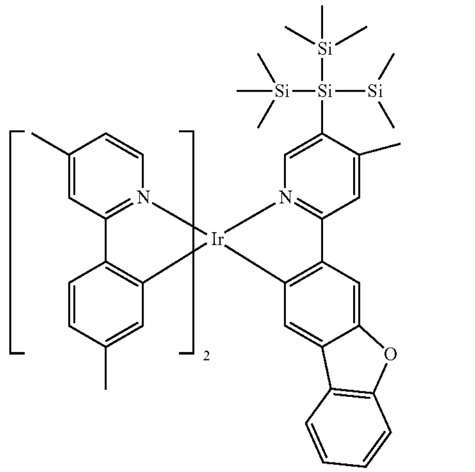
478
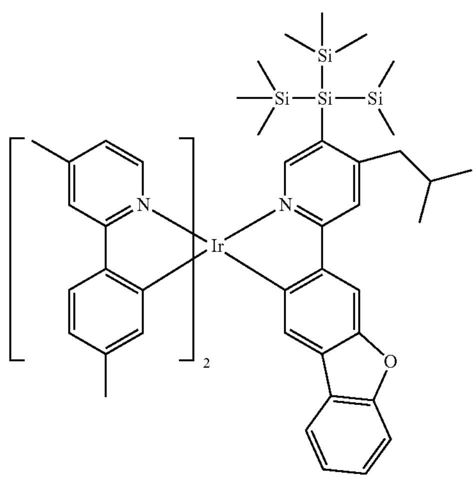
479
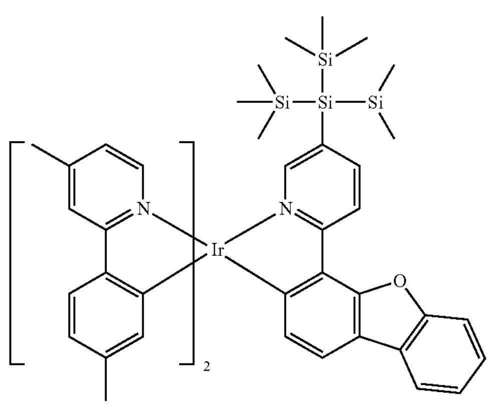

-continued

480

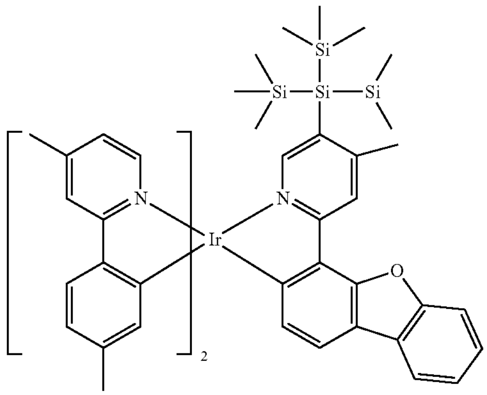

481

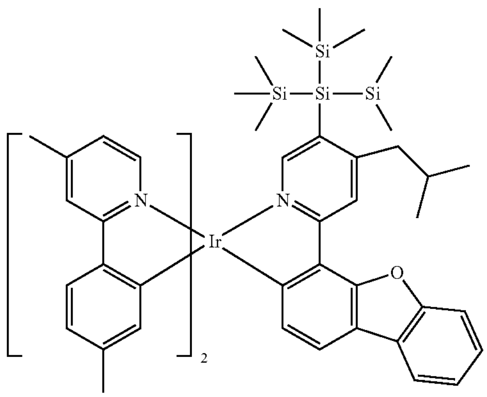

Formula 2A

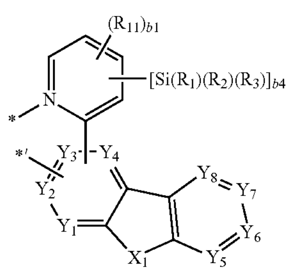

Regarding the organometallic compound represented by Formula 1, $L_1$ is selected from a ligand represented by Formula 2A, and b4 in Formula 2A is 1 or more. That is, a substituent of a pyridine-based ring in Formula 2A may include at least one group —$Si(R_1)(R_2)(R_3)$. Group —$Si(R_1)(R_2)(R_3)$ increases spin density of metal M in Formula 1. Accordingly, an organic light-emitting device using the organometallic compound represented by Formula 1 having the ligand represented by Formula 2A may have high efficiency.

Also, $X_1$ in Formula 2A may be selected from O, S, $S(=O)_2$, $N(R_{21})$, and $Si(R_{22})(R_{23})$. When $X_1$ is selected from the groups above, charge mobility of the organometallic compound represented by Formula 1 having the ligand represented by Formula 2A improves, and energy levels thereof are easily controllable. Accordingly, efficiency and lifespan of an organic light-emitting device using the organometallic compound may be improved.

For example, HOMO, LUMO, singlet ($S_1$) and triplet ($T_1$) energy levels of the organometallic compounds 1, 2, 8, 22, 139, 146, 304, 305, 321, 323, 327 and 419 were evaluated by using a DFT method of Gaussian program (structurally optimized at a level of B3LYP, 6-31G(d,p)). Evaluation results are shown in Table 1 below.

TABLE 1

| Compound No. | HOMO(eV) | LUMO(eV) | $S_1$ energy level (eV) | $T_1$ energy level (eV) |
|---|---|---|---|---|
| Compound 1 | −4.842 | −1.262 | 2.887 | 2.616 |
| Compound 2 | −4.874 | −1.309 | 2.869 | 2.591 |
| Compound 8 | −4.812 | −1.249 | 2.875 | 2.608 |
| Compound 22 | −4.812 | −1.250 | 2.889 | 2.633 |
| Compound 139 | −4.827 | −1.283 | 2.867 | 2.589 |
| Compound 146 | −4.829 | −1.261 | 2.872 | 2.510 |
| Compound 304 | −4.781 | −1.267 | 2.837 | 2.586 |
| Compound 305 | −4.773 | −1.244 | 2.852 | 2.600 |
| Compound 321 | −4.856 | −1.369 | 2.803 | 2.555 |
| Compound 323 | −4.820 | −1.281 | 2.849 | 2.591 |
| Compound 327 | −4.863 | −1.304 | 2.887 | 2.614 |
| Compound 419 | −4.756 | −1.331 | 2.753 | 2.525 |

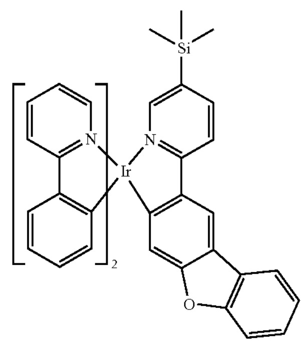

Compound 1

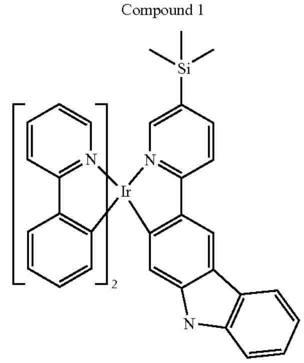

Compound 2

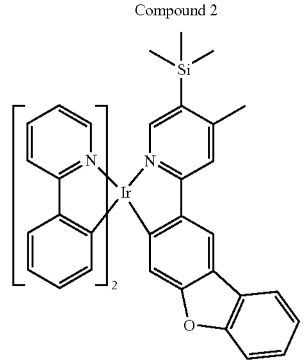

Compound 8

TABLE 1-continued
| Compound No. | HOMO(eV) | LUMO(eV) | $S_1$ energy level (eV) | $T_1$ energy level (eV) |
|---|---|---|---|---|
| 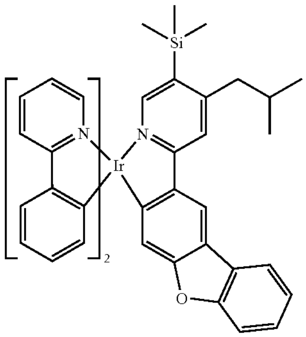 Compound 22 | | | | |
| 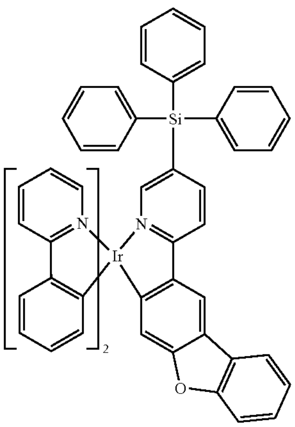 Compound 139 | | | | |
| 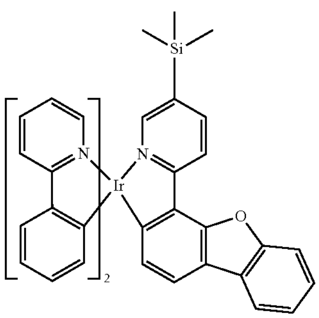 Compound 146 | | | | |
| 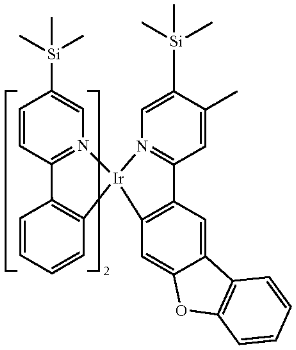 Compound 304 | | | | |
TABLE 1-continued
| Compound No. | HOMO(eV) | LUMO(eV) | $S_1$ energy level (eV) | $T_1$ energy level (eV) |
|---|---|---|---|---|
| 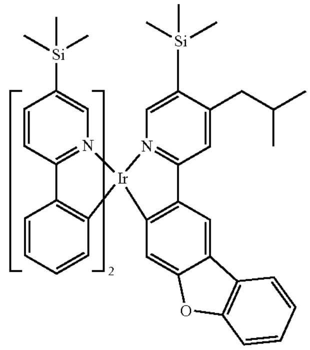 Compound 305 | | | | |
| 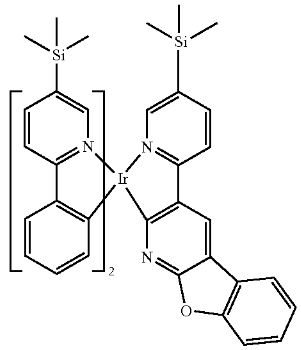 Compound 321 | | | | |
| 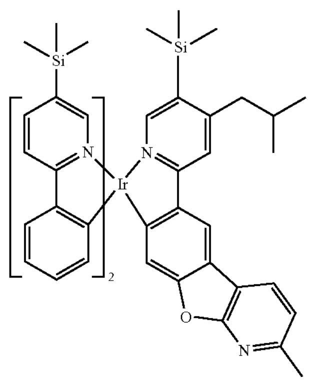 Compound 323 | | | | |
| 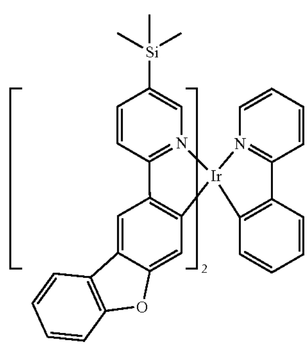 Compound 327 | | | | |

TABLE 1-continued

| Compound No. | HOMO(eV) | LUMO(eV) | $S_1$ energy level (eV) | $T_1$ energy level (eV) |
|---|---|---|---|---|

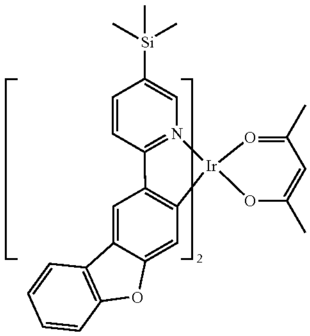

Compound 419

From Table 1, it is confirmed that the organometallic compound represented by Formula 1 has electric characteristics that are suitable for use as a material for manufacturing a device, for example, an organic light-emitting device.

Synthesis methods of the organometallic compound represented by Formula 1 may be recognizable by one of ordinary skill in the art by referring to Synthesis Examples provided below.

The organometallic compound represented by Formula 1 is suitable for use in an organic layer of an organic light-emitting device, for example, for use as a dopant in an emission layer of the organic layer. Thus, another aspect provides an organic light-emitting device that includes:

a first electrode;

a second electrode; and an organic layer disposed between the first electrode and the second electrode, wherein the organic layer includes an emission layer and at least one organometallic compound represented by Formula 1.

The organic light-emitting device may have, due to the inclusion of an organic layer including the organometallic compound represented by Formula 1, a low driving voltage, high efficiency, high power, and a long lifespan.

The organometallic compound of Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host).

The expression "(an organic layer) includes at least one organometallic compounds" used herein may include an embodiment in which (an organic layer) includes identical organometallic compounds of Formula 1 and an embodiment in which (an organic layer) includes two or more different organometallic compounds of Formula 1.

For example, the organic layer may include, as the organometallic compound, only Compound 1. In this regard, Compound 1 may be included in an emission layer of the organic light-emitting device. In some embodiments, the organic layer may include, as the organometallic compound, Compound 1 and Compound 2. In this regard, Compound 1 and Compound 2 may be included in an identical layer (for example, Compound 1 and Compound 2 all may be included in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

For example, the first electrode is an anode, and the second electrode is a cathode, and the organic layer includes i) a hole transport region between the first electrode and the emission layer, and ii) an electron transport region between the emission layer and the second electrode, and the hole transport region includes at least one selected from a hole injection layer, a hole transport layer, and an electron blocking layer, and the electron transport region includes at least one selected from a hole blocking layer, an electron transport layer, and an electron injection layer.

The term "organic layer" as used herein refers to a single layer and/or a plurality of layers disposed between the first electrode and the second electrode of an organic light-emitting device. The "organic layer" may include, in addition to an organic compound, an organometallic complex including metal.

The FIGURE is a schematic view of an organic light-emitting device 10 according to an embodiment. Hereinafter, the structure of an organic light-emitting device according to an embodiment and a method of manufacturing an organic light-emitting device according to an embodiment will be described in connection with the FIGURE. The organic light-emitting device 10 includes a first electrode 11, an organic layer 15, and a second electrode 19, which are sequentially stacked.

In the FIGURE, a substrate may be additionally disposed under the first electrode 11 or above the second electrode 19. As the substrate, any substrate that is used in general organic light-emitting devices may be used. The substrate may be a glass substrate or transparent plastic substrate, each with excellent mechanical strength, thermal stability, transparency, surface smoothness, ease of handling, and water-resistance.

The first electrode 11 may be formed by depositing or sputtering a material for forming the first electrode on the substrate. The first electrode 11 may be an anode. The material for the first electrode 11 may be selected from materials with a high work function to allow holes be easily provided. The first electrode 11 may be a reflective electrode or a transmissive electrode. The material for the first electrode may be, for example, indium tin oxide (ITO), indium zinc oxide (IZO), tin oxide ($SnO_2$), and zinc oxide (ZnO). In some embodiments, magnesium (Mg), aluminum (Al), aluminum-lithium (Al—Li), calcium (Ca), magnesium-indium (Mg—In), or magnesium-silver (Mg—Ag) may be used as the material for the first electrode.

The first electrode 11 may have a single-layer structure or a multi-layer structure including two or more layers. For example, the first electrode 11 may have a three-layered structure of ITO/Ag/ITO, but the structure of the first electrode 11 is not limited thereto.

An organic layer 15 is disposed on the first electrode 11. The organic layer 15 may include a hole transport region, an emission layer, and an electron transport region.

The hole transport region may be disposed between the first electrode 11 and the emission layer.

The hole transport region may include at least one selected from a hole injection layer, a hole transport layer, an electron blocking layer, and a buffer layer.

The hole transport region may include only either a hole injection layer or a hole transport layer. In some embodiments, the hole transport region may have a structure of hole injection layer/hole transport layer or hole injection layer/hole transport layer/electron blocking layer, which are sequentially stacked in this stated order from the first electrode 11.

A hole injection layer may be formed on the first electrode 11 by using various methods, such as vacuum deposition, spin coating, casting, or Langmuir-Blodgett (LB).

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100 to about 500° C., a vacuum pressure of about $10^{-8}$ to about $10^{-3}$ torr, and a deposition rate of about 0.01 to about 100 Angstroms per second (Å/sec). However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for a hole transport layer and an electron blocking layer may be understood by referring to conditions for forming the hole injection layer.

The hole transport region may include at least one selected from m-MTDATA, TDATA, 2-TNATA, NPB, β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (PANI/CSA), (polyaniline)/poly(4-styrenesulfonate) (Pani/PSS), a compound represented by Formula 201 below, and a compound represented by Formula 202 below:

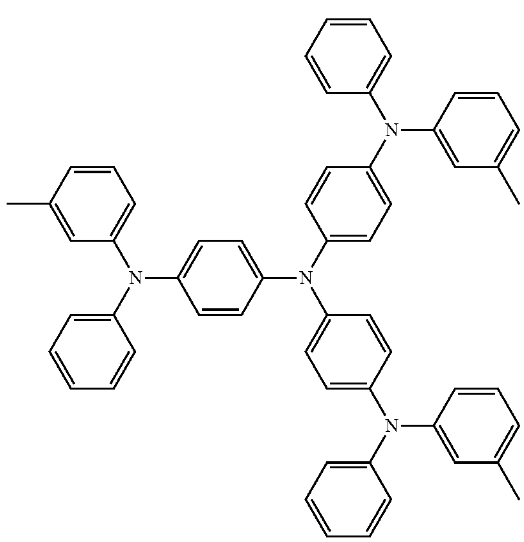

m-MTDATA

-continued

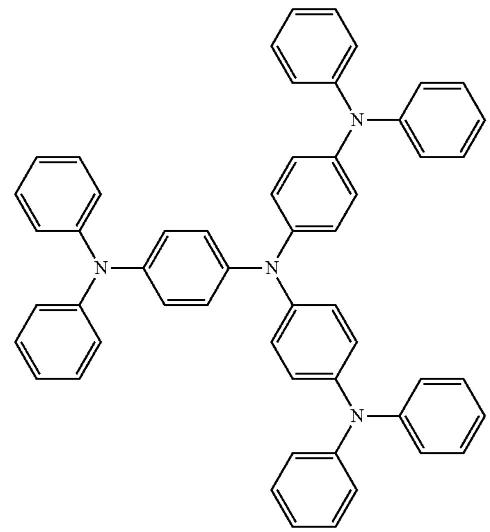

TDATA

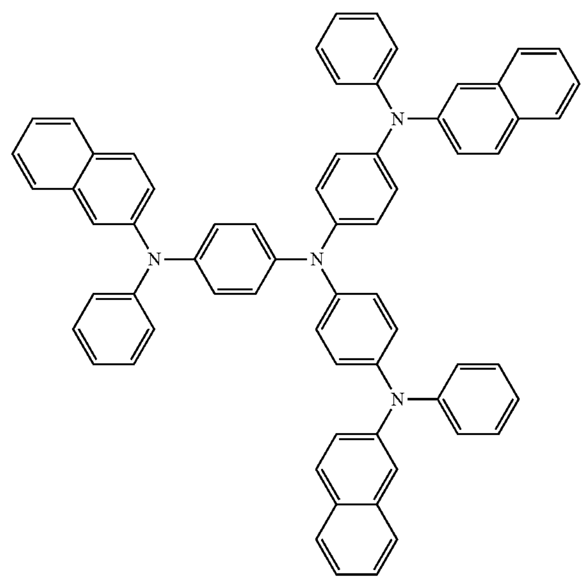

2-TNATA

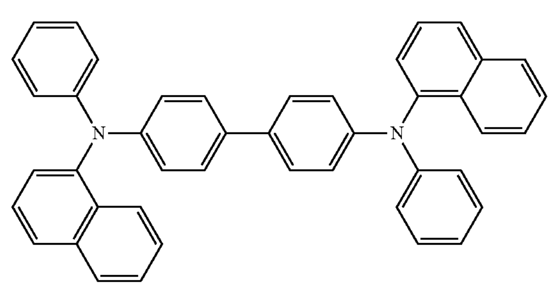

NPB

-continued

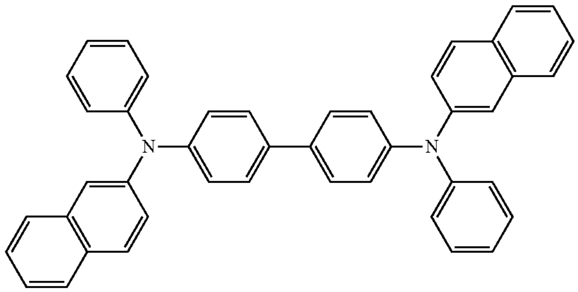

β-NPB

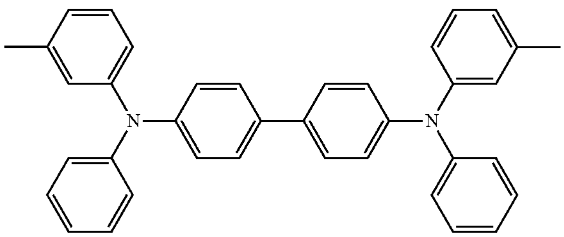

TPD

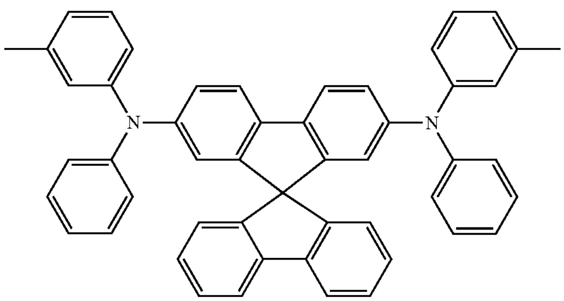

Spiro-TPD

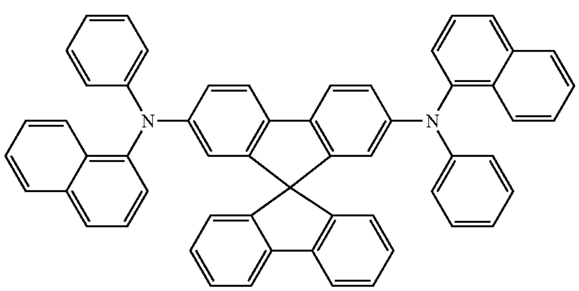

Spiro-NPB

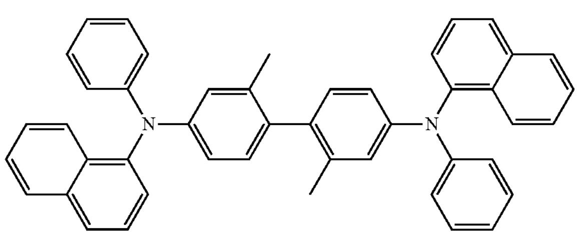

methylated NPB

-continued

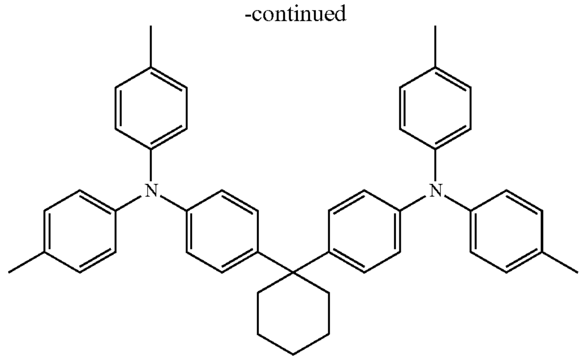

TAPC

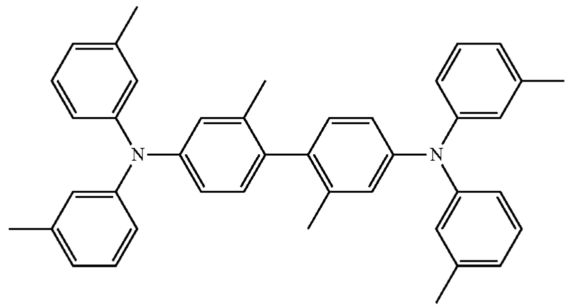

HMTPD

Formula 201

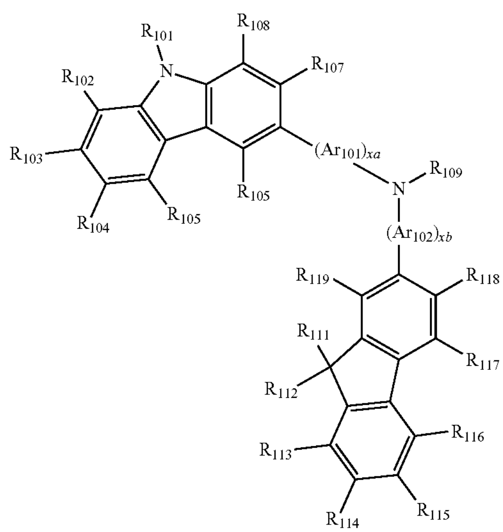

Formula 202

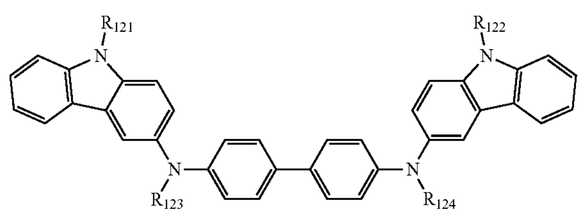

$Ar_{101}$ to $Ar_{102}$ in Formula 201 may be each independently selected from a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

In Formula 201, xa and xb may be each independently an integer of 0 to 5, or 0, 1, or 2. For example, xa is 1 and xb is 0, but xa and xb are not limited thereto.

$R_{101}$ to $R_{108}$, $R_{111}$ to $R_{119}$ and $R_{121}$ to $R_{124}$ in Formulae 201 and 202 may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, and so on), or a $C_1$-$C_{10}$ alkoxy group (for example, a methoxy group, an ethoxy group, a propoxy group, a butoxy group, a pentoxy group, and so on);

a $C_1$-$C_{10}$ alkyl group or a $C_1$-$C_{10}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but they are not limited thereto.

$R_{109}$ in Formula 201 may be selected from a phenyl group, a naphthyl group, an anthracenyl group and a pyridinyl group; and a phenyl group, a naphthyl group, an anthracenyl group and a pyridinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

According to an embodiment, the compound represented by Formula 201 may be represented by Formula 201A, but is not limited thereto:

Formula 201A

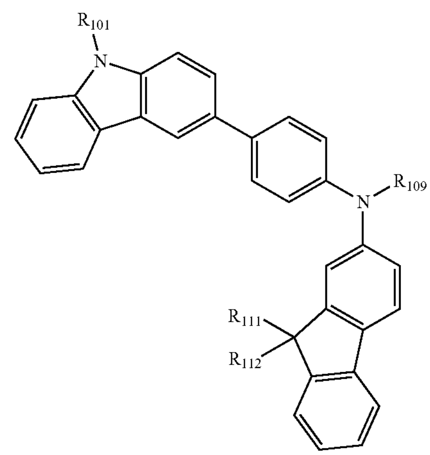

$R_{101}$, $R_{111}$, $R_{112}$, and $R_{109}$ in Formula 201A may be understood by referring to the description provided herein.

For example, the compound represented by Formula 201, and the compound represented by Formula 202 may include compounds HT1 to HT20 illustrated below, but are not limited thereto.

HT1

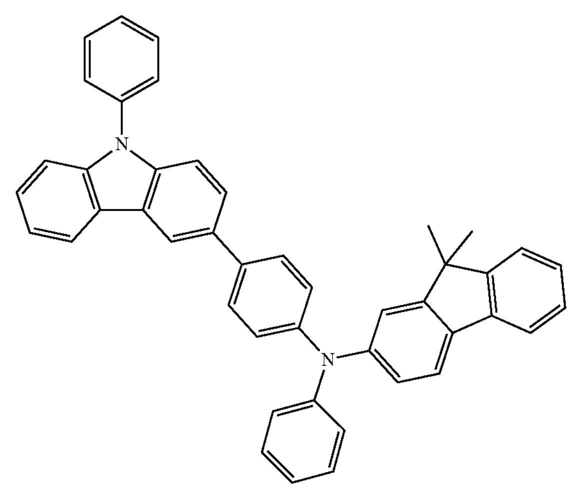

HT2
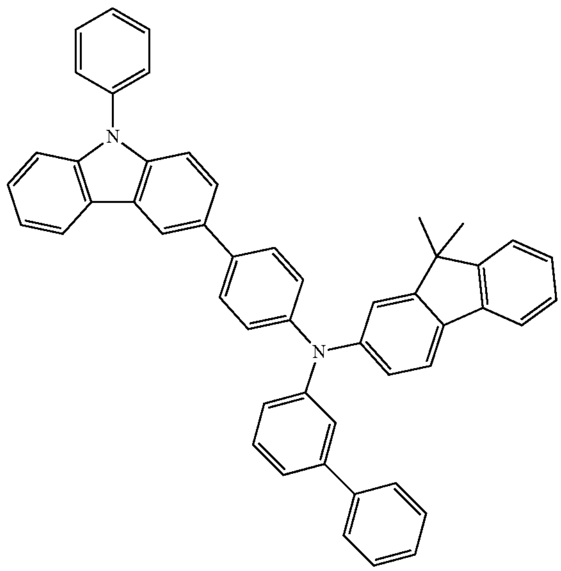
HT3
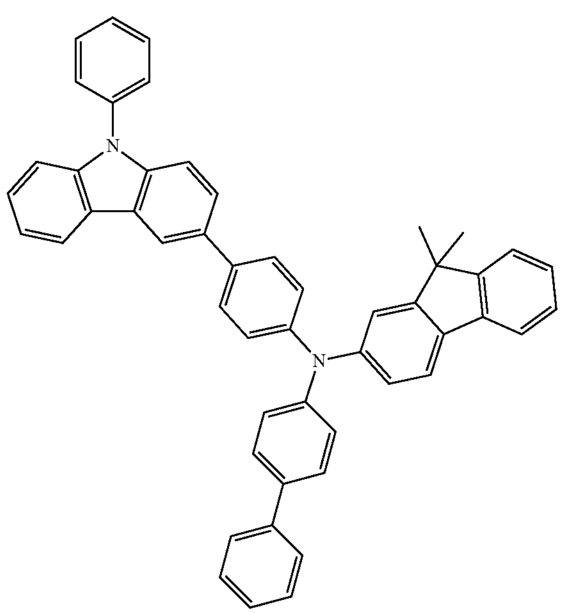
HT4
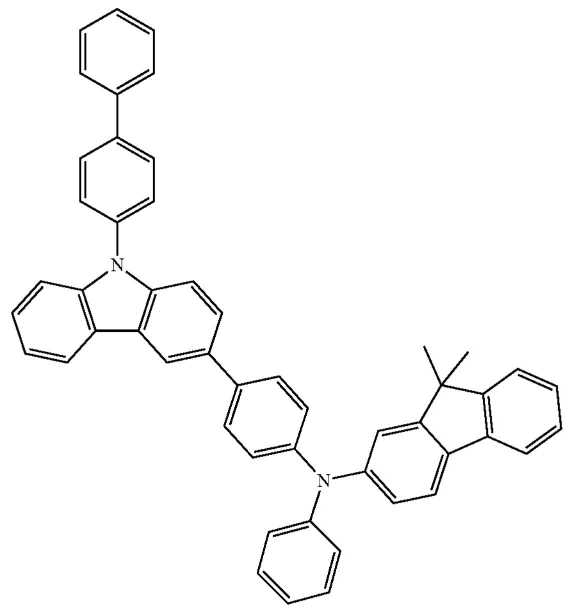
HT5
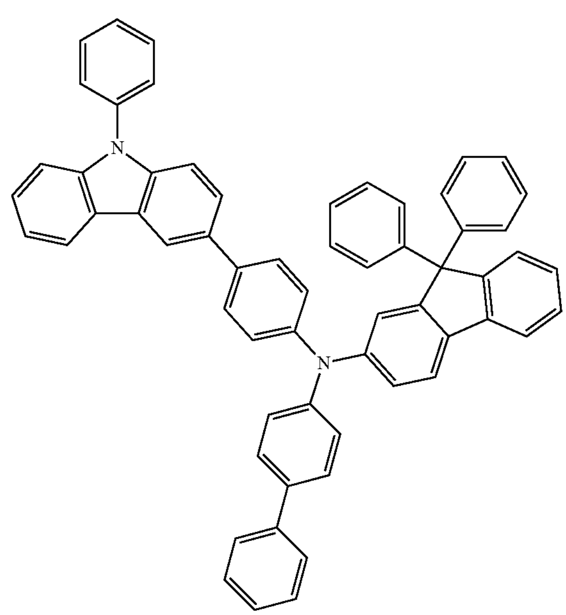

-continued
HT6
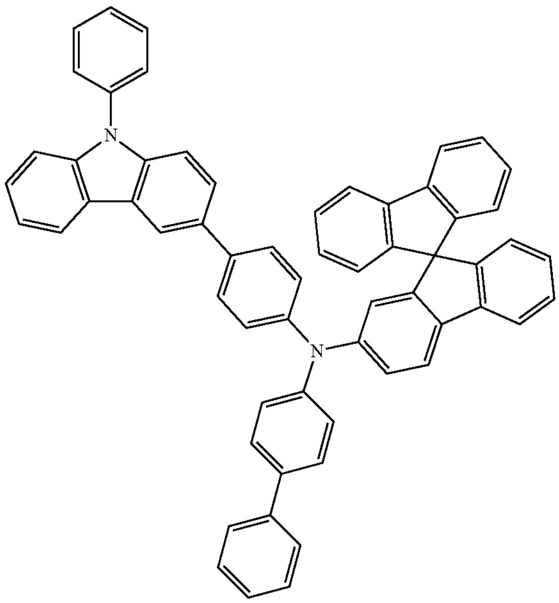
HT7
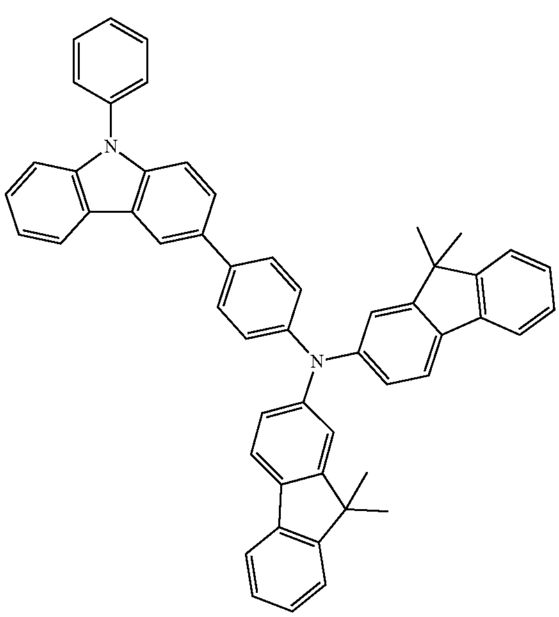
-continued
HT8
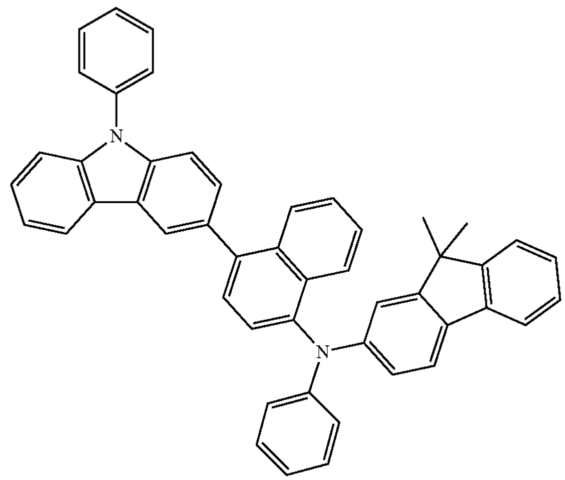
HT9
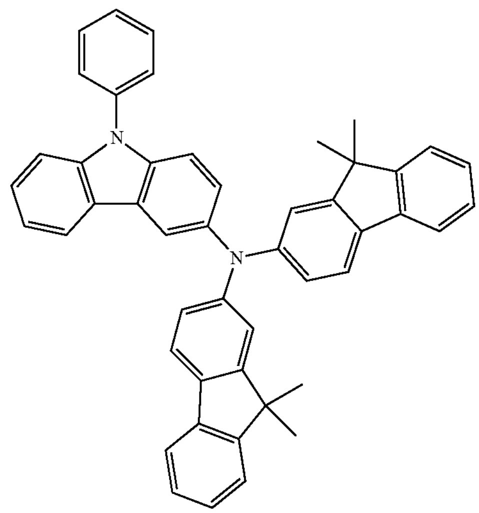
HT10
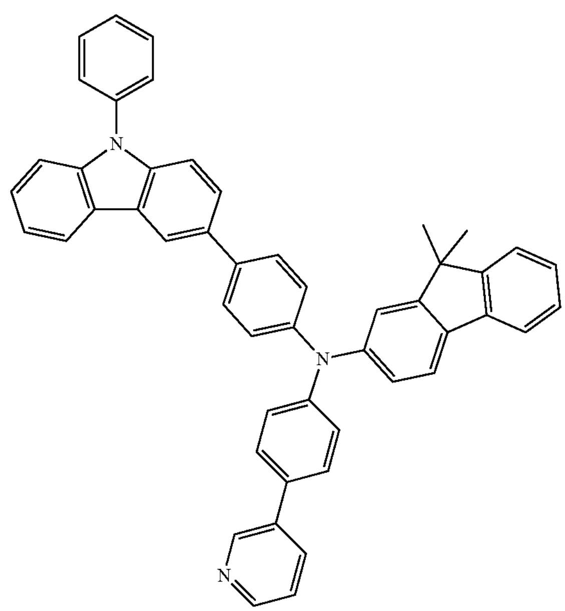

-continued
HT11
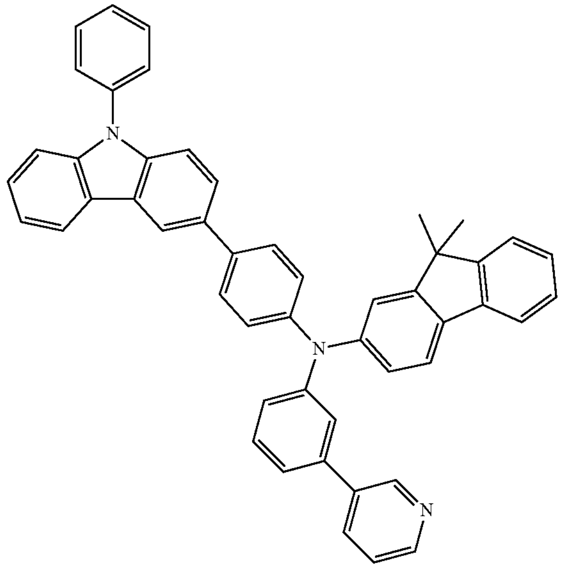
HT12
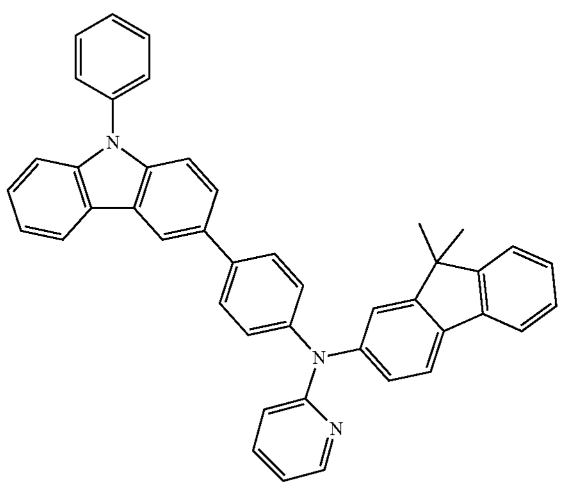
HT13
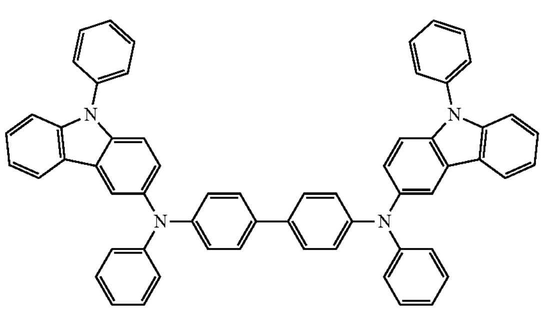
-continued
HT14
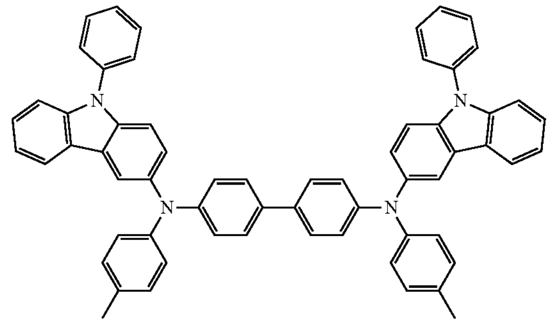
HT15
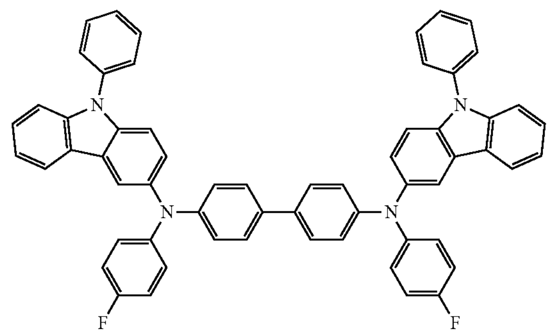
HT16
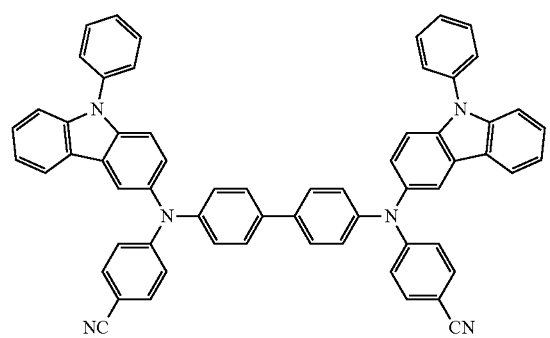
HT17
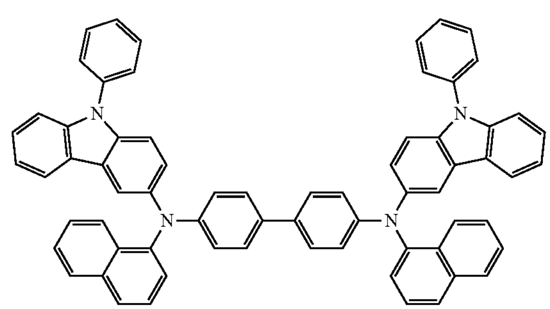

-continued

HT18

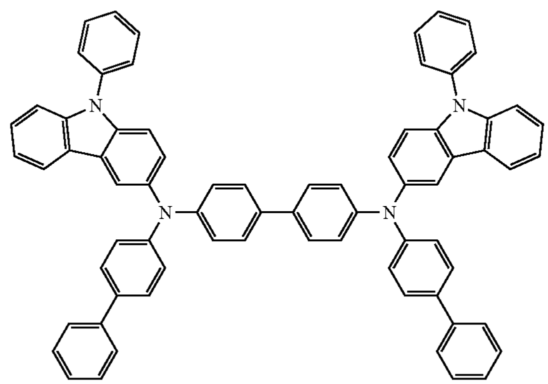

HT19

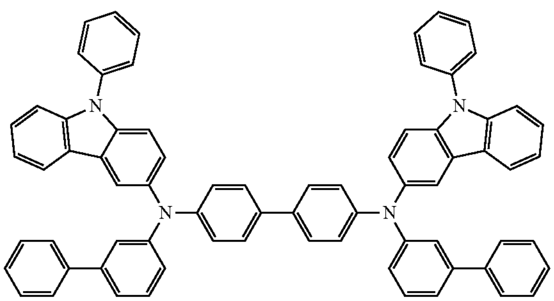

HT20

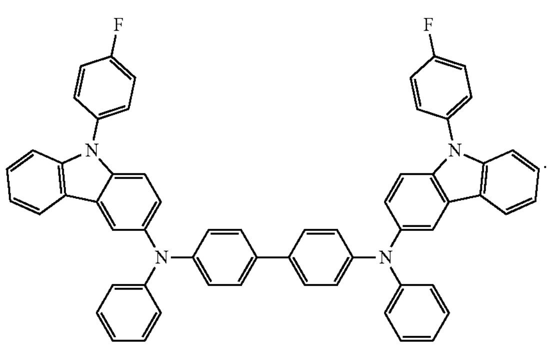

A thickness of the hole transport region may be in a range of about 100 Angstroms (Å) to about 10,000 Å, for example, about 100 Å to about 1,000 Å. When the hole transport region includes a hole injection layer and a hole transport layer, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenum oxide; and a cyano group-containing compound, such as Compound HT-D1 below, but are not limited thereto.

Compound HT-D1

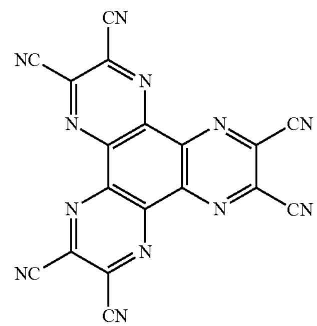

F4-TCNQ

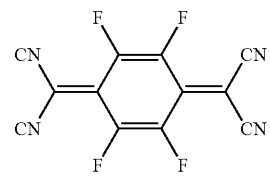

The hole transport region may include a buffer layer.

Also, the buffer layer may compensate for an optical resonance distance according to a wavelength of light emitted from the emission layer, and thus, efficiency of a formed organic light-emitting device may be improved.

Then, an emission layer (EML) may be formed on the hole transport region by vacuum deposition, spin coating, casting, LB deposition, or the like. When the emission layer is formed by vacuum deposition or spin coating, the deposition or coating conditions may be similar to those applied to form the hole injection layer, although the deposition or coating conditions may vary according to the material that is used to form the emission layer.

Meanwhile, when the hole transport region includes an electron blocking layer, a material for the electron blocking layer may be selected from materials for the hole transport region described above and materials for a host to be explained later. However, the material for the electron blocking layer is not limited thereto. For example, when the hole transport region includes an electron blocking layer, a material for the electron blocking layer may be mCP, which will be explained below.

The emission layer may include a host and a dopant, and the dopant may include the organometallic compound represented by Formula 1.

The host may include at least one selected form TPBi, TBADN, ADN (also referred to as "DNA"), CBP, CDBP, TCP, mCP, Compound H50, and Compound H51:

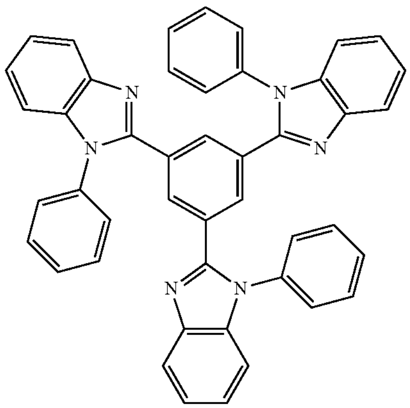
TPBi
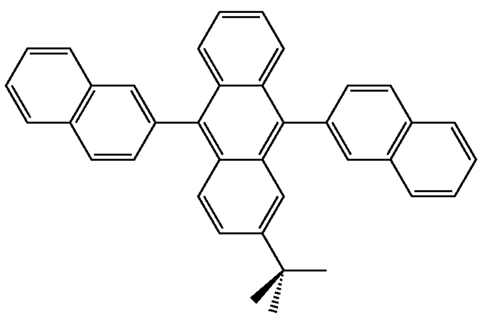
TBADN
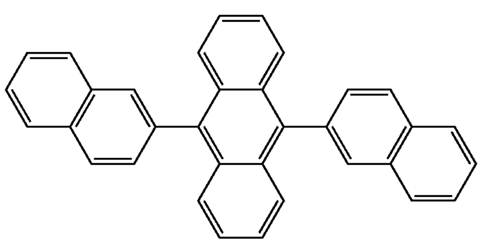
ADN
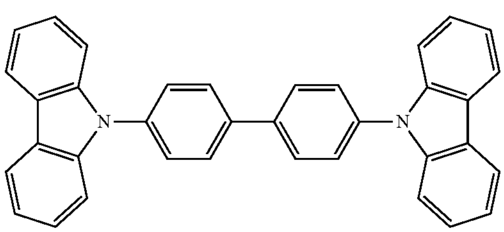
CBP
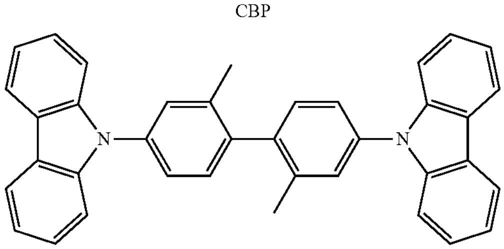
CDBP
-continued
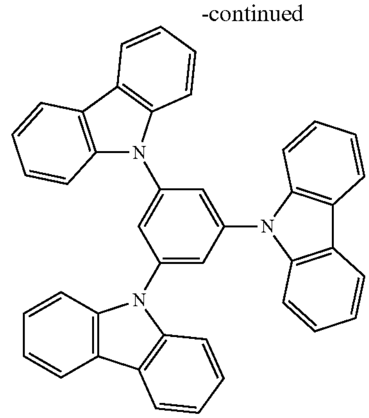
TCP
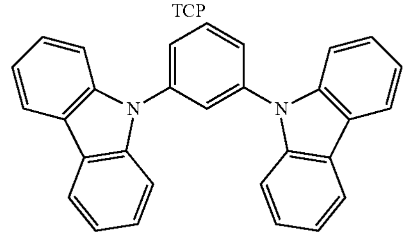
mCP
Compound H50
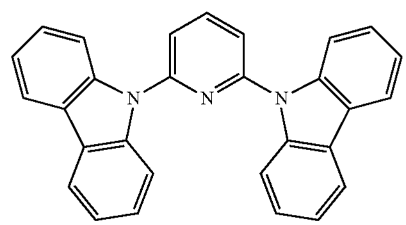
Compound H51
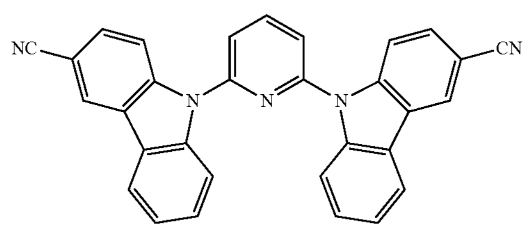
In some embodiments, the host may further include a compound represented by Formula 301 below.
Formula 301
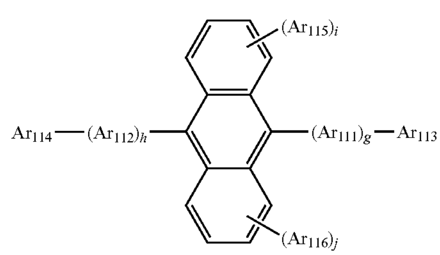
$Ar_{111}$ to $Ar_{112}$ in Formula 301 may be each independently selected from
a phenylene group, a naphthylene group, a phenanthrenylene group, and a pyrenylene group; and a phenylene group, a naphthylene group, a phenanthrenylene group, and a pyrenylene group, each substituted with at least one selected from a phenyl group, a naphthyl group, and an anthracenyl group.

$Ar_{113}$ to $Ar_{116}$ in Formula 301 may be each independently selected from a $C_1$-$C_{10}$ alkyl group, a phenyl group, a naphthyl group, a phenanthrenyl group, and a pyrenyl group; and a phenyl group, a naphthyl group, a phenanthrenyl group, and a pyrenyl group, each substituted with at least one selected from a phenyl group, a naphthyl group, and an anthracenyl group.

g, h, i, and j in Formula 301 may be each independently an integer of 0 to 4, for example, an integer of 0, 1, or 2.

$Ar_{113}$ to $Ar_{116}$ in Formula 301 may be each independently selected from a $C_1$-$C_{10}$ alkyl group substituted with at least one selected from a phenyl group, a naphthyl group, and an anthracenyl group;

a phenyl group, a naphthyl group, an anthracenyl group, a pyrenyl, a phenanthrenyl group, and a fluorenyl group;

a phenyl group, a naphthyl group, an anthracenyl group, a pyrenyl group, a phenanthrenyl group, and a fluorenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, and a fluorenyl group; and

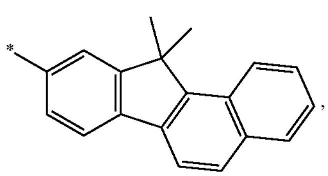 [SMILES: *c1ccc2c(c1)C(C)(C)c1c-2ccc2ccccc12]

but embodiments are not limited thereto.

In some embodiments, the host may include a compound represented by Formula 302 below:

Formula 302

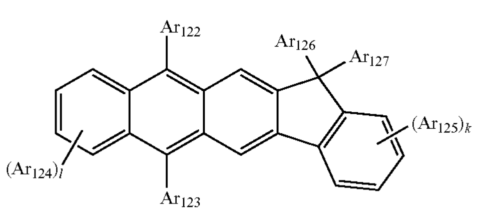

$Ar_{122}$ to $Ar_{125}$ in Formula 302 are the same as described in detail in connection with $Ar_{113}$ in Formula 301.

$Ar_{126}$ and $Ar_{127}$ in Formula 302 may be each independently a $C_1$-$C_{10}$ alkyl group (for example, a methyl group, an ethyl group, or a propyl group).

k and l in Formula 302 may be each independently an integer of 0 to 4. For example, k and l may be 0, 1, or 2.

The compound represented by Formula 301 and the compound represented by Formula 302 may include Compounds H1 to H42 illustrated below, but are not limited thereto.

H1

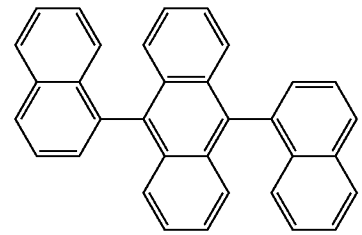

H2

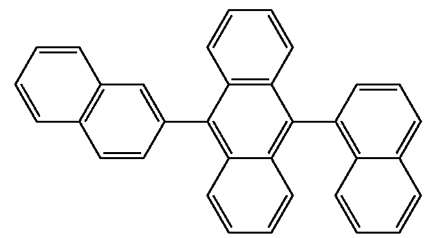

H3

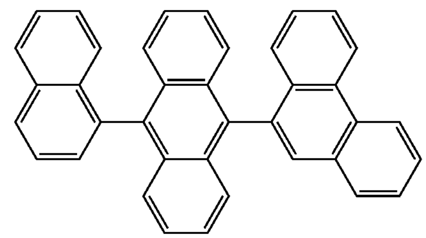

H4

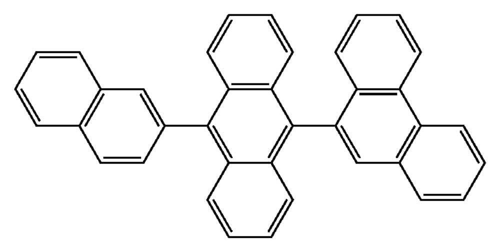

H5

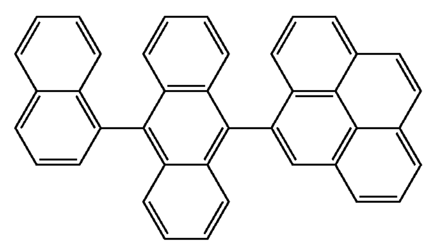

H6

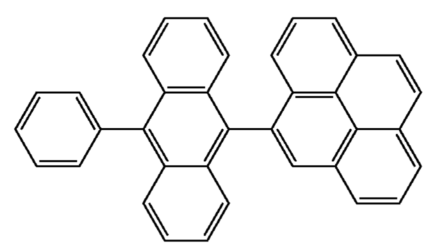

-continued
H7
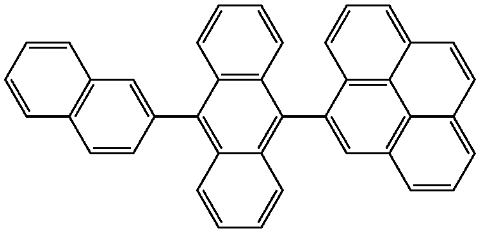
H8
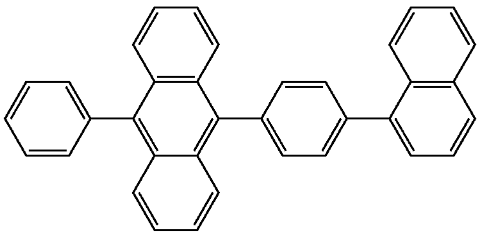
H9
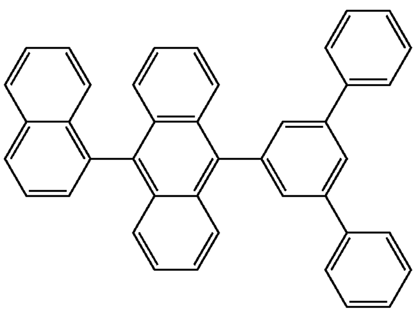
H10
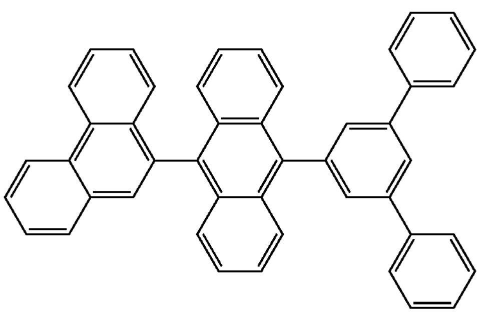
H11
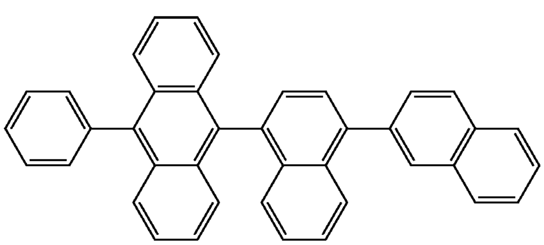
H12
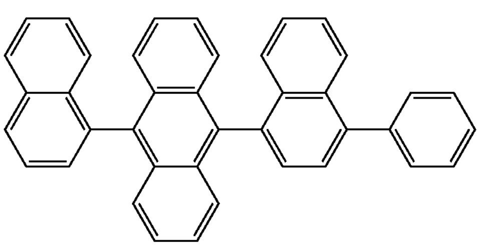
-continued
H13
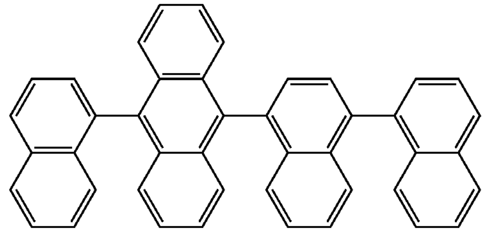
H14
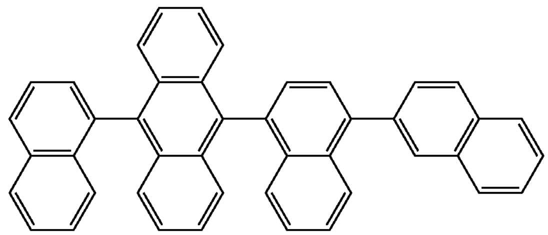
H15
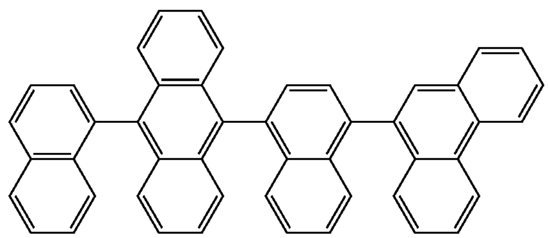
H16
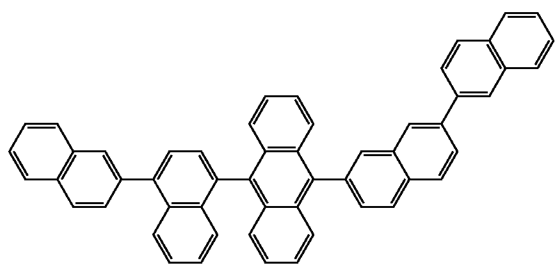
H17
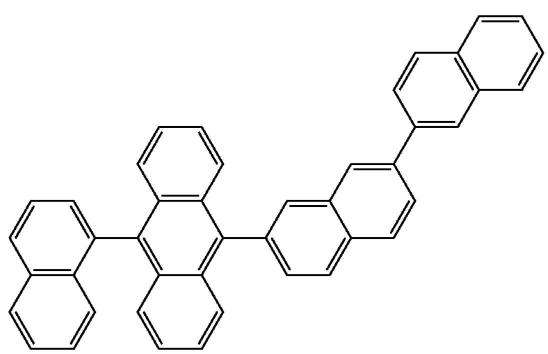

H18
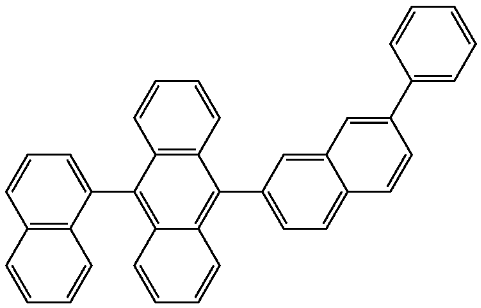
H19
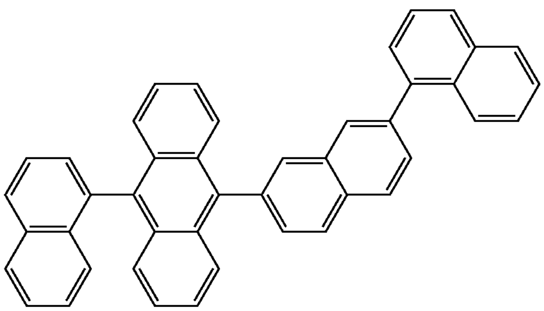
H20
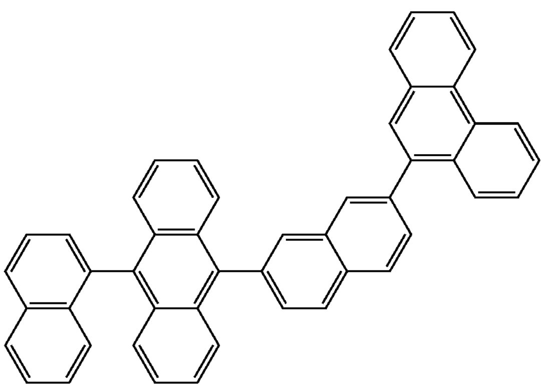
H21
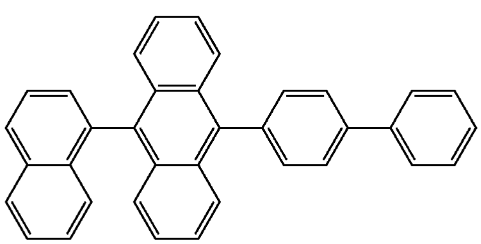
H22
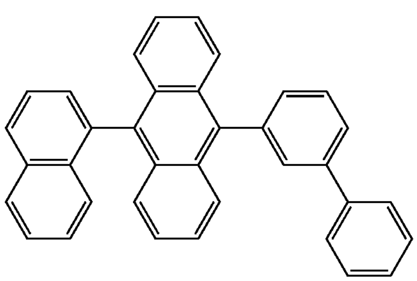
H23
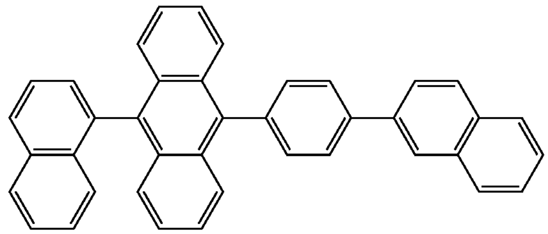
H24
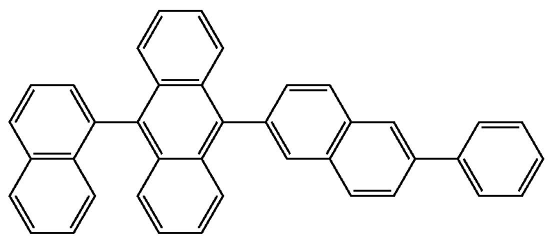
H25
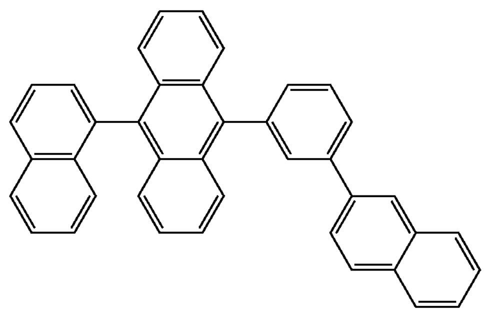
H26
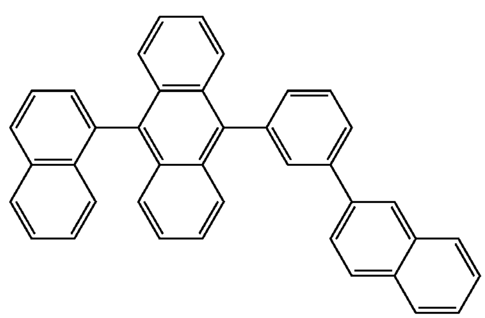
H27
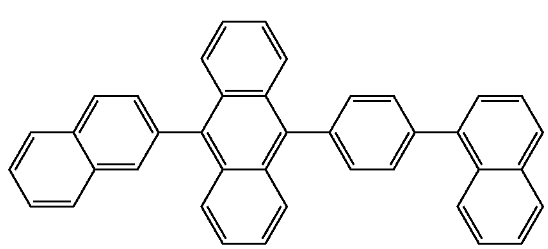

H20
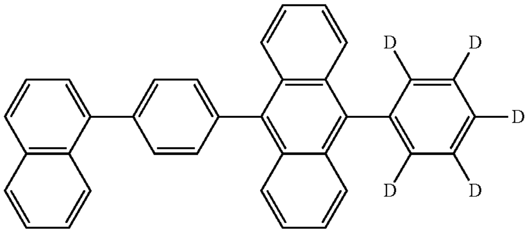
H29
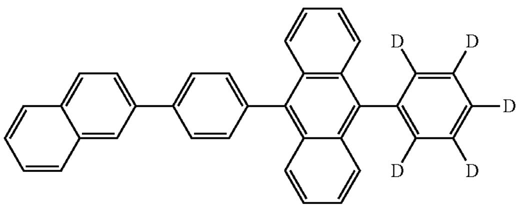
H30
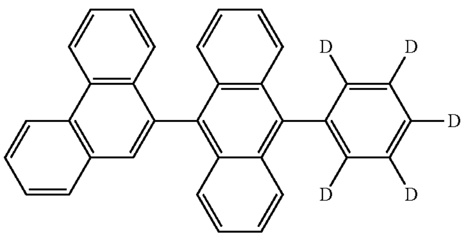
H31
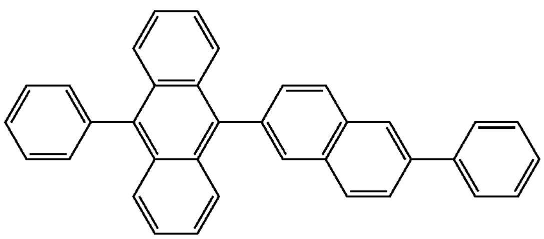
H32
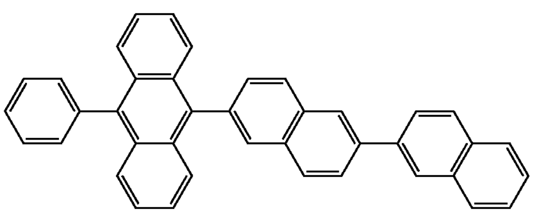
H33
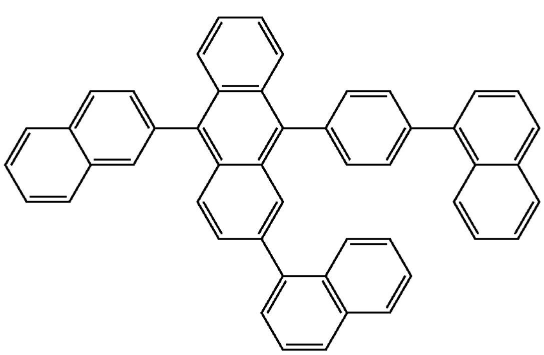
H34
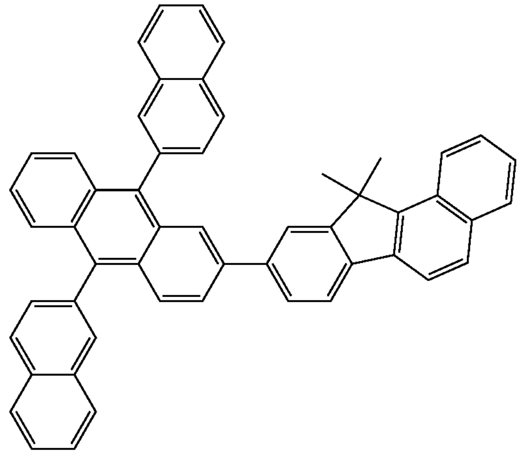
H35
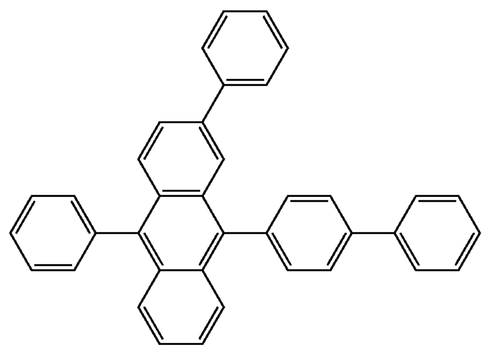
H36
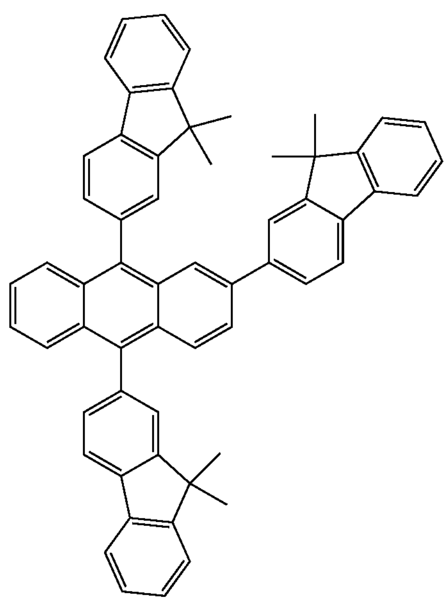

-continued

37

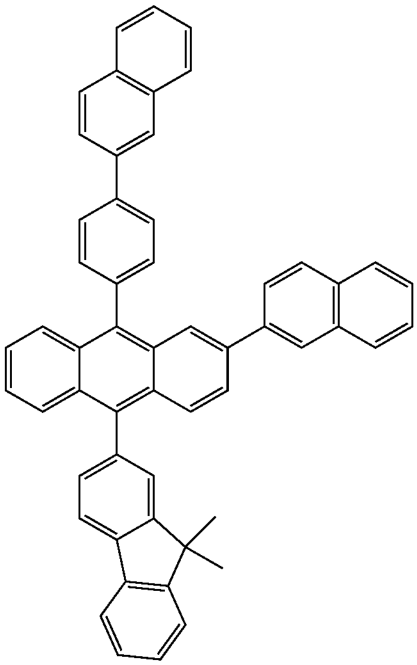

H38

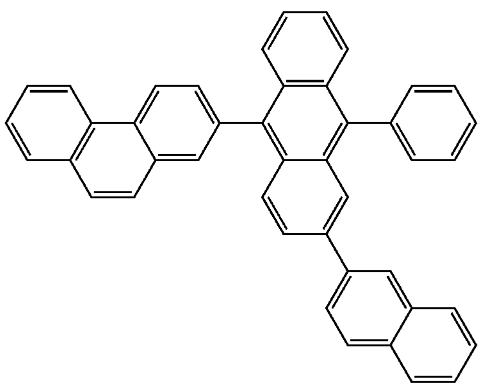

H39

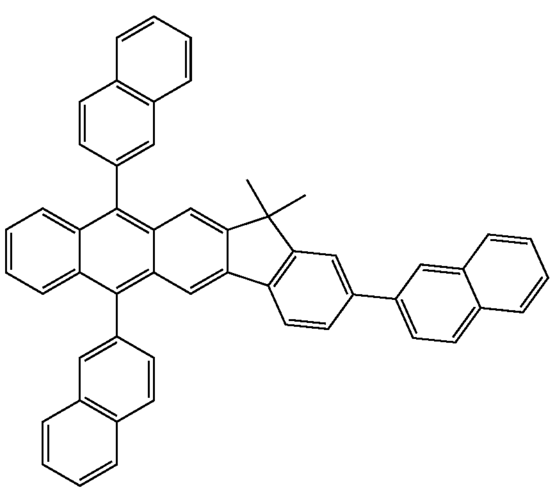

-continued

H40

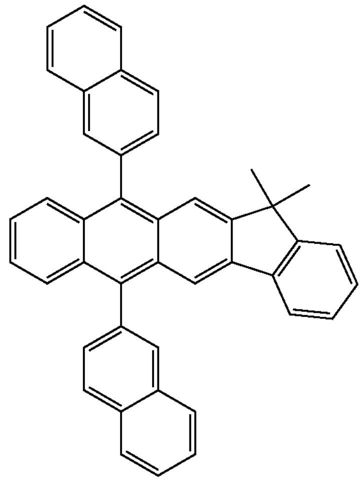

H41

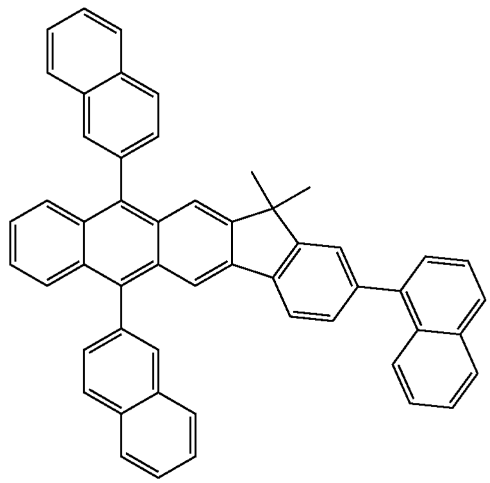

H42

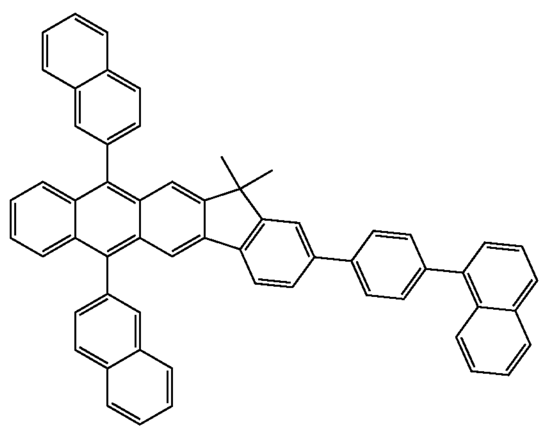

When the organic light-emitting device is a full color organic light-emitting device, the emission layer may be patterned into a red emission layer, a green emission layer, and a blue emission layer. In some embodiments, due to a stack structure including a red emission layer, a green emission layer, and/or a blue emission layer, the emission layer may emit white light.

When the emission layer includes a host and a dopant, an amount of the dopant may be in a range of about 0.01 to about 15 parts by weight based on 100 parts by weight of the host, but is not limited thereto.

A thickness of the emission layer may be in a range of about 100 Å to about 1000 Å, for example, about 200 Å to about 600 Å. When the thickness of the emission layer is within this range, excellent light-emission characteristics may be obtained without a substantial increase in driving voltage.

Then, an electron transport region may be disposed on the emission layer.

The electron transport region may include at least one selected from a hole blocking layer, an electron transport layer, and an electron injection layer.

For example, the electron transport region may have a structure of hole blocking layer/electron transport layer/electron injection layer or a structure of electron transport layer/electron injection layer, but the structure of the electron transport region is not limited thereto. The electron transport layer may have a single-layered structure or a multi-layer structure including two or more different materials.

Conditions for forming the hole blocking layer, the electron transport layer, and the electron injection layer which constitute the electron transport region may be understood by referring to the conditions for forming the hole injection layer.

When the electron transport layer includes a hole blocking layer, the hole blocking layer may include, for example, at least one of BCP, Bphen, and Balq but is not limited thereto.

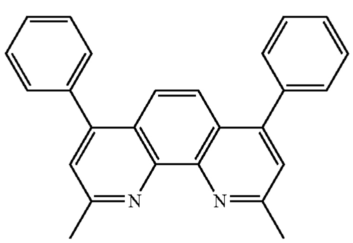

BCP

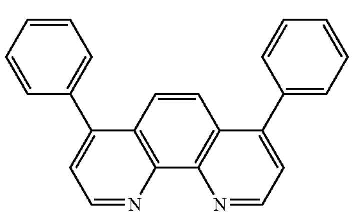

Bphen

A thickness of the hole blocking layer may be in a range of about 20 Å to about 1,000 Å, for example, about 30 Å to about 300 Å. When the thickness of the hole blocking layer is within these ranges, the hole blocking layer may have improved hole blocking ability without a substantial increase in driving voltage.

The electron transport layer may further include at least one selected from BCP, Bphen, $Alq_3$, BAlq, TAZ, and NTAZ.

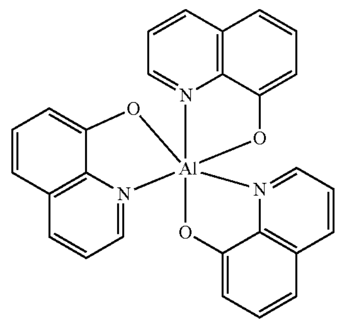

$Alq_3$

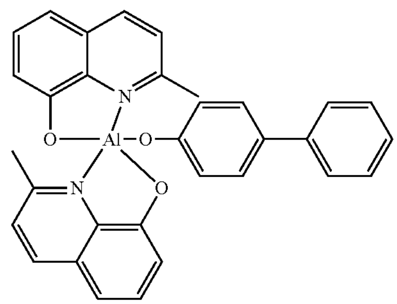

BAlq

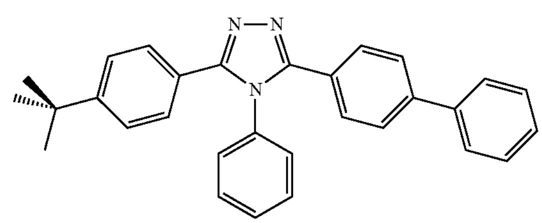

TAZ

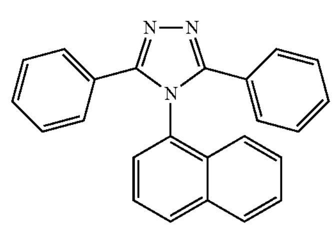

NTAZ

In some embodiments, the electron transport layer may include at least one of ET1 and ET2, but are not limited thereto:

ET1

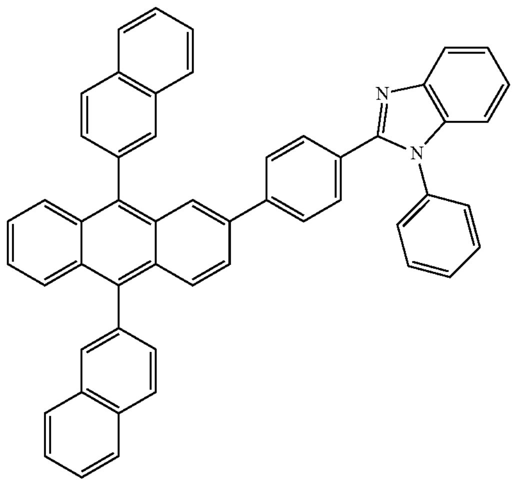

ET2

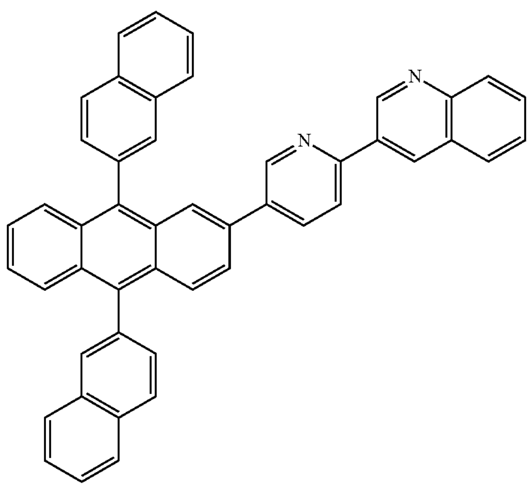

A thickness of the electron transport layer may be in a range of about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium quinolate, LiQ) or ET-D2.

ET-D1

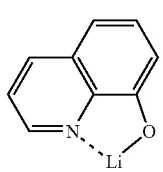

-continued

ET-D2

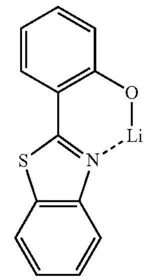

The electron transport region may include an electron injection layer (EIL) that allows electrons to be easily provided from a second electrode 19.

The electron injection layer may include at least one selected from, LiF, NaCl, CsF, $Li_2O$, BaO, and LiQ.

A thickness of the electron injection layer may be in a range of about 1 Å to about 100 Å, about 3 Å to about 90 Å. When the thickness of the electron injection layer is within the range described above, the electron injection layer may have satisfactory electron injection characteristics without a substantial increase in driving voltage.

The second electrode 19 is disposed on the organic layer 15. The second electrode 19 may be a cathode. A material for forming the second electrode 19 may be selected from metal, an alloy, an electrically conductive compound, and a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as a material for forming the second electrode 19. In some embodiments, to manufacture a top emission type light-emitting device, a transmissive electrode formed using ITO or IZO may be used as the second electrode 19.

Hereinbefore, the organic light-emitting device has been described with reference to the FIGURE, but is not limited thereto.

A $C_1$-$C_{60}$ alkyl group as used herein refers to a linear or branched aliphatic hydrocarbon monovalent group having 1 to 60 carbon atoms. Detailed examples thereof are a methyl group, an ethyl group, a propyl group, an isobutyl group, a sec-butyl group, a tert-butyl group, a pentyl group, an iso-amyl group, and a hexyl group. A $C_1$-$C_{60}$ alkylene group as used herein refers to a divalent group having the same structure as the $C_1$-$C_{60}$ alkyl group.

A $C_1$-$C_{60}$ alkoxy group as used herein refers to a monovalent group represented by —$OA_{101}$ (wherein $A_{101}$ is the $C_1$-$C_{60}$ alkyl group). Detailed examples thereof are a methoxy group, an ethoxy group, and an isopropyloxy group.

A $C_2$-$C_{60}$ alkenyl group as used herein refers to a hydrocarbon group having at least one carbon-carbon double bond in the middle or at the terminal of the $C_2$-$C_{60}$ alkyl group. Detailed examples thereof are an ethenyl group, a propenyl group, and a butenyl group. A $C_2$-$C_{60}$ alkenylene group as used herein refers to a divalent group having the same structure as the $C_2$-$C_{60}$ alkenyl group.

A $C_2$-$C_{60}$ alkynyl group as used herein refers to a hydrocarbon group having at least one carbon-carbon triple bond in the middle or at the terminal of the $C_2$-$C_{60}$ alkyl group. Detailed examples thereof are an ethynyl group, and a propynyl group. A $C_2$-$C_{60}$ alkynylene group as used herein refers to a divalent group having the same structure as the $C_2$-$C_{60}$ alkynyl group.

A $C_3$-$C_{10}$ cycloalkyl group as used herein refers to a monovalent hydrocarbon monocyclic group having 3 to 10 carbon atoms. Detailed examples thereof are a cyclopropyl group, a cyclobutyl group, a cyclopentyl group, a cyclohexyl group, and a cycloheptyl group. A $C_3$-$C_{10}$ cycloalkylene group as used herein refers to a divalent group having the same structure as the $C_3$-$C_{10}$ cycloalkyl group.

A $C_1$-$C_{10}$ heterocycloalkyl group as used herein refers to a monovalent monocyclic group having at least one hetero atom selected from N, O, P, and S as a ring-forming atom and 1 to 10 carbon atoms. Detailed examples thereof are a tetrahydrofuranyl group, and a tetrahydrothiophenyl group. A $C_1$-$C_{10}$ heterocycloalkylene group as used herein refers to a divalent group having the same structure as the $C_1$-$C_{10}$ heterocycloalkyl group.

A $C_3$-$C_{10}$ cycloalkenyl group as used herein refers to a monovalent monocyclic group that has 3 to 10 carbon atoms and at least one double bond in the ring thereof, and which is not aromatic. Detailed examples thereof are a cyclopentenyl group, a cyclohexenyl group, and a cycloheptenyl group. A $C_3$-$C_{10}$ cycloalkenylene group as used herein refers to a divalent group having the same structure as the $C_3$-$C_{10}$ cycloalkenyl group.

A $C_1$-$C_{10}$ heterocycloalkenyl group as used herein refers to a monovalent monocyclic group that has at least one hetero atom selected from N, O, P, and S as a ring-forming atom, 1 to 10 carbon atoms, and at least one double bond in its ring. Detailed examples of the $C_1$-$C_{10}$ heterocycloalkenyl group are a 2,3-dihydrofuranyl group and a 2,3-dihydrothiophenyl group. A $C_1$-$C_{10}$ heterocycloalkenylene group as used herein refers to a divalent group having the same structure as the $C_1$-$C_{10}$ heterocycloalkenyl group.

A $C_6$-$C_{60}$ aryl group as used herein refers to a monovalent group having a carbocyclic aromatic system having 6 to 60 carbon atoms, and a $C_6$-$C_{60}$ arylene group as used herein refers to a divalent group having a carbocyclic aromatic system having 6 to 60 carbon atoms. Detailed examples of the $C_6$-$C_{60}$ aryl group are a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

A $C_1$-$C_{60}$ heteroaryl group as used herein refers to a monovalent group having a carbocyclic aromatic system that has at least one hetero atom selected from N, O, P, and S as a ring-forming atom, and 1 to 60 carbon atoms. A $C_1$-$C_{60}$ heteroarylene group as used herein refers to a divalent group having a carbocyclic aromatic system that has at least one hetero atom selected from N, O, P, and S as a ring-forming atom, and 1 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

A $C_6$-$C_{60}$ aryloxy group as used herein indicates —$OA_{102}$ (wherein $A_{102}$ is the $C_6$-$C_{60}$ aryl group), and a $C_6$-$C_{60}$ arylthio group as used herein indicates —$SA_{103}$ (wherein $A_{103}$ is the $C_6$-$C_{60}$ aryl group).

A monovalent non-aromatic condensed polycyclic group as used herein refers to a monovalent group (for example, having 8 to 60 carbon atoms) that has two or more rings condensed to each other, only carbon atoms as a ring forming atom, and which is non-aromatic in the entire molecular structure. A detailed example of the monovalent non-aromatic condensed polycyclic group is a fluorenyl group. A divalent non-aromatic condensed polycyclic group as used herein refers to a divalent group having the same structure as the monovalent non-aromatic condensed polycyclic group.

A monovalent non-aromatic condensed heteropolycyclic group as used herein refers to a monovalent group (for example, having 2 to 60 carbon atoms) that has two or more rings condensed to each other, has a heteroatom selected from N, O P, and S, other than carbon atoms, as a ring forming atom, and which is non-aromatic in the entire molecular structure. An example of the monovalent non-aromatic condensed heteropolycyclic group is a carbazolyl group. A divalent non-aromatic condensed heteropolycyclic group as used herein refers to a divalent group having the same structure as the monovalent non-aromatic condensed heteropolycyclic group.

At least one of substituents of the substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from a deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$ a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), and —P(═O)($Q_{28}$)($Q_{29}$); and —N($Q_{31}$)($Q_{32}$), —Si($Q_{33}$)($Q_{34}$)($Q_{35}$), —B($Q_{36}$)($Q_{37}$), and —P(═O)($Q_{38}$)($Q_{39}$);

wherein $Q_1$ to $Q_9$, $Q_{11}$ to $Q_{19}$, $Q_{21}$ to $Q_{29}$, and $Q_{31}$ to $Q_{39}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLE

Synthesis Example 1: Synthesis of Compound 1

Synthesis of Compound A1

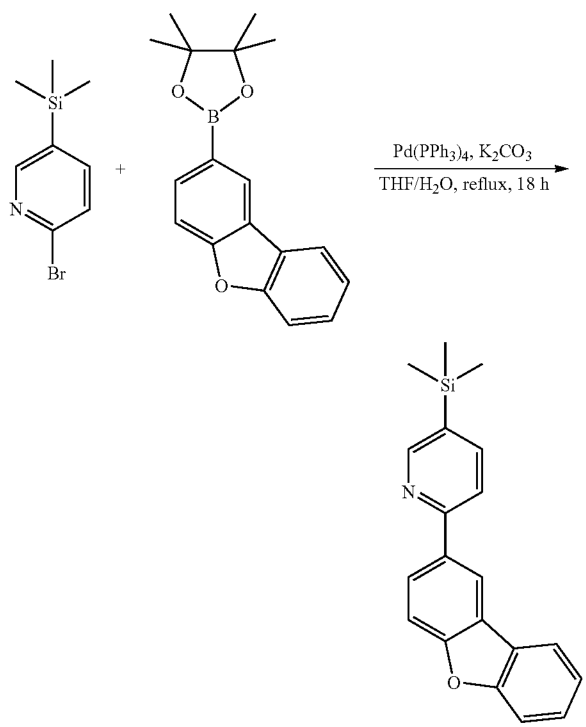

Compound A1

210 milliliters (mL) of tetrahydrofuran (THF) and 70 mL of distilled water were mixed with 2-bromo-5-(trimethylsilyl)pyridine (9 grams (g), 39.09 millimoles (mmol)), 2-(dibenzo[b,d]furan-2-yl)-4,4,5,5-tetramethyl-1,3,2-dioxaborolane (13.22 g, 44.96 mmol), $Pd(PPh_3)_4$ (2.26 g, 1.95 mmol), and $K_2CO_3$ (16.21 g, 117.27 mmol). The resultant mixture was stirred under reflux for 18 hours. The temperature was decreased to room temperature. The product was extracted by using methylene chloride (MC). The organic layer was dried with anhydrous magnesium sulfate ($MgSO_4$) and the solution was filtered. The obtained filtrate was concentrated and the obtained residual was purified by column chromatography (MC:Hexane=1:1) to obtain 7.4 g (60%) of Compound A1.

Synthesis of Compound M2A

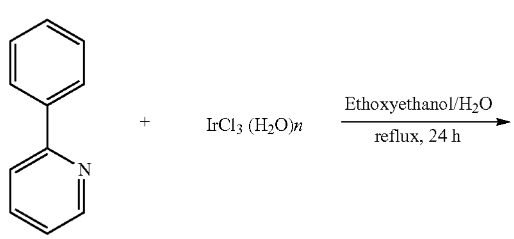

-continued

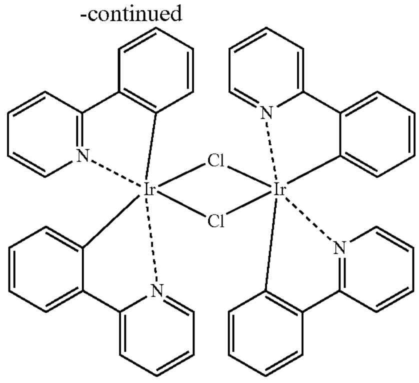

Compound M2A 2-phenylpyridine (14.66 g, 94.44 mmol) and iridium chloride (14.80 g, 41.97 mmol) were mixed with 210 mL of ethoxyethanol and 70 mL of distilled water. The mixture was stirred under reflux for 24 hours to carry out the reaction. Upon completion of the reaction, the temperature was reduced to room temperature. The resultant solid was separated by filtration and thoroughly washed with water, methanol, and hexane in the stated order. The obtained solid was dried in a vacuum oven to obtain 19.5 g (87%) of Compound M2A.

Synthesis of Compound M1A

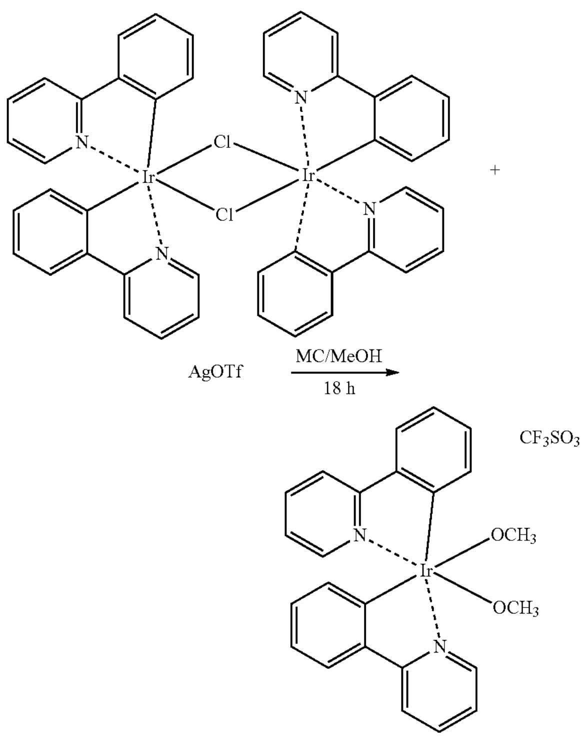

Compound M1A

Compound M2A (6.01 g, 5.60 mmol) was mixed with 45 mL of MC, and a solution of AgOTf (2.88 g, 11.21 mmol) in 15 mL of methanol was added thereto. The flask was wrapped with an aluminum foil to block the sunlight, and the mixture was stirred at room temperature for 18 hours to carry out the reaction. The generated solid was removed by celite filtration, and a filtrate was concentrated under reduced pressure. The obtained solid (Compound M1A) was used for the subsequent reaction without purification.

Synthesis of Compound 1

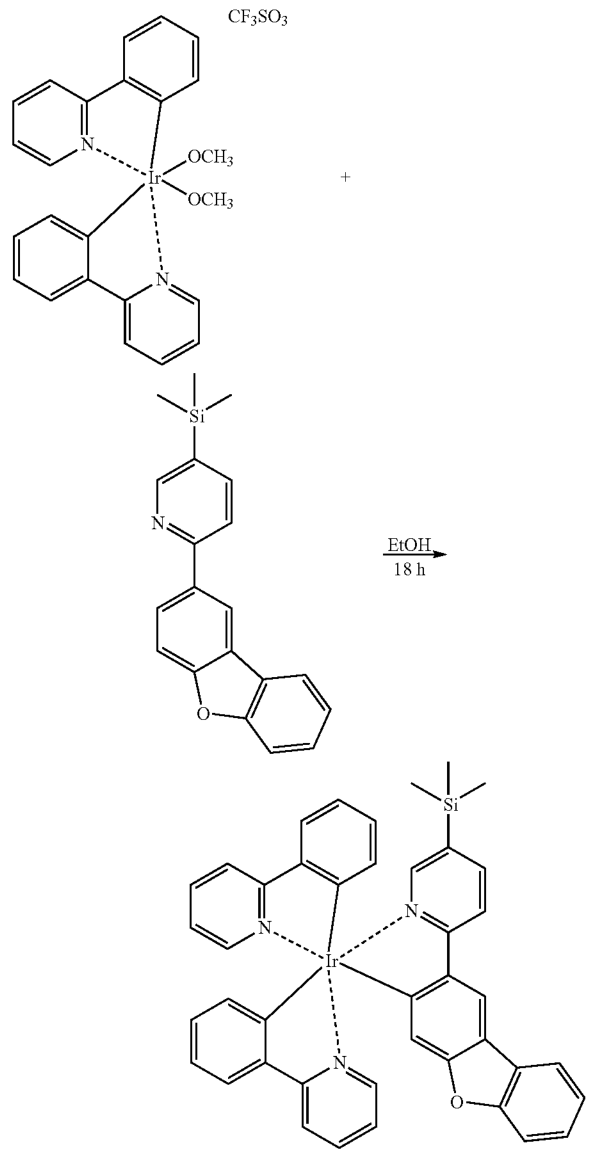

Compound 1

Compound M1A (8 g, 11.22 mmol) and Compound A1 (4.28 g, 13.47 mmol) were mixed with 100 mL of ethanol, and the resulting mixture was stirred under reflux for 18 hours to carry out the reaction. Upon completion of the reaction, the temperature was reduced to room temperature. The resultant mixture was filtered to separate a solid, which was thoroughly washed with ethanol and hexane. The product was purified by column chromatography (MC: hexane=40:60) to obtain 2.54 g (28%) of Compound 1. The obtained product was confirmed by Mass Spectroscopy and HPLC analysis.

HRMS(MALDI) calcd for $C_{42}H_{34}IrN_3OSi$: m/z 817.2100, Found: 817.2104.

Synthesis Example 2: Synthesis of Compound 3

Synthesis of Compound B1

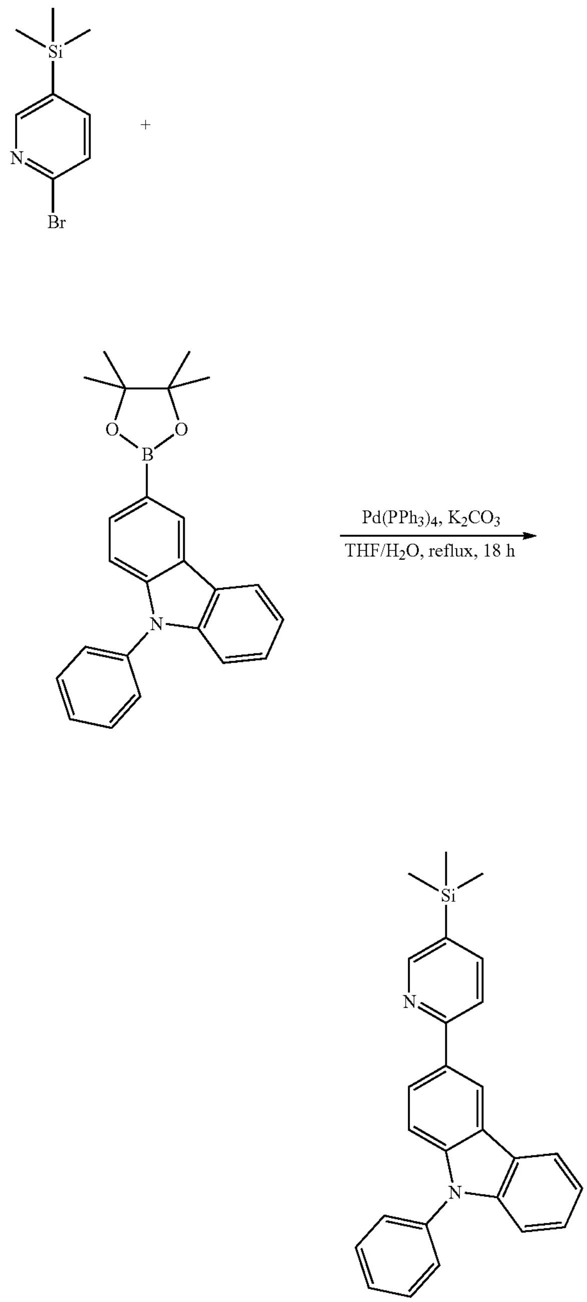

Compound B1

8.5 g (55%) of Compound B1 was prepared in the same manner as used to synthesize Compound A1 in Synthesis Example 1, except that 2-bromo-5-(trimethylsilyl)pyridine (9 g, 39.09 mmol) and 9-phenyl-3-(4,4,5,5-tetramethyl-1,3,2-dioxaborolan-2-yl)-9H-carbazole (13.47 g, 46.92 mmol) were used instead of 2-bromo-5-(trimethylsilyl)pyridine (9 g, 39.09 mmol) and 2-(dibenzo[b,d]furan-2-yl)-4,4,5,5-tetramethyl-1,3,2-dioxaborolane (13.22 g, 44.96 mmol), respectively.

Synthesis of Compound 3

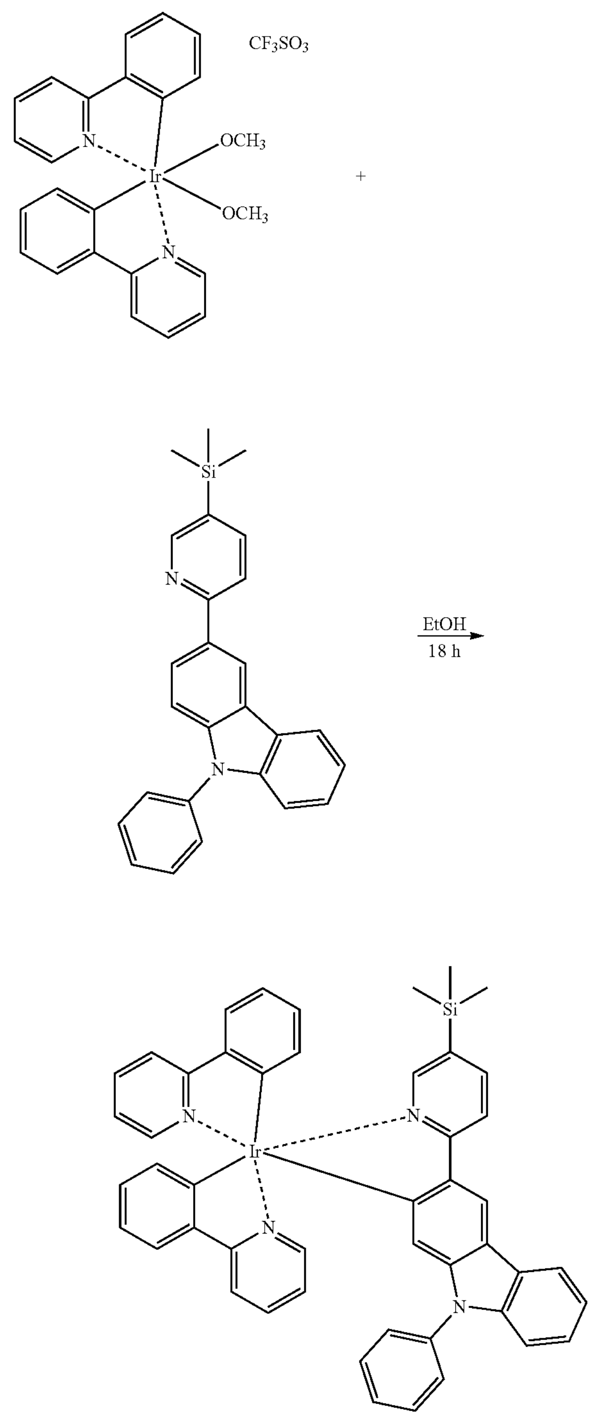

Compound 3

2.4 g (32%) of Compound 3 was obtained in the same manner as used to synthesize Compound 1 in Synthesis Example 1, except that Compound M1A (6.00 g, 8.42 mmol) and Compound B1 (3.97 g, 10.10 mmol) were used instead of Compound M1A (8 g, 11.22 mmol) and Compound A1 (4.28 g, 13.47 mmol), respectively. The obtained product was confirmed by Mass Spectroscopy and HPLC analysis.

HRMS(MALDI) calcd for $C_{48}H_{39}IrN_4Si$: m/z 892.2573, Found: 892.2575.

Synthesis Example 3: Synthesis of Compound 8

Synthesis of Compound C3

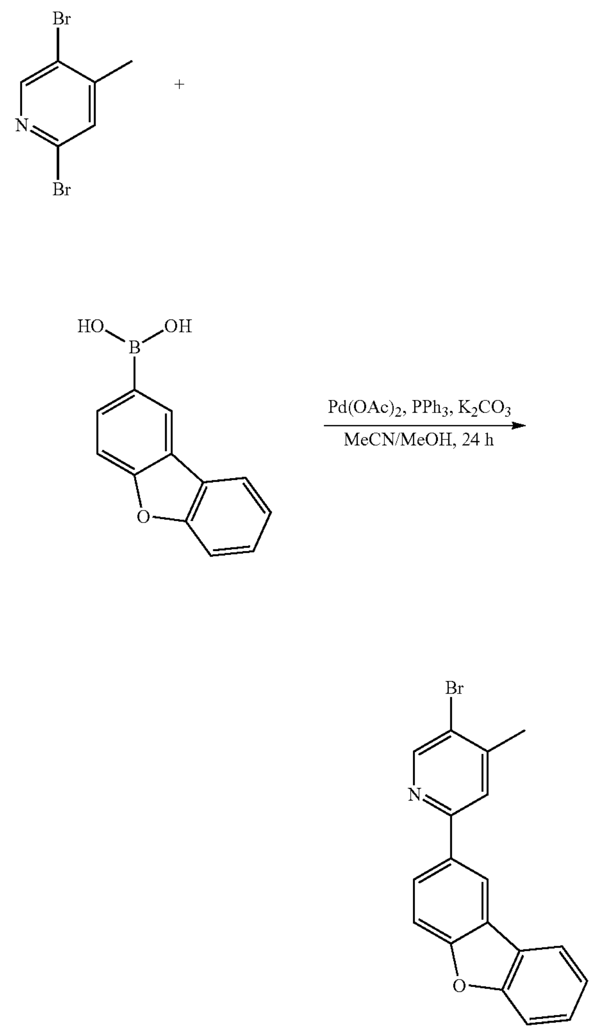

Compound C3

2,5-dibromo-4-methylpyridine (18.55 g, 73.92 mmol), dibenzo[b,d]furan-2-ylboronic acid (18.81 g, 88.70 mmol), $Pd(OAc)_2$ (1.66 g, 7.39 mmol), $PPh_3$ (3.88 g, 14.78 mmol), and $K_2CO_3$ (20.43 g, 147.84 mmol) were mixed with 200 mL of acetonitrile and 100 mL of methanol. The resultant mixture was stirred at a temperature of 50° C. for 18 hours. Upon completion, the reaction mixture was cooled to room temperature and filtered. The product was extracted with methylene chloride (MC). The combined organic extracts were dried over anhydrous magnesium sulfate ($MgSO_4$) and filtered. A filtrate was subjected to reduced pressure and the obtained residual was purified by column chromatography (MC:Hx=60:40) to obtain 13.0 g (52%) of Compound C3.

Synthesis of Compound C2

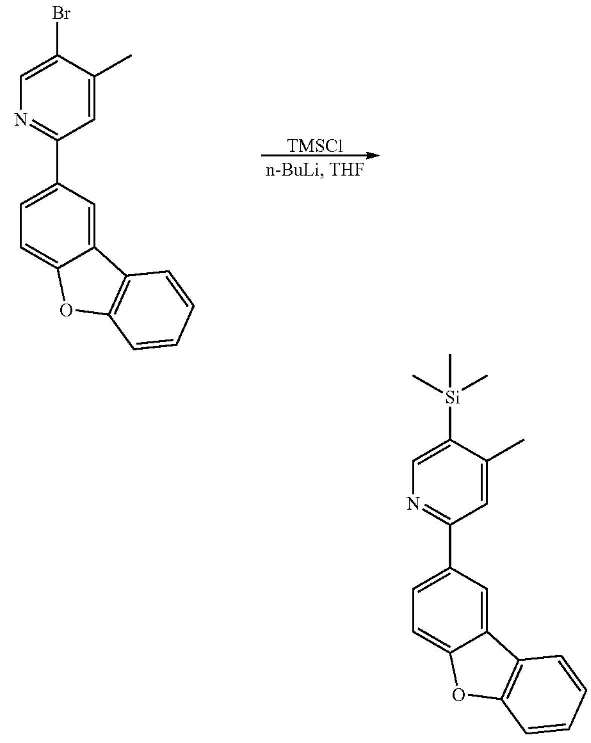

Compound C2

300 mL of THF was added to Compound C3 (12.24 g, 36.20 mmol) and the mixture was cooled to a temperature of −78° C. A 1.6 molar (M) solution of n-BuLi (33.94 mL, 54.30 mmol) was slowly added thereto, and the resulting mixture was stirred at a temperature of −78° C. for 1 hour. TMSCl (6.89 mL, 54.30 mmol) was added thereto, and a reaction was carried out at a temperature of −78° C. for 1 hour, and then at room temperature for 12 hours. The organic layer separated therefrom was extracted with methylene chloride (MC). and the combined organic extracts were dried with anhydrous magnesium sulfate. The dried solution was filtered and the filtrate was concentrated under reduced pressure. The crude product was purified by column chromatography (EA:Hexane=4:96) to obtain 8.0 g (67%) of Compound C2.

Synthesis of Compound 8

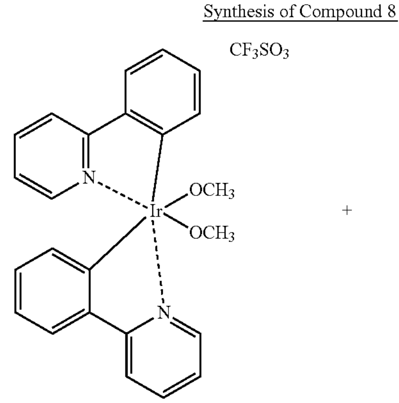

-continued

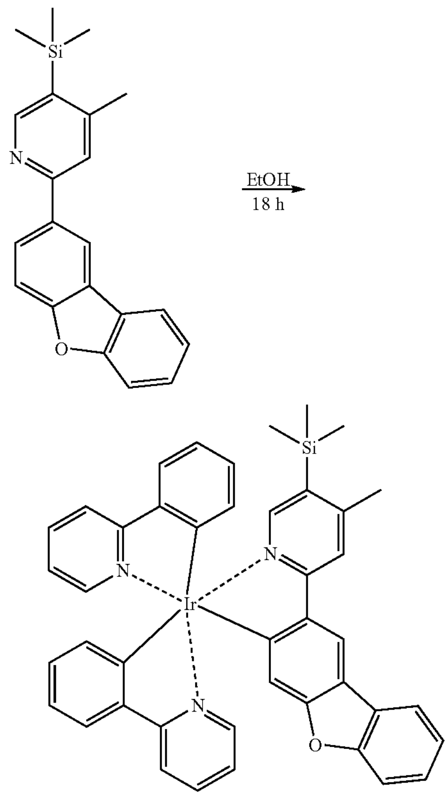

Compound 8

2.05 g (29%) of Compound 8 was prepared in the same manner as Compound 1 in Synthesis Example 1, except that Compound M1A (6.00 g, 8.42 mmol) and Compound C2 (3.35 g, 10.11 mmol) were used instead of Compound M1A (8 g, 11.22 mmol) and Compound A1 (4.46 g, 13.47 mmol), respectively. The obtained product was confirmed by Mass Spectroscopy and HPLC analysis.

HRMS(MALDI) calcd for $C_{43}H_{36}IrN_3OSi$: m/z 831.2257, Found: 831.2259.

Synthesis Example 4: Synthesis of Compound 22

Synthesis of Compound C1

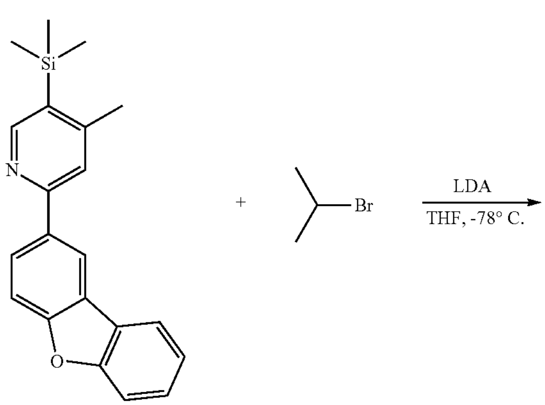

-continued

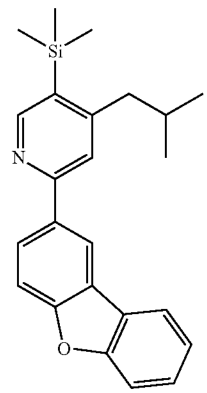

Compound C1

Compound C2 (7.1 g, 21.42 mmol) was mixed with 100 mL of THF, and the resulting mixture was cooled to a temperature of −78° C. Lithium diisopropylamide (LDA, 26.8 mL, 53.54 mmol) was slowly added thereto. The resulting mixture was stirred at a temperature of −78° C. for 1 hour and at room temperature for 1.5 hours to perform the reaction. The temperature was reduced to −78° C. 2-bromopropane (5.03 mL, 53.54 mmol) was slowly added to the resulting mixture, the reaction mixture was warmed to room temperature, and the reaction was carried out for 12 hours. The product was extracted with MC. The combined organic extracts were dried over anhydrous magnesium sulfate. The dried organic solution was filtered and a filtrate was concentrated under reduced pressure. The product was purified by column chromatography (EA:Hexane=4:96) to obtain 6.80 g (85%) of Compound C1.

Synthesis of Compound 22

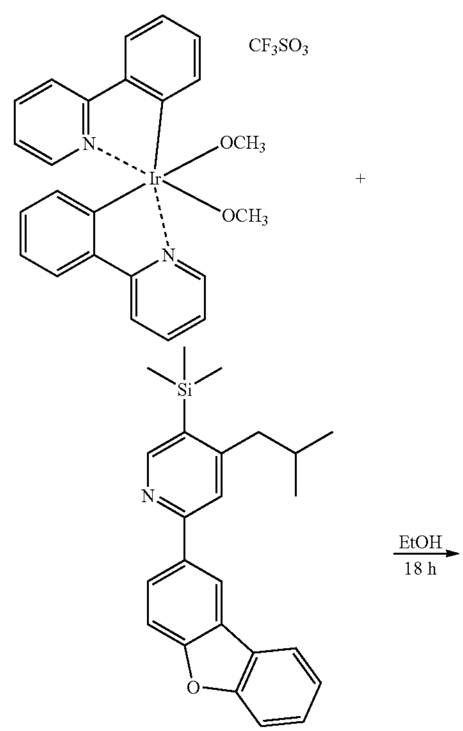

-continued

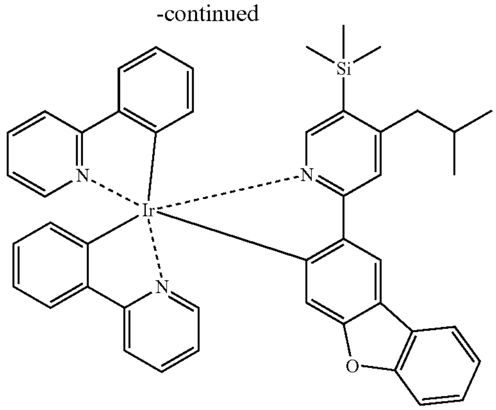

Compound 22

2.30 g (31%) of Compound 22 was prepared in the same manner as Compound 1 in Synthesis Example 1, except that Compound M1A (6.00 g, 8.42 mmol) and Compound C1 (3.77 g, 10.10 mmol) were used instead of Compound M1A (8 g, 11.22 mmol) and Compound A1 (4.28 g, 13.47 mmol), respectively. The obtained product was confirmed by Mass Spectroscopy and HPLC analysis.

HRMS(MALDI) calcd for $C_{46}H_{42}IrN_3OSi$: m/z 873.2726, Found: 873.2720.

Synthesis Example 5: Synthesis of Compound 35

Synthesis of Compound D3

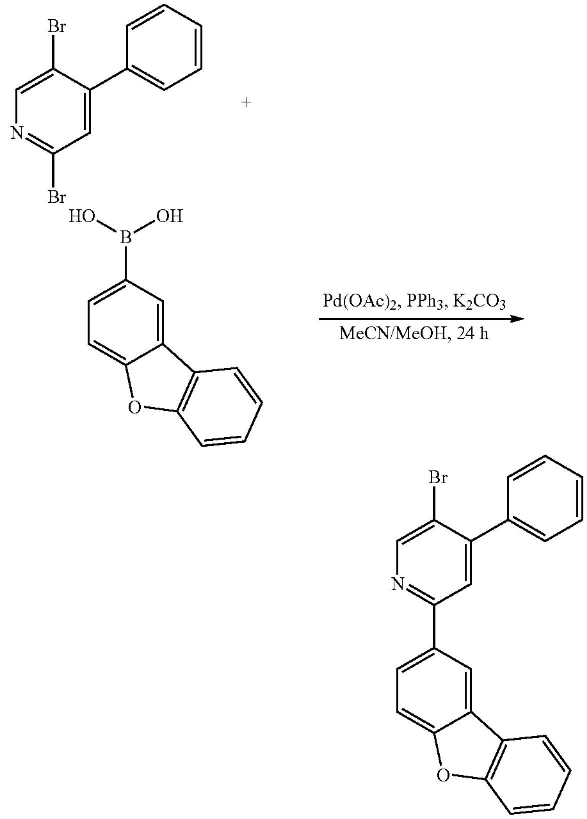

Compound D3

13.7 g (69%) of Compound D3 was prepared in the same manner as Compound C3 of Synthesis Example 3, except that 2,5-dibromo-4-phenylpyridine (15.64 g, 49.97 mmol) and dibenzo[b,d]furan-2-ylboronic acid (12.71 g, 55.96 mmol) were used instead of 2,5-dibromo-4-methylpyridine (18.55 g, 73.92 mmol) and dibenzo[b,d]furan-2-ylboronic acid (18.81 g, 88.70 mmol), respectively.

Synthesis of Compound D2

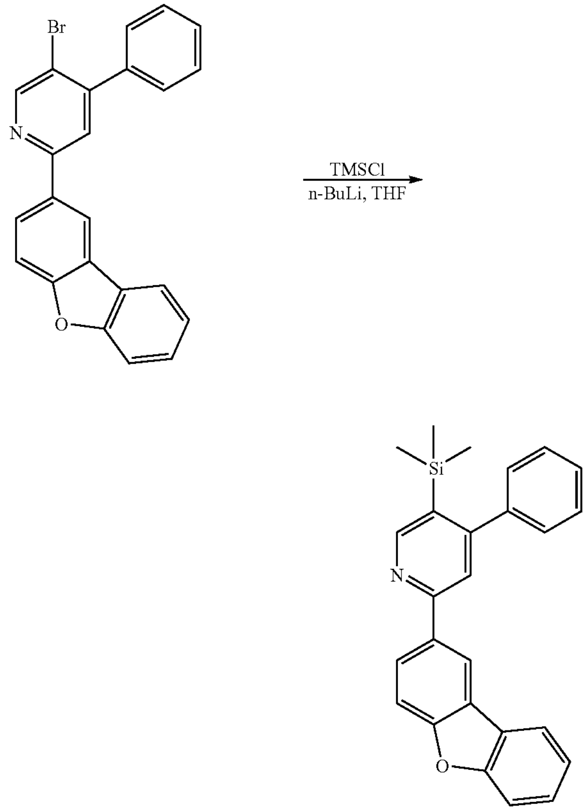

Compound D2

6.6 g (66%) of Compound D2 was prepared in the same manner as Compound C2 in Synthesis Example 3, except that Compound D3 (10.17 g, 25.41 mmol) was used instead of Compound C3 (12.24 g, 36.20 mmol).

Synthesis of Compound 35

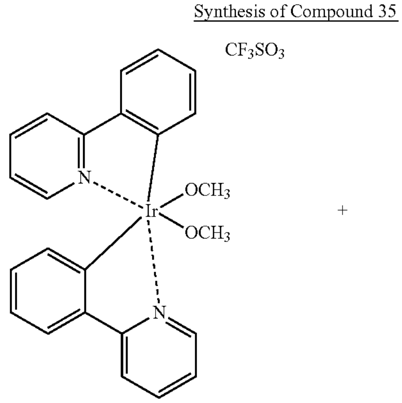

-continued

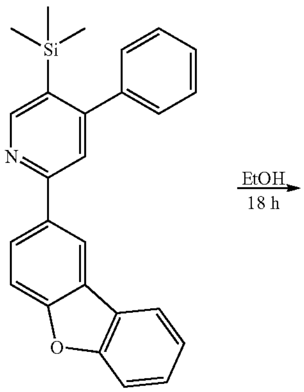

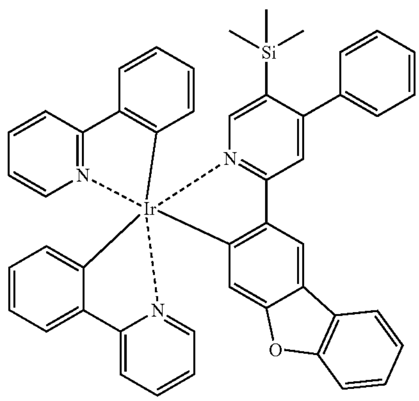

Compound 35

1.8 g (24%) of Compound 35 was prepared in the same manner as Compound 1 in Synthesis Example 1, except that Compound M1A (6.00 g, 8.41 mmol) and Compound D2 (3.97 g, 10.09 mmol) were used instead of Compound M1A (8 g, 11.22 mmol) and Compound A1 (4.46 g, 13.47 mmol), respectively. The obtained product was confirmed by Mass Spectroscopy and HPLC analysis.

HRMS(MALDI) calcd for $C_{48}H_{38}IrN_3OSi$: m/z 893.2413, Found: 893.2417.

Synthesis Example 6: Synthesis of Compound 300

Synthesis of Compound M2B

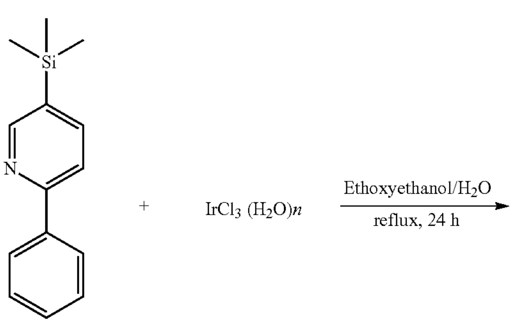

-continued

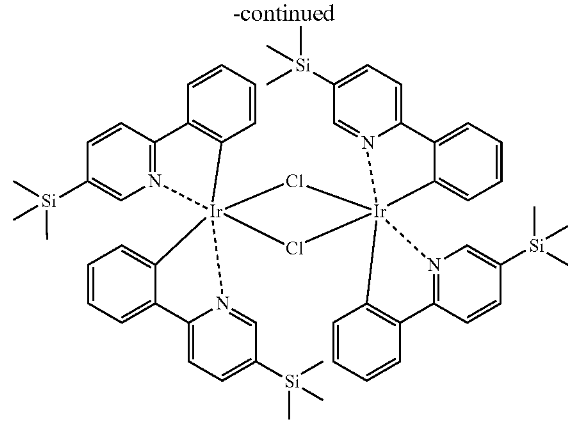

Compound M2B 17.2 g (86%) of Compound M2B was prepared in the same manner as Compound M2A in Synthesis Example 1, except that 2-phenyl-5-(trimethylsilyl)pyridine (15.05 g, 66.14 mmol) and iridium chloride (4.10 g, 11.62 mmol) were respectively used instead of 2-phenylpyridine (14.66 g, 94.44 mmol) and iridium chloride (14.80 g, 41.97 mmol).

Synthesis of Compound M1B

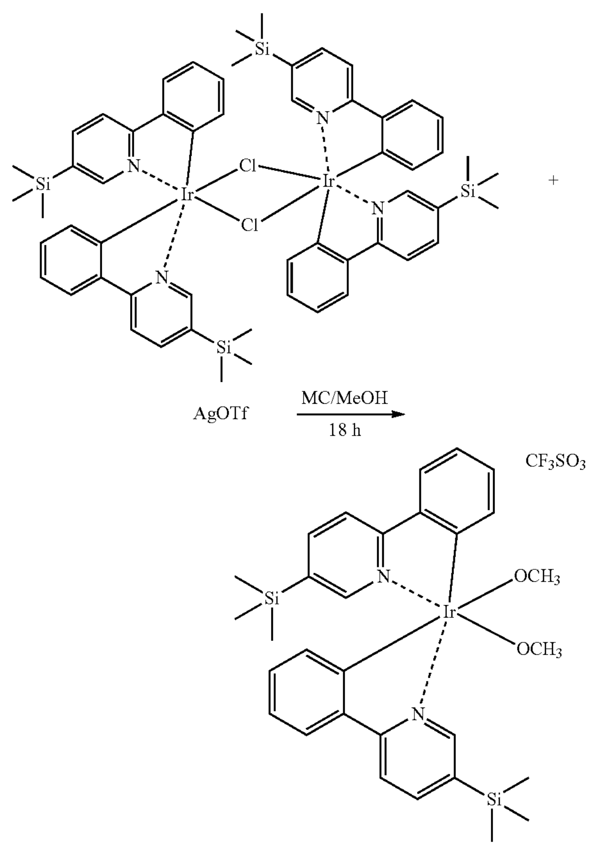

Compound M1B

Compound M1B was prepared in the same manner as Compound M1A in Synthesis Example 1, except that Compound M2B (4.76 g, 3.5 mmol) was used instead of Compound M2A (6.01 g, 5.60 mmol).

Synthesis of Compound 300

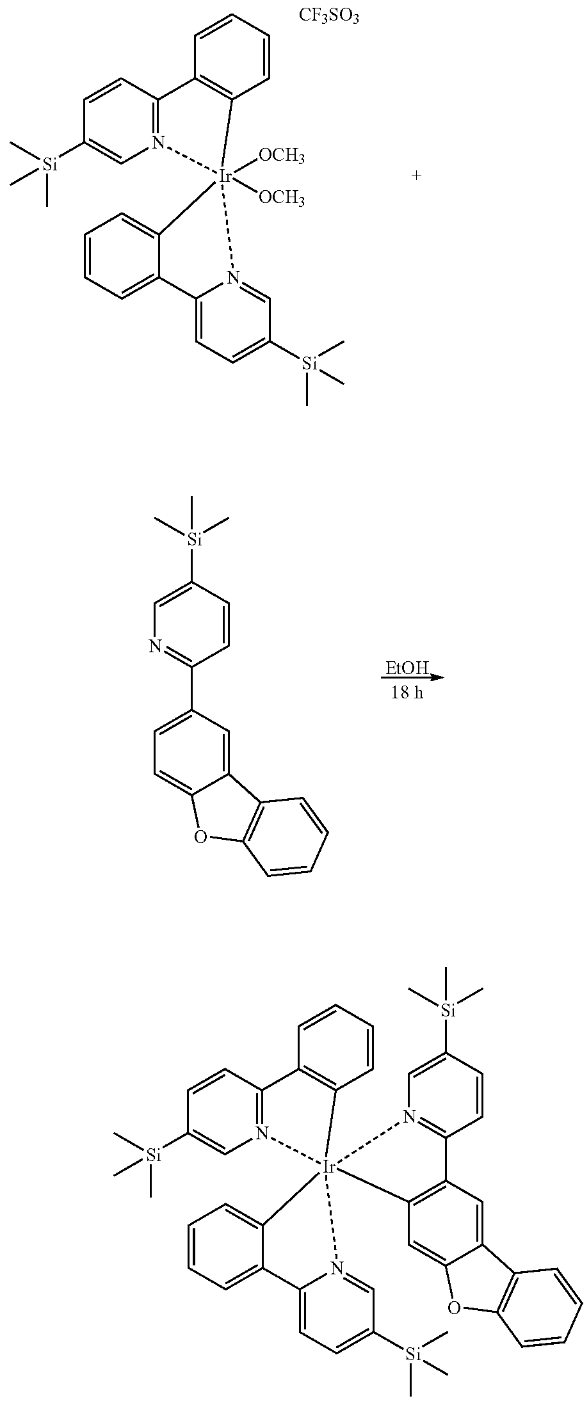

Compound 300

1.3 g (19%) of Compound 300 was prepared in the same manner as Compound 1 in Synthesis Example 1, except that Compound M1B (6.00 g, 6.99 mmol) and Compound A1 (2.66 g, 8.39 mmol) were used instead of Compound M1A (8 g, 11.22 mmol) and Compound A1 (4.46 g, 13.47 mmol), respectively. The obtained product was confirmed by Mass Spectroscopy and HPLC analysis.

HRMS(MALDI) calcd for $C_{48}H_{50}IrN_3OSi_3$: m/z 961.2891, Found: 961.2887.

Synthesis Example 7: Synthesis of Compound 305

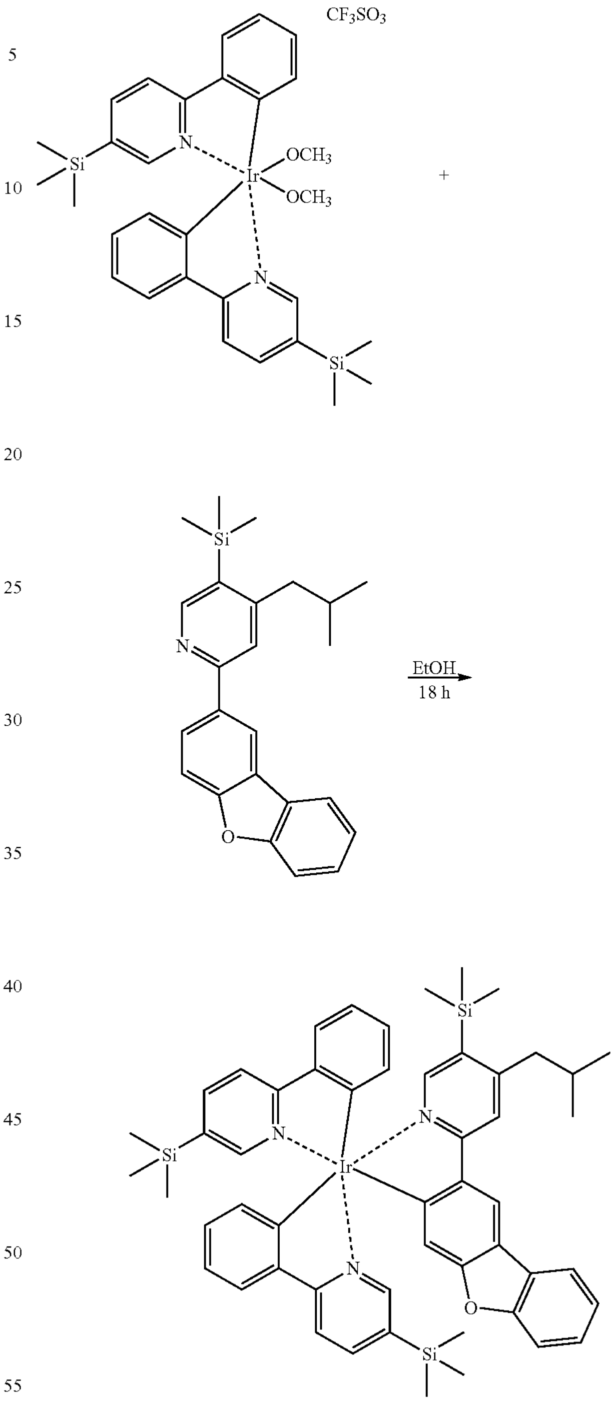

Compound 305

1.4 g (20%) of Compound 305 was prepared in the same manner as Compound 1 in Synthesis Example 1, except that Compound M1B (6.00 g, 6.99 mmol) and Compound C1 (3.14 g, 8.39 mmol) were used instead of Compound M1A (8 g, 11.22 mmol) and Compound A1 (4.46 g, 13.47 mmol), respectively. The obtained product was confirmed by Mass Spectroscopy and HPLC analysis.

HRMS(MALDI) calcd for $C_{52}H_{58}IrN_3OSi_3$: m/z 1017.3517, Found: 1017.3512.

Synthesis Example 8: Synthesis of Compound 322

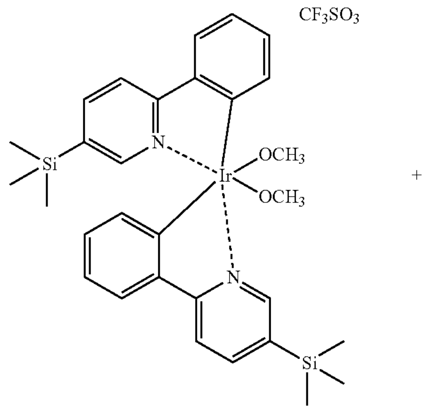

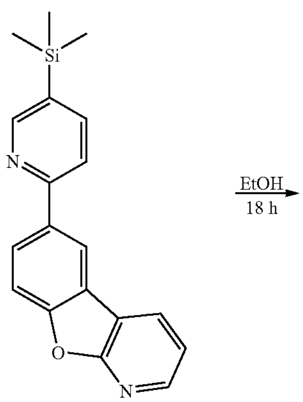

Compound E1

-continued

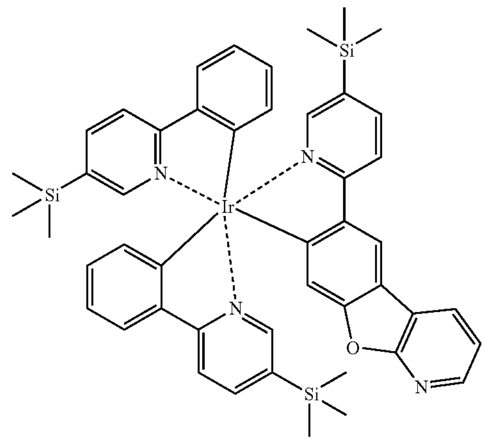

Compound 322

1.1 g (16%) of Compound 322 was prepared in the same manner as used to synthesize Compound 1 in Synthesis Example 1, except that Compound M1B (6.00 g, 6.99 mmol) and Compound E1 (2.78 g, 8.74 mmol) were used instead of Compound M1A (8 g, 11.22 mmol) and Compound A1 (4.46 g, 13.47 mmol), respectively. The obtained product was confirmed by Mass Spectroscopy and HPLC analysis.

HRMS(MALDI) calcd for $C_{47}H_{49}IrN_4OSi_3$: m/z 962.2843, Found: 962.2843.

Synthesis Example 9: Synthesis of Compound 327

Synthesis of Compound M2C

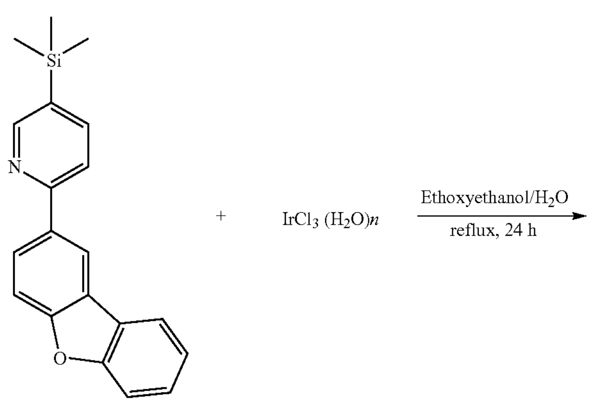

-continued
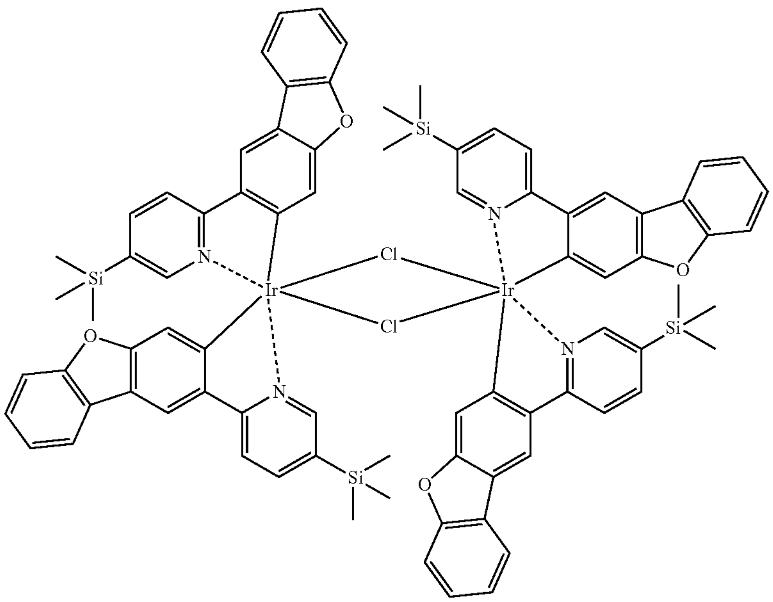
Compound M2C
8.3 g (83%) of Compound M2C was prepared in the same manner as Compound M2A in Synthesis Example 1, except that Compound A1 (8.3 g, 26.15 mmol) and iridium chloride (4.10 g, 11.62 mmol) were used instead of 2-phenylpyridine (14.66 g, 94.44 mmol) and iridium chloride (14.80 g, 41.97 mmol), respectively.
Synthesis of Compound M1C
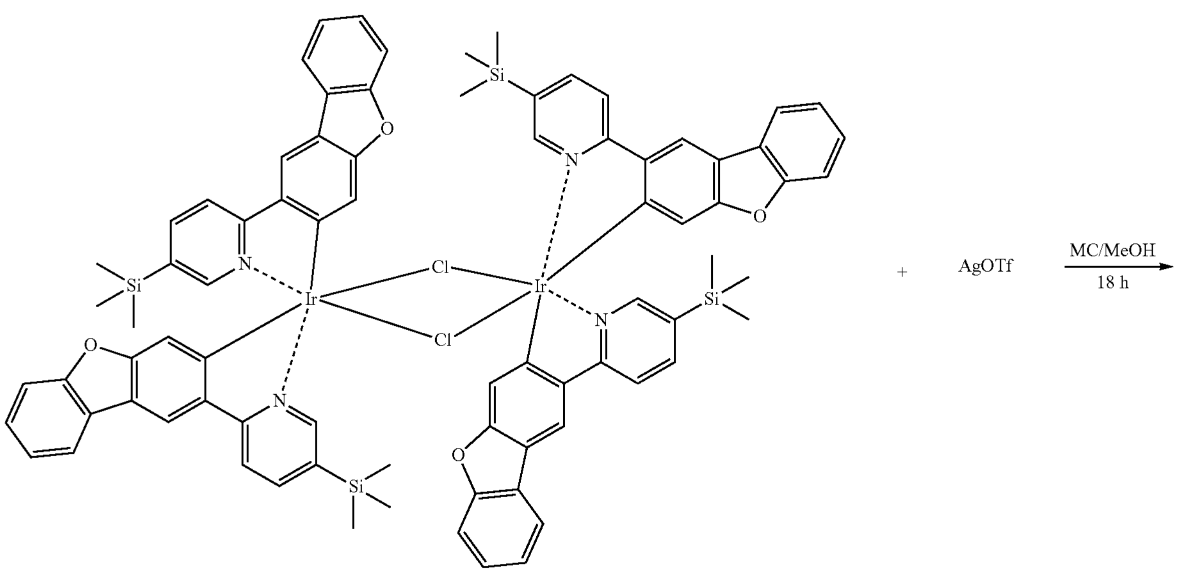

-continued

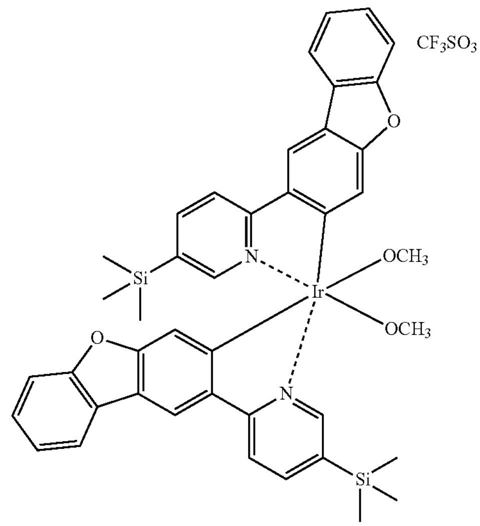

Compound M1C

Compound M1C was prepared in the same manner as Compound M1A in Synthesis Example 1, except that Compound M2C (4.973 g, 2.89 mmol) was used instead of Compound M2A (6.01 g, 5.60 mmol).

Synthesis of Compound 293

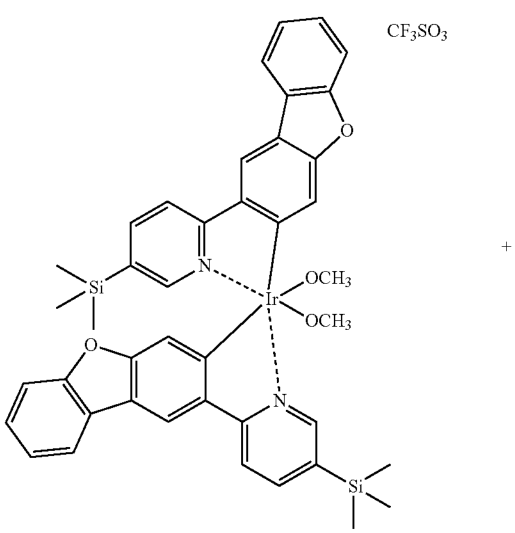

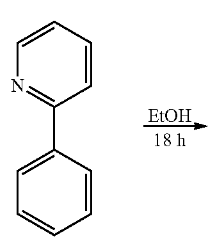

-continued

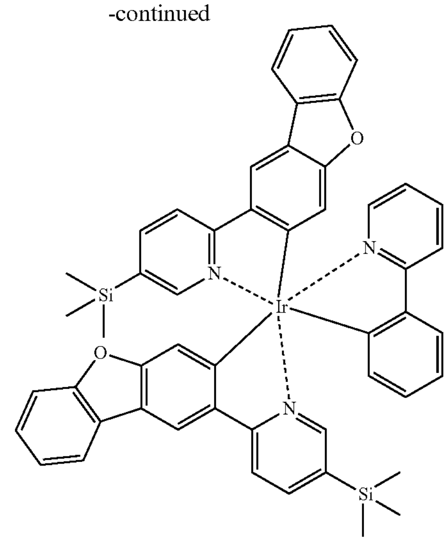

Compound 327

1.4 g (25%) of Compound 327 was prepared in the same manner as Compound 1 in Synthesis Example 1, except that Compound M1C (6.00 g, 5.78 mmol) and phenylpyridine (1.08 g, 6.94 mmol) were used instead of Compound M1A (8 g, 11.22 mmol) and Compound A1 (4.46 g, 13.47 mmol), respectively. The obtained product was confirmed by Mass Spectroscopy and HPLC analysis.

HRMS(MALDI) calcd for $C_{51}H_{44}IrN_3O_2Si_2$: m/z 979.2601, Found: 979.2603.

Example 1

An ITO glass substrate was cut to a size of 50 millimeters (mm)×50 mm×0.5 mm, sonicated in acetone, isopropyl alcohol, and pure water, for 15 minutes in each solvent, and washed by exposure to UV ozone for 30 minutes.

Subsequently, on the ITO electrode (anode) on the glass substrate, m-MTDATA was deposited at a deposition speed of 1 Å/sec to form a hole injection layer having a thickness of 600 Å, and α-NPD was deposited on the hole injection layer at a deposition rate of 1 Å/sec to form a hole transport layer having a thickness of 250 Å.

Compound 1 (dopant) and CBP (host) were co-deposited on the hole transport layer at a deposition rate of 0.1 Å/sec and a deposition rate of 1 Å/sec, respectively, to form an emission layer having a thickness of 400 Å.

BAlq was deposited on the emission layer at a deposition rate of 1 Å/sec to form a hole blocking layer having a thickness of 50 Å, and $Alq_3$ was deposited on the hole blocking layer to form an electron transport layer having a thickness of 300 Å. Subsequently, LiF was deposited on the electron transport layer to form an electron injection layer having a thickness of 10 Å, and Al was vacuum deposited on the electron injection layer to form a second electrode (cathode) having a thickness of 1,200 Å, thereby completing the manufacture of an organic light-emitting device having a structure of ITO/m-MTDATA (600 Å)/α-NPD (250 Å)/CBP+10% (Compound 1) (400 Å)/BAlq (50 Å)/$Alq_3$ (300 Å)/LiF (10 Å)/Al (1,200 Å).

Examples 2 to 9 and Comparative Example 1

Organic light-emitting devices were manufactured in the same manner as in Example 1, except that in forming an emission layer, corresponding compounds shown in Table 2 were used as a dopant instead of Compound 1.

Evaluation Example 1: Evaluation on Characteristics of Organic Light-Emitting Devices The driving voltage, efficiency, power, color purity, and lifespan (T95) of the organic light-emitting devices manufactured according to Examples 1 to 9 and Comparative Example 1 were evaluated. Results thereof are shown in Table 2. This evaluation was performed using a current-voltage meter (Keithley 2400) and a luminance meter (Minolta Cs-1000A), and the lifespan ($T_{93}$)(at 6000 nit) was evaluated by measuring the amount of time that elapsed until luminance was reduced to 95% of the initial brightness of 100%.

TABLE 2

| | Dopant | Driving Voltage (V) | Efficiency (cd/A) | Power (lm/VV) | ClEx | ClEy | Lifespan (hr) ($T_{95}$) |
|---|---|---|---|---|---|---|---|
| Example 1 | Compound 1 | 5.0 | 49.0 | 30.8 | 0.339 | 0.605 | 210 |
| Example 2 | Compound 3 | 4.8 | 47.5 | 31.1 | 0.340 | 0.602 | 145 |
| Example 3 | Compound 8 | 4.9 | 48.0 | 30.8 | 0.338 | 0.607 | 195 |
| Example 4 | Compound 22 | 5.0 | 48.5 | 30.5 | 0.336 | 0.604 | 200 |
| Example 5 | Compound 35 | 5.2 | 50.5 | 30.5 | 0.356 | 0.605 | 230 |
| Example 6 | Compound 300 | 4.8 | 51.0 | 33.4 | 0.360 | 0.607 | 230 |
| Example 7 | Compound 305 | 4.9 | 50.0 | 32.0 | 0.345 | 0.605 | 210 |
| Example 8 | Compound 322 | 4.9 | 51.5 | 33.0 | 0.355 | 0.604 | 150 |
| Example 9 | Compound 327 | 4.6 | 50.5 | 34.5 | 0.340 | 0.607 | 180 |
| Comparative Example 1 | Compound A | 5.1 | 47.5 | 29.2 | 0.340 | 0.607 | 85 |

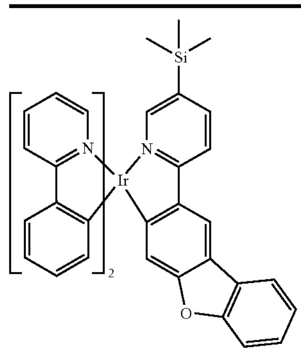

Compound 1

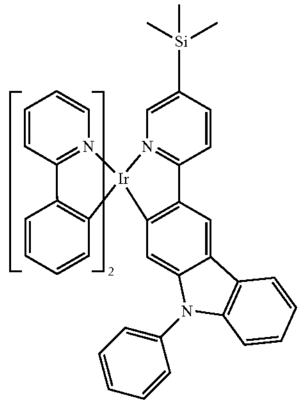

Compound 3

TABLE 2-continued
| Dopant | Driving Voltage (V) | Efficiency (cd/A) | Power (lm/VV) | CIEx | CIEy | Lifespan (hr) (T95) |
|---|---|---|---|---|---|---|
| 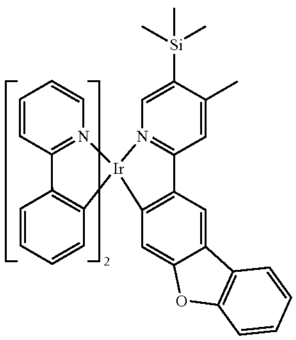 Compound 8 | | | | | | |
| 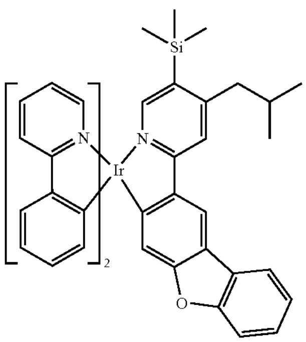 Compound 22 | | | | | | |
| 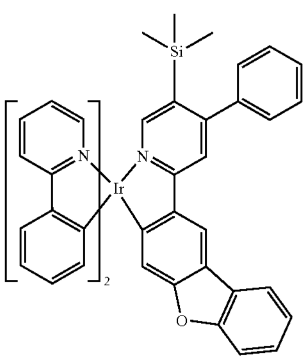 Compound 35 | | | | | | |
| 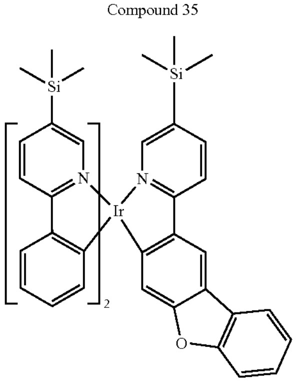 Compound 300 | | | | | | |

TABLE 2-continued

| Dopant | Driving Voltage (V) | Efficiency (cd/A) | Power (lm/VV) | CIEx | CIEy | Lifespan (hr) ($T_{95}$) |
|---|---|---|---|---|---|---|
| 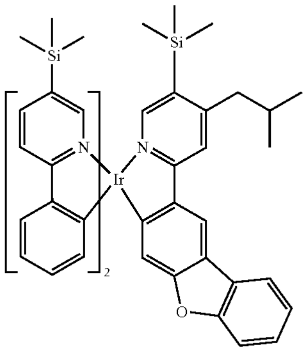 Compound 305 | | | | | | |
| 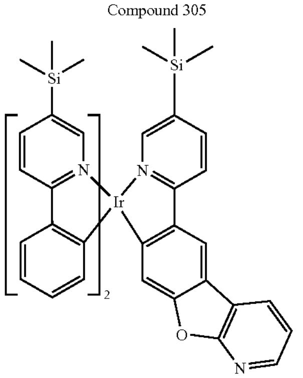 Compound 322 | | | | | | |
| 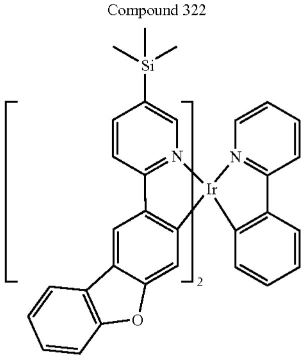 Compound 327 | | | | | | |
| 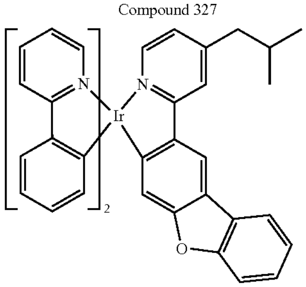 Compound A | | | | | | |

Referring to Table 2, it was confirmed that the organic light-emitting devices manufactured according to Examples 1 to 9 have a lower driving voltage, higher efficiency, higher power, higher color purity, and a longer lifespan, than the organic light-emitting devices manufactured according to Comparative Example 1.

The organometallic compound according to embodiments has excellent electric characteristics and thermal stability. Accordingly, an organic light-emitting device including the organometallic compound may have excellent driving voltage, efficiency, power, color purity, and lifespan characteristics.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the FIGURES, it will be understood by those of ordinary skill in the art that various changes in form and details may be made therein without departing from the spirit and scope of the present inventive concept as defined by the following claims.

What is claimed is:

1. An organometallic compound represented by Formula 1:

$$M(L_1)_{n1}(L_2)_{n2} \qquad \text{Formula 1}$$

wherein

M in Formula 1 is Ir, in Formula 1, Li is a ligand represented by one of Formulae 2A(1) to 2A(8) and 2A(25) to 2A(40), n1 is 1, or 2, and when n1 is 2, $L_1$ in number of n1 are identical or different, Formula 2A(1)

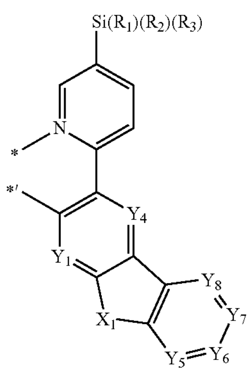

Formula 2A(2)

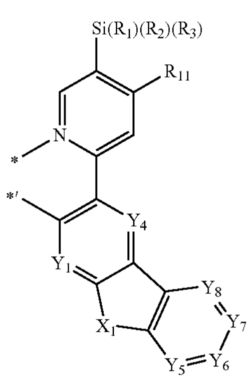

-continued

Formula 2A(3)

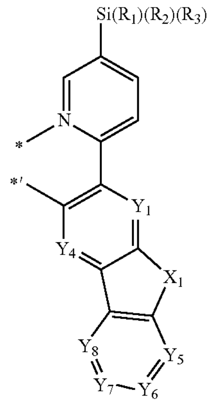

Formula 2A(4)

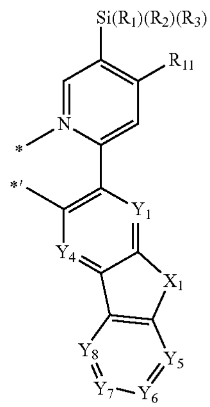

Formula 2A(5)

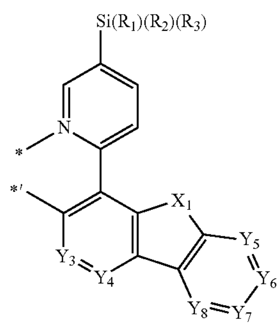

Formula 2A(6)

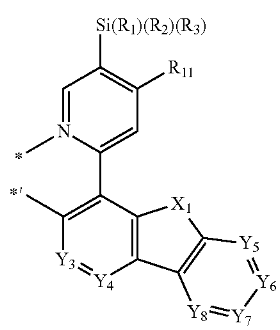

Formula 2A(7)
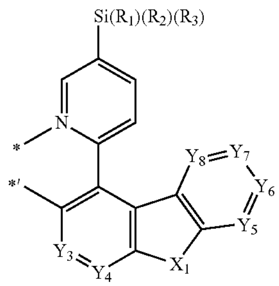
Formula 2A(8)
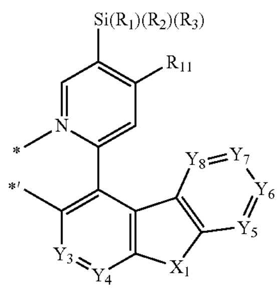
Formula 2A(25)
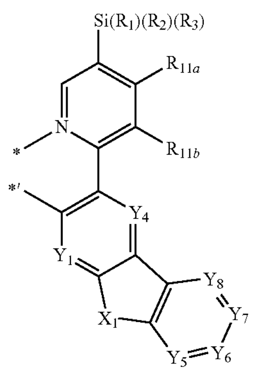
Formula 2A(26)
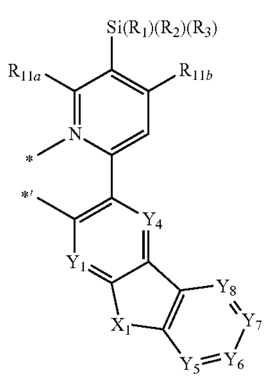
Formula 2A(27)
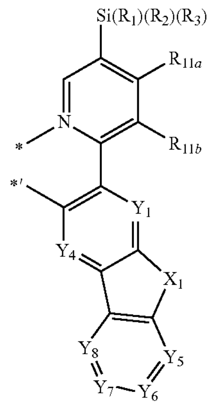
Formula 2A(28)
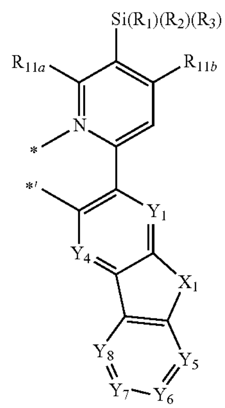
Formula 2A(29)
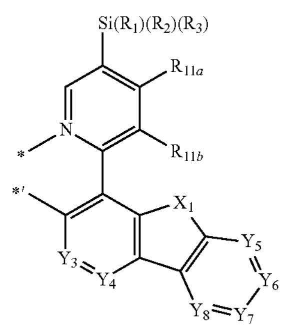
Formula 2A(30)
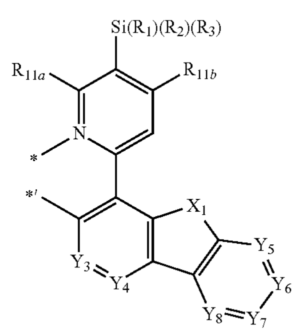

-continued
Formula 2A(31)
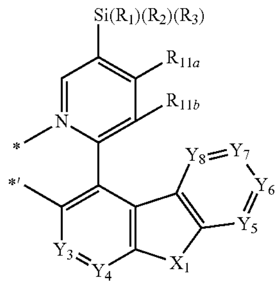
Formula 2A(32)
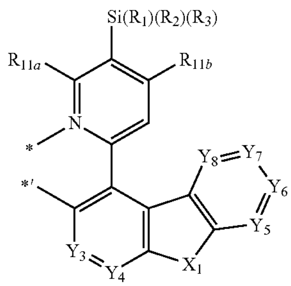
Formula 2A(33)
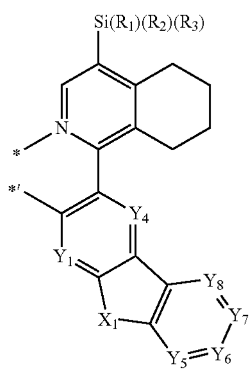
Formula 2A(34)
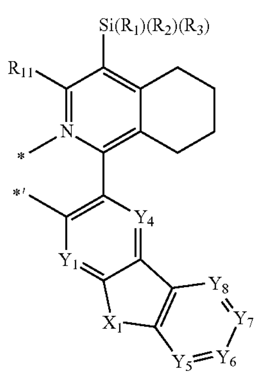
-continued
Formula 2A(35)
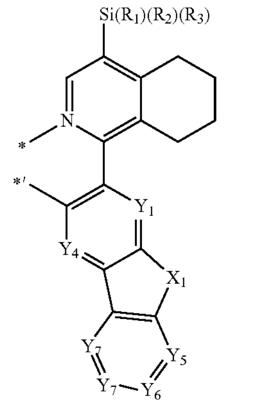
Formula 2A(36)
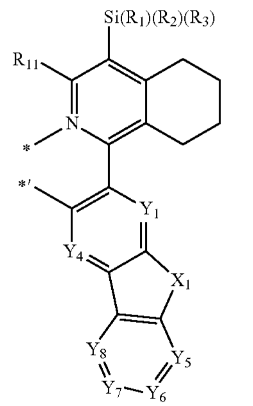
Formula 2A(37)
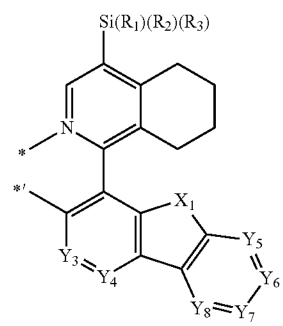
Formula 2A(38)
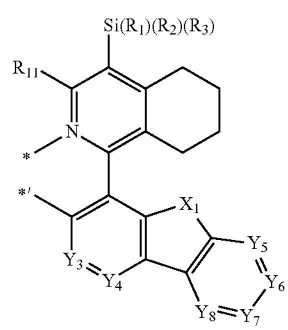

-continued

Formula 2A(39)

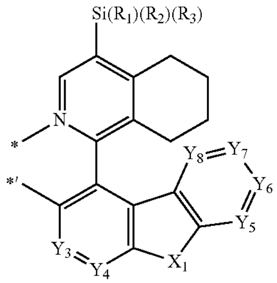

Formula 2A(40)

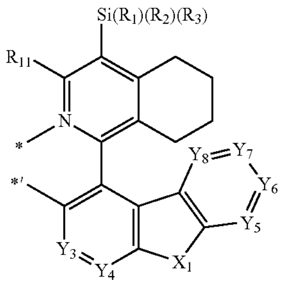

$X_1$ in Formulae 2A(1) to 2A(8) and 2A(25) to 2A(40) is O, or S, in Formulae 2A(1) to 2A(8) and 2A(25) to 2A(40), $Y_1$ is N, $C(R_{41})$, or a carbon atom connected to a pyridine ring, $Y_2$ is N, $C(R_{42})$, or a carbon atom connected to a pyridine ring, $Y_3$ is N, $C(R_{43})$, or a carbon atom connected to a pyridine ring, $Y_4$ is N, $C(R_{44})$, or a carbon atom connected to a pyridine ring, $Y_5$ is N or $C(R_{45})$, $Y_6$ is N or $C(R_{46})$, $Y_7$ is N or $C(R_{47})$, $Y_8$ is N or $C(R_{48})$, and one of $Y_1$ to $Y_4$ is a carbon atom connected to a pyridine ring, provided that when Formula 1 comprises a azadibenzofuran or an azadibenzothiophene, then L1 is of Formula 2A(1) or 2A(5), $Y_1$ is $C(R_{41})$ or a carbon atom connected to a pyridine ring, $Y_2$ is $C(R_{42})$ or a carbon atom connected to a pyridine ring, $Y_3$ is $C(R_{43})$ or a carbon atom connected to a pyridine ring, $Y_4$ is $C(R_{44})$ or a carbon atom connected to a pyridine ring, $Y_5$ is N, $Y_6$ is $C(R_{46})$, $Y_7$ is $C(R_{47})$, and $Y_8$ is $C(R_{48})$, $R_1$ to $R_3$ in Formulae 2A(1) to 2A(8) and 2A(25) to 2A(40) are each independently a $C_1$-$C_{60}$ alkyl group that is unsubstituted or substituted with at least one selected from a deuterium, —F, —$CD_3$, —$CD_2H$, —$CDH_2$, —$CF_3$, —$CF_2H$, —$CFH_2$, and a cyano group, $R_{11}$, $R_{11a}$, $R_{11b}$, and $R_{41}$ to $R_{48}$ in Formulae 2A(1) to 2A(8) and 2A(25) to 2A(40) are each independently selected from:

a hydrogen, a deuterium, —F, and a cyano group; and a $C_1$-$C_{60}$ alkyl group, a $C_2$-$C_{60}$ alkenyl group, a $C_3$-$C_{10}$ cycloalkyl group, and a $C_1$-$C_{10}$ heterocycloalkyl group, each unsubstituted or substituted with at least one selected from a deuterium, —F, —$CD_3$, —$CD_2H$, —$CDH_2$, —$CF_3$, —$CF_2H$, —$CFH_2$, a cyano group, a $C_1$-$C_{60}$ alkyl group, a $C_2$-$C_{60}$ alkenyl group, and a $C_3$-$C_{10}$ cycloalkyl group, provided that $R_{11}$, $R_{11a}$, and $R_{11b}$ in Formulae 2A(1) to 2A(8) and 2A(25) to 2A(40) are each not hydrogen, in Formula 1, $L_2$ is a ligand represented by one of Formulae 3-1(1) to 3-1(59), n2 is 1, or 2, 3, or 4, and when n2 is 2, $L_2$ in number of n2 are identical or different, Formula 3-1(1)

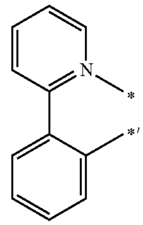

Formula 3-1(2)

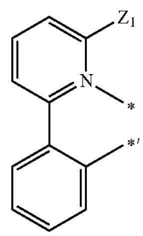

Formula 3-1(3)

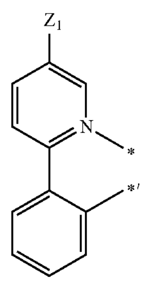

Formula 3-1(4)

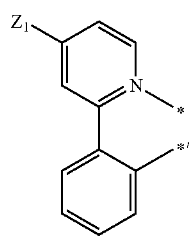

Formula 3-1(5)

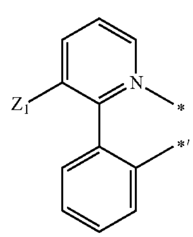

Formula 3-1(6)

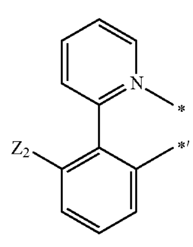

-continued
Formula 3-1(7)
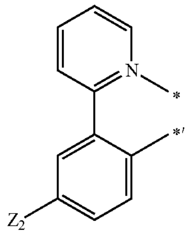
Formula 3-1(8)
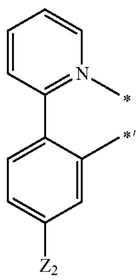
Formula 3-1(9)
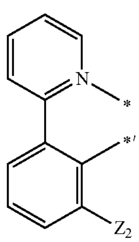
Formula 3-1(10)
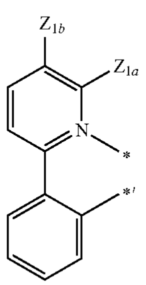
Formula 3-1(11)
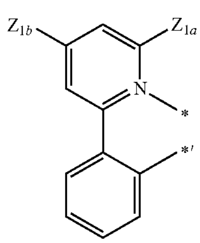
Formula 3-1(12)
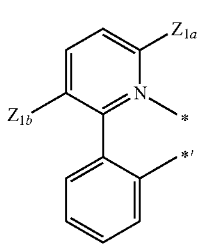
-continued
Formula 3-1(13)
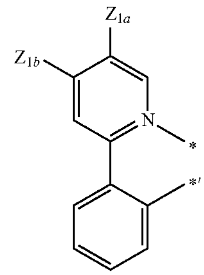
Formula 3-1(14)
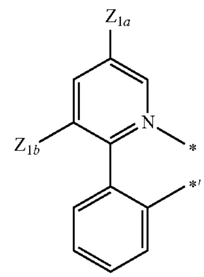
Formula 3-1(15)
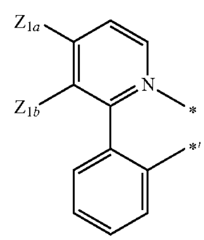
Formula 3-1(16)
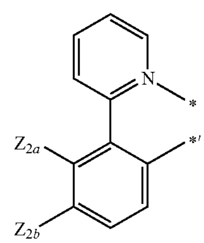
Formula 3-1(17)
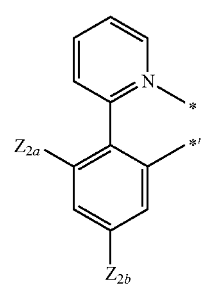
Formula 3-1(18)
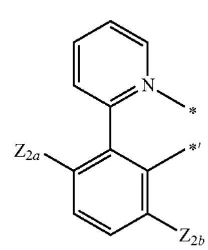

-continued
Formula 3-1(19)
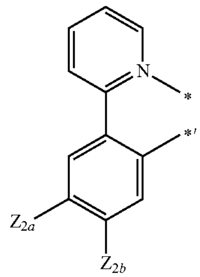
Formula 3-1(20)
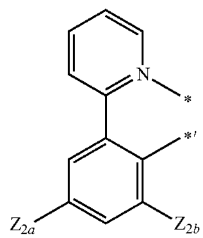
Formula 3-1(21)
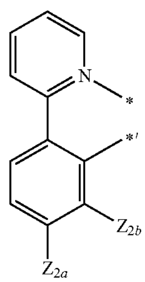
Formula 3-1(22)
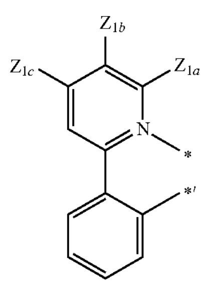
Formula 3-1(23)
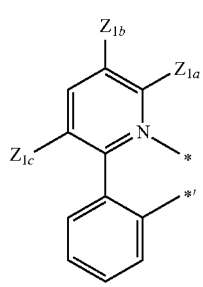
Formula 3-1(24)
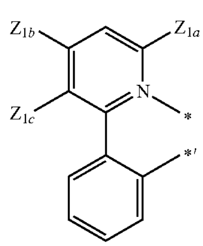
-continued
Formula 3-1(25)
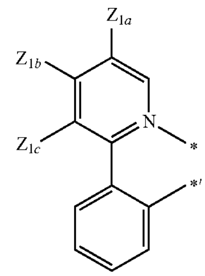
Formula 3-1(26)
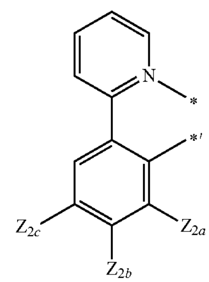
Formula 3-1(27)
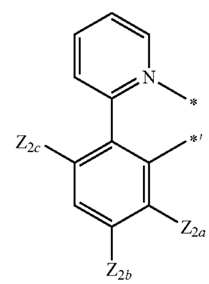
Formula 3-1(28)
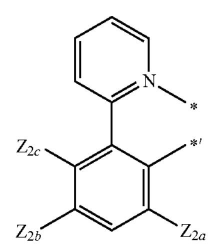
Formula 3-1(29)
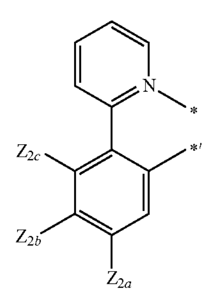

-continued
Formula 3-1(30)
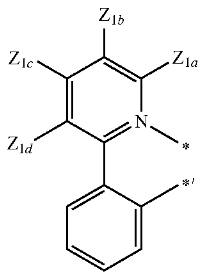
Formula 3-1(31)
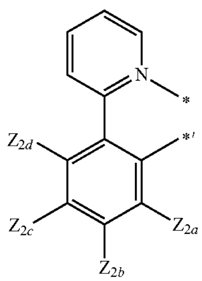
Formula 3-1(32)
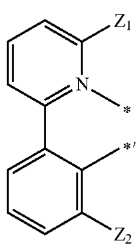
Formula 3-1(33)
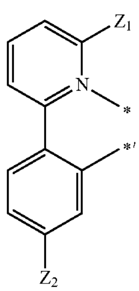
Formula 3-1(34)
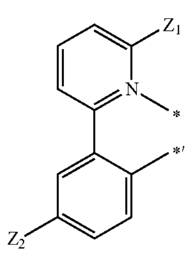
Formula 3-1(35)
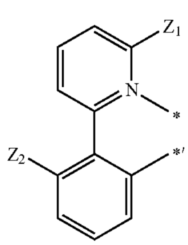
-continued
Formula 3-1(36)
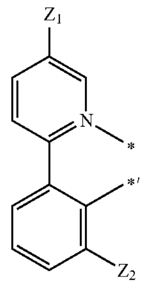
Formula 3-1(37)
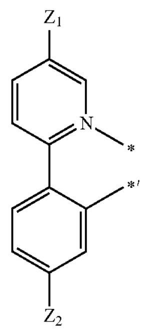
Formula 3-1(38)
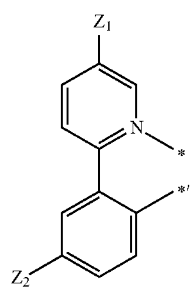
Formula 3-1(39)
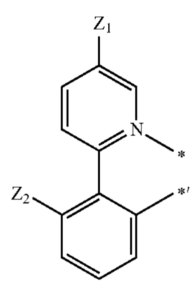
Formula 3-1(40)
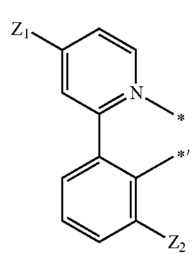

-continued
Formula 3-1(41)
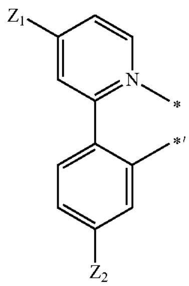
Formula 3-1(42)
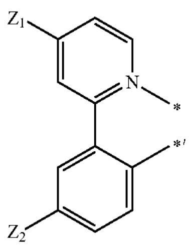
Formula 3-1(43)
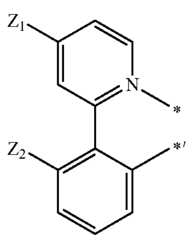
Formula 3-1(44)
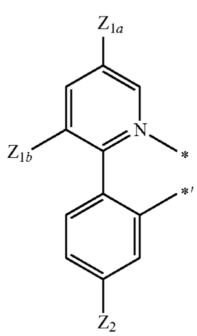
Formula 3-1(45)
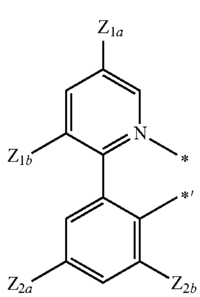
-continued
Formula 3-1(46)
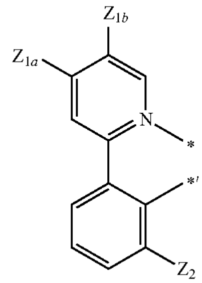
Formula 3-1(47)
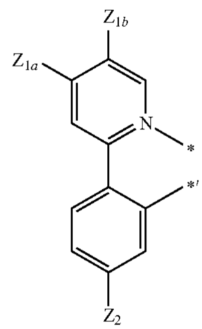
Formula 3-1(48)
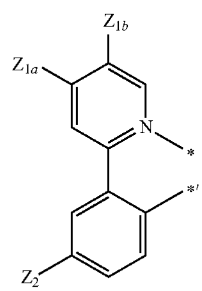
Formula 3-1(49)
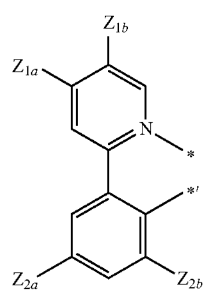
Formula 3-1(50)
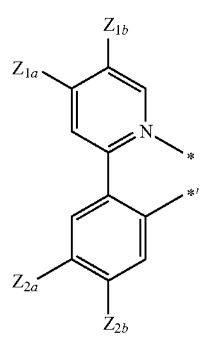

-continued
Formula 3-1(51)
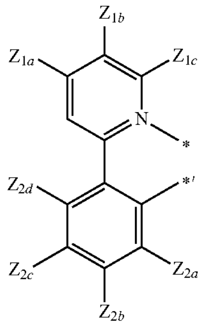
Formula 3-1(52)
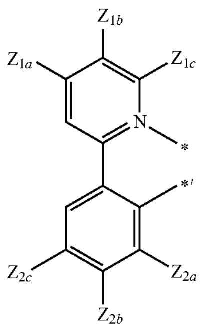
Formula 3-1(53)
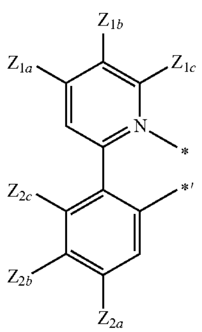
Formula 3-1(54)
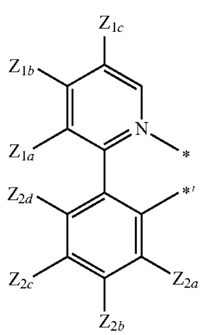
Formula 3-1(55)
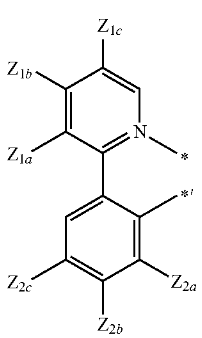
-continued
Formula 3-1(56)
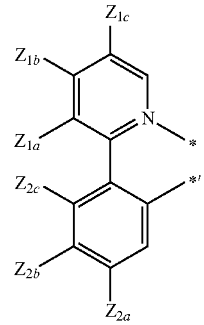
Formula 3-1(57)
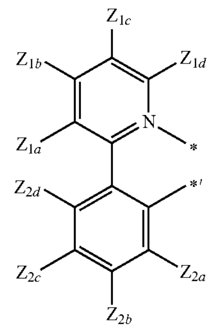
Formula 3-1(58)
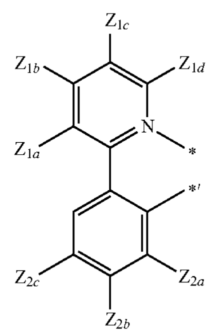
Formula 3-1(59)
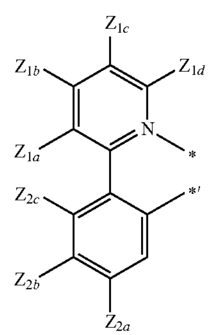

$Z_1$, $Z_2$, $Z_{1a}$, $Z_{1b}$, $Z_{1c}$, $Z_{1d}$, $Z_{2a}$, $Z_{2b}$, $Z_{2c}$, and $Z_{2d}$ in Formulae 3-1(1) to 3-1(59) are each independently selected from:

a deuterium, —F, and a cyano group;

a $C_1$-$C_{60}$ alkyl group, a $C_2$-$C_{60}$ alkenyl group, a $C_3$-$C_{10}$ cycloalkyl group, and a $C_1$-$C_{10}$ heterocycloalkyl group, each unsubstituted or substituted with at least one selected from a deuterium, —F, —$CD_3$, —$CD_2H$, —$CDH_2$, —$CF_3$, —$CF_2H$, —$CFH_2$, a cyano group, a $C_1$-$C_{60}$ alkyl group, a $C_2$-$C_{60}$ alkenyl group, and a $C_3$-$C_{10}$ cycloalkyl group; and —$Si(Q_3)(Q_4)(Q_5)$;

$Q_3$ to $Q_5$ are each independently selected from:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, and a tert-pentyl group; and an n-propyl group, an isopropyl group, an n-butyl group, an isobutyl group, a sec-butyl group, a tert-butyl group, an n-pentyl group, an isopentyl group, a sec-pentyl group, and a tert-pentyl group, each substituted with at least one selected from a deuterium, and a $C_1$-$C_{10}$ alkyl group, $L_1$ and $L_2$ in Formula 1 are different from each other, sum of n1 and n2 is 3, and

* and *' in Formula 2A are binding sites to M in Formula 1.

2. The organometallic compound of claim 1, wherein in Formula 1, n1 is 1 and n2 is 2.

3. The organometallic compound of claim 1, wherein $R_1$ to $R_3$ in Formulae 2A(1) to 2A(8) and 2A(25) to 2A(40) are each independently a $C_1$-$C_{20}$ alkyl group that is unsubstituted or substituted with at least one selected from a deuterium, —F, —$CD_3$, —$CD_2H$, —$CDH_2$, —$CF_3$, —$CF_2H$, —$CFH_2$, and a cyano group.

4. The organometallic compound of claim 1, wherein $R_1$ to $R_3$ in Formulae 2A(1) to 2A(8) and 2A(25) to 2A(40) are each independently selected from:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, and a tert-pentyl group; and an n-propyl group, an isopropyl group, an n-butyl group, an isobutyl group, a sec-butyl group, a tert-butyl group, an n-pentyl group, an isopentyl group, a sec-pentyl group, and a tert-pentyl group, each substituted with at least one selected from a deuterium.

5. The organometallic compound of claim 1, wherein $R_{11}$, $R_{11a}$, $R_{11b}$, and $R_{41}$ to $R_{48}$ in Formulae 2A(1) to 2A(8) and 2A(25) to 2A(40) are each independently selected from a hydrogen, a deuterium, —F, a cyano group, a $C_1$-$C_{20}$ alkyl group, and a $C_1$-$C_{20}$ alkoxy group; and a $C_1$-$C_{20}$ alkyl group and a $C_1$-$C_{20}$ alkoxy group, each substituted with at least one selected from a deuterium, —F, —$CD_3$, —$CD_2H$, —$CDH_2$, —$CF_3$, —$CF_2H$, —$CFH_2$, a cyano group, a $C_1$-$C_{10}$ alkyl group, a cyclopentyl group, a cyclohexyl group, a cycloheptyl group, a cyclooctyl group, an adamantanyl group, and norbornanyl group; and a cyclopentyl group, a cyclohexyl group, a cycloheptyl group, a cyclooctyl group, an adamantanyl group, and norbornanyl group; and a cyclopentyl group, a cyclohexyl group, a cycloheptyl group, a cyclooctyl group, an adamantanyl group, and norbornanyl group, each substituted with at least one selected from a deuterium, —F, —$CD_3$, —$CD_2H$, —$CDH_2$, —$CF_3$, —$CF_2H$, —$CFH_2$, a cyano group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, and norbornanyl group, provided that $R_1$, $R_{11a}$, and $R_{11b}$ in Formulae 2A(1) to 2A(8) and 2A(25) to 2A(40) are each not hydrogen.

6. The organometallic compound of claim 1, wherein $R_{11}$, $R_{11a}$, $R_{11b}$, and $R_{41}$ to $R_{48}$ in Formulae 2A(1) to 2A(8) and 2A(25) to 2A(40) are each independently selected from:

a hydrogen, a deuterium, —F, a cyano group, a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl, and norbornanyl group; and a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, and norbornanyl group, each substituted with at least one selected from a deuterium, —F, —$CD_3$, —$CD_2H$, —$CDH_2$, —$CF_3$, —$CF_2H$, —$CFH_2$, a cyano group, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, and norbornanyl group, provided that Ru, $R_{11a}$, and $R_{11b}$ in Formulae 2A(1) to 2A(8) and 2A(25) to 2A(40) are each not hydrogen.

7. The organometallic compound of claim 1, wherein $Y_5$ is N.

8. The organometallic compound of claim 1, wherein the organometallic compound is one of following Compounds:
1
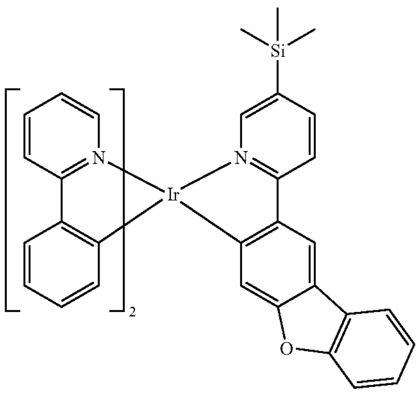
2
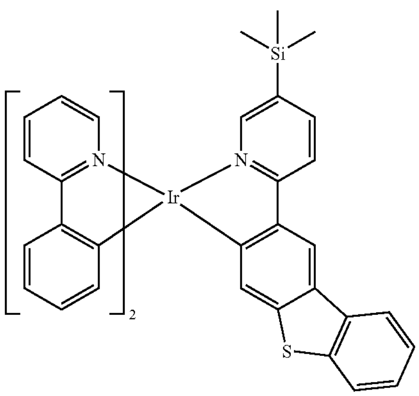
8
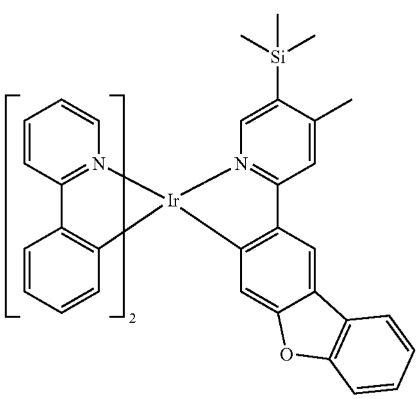
9
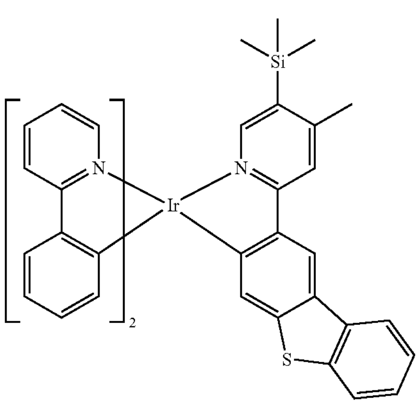
-continued
15
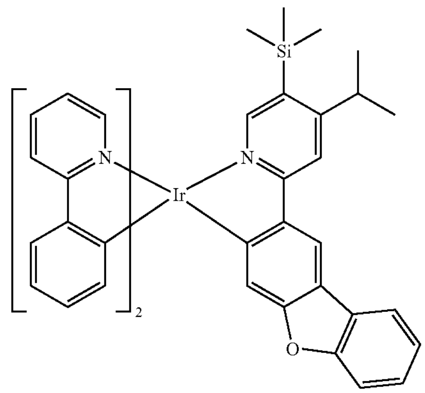
16
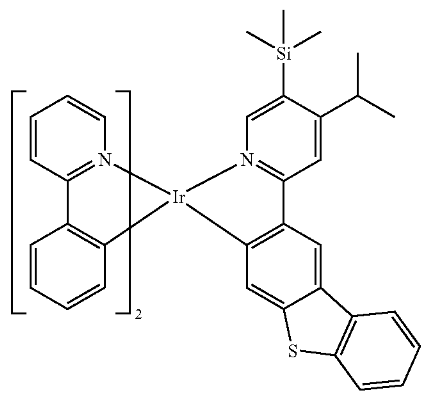
22
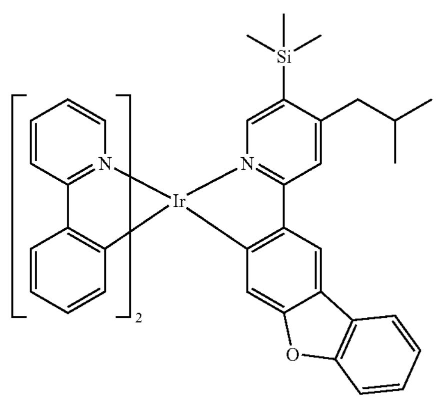
23
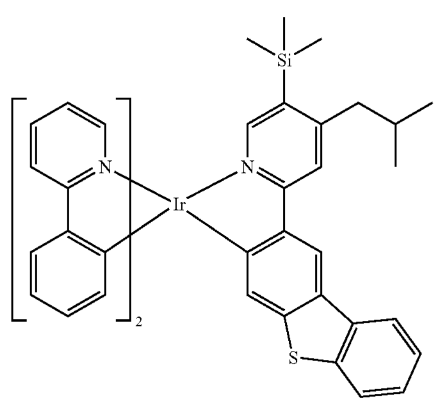

-continued
31
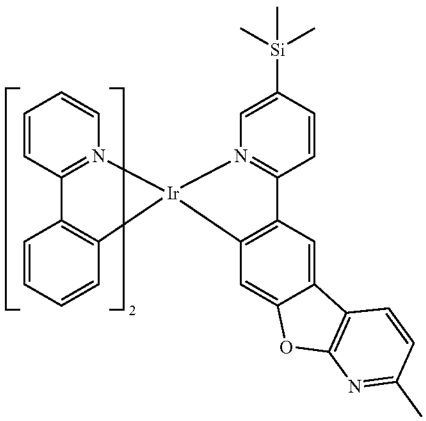
32
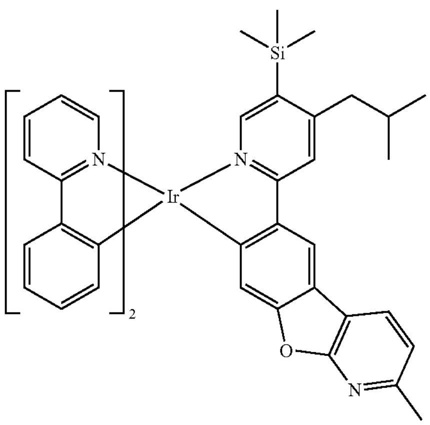
91
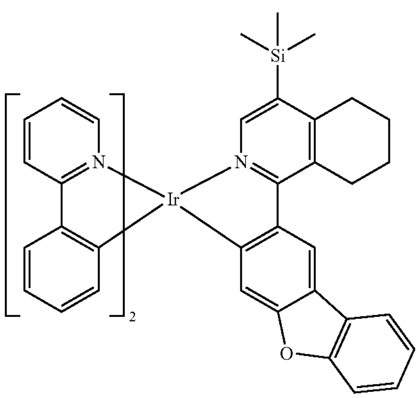
92
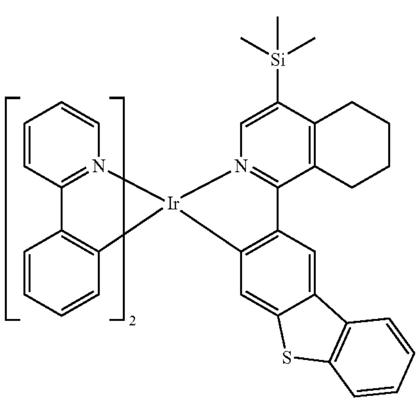
-continued
98
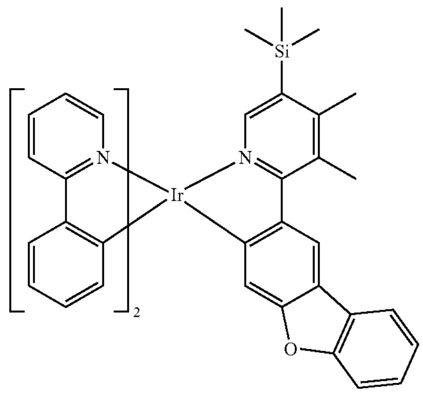
99
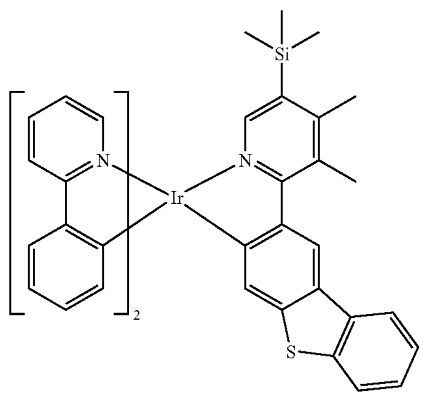
105
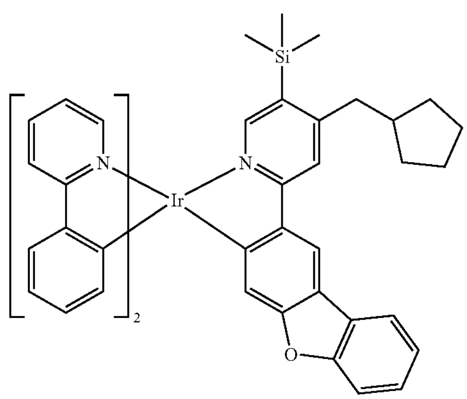
106
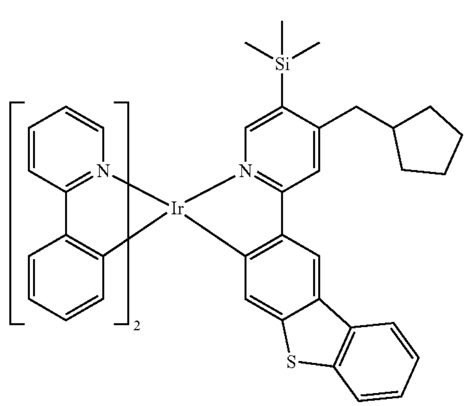

146
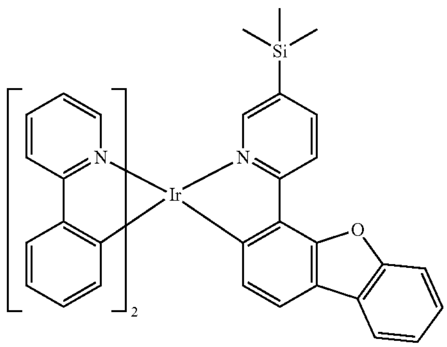
147
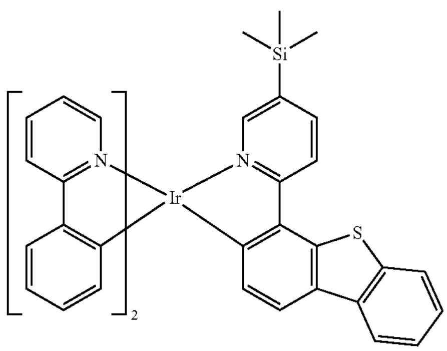
153
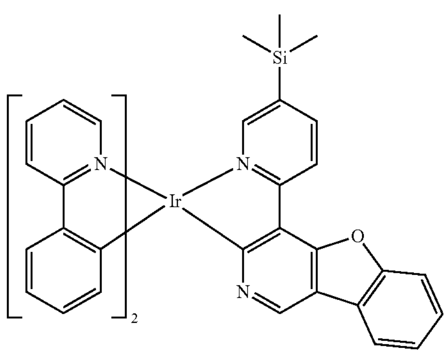
154
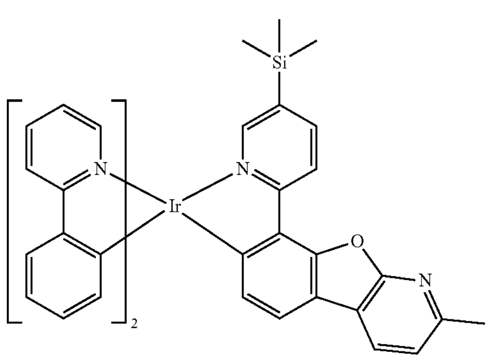
156
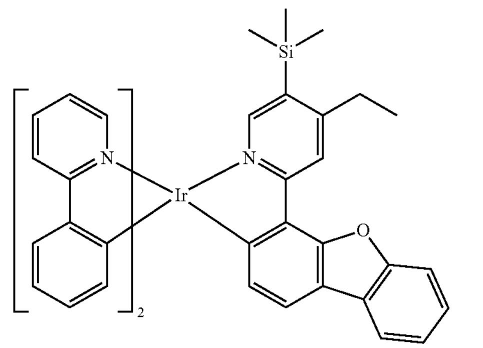
157
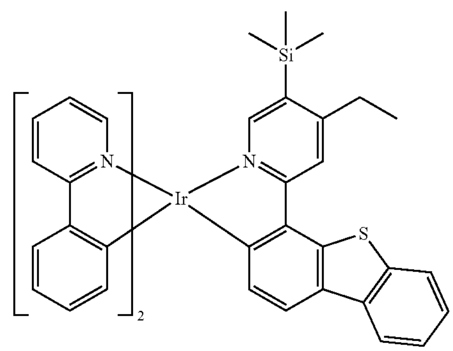
164
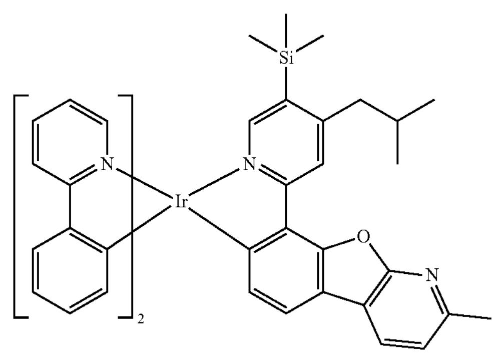
184
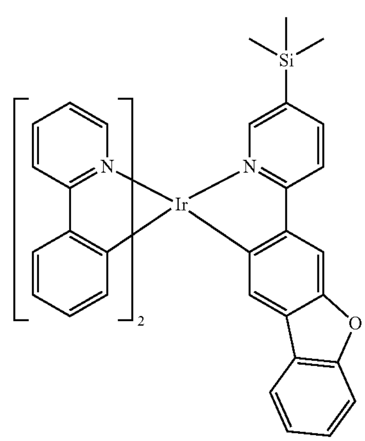

-continued
185
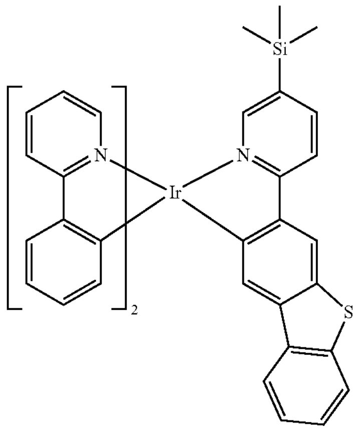
191
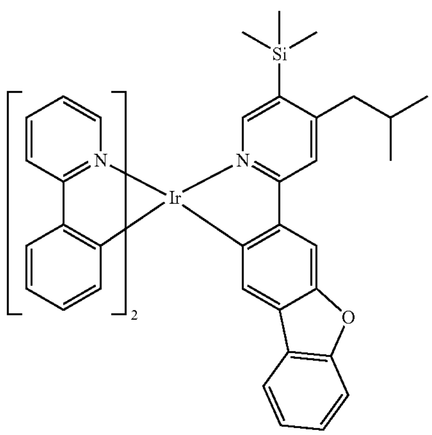
192
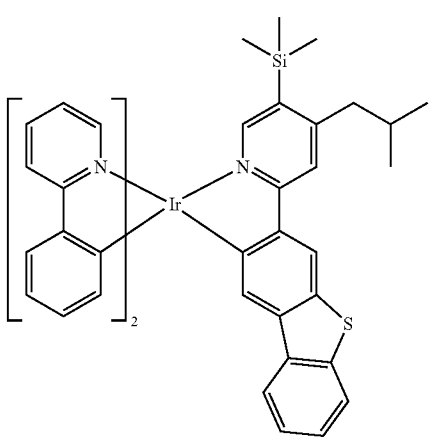
-continued
212
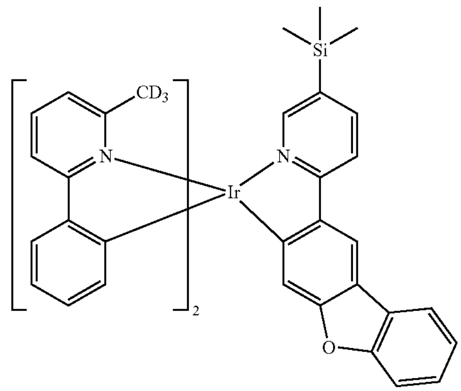
213
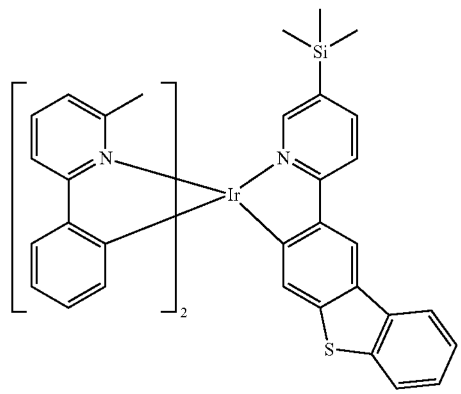
226
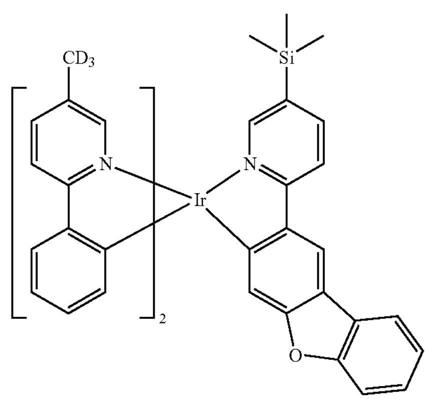
227
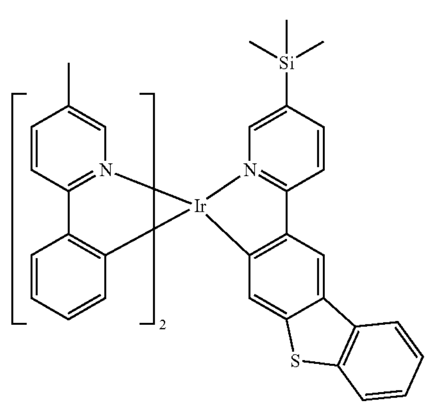

-continued
233
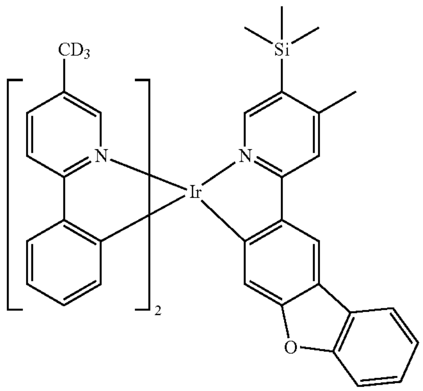
240
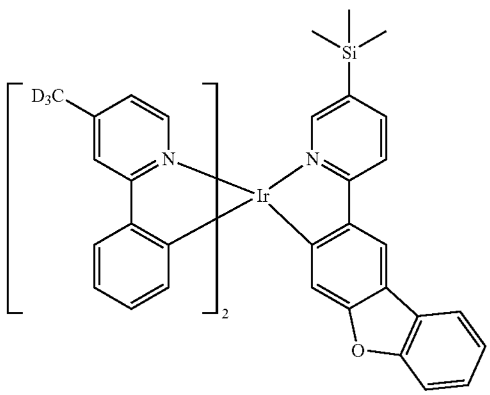
241
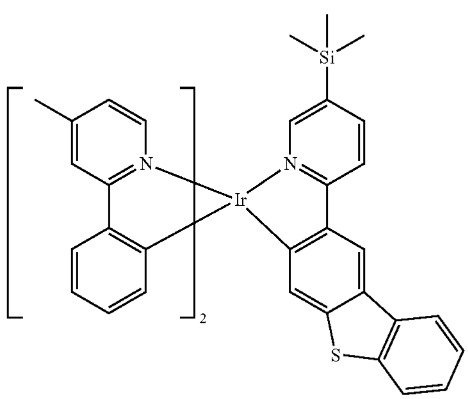
254
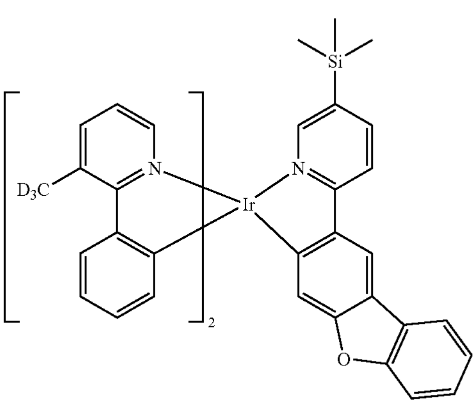
-continued
255
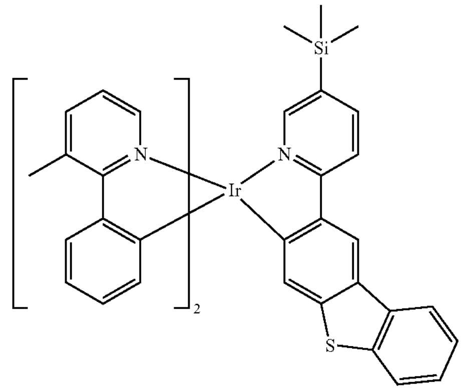
272
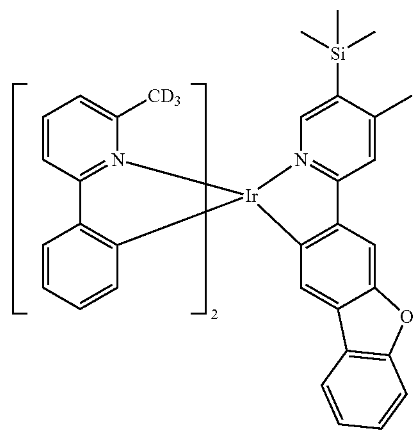
273
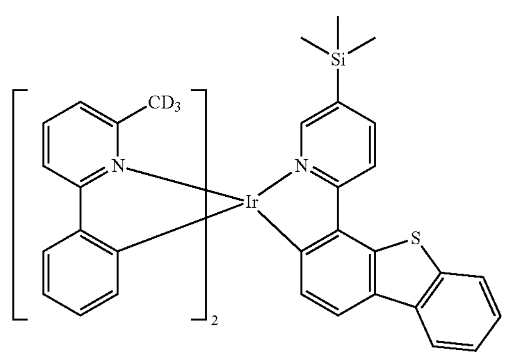
279
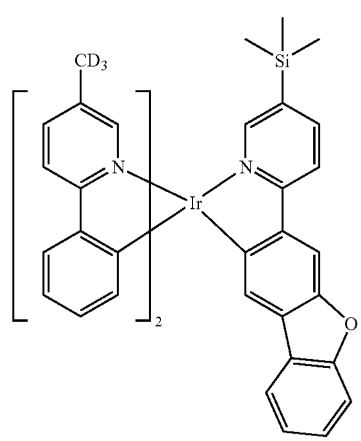

-continued
286
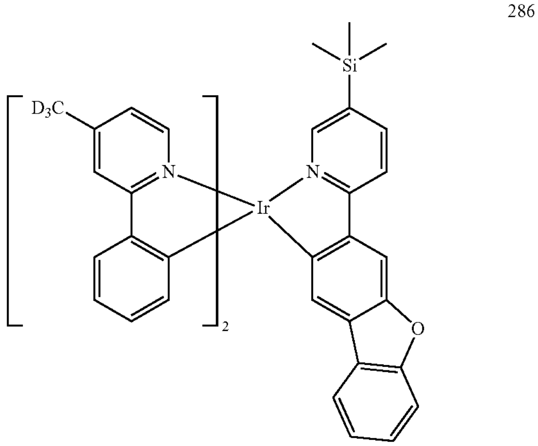
287
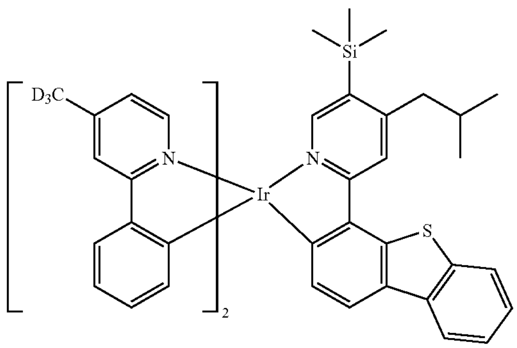
294
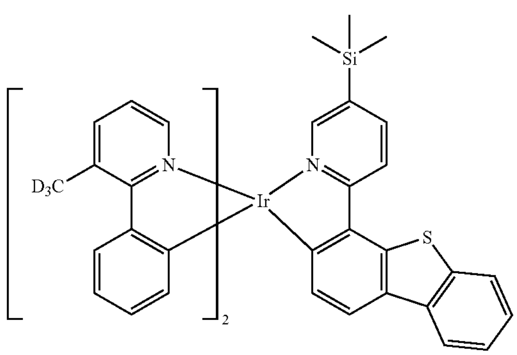
300
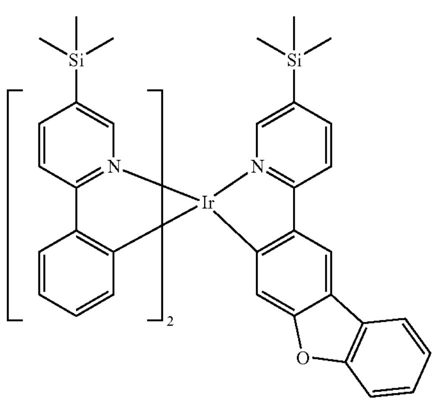
-continued
301
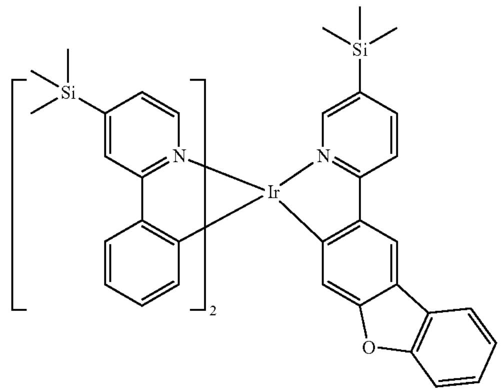
302
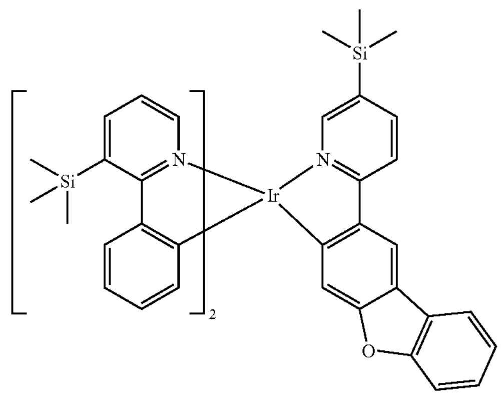
303
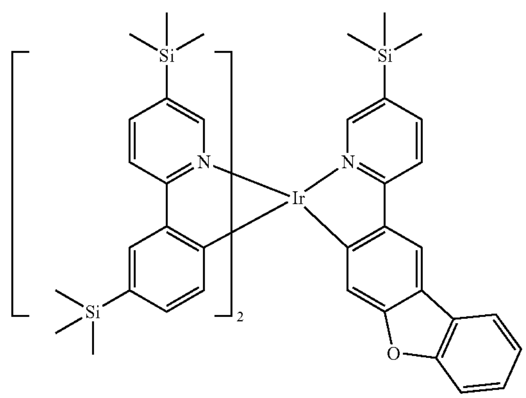
304
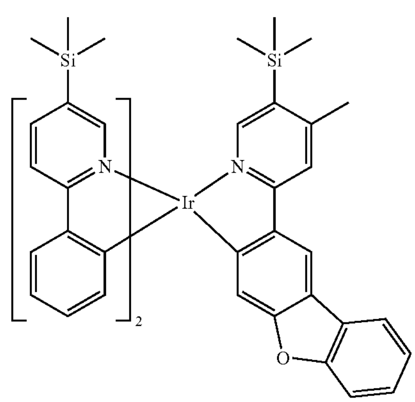

-continued
305
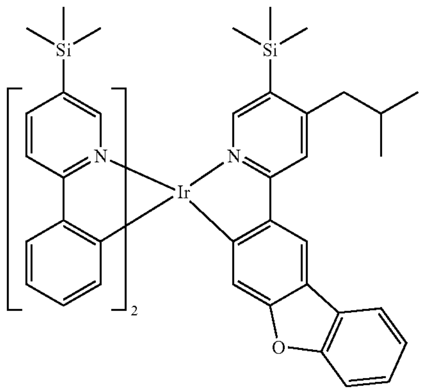
307
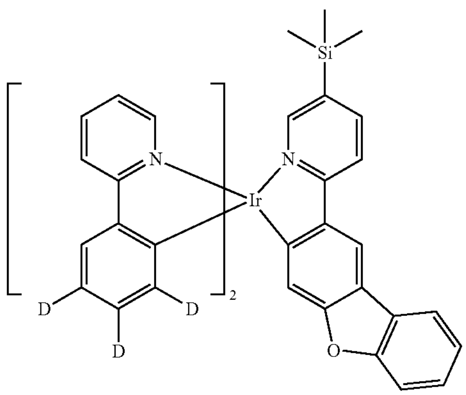
308
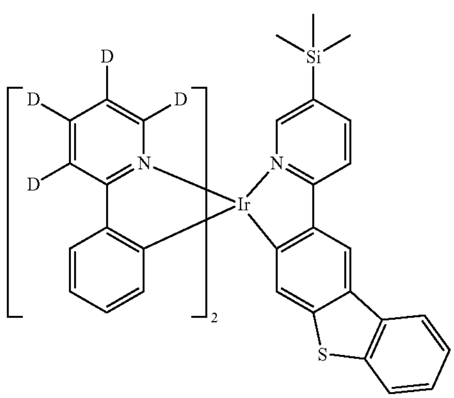
314
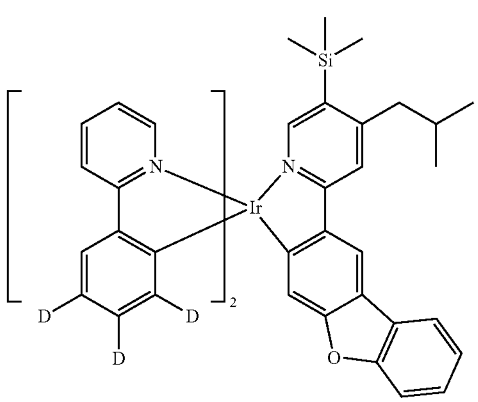
-continued
322
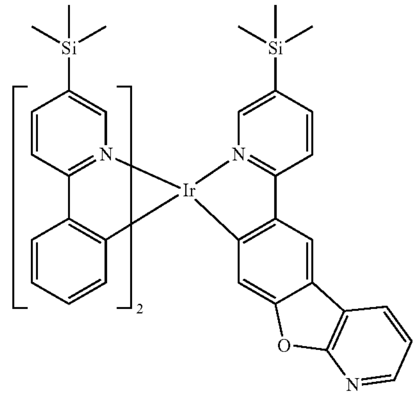
323
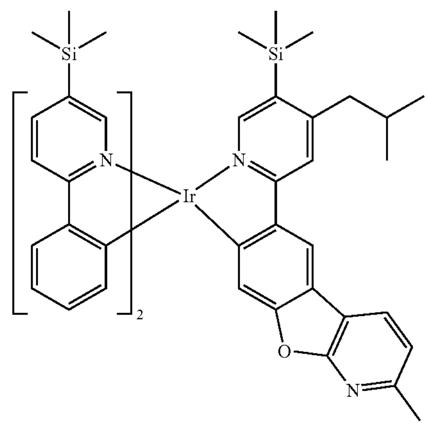
326
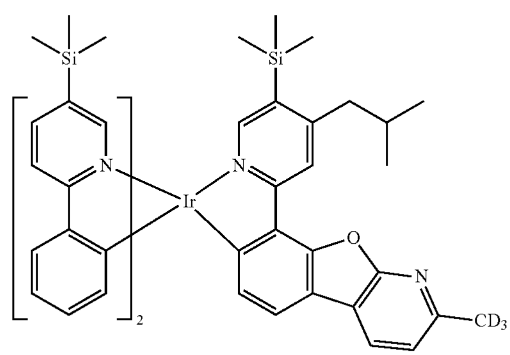
327
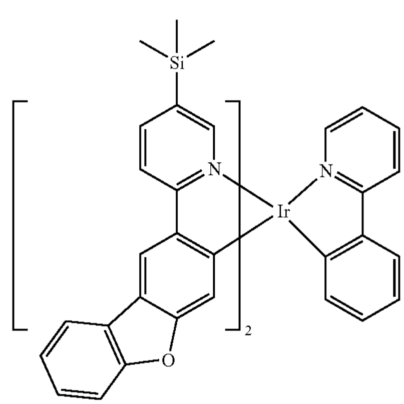

-continued
328
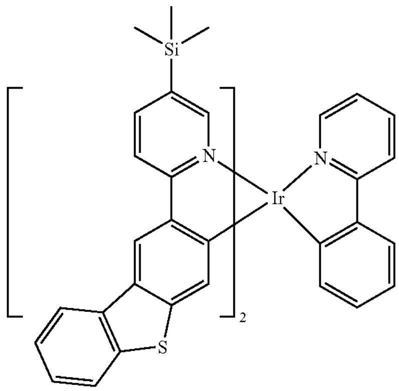
334
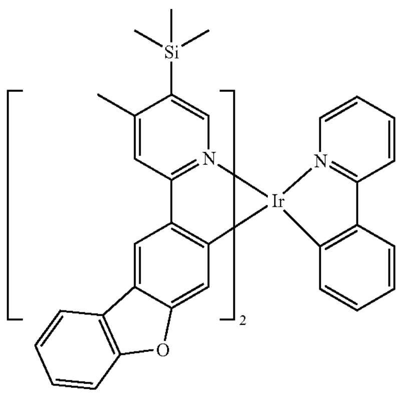
335
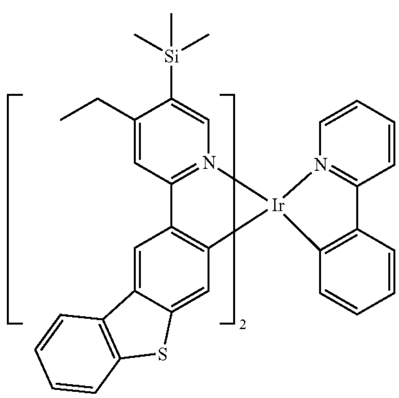
341
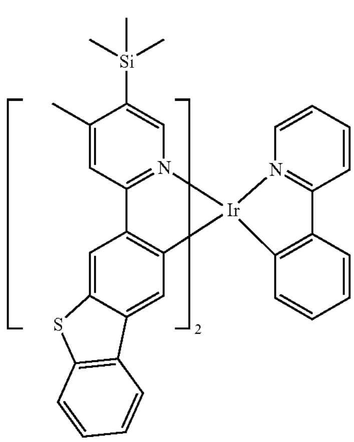
-continued
342
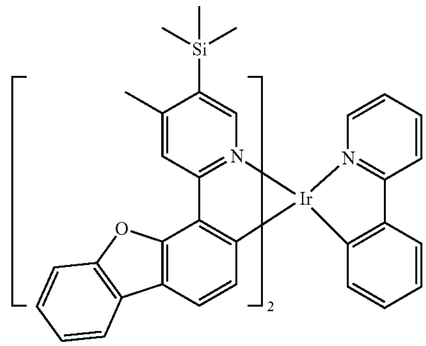
348
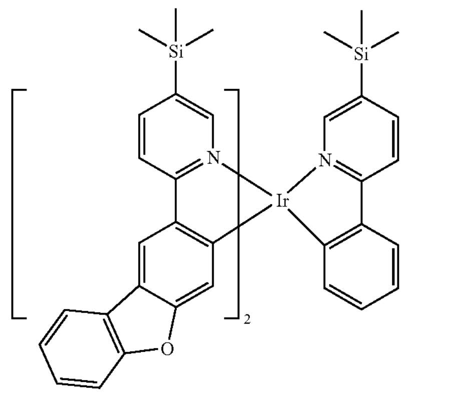
349
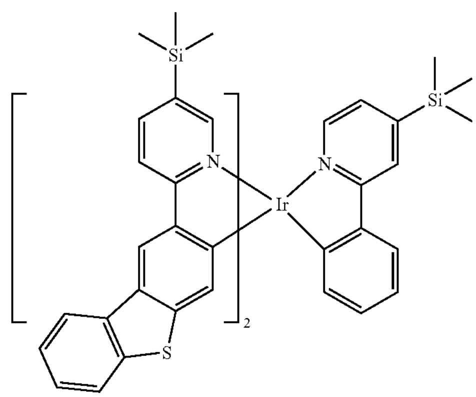
356
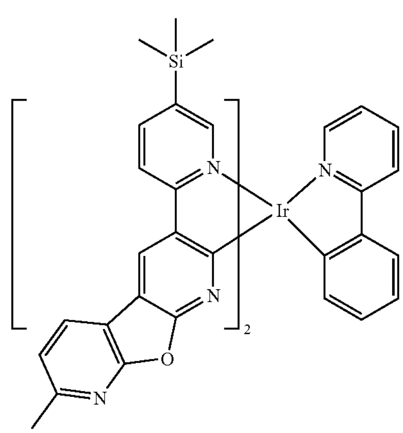

357
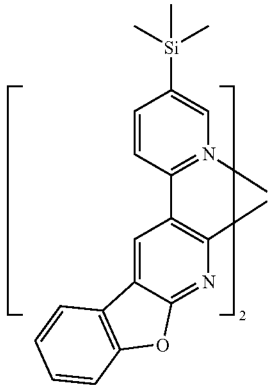
358
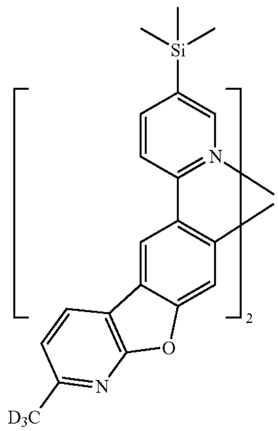
360
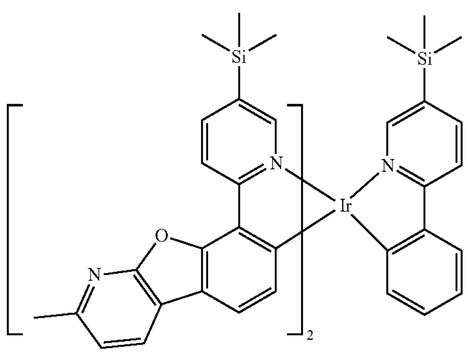
361
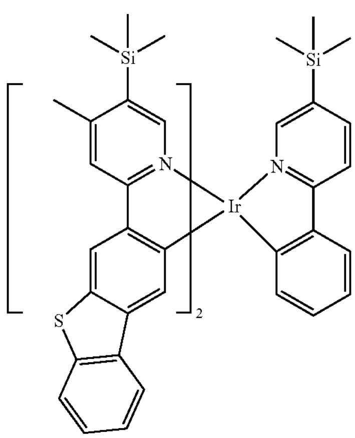
362
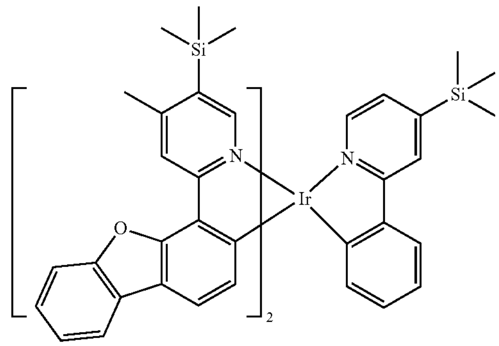
368
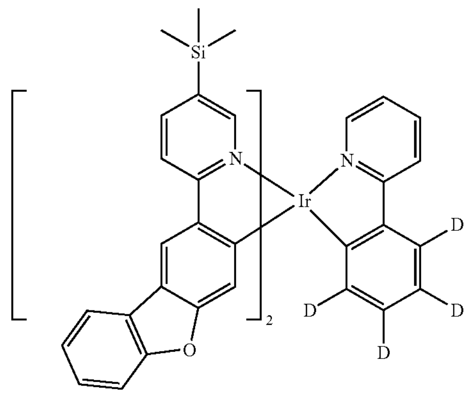
369
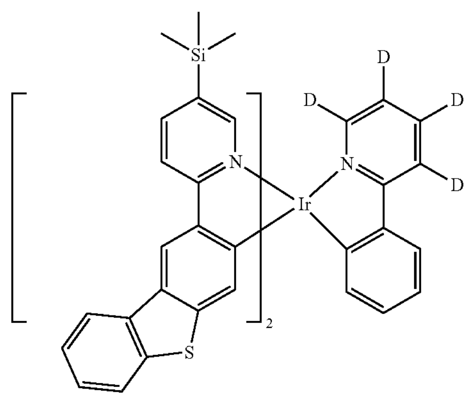
375
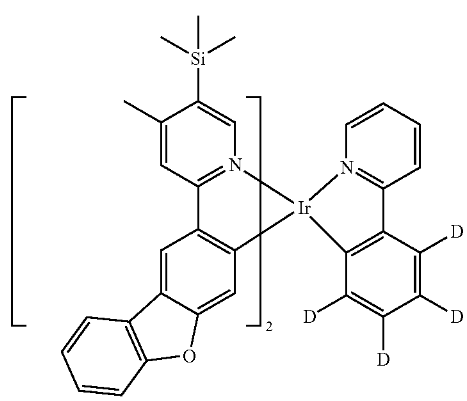

376
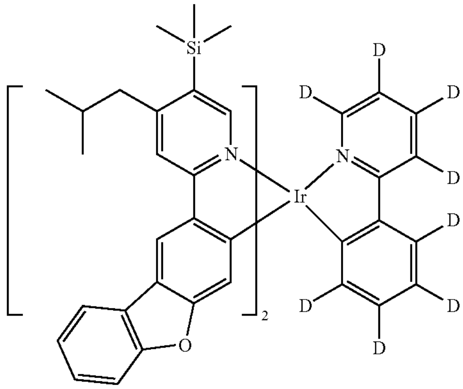
380
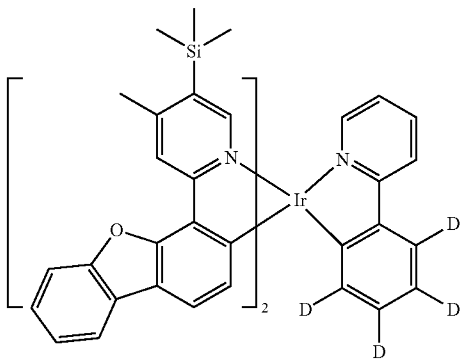
381
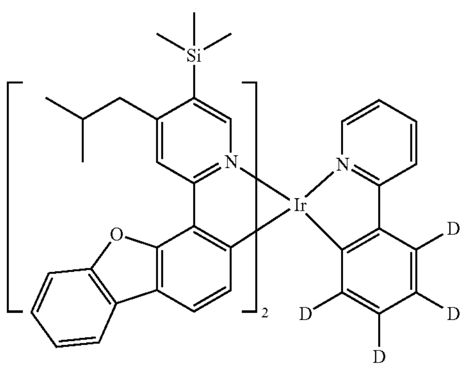
382
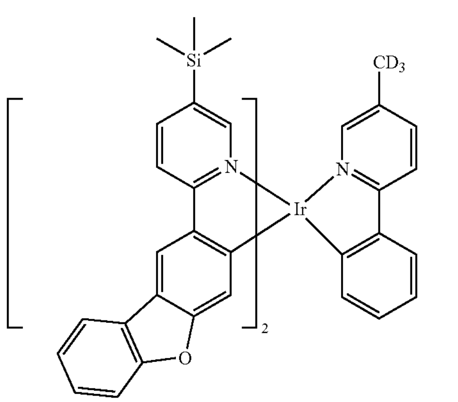
383
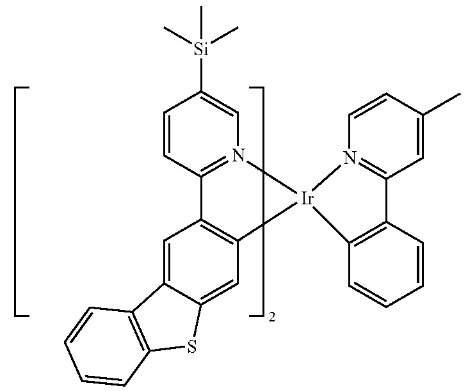
389
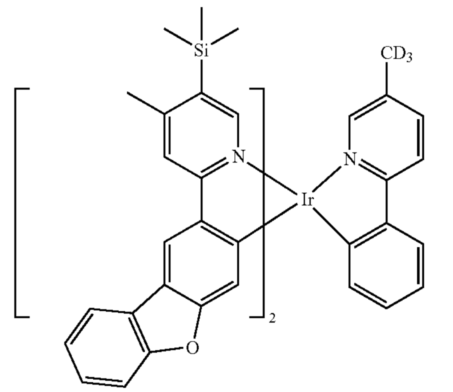
390
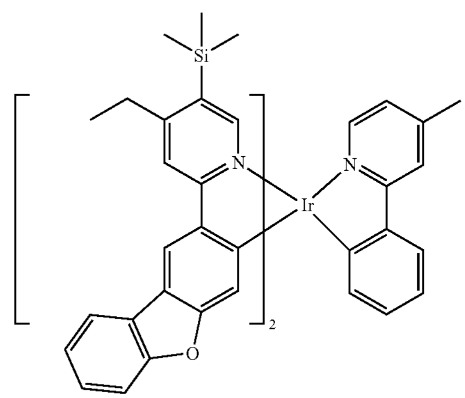
396
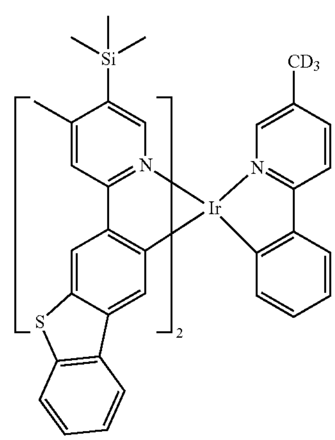

-continued

397

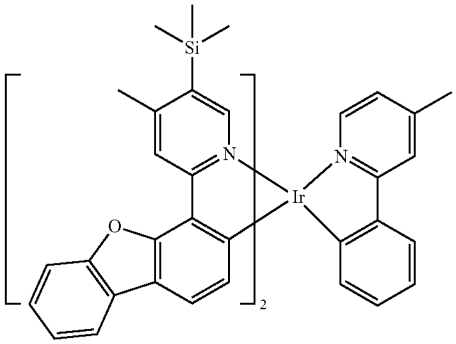

403

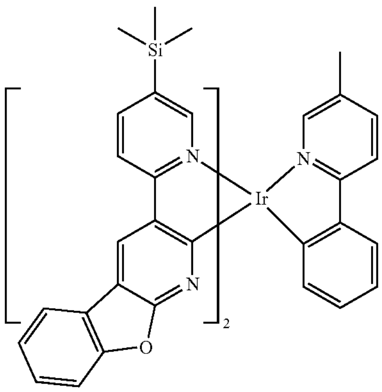

404

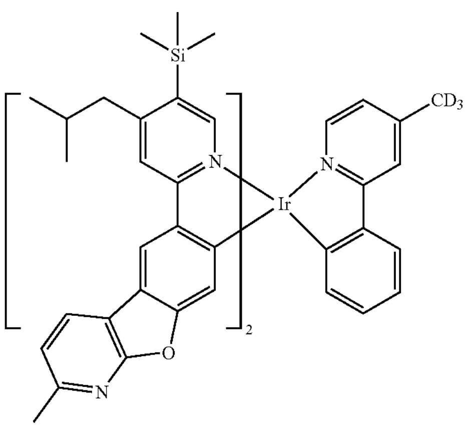

-continued

406

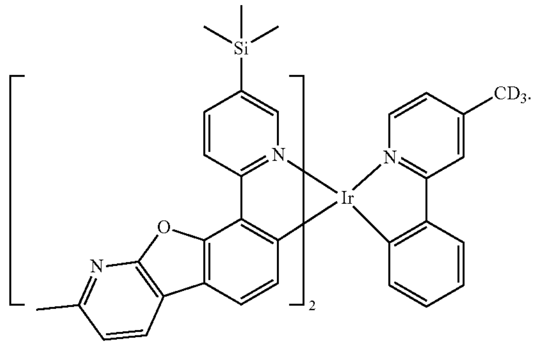

9. An organic light-emitting device comprising:

a first electrode;

a second electrode; and an organic layer disposed between the first electrode and the second electrode, wherein the organic layer comprises an emission layer and at least one organometallic compound of claim 1.

10. The organic light-emitting device of claim 9, wherein the first electrode is an anode, the second electrode is a cathode, and the organic layer comprises a hole transport region between the first electrode and the emission layer, and an electron transport region between the emission layer and the second electrode, wherein the hole transport region comprises at least one of a hole injection layer, a hole transport layer, and an electron blocking layer and the electron transport region comprises at least one selected from a hole blocking layer, an electron transport layer, and an electron injection layer.

11. The organic light-emitting device of claim 9, wherein the emission layer comprises at least one organometallic compound of claim 1.

* * * * *